US012272734B2

(12) United States Patent
Huang et al.

(10) Patent No.: US 12,272,734 B2
(45) Date of Patent: Apr. 8, 2025

(54) SEMICONDUCTOR DEVICE AND METHOD FOR FORMING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Yu-Shiang Huang, New Taipei (TW); Chee-Wee Liu, Taipei (TW)

(73) Assignees: TAIWAN SEMICONDUCTOR MANUFACTURING COMPANY, LTD., Hsinchu (TW); National Taiwan University, Taipei (TW)

( * ) Notice: Subject to any disclaimer, the term of this patent is extended or adjusted under 35 U.S.C. 154(b) by 604 days.

(21) Appl. No.: 17/461,793

(22) Filed: Aug. 30, 2021

(65) Prior Publication Data

US 2023/0066323 A1 Mar. 2, 2023

(51) Int. Cl.
*H01L 29/423* (2006.01)
*H01L 29/06* (2006.01)
*H01L 29/417* (2006.01)
*H01L 29/66* (2006.01)
*H01L 29/786* (2006.01)

(52) U.S. Cl.
CPC .... *H01L 29/42392* (2013.01); *H01L 29/0665* (2013.01); *H01L 29/41775* (2013.01); *H01L 29/6653* (2013.01); *H01L 29/66545* (2013.01); *H01L 29/78696* (2013.01)

(58) Field of Classification Search
CPC ......... H01L 29/42392; H01L 29/41775; H01L 29/6653; H01L 29/66545; H01L 29/78696
See application file for complete search history.

(56) References Cited

U.S. PATENT DOCUMENTS 10,074,575 B1 * 9/2018 Guillorn ......... H01L 21/823821
10,840,329 B1 * 11/2020 Xie ................. H01L 21/823412
2021/0226034 A1 * 7/2021 Xie ..................... H01L 29/1079
(Continued)

OTHER PUBLICATIONS

S. Kal et al., "Selective isotropic etching of Group IV semiconductors to enable gate all around device architectures", TEL Technology Center, America, LLC-imec , Apr. 10, 2018.
(Continued)

*Primary Examiner* — Yara B Green
*Assistant Examiner* — Fakeha Sehar
(74) *Attorney, Agent, or Firm* — Maschoff Brennan

(57) ABSTRACT

A semiconductor device includes a substrate, a semiconductor strip, an isolation dielectric, a plurality of channel layers, a gate structure, a plurality of source/drain structures, and an isolation layer. The semiconductor strip extends upwardly from the substrate and has a length extending along a first direction. The isolation dielectric laterally surrounds the semiconductor strip. The channel layers extend in the first direction above the semiconductor strip and arrange in a second direction substantially perpendicular to the substrate. The gate structure surrounds each of the channel layers. The source/drain structures are above the semiconductor strip and on either side of the channel layers. The isolation layer is interposed between the semiconductor strip and the gate structure and further interposed between the semiconductor strip and each of the plurality of source/drain structures.

20 Claims, 132 Drawing Sheets

(56) References Cited

U.S. PATENT DOCUMENTS

2023/0060619 A1* 3/2023 Frougier ............ H01L 29/7849
2023/0133545 A1* 5/2023 Frougier ............... H01L 29/775
257/329

OTHER PUBLICATIONS

Akihiro Kojima et al., "Dual-Frequency Superimposed RF Capacitive-Coupled Plasma Etch Process", Japanese Journal of Applied Physics, vol. 44, No. 8, 2005.
B. E. E. Kastenmeier et al., "Highly selective etching of silicon nitride over silicon and silicon dioxide", Journal of Vacuum Science & Technology A, 1999.
C. Auth et al., "A 22nm High Performance and Low-Power CMOS Technology Featuring Fully-Depleted Tri-Gate Transistors, Self-Aligned Contacts and High Density MIM Capacitors", Symposium on VLSI Technology Digest of Technical Papers, 2012.
G. Dingemans et al., "Plasma-Assisted ALD for the Conformal Deposition of SiO2: Process, Material and Electronic Properties", Journal of The Electrochemical Society, 2012.
Geumjong Bae et al., "3nm GAA Technology featuring Multi-Bridge-Channel FET for Low Power and High Performance Applications", IEEE, 2018.
H. Arimura et al., "A record GmSAT/SSSAT and PBTI reliability in Si-passivated Ge nFinFETs by improved gate stack surface preparation", Symposium on VLSI Technology Digest of Technical Papers, 2019.
H. Mertens et al., "Vertically Stacked Gate-All-Around Si Nanowire Transistors: Key Process Optimizations and Ring Oscillator Demonstration", IEDM, 2017.
L. Witters et al., "Strained Germanium Gate-All-Around pMOS Device Demonstration Using Selective Wire Release Etch Prior to Replacement Metal Gate Deposition", IEEE Transactions on Electron Devices, vol. 64, No. 11, Nov. 2017.
M. Garcia Bardon et al., "Extreme Scaling enabled by 5 Tracks Cells : Holistic design-device co-optimization for FinFETs and Lateral Nanowires", IEDM, 2016.
M.J.H. van Dal et al., "Ge CMOS gate stack and contact development for Vertically Stacked Lateral Nanowire FETs", IEDM, 2018.
Nicolas Loubet et al., "Selective etching of Si1-xGex versus Si with gaseous HCI for the formation of advanced CMOS devices", Thin Solid Films, 2008.
N. Loubet et al., "Stacked Nanosheet Gate-All-Around Transistor to Enable Scaling Beyond FinFET", Symposium on VLSI Technology Digest of Technical Papers, 2017.
F. Roozeboom et al., "Cyclic Etch/Passivation-Deposition as an All-Spatial Concept toward High-Rate Room Temperature Atomic Layer Etching", ECS Journal of Solid State Science and Technology, 2015.
Stephan Borel et al., "Control of Selectivity between SiGe and Si in Isotropic Etching Processes", Japanese Journal of Applied Physics, 2004.
S.C. Song et al., "2nm Node: Benchmarking FinFET vs Nano-Slab Transistor Architectures for Artificial Intelligence and Next Gen Smart Mobile Devices", Symposium on VLSI Technology Digest of Technical Papers, 2019.
T. Tastsumi et al., "Quantitative control of etching reactions on various SiOCH materials", Journal of Vacuum Science & Technology A, 2005.
Y. Bogumilowicz et al., "Chemical vapour etching of Si, SiGe and Ge with HCI; applications to the formation of thin relaxed SiGe buffers and to the revelation of threading dislocations", Semiconductor Science and Technology, 2005.
Y.M. Lee et al., "Accurate Performance Evaluation for the Horizontal Nanosheet Standard-Cell Design Space Beyond 7nm Technology", IEDM, 2017.

* cited by examiner

A1-A1

C1-C1

B1-B1

C1-C1

B1-B1

A1-A1

C1-C1

B1-B1

C1-C1

B1-B1

A1-A1

B1-B1

C1-C1

C1-C1

B1-B1

B1-B1

C1-C1

C1-C1

B1-B1

C1-C1

B1-B1

C1-C1

B1-B1

C1-C1

B1-B1

C1-C1

B1-B1

C1-C1

B1-B1

C5-C5

B5-B5

B2-B2

C2-C2

C2-C2

B2-B2

C2-C2

B2-B2

C2-C2

B2-B2

B2-B2

C2-C2

C3-C3

B3-B3

C3-C3

B3-B3

C3-C3

B3-B3

M3

C4-C4

B4-B4

C4-C4

B4-B4

B4-B4

C4-C4

C4-C4

B4-B4

C4-C4

B4-B4

C4-C4

B4-B4

B4-B4

C4-C4

B4-B4

C4-C4

SEMICONDUCTOR DEVICE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
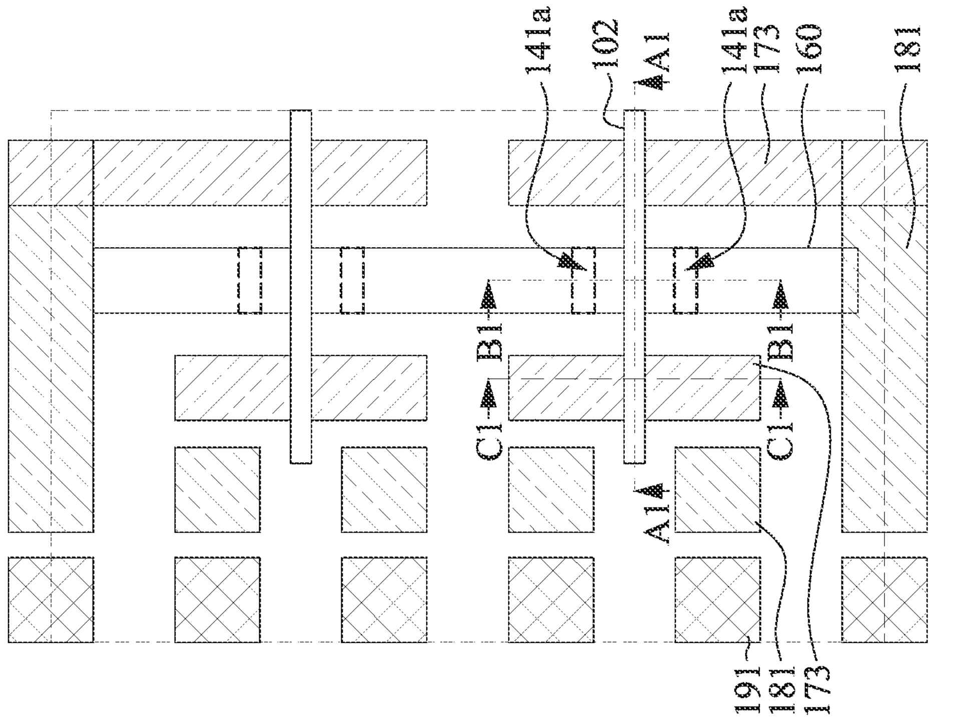
FIGS. 1A to 1D are schematic views of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The embodiments of the disclosure may be applied to the gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure. In addition, the embodiments of the disclosure may also be applied, however, to a variety of metal oxide semiconductor transistors (e.g., complementary-field effect transistor (CFET) and fin field effect transistor (FinFET)).

It has been appreciated that the GAA transistor and the variety of metal oxide semiconductor transistors suffer some issues as described below. A parasitic channel may take place underneath the stacked channels of the GAA transistor, which may degrade the IOFF of the semiconductor device and in turn adversely affects the gate control and would degrade the device performance. In some embodiments, a large ground plane doping (~2e19 $cm^{-3}$) process, a $\Delta E_v$, and/or a large Eg may be applied to the GAA transistor to address the issue associated with the parasitic channel issue. However, the parasitic current may still take place in the GAA transistor to degrade the IOFF of the semiconductor device. The present disclosure will be described with respect to embodiments in a specific context, a GAA transistor manufactured using an improved process flow to address the foregoing issues. Hereinafter, various embodiments will be explained in detail with reference to the accompanying drawings.

Figure 1B:
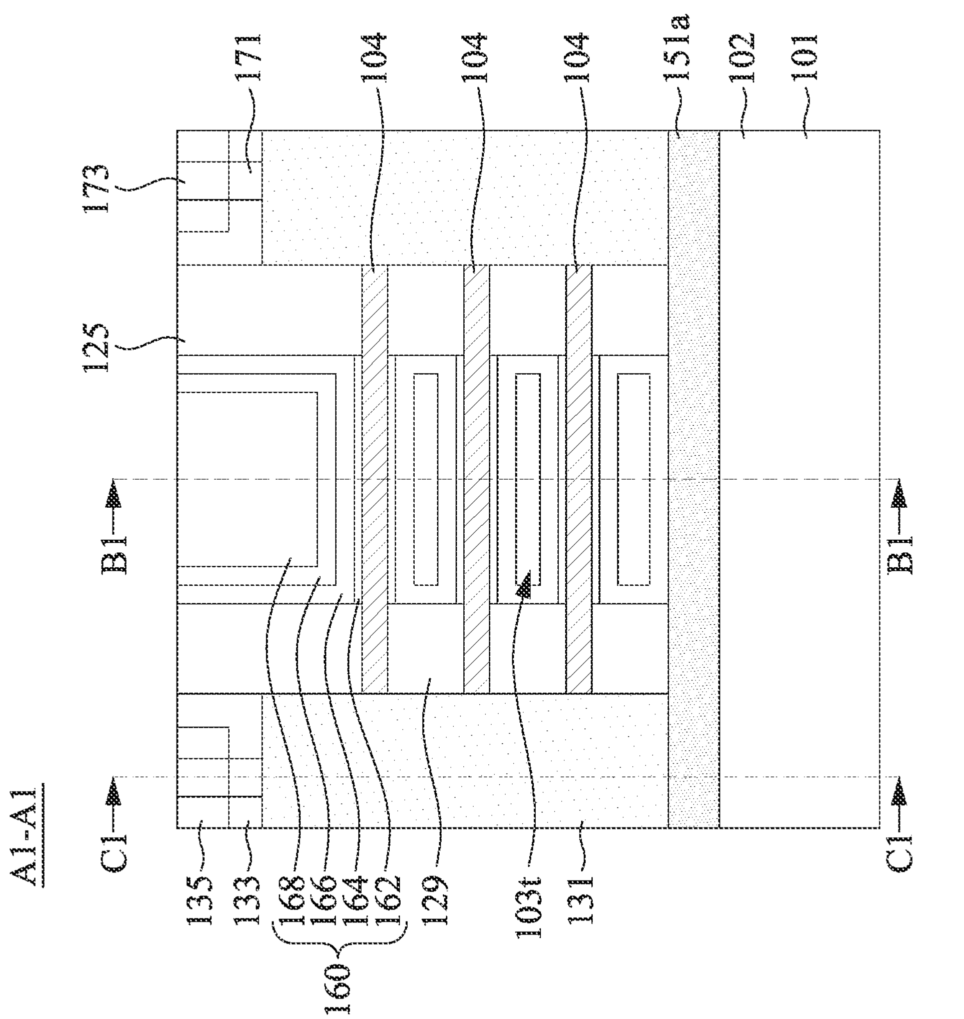
Figure 1D:
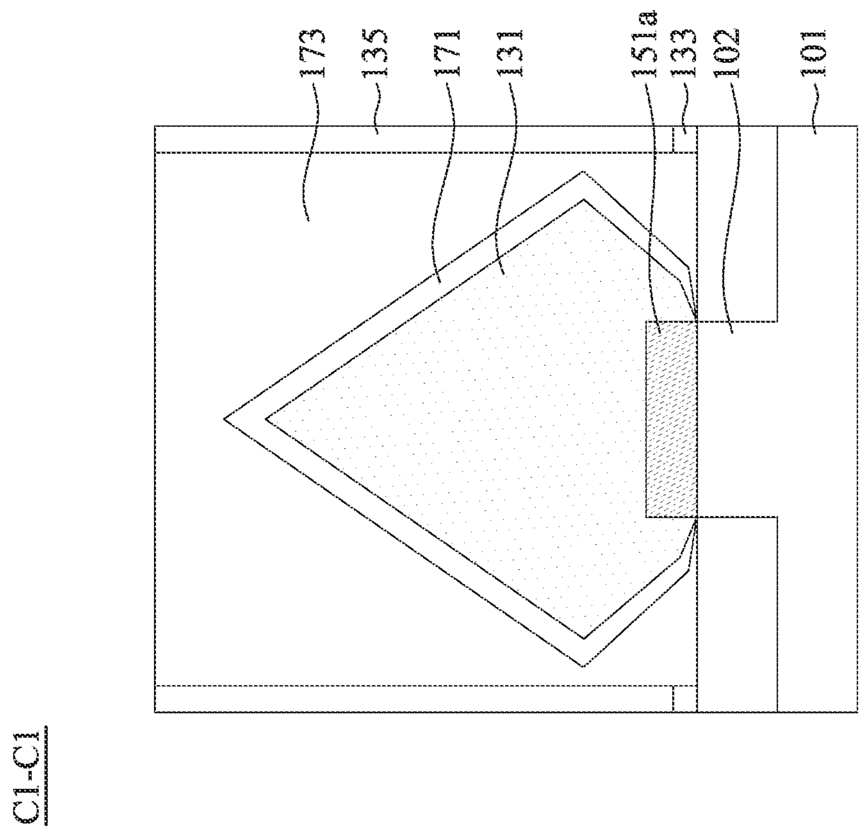
Figure 1C:
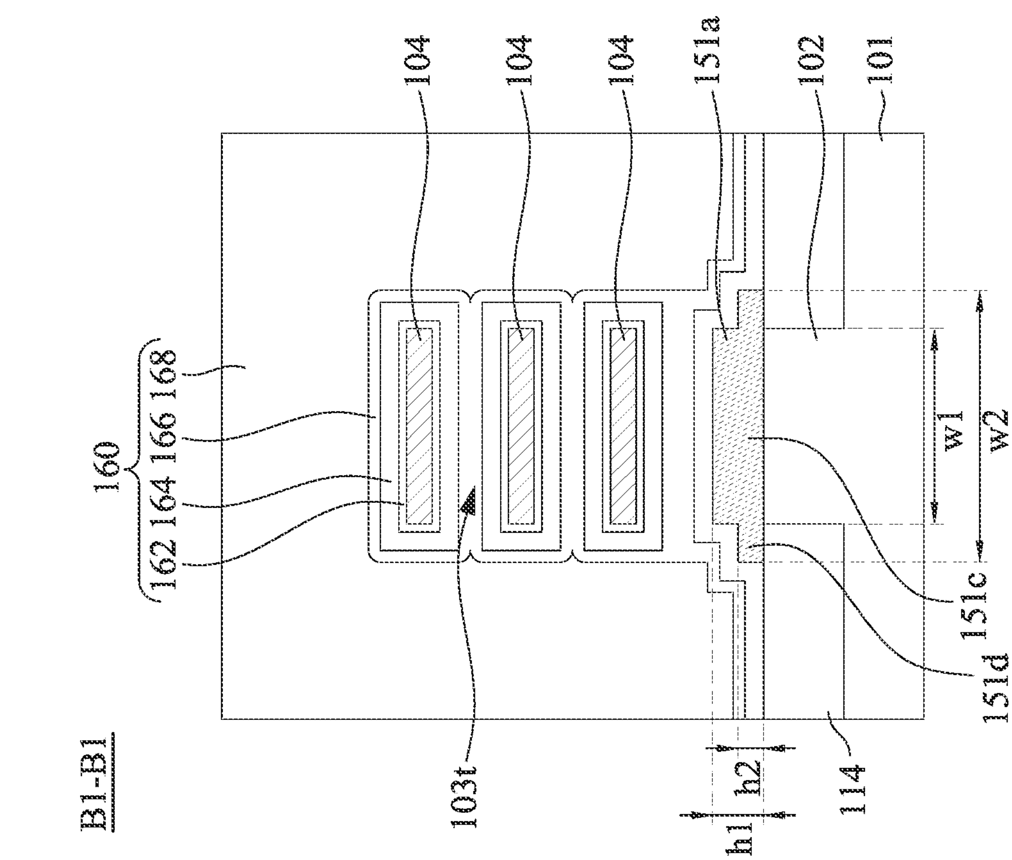

FIGS. 1A to 1D are schematic views of a semiconductor device in accordance with some embodiments of the present disclosure, in which FIG. 1A is a top view of the semiconductor device, FIG. 1B is a cross-sectional view along line A1-A1 of FIG. 1A, FIG. 1C is a cross-sectional view along line B1-B1 of FIG. 1A, and FIG. 1D is a cross-sectional view along line C1-C1 of FIG. 1A. It is noted that some elements in FIGS. 1B to 1D are not illustrated in FIG. 1A for brevity.

Reference is made to FIG. 1A. Shown there is an integrated circuit. The integrated circuit includes a plurality of semiconductor strip 102 over a substrate. In some embodiments, the semiconductor strip 102 can also be referred to as fin structures. The integrated circuit further includes a plurality of channel layers 104 as shown in FIGS. 1B and 1C disposed over the semiconductor strip 102. In some embodiments, the channel layers 104 may also be referred to as "nanosheets" or "nanowires" used to form a channel region of a semiconductor device such as a GAA transistor. The use of the channel layers 104 to define a channel or channels of the semiconductor device is further provided below. In some embodiments, the channel layers 104 may include silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, or the like.

Reference is made to FIGS. 1C and 1D. The integrated circuit includes an isolation dielectric 114. The semiconductor strip 102 has a top surface in a level substantially the same as a top surface of the isolation dielectric 114. In some embodiments, a portion of the semiconductor strip 102 is higher than a top surface of the isolation dielectric 114. In some embodiments, the isolation dielectric 114 is made of silicon oxide, silicon nitride, silicon oxynitride, fluoride-doped silicate glass (FSG), or other low-K dielectric materials.

Reference is made to FIGS. 1C and 1D. The integrated circuit further includes a gate structure 160 wrapping around the channel layers 104 semiconductor layers 104. In some embodiments, the gate structure 160 covers at least four sides of each of the channel layers 104. In some embodiments, the gate structure 160 includes an interfacial layer 162, the gate dielectric layer 164 over the interfacial layer 162, the work function metal layer 166 over the gate dielectric layer 164, and the gate electrode 168 over the work function metal layer 166.

In some embodiments, the interfacial layer 162 may be made of oxide, such as silicon oxide ($SiO_2$) or other suitable material. In some embodiments, the high-k dielectric layer 164 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 164 may include oxide layers. In some embodiments, the work function metal layer 166 may include p-type work function metal materials and n-type work function metal materials. P-type work function materials include compositions such as ruthenium (Ru), palladium (Pd), platinum (Pt), cobalt (Co), nickel (Ni), and conductive metal oxides, or any combination thereof. N-type metal materials include compositions such as hafnium (Hf), zirconium (Zr), titanium (Ti), tantalum (Ta), aluminum (Al), metal carbides (e.g., hafnium carbide (HfC), zirconium carbide (ZrC), titanium carbide (TIC), and aluminum carbide ($Al_4C_3$)), aluminides, other suitable material, or any combination thereof. The work function metal(s) may be deposited by a suitable deposition process, for example, chemical vapor deposition (CVD), plasma-enhanced chemical vapor deposition (PECVD), physical vapor deposition (PVD), plating, thermal or e-beam evaporation, and sputtering. For example, the work function metal layer 166 may include materials such as titanium nitride (TiN) or tantalum nitride (TaN). In some embodiments, the gate electrode 168 may be made of conductive material, such as, aluminum (Al), platinum (Pt), gold (Au), tungsten (W), titanium (Ti), other suitable material, or any combinations thereof.

Reference is made to FIG. 1B. The integrated circuit further includes gate spacers 125 disposed on opposite sidewalls of the gate structure 160. In some embodiments, the gate spacer 125 may include $SiO_2$, $Si_3N_4$, $SiO_xN_y$, SiC, SiCN films, SiOC, SiOCN films, other suitable material, or combinations thereof. In some embodiments, the integrated circuit further includes a plurality of inner spacers 129 disposed on opposite sidewalls of the gate structure 160 and between the channel layers 104. In some embodiments, the inner spacers 129 may include $SiO_2$, $Si_3N_4$, $SiO_xN_y$, SiC, SiCN films, SiOC, SiOCN films, other suitable material, or combinations thereof.

Reference is made to FIGS. 1B and 1D. The integrated circuit further includes a plurality of source/drain structures 131 and a plurality of silicide layers 171 formed over the source/drain structures 131. The source/drain structures 131 are disposed on opposite sides of the gate structure 160 and in contact with longitudinal ends of the channel layers 104, and may act as source/drain regions of the semiconductor device in the integrated circuit. The source/drain structures 131 can also be interchangeably referred to as epitaxial structures. In various embodiments, the source/drain structures 131 may include Ge, Si, GaAs, AlGaAs, SiGe, GaAsP, SiP, other suitable material, or combinations thereof. In some embodiments, each of the source/drain structures 131 includes a first epitaxial layer and a second epitaxial layer over the first epitaxial layer. In some embodiments, the silicide layers 171 may include $CoSi_2$, $TiSi_2$, $WSi_2$, $NiSi_2$, $MoSi_2$, $TaSi_2$, PtSi, or the like.

In FIG. 1B, a contact etch stop layer (CESL) 133 is disposed over the source/drain structures 131 and extending along sidewalls of the gate spacers 125. An interlayer dielectric (ILD) layer 135 is disposed over the CESL 133 and adjacent to the gate spacers 125. In some embodiments, the CESL 133 may be made of silicon nitride, silicon oxynitride, other suitable material, or combinations thereof. The ILD layer 135 may include material different than the CESL 133. In some embodiments, the ILD layer 135 may be made of silicon oxide, silicon nitride, silicon oxynitride, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In FIGS. 1B and 1D, the integrated circuit further includes a plurality of contacts 173 pass through the CESL 133 and the ILD layer 135 and land on the silicide layers 171. In some embodiments, the contacts 173 may be made of a liner and a filling metal. The liner is between filling metal and the underlying silicide layers 171. In some embodiments, the liner assists with the deposition of filling metal and helps to reduce diffusion of a material of filling metal through the gate spacers 125. In some embodiments, the liner includes titanium (Ti), titanium nitride (TiN), tantalum (Ta), tantalum nitride (TaN), or another suitable material. The filling metal includes a conductive material, such tungsten (W), copper (Cu), aluminum (Al), ruthenium (Ru), cobalt (Co), molybdenum (Mo), nickel (Ni), other suitable material, or combinations thereof.

Reference is made to FIGS. 1B to 1D. The integrated circuit further includes an isolation layer 151*a*. In FIG. 1B, the isolation layer 151*a* extends along a top surface of the semiconductor strip 102 and passes through a bottom of the gate structure 160 and bottoms of the source/drain structures 131.

In FIG. 1C, the isolation layer 151*a* is interposed between the semiconductor strip 102 and the gate structure 160 and extends past opposite sidewalls of the semiconductor strip 102, therefore the gate structure 160 is spaced apart from the semiconductor strip 102 by the isolation layer 151*a*. In greater detail, the isolation layer 151*a* has a step-liked sidewall and a greater width w2 than a width w1 of the semiconductor strip 102. The isolation layer 151*a* has a first portion 151*c* on the semiconductor strip 102 and a second portion 151*d* on the isolation dielectric 114. The first portion 151*c* of the isolation layer 151*a* has a greater height h1 than the height h2 of the second portion 151*d* of the isolation layer 151*a*, such that the isolation layer 151*a* has a convex top surface. In some embodiments, a height of the first portion 151*c* of the isolation layer 151*a* may be substantially equal to a height of the second portion 151*d* of the isolation layer 151*a*. In some embodiments, a height of the first portion 151*c* of the isolation layer 151*a* may be lower than a height of the second portion 151*d* of the isolation layer 151*a*.

In FIG. 1D, the isolation layer 151*a* extends from a top surface of the semiconductor strip 102 into the epitaxy structure 131. Hence, the forming of the isolation layer 151*a* can not only reduce the parasitic leakage current but also reduce the parasitic capacitance of the semiconductor device, which may improve the IOFF of the semiconductor device and in turn beneficial affects the gate control, thereby the device performance may be improved. In some embodiments, the isolation layer 151*a* may be made of $SiO_2$, $Si_3N_4$, $SiO_xN_y$, SiC, SiCN films, SiOC, SiOCN films, other suitable material, or combinations thereof. In some embodiments, the isolation layer 151*a* may include low-K dielectric material or other suitable material. In some embodiments, the isolation layer 151*a* may be replaced by an air gap.

Reference is made to FIG. 1A. A plurality of metal lines 181 extend above and electrically connected to the contacts 173, and a plurality of metal lines 191 extend above the metal lines 181. In some embodiments, the metal lines 181 and/or the metal lines 191 may include copper (Cu), aluminum (Al), ruthenium (Ru), cobalt (Co), molybdenum (Mo), nickel (Ni), tungsten (W), other suitable material, or combinations thereof.

Figure 2A:
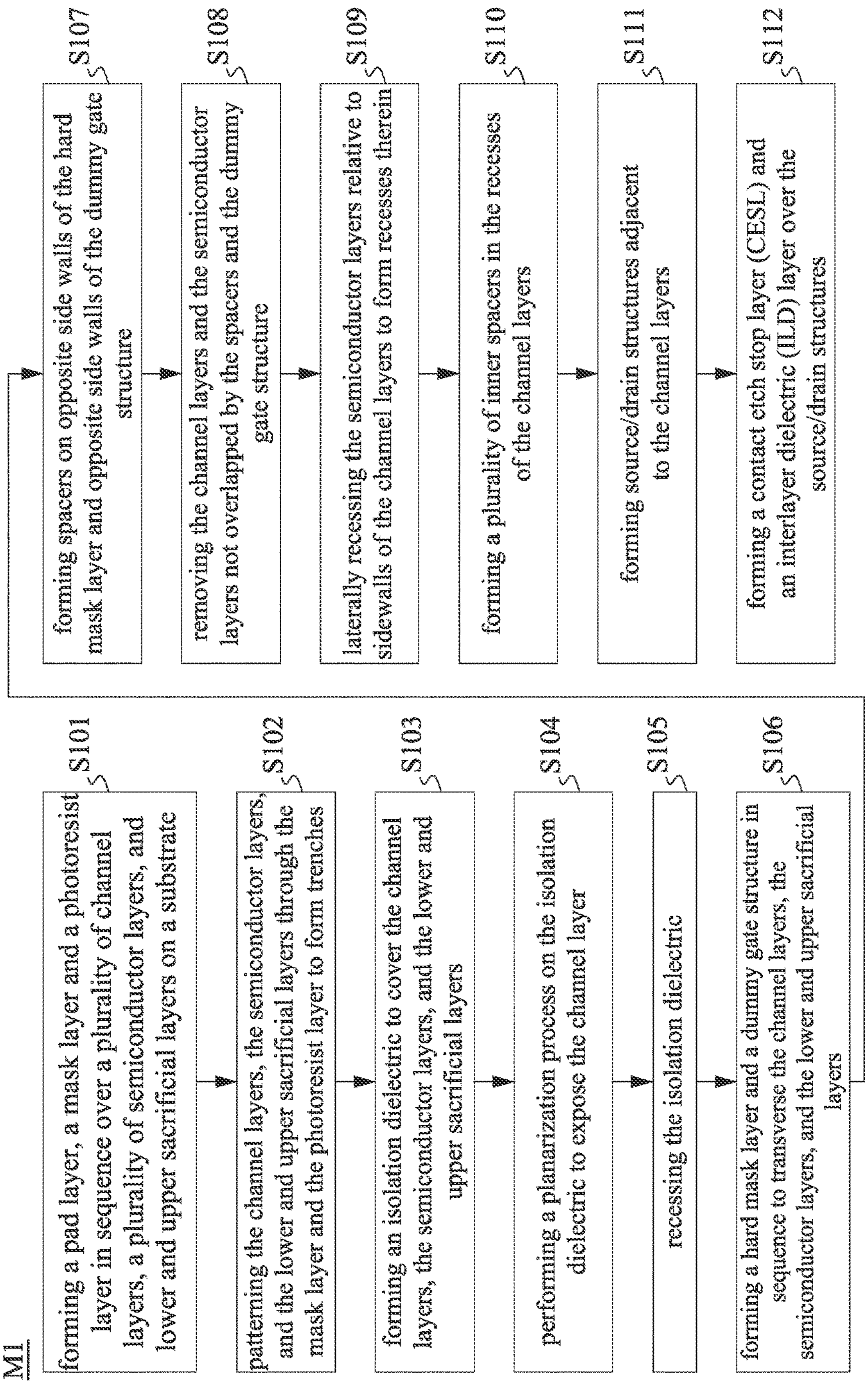
FIGS. 2A and 2B are a method M1 of manufacturing a semiconductor device in accordance with some embodiments of the present disclosure.
Figure 2B:
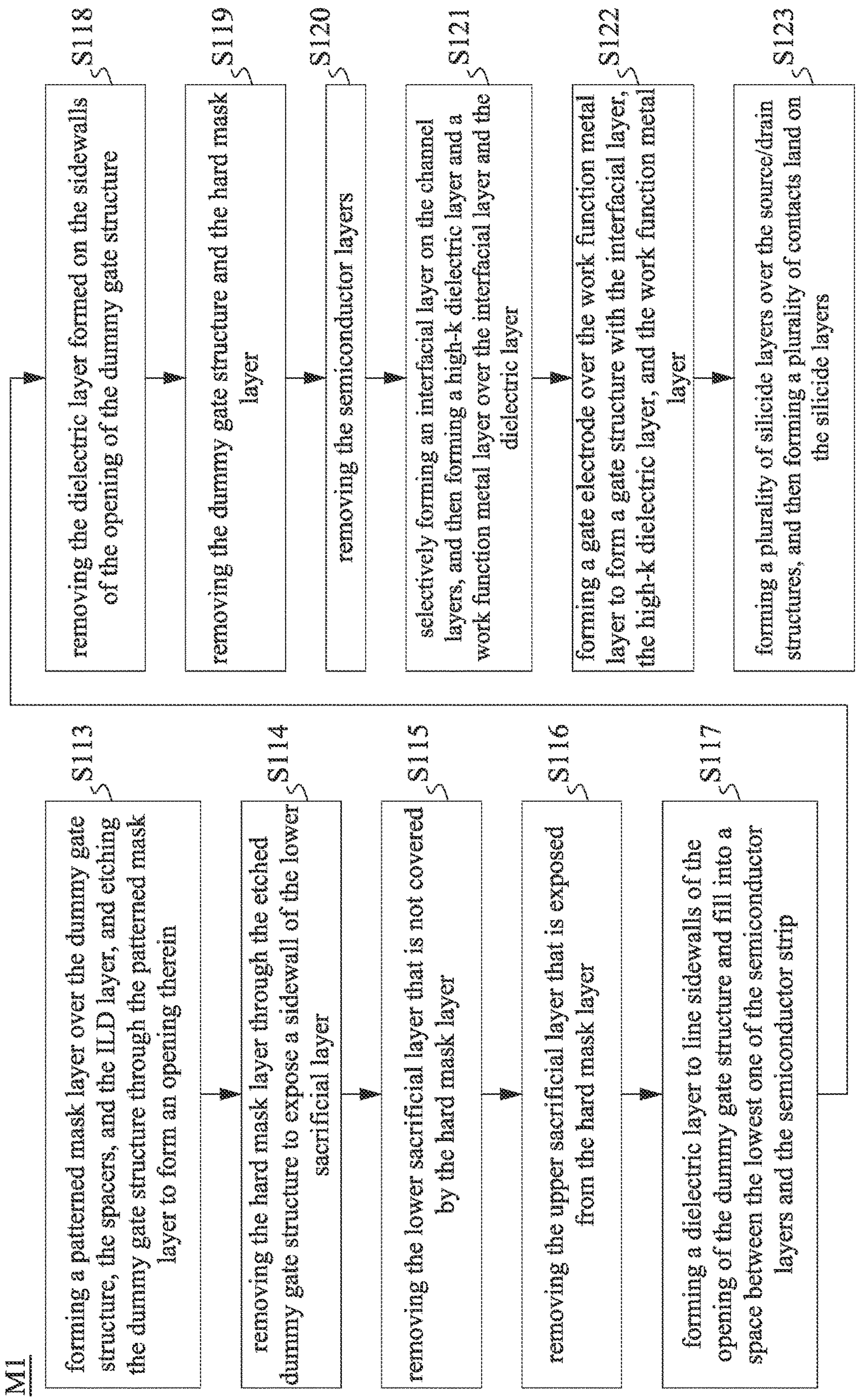

Referring now to FIGS. 2A and 2B, illustrated is an exemplary method M1 for fabrication of a semiconductor device in accordance with some embodiments, in which the fabrication includes a process of the semiconductor device with an isolation layer that is interposed between a semiconductor strip and a gate structure and between a semiconductor strip and a source/drain structure. The method M1 includes a relevant part of the entire manufacturing process. It is understood that additional operations may be provided before, during, and after the operations shown by FIGS. 2A and 2B, and some of the operations described below can be replaced or eliminated for additional embodiments of the method. The order of the operations/processes may be interchangeable. It is noted that FIGS. 2A and 2B have been simplified for a better understanding of the disclosed embodiment. Moreover, the semiconductor device may be configured as a system-on-chip (SoC) device having various PMOS and NMOS transistors that are fabricated to operate at different voltage levels.

FIGS. 3A to 25C illustrate a method in various stages of fabricating the semiconductor device in accordance with some embodiments of the present disclosure. FIGS. 3A-25A are cross-sectional views along line A1-A1 in FIG. 1A. FIGS. 3B-25B are cross-sectional views along line B1-B1 in FIG. 1A. FIGS. 3C-25C are cross-sectional views along line C1-C1 in FIG. 1A. It is understood that the semiconductor device in FIGS. 3A to 25C may also include resistors, capacitors, inductors, diodes, and other suitable microelectronic devices that may be implemented in integrated circuits. The fabrication of the semiconductor device is merely example for describing the semiconductor device with an isolation layer that is interposed between a semiconductor strip and a gate structure and between a semiconductor strip and a source/drain structure with some embodiments of the present disclosure.

Figure 3A:
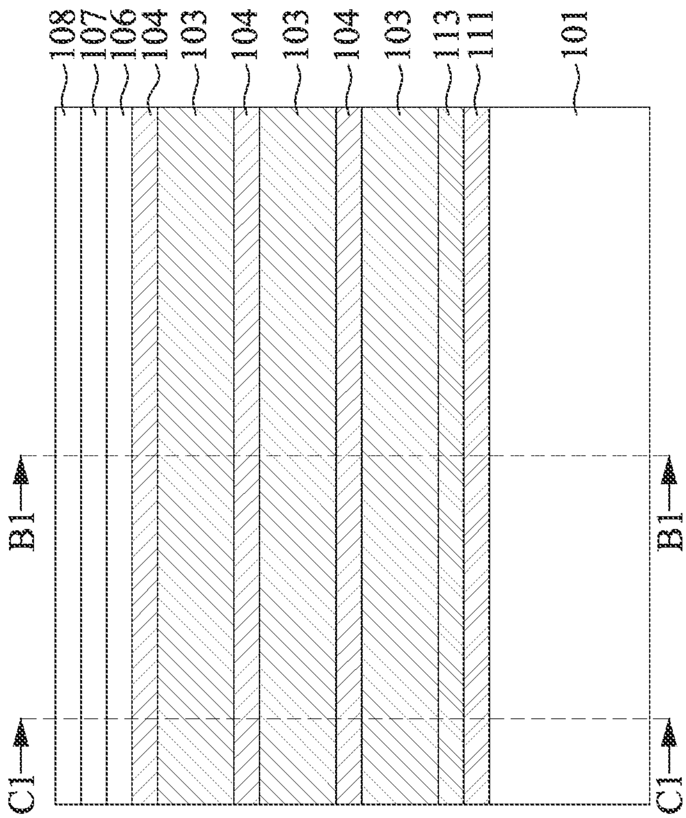
FIGS. 3A to 25C illustrate a method in various stages of fabricating the semiconductor device in accordance with some embodiments of the present disclosure.
Figure 3C:
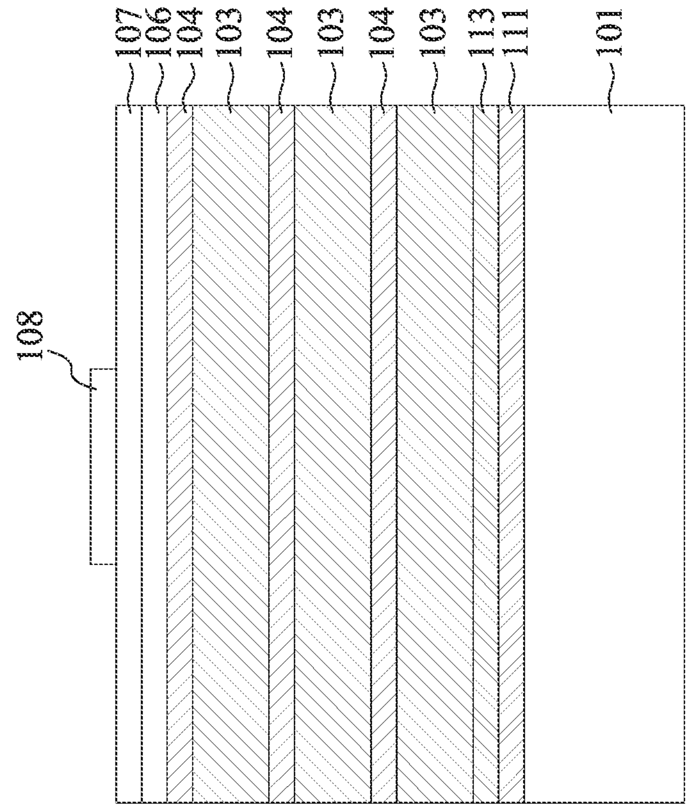
Figure 3B:
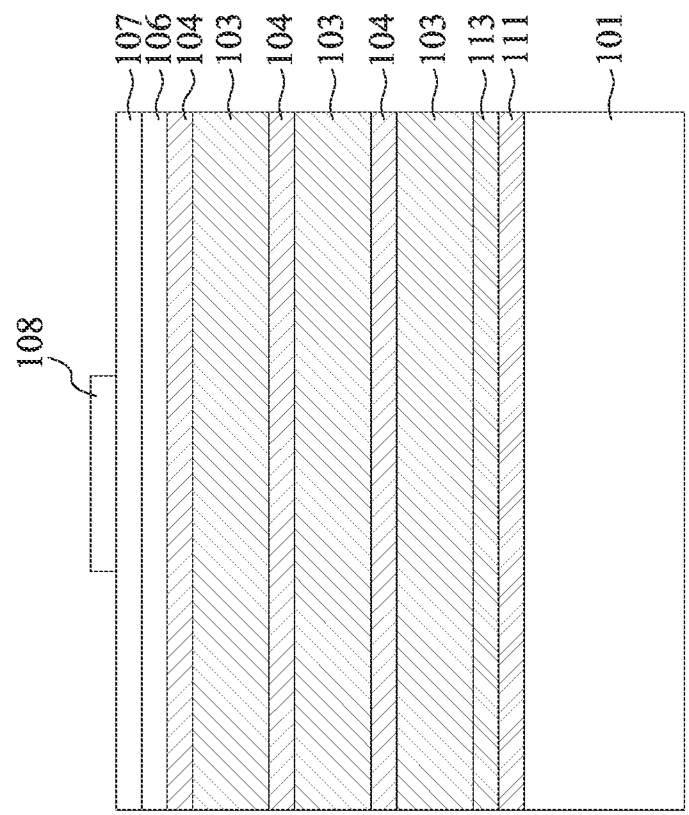

The method M1 begins at block S101 where a pad layer, a mask layer and a photoresist layer are formed in sequence over a plurality of channel layers, a plurality of semiconductor layers, and lower and upper sacrificial layers on a substrate, as illustrated in FIGS. 3A to 3C.

Shown there is a substrate 101. In some embodiments, the substrate 101 is a semiconductor substrate, such as a bulk semiconductor, a semiconductor-on-insulator (SOI) substrate, or the like. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 101 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Referring to FIGS. 3A to 3C, in some embodiments of block S101, a sacrificial layer 111 and a sacrificial layer 113 are deposited over the substrate 101 and a plurality of semiconductor layers 103 and a plurality of channel layers 104 are alternately deposited over the sacrificial layer 113.

In some embodiments, the sacrificial layer 111, the sacrificial layer 113, and the semiconductor layers 103 have the same material and/or components, but ratios of the material components thereof are different from each other, such that the sacrificial layer 111, the sacrificial layer 113, and the semiconductor layers 103 have different etching rates during an etching process.

For example, the sacrificial layer 111, the sacrificial layer 113, and the semiconductor layer 103 are made from SiGe. The sacrificial layer 113 has a different germanium atomic percentage concentration than the sacrificial layer 111 and the semiconductor layer 103. In some embodiments, the sacrificial layer 113 has a lower germanium atomic percentage concentration than the sacrificial layer 111 and the semiconductor layer 103. In FIGS. 3A to 3C, the germanium percentage (atomic percentage concentration) of the sacrificial layer 111 is in the range between about 40 percent and about 80 percent, e.g., about 60 percent, while higher or lower germanium percentages may be used, the proportion between Si and Ge may vary from embodiments, and the disclosure is not limited thereto. The germanium percentage (atomic percentage concentration) of the sacrificial layer 113 is in the range between about 5 percent and about 40 percent, e.g., about 15 percent, while higher or lower germanium percentages may be used, the proportion between Si and Ge may vary from embodiments, and the disclosure is not limited thereto. The germanium percentage (atomic percentage concentration) of the semiconductor layer 103 is in the range between about 10 percent and about 50 percent, e.g., about 30 percent, while higher or lower germanium percentages may be used, the proportion between Si and Ge may vary from embodiments, and the disclosure is not limited thereto. In some embodiments, the sacrificial layer 113 has a higher germanium atomic percentage concentration than the sacrificial layer 111 and the semiconductor layer 103.

In some embodiments, adjacent two of the sacrificial layer 111, the sacrificial layer 113, and the semiconductor layers 103 have different material and/or components, such that the sacrificial layer 111, the sacrificial layer 113, and the semiconductor layers 103 have different etching rates during an etching process. For example, the sacrificial layer 113 may be made from SiGe, and the lowermost one of the semiconductor layer 103 may be a pure silicon layer.

In some embodiments, the sacrificial layer 111 has a thicker thickness than the sacrificial layer 113. For example, the sacrificial layer 111 has a thickness in a range from about 2 nm to about 50 nm, e.g., 10, 20, 30, 40, 50 nm. The sacrificial layer 113 has a thickness in a range from about 2 nm to about 50 nm, e.g., 10, 20, 30, 40, 50 nm. In some embodiments, the sacrificial layer 111 may have a thickness substantially the same as or comparable to the sacrificial layer 113. In some embodiments, the sacrificial layer 111 has a thinner thickness than the sacrificial layer 113.

In some embodiments, the channel layers 104 has different materials and/or components than the semiconductor layers 103, such that the semiconductor layers 103 and the channel layers 104 have different etching rates. The channel layers 104 may be pure silicon layers that are free from germanium. The channel layers 104 may also be substantially pure silicon layers, for example, with a germanium percentage lower than about 1 percent, such that the semiconductor layers 103 have a higher germanium atomic percentage concentration than the channel layers 104. For example, the germanium percentage (atomic percentage concentration) of the semiconductor layer 103 is in the range between about 10 percent and about 50 percent, e.g., 30 percent, while higher or lower germanium percentages may be used, the proportion between Si and Ge may vary from embodiments, and the disclosure is not limited thereto.

In some embodiments, the channel layer 104 may have a thickness in a range from about 3 nm to about 100 nm, by way of example but not limitation. The channel layer 104 may have a width in a range from about 3 nm to about 200 nm along a lengthwise direction of the gate structure 160 as shown in FIG. 1A, by way of example but not limitation. In some embodiments, the channel layer 104 may have a circular cross section, square cross section, rectangular cross section, diamond cross section, V or A-shaped cross section, other suitable cross sections. A pitch between the channel layers 104 is determined by the thickness of the semiconductor layer 103. In some embodiments, the pitch of the channel layers 104 is measured in a range from about 5 nm to about 30 nm, by way of example but not limitation.

The sacrificial layers 111 and 113, the semiconductor layers 103, and the channel layers 104 may be formed by chemical vapor deposition (CVD), molecular beam epitaxy (MBE), or other suitable process(es). In some embodiments, the sacrificial layers 111 and 113 and the semiconductor layers 103, and the channel layers 104 are formed by an epitaxy growth process, and thus the sacrificial layers 111 and 113 and the semiconductor layers 103, and the channel layers 104 can also be referred to as epitaxial layers in this content. In some embodiments, a ground plane doping process may be performed on the channel layers 104 (e.g., an n-doping process for pFET device, and a p-doping process for nFET device). For example, the grown materials may be in-situ doped during growth, which may obviate prior implanting of the channel layers 104 although in-situ and implantation doping may be used together. In some embodiments, the semiconductor layers 103 and the channel layers 104 may include silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, or the like.

Referring to FIGS. 3A to 3C, the substrate 101 undergoes a series of deposition and photolithography processes, such that a pad layer 106, a mask layer 107 and a patterned photoresist layer 108 are formed on the semiconductor layers 103 and the channel layers 104. In greater detail, the pad layer 106 is deposited over the topmost channel layers 104, and the mask layer 107 is deposited over the pad layer 106. The pad layer 106 may be a thin film having silicon oxide formed, for example, using a thermal oxidation operation. The pad layer 106 may act as an adhesion layer between the channel layer 104 and the mask layer 107. In some embodiments, the mask layer 107 is formed of silicon nitride, for example, using low-pressure chemical vapor deposition (LPCVD) or plasma enhanced chemical vapor deposition (PECVD). The mask layer 107 is used as a hard mask during subsequent patterning operations. A photoresist layer 108 is formed on the mask layer 107 and is then patterned, forming openings in the photoresist layer 108, so that regions of the mask layer 107 are exposed.

Figure 4A:
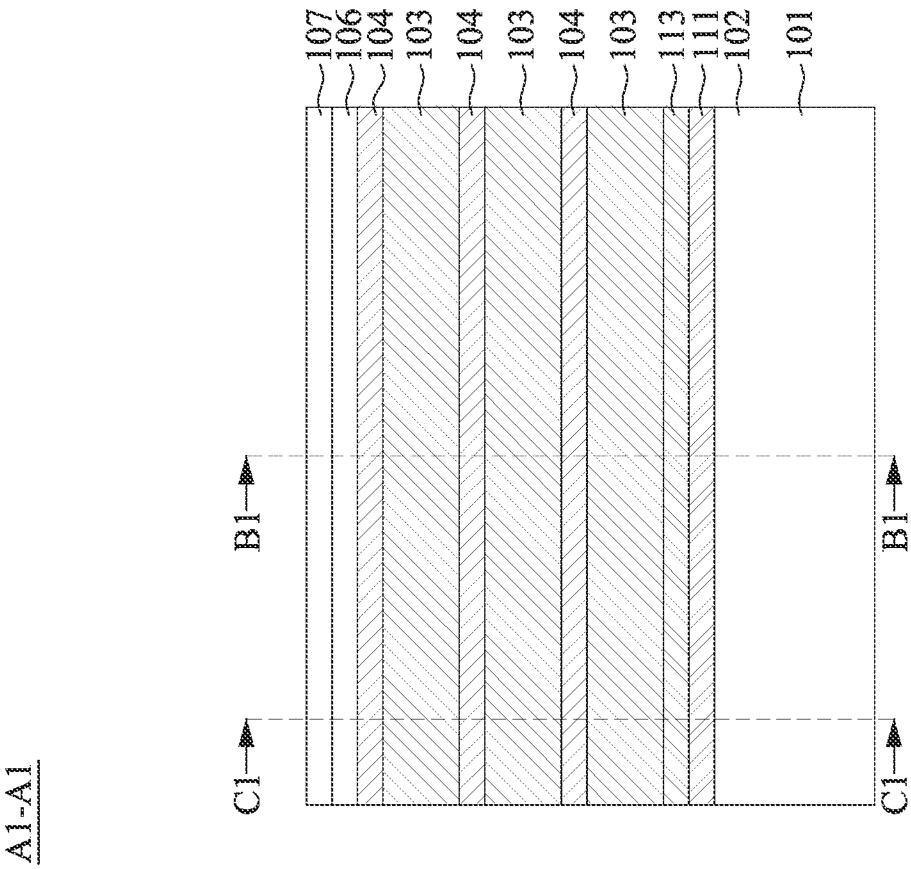
Figure 4C:
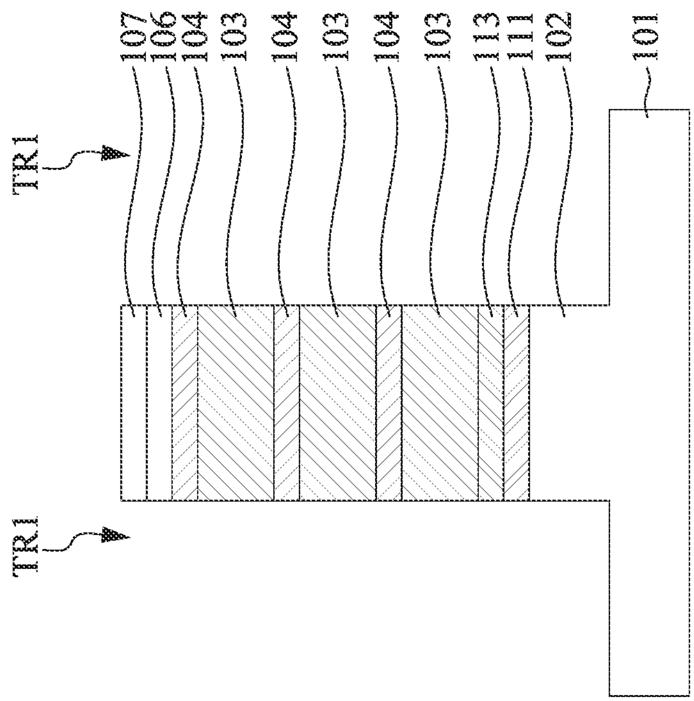
Figure 4B:
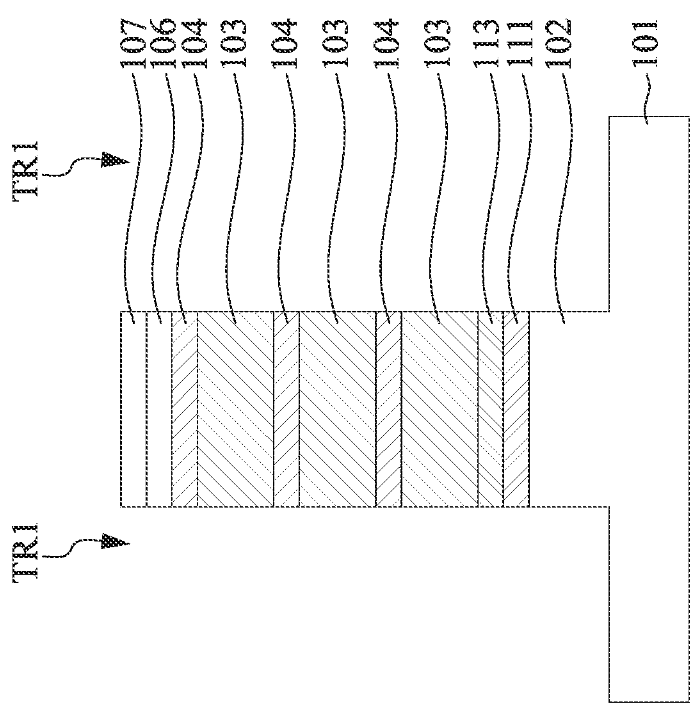

Returning to FIG. 2A, the method M1 then proceeds to block S102 where the channel layers, the semiconductor layers, and the lower and upper sacrificial layers are patterned through the mask layer and the photoresist layer to form trenches. With reference to FIGS. 4A to 4C, in some embodiments of block S102, the semiconductor layers 103, the channel layers 104, and the sacrificial layers 111 and 113 may be patterned using suitable processes including photolithography and etch processes. For example, the mask layer 107 and pad layer 106 are etched through the photoresist layer 108 and exposing underlying channel layer 104. The semiconductor layers 103, the channel layers 104, the sacrificial layers 111 and 113, and the substrate 101 are then etched, forming trenches TR1. A portion of the substrate 110 between neighboring trenches TR1 can be referred to as a semiconductor strip 102 in the following discussion. In some embodiments, the semiconductor strip 102 can also be referred to as a fin structure. After etching the semiconductor layers 103, the channel layers 104, the sacrificial layers 111 and 113, and the substrate 101 is complete, the photoresist layer 108 is removed. Next, a cleaning step may be optionally performed to remove a native oxide of the semiconductor substrate 101. The cleaning may be performed using diluted hydrofluoric (HF) acid, for example.

Figure 5A:
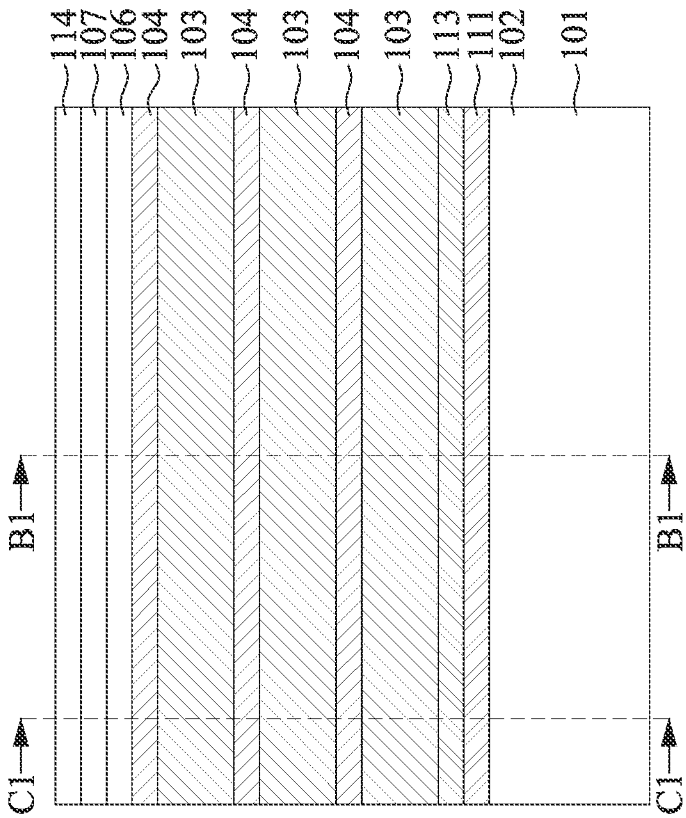
Figure 5C:
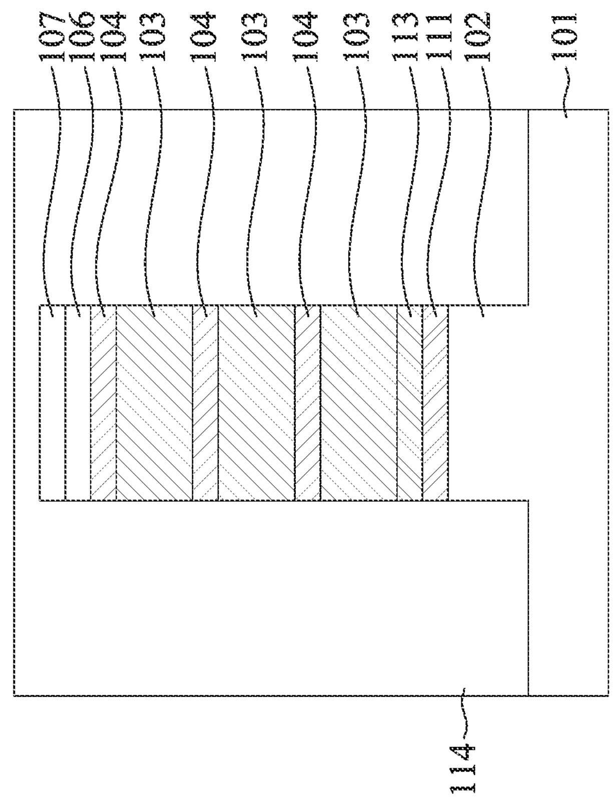
Figure 5B:
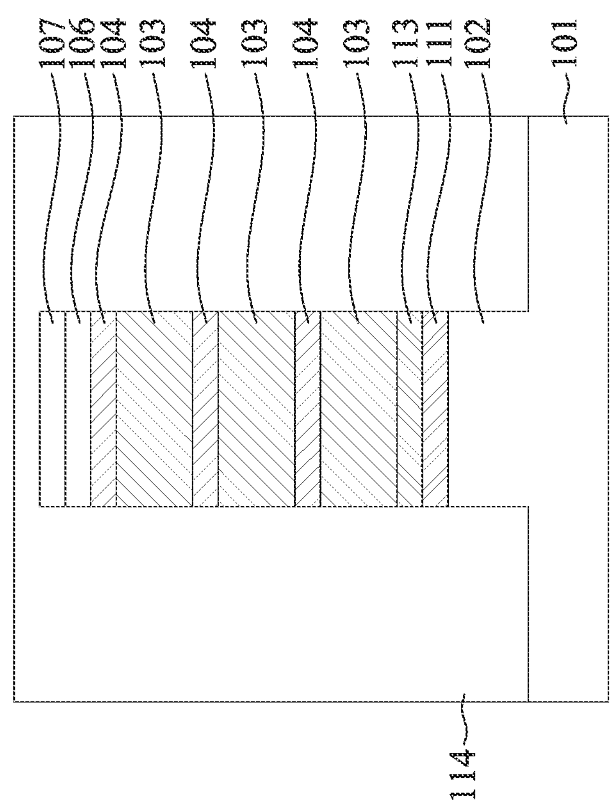

Returning to FIG. 2A, the method M1 then proceeds to block S103 where an isolation dielectric is formed to cover the channel layers, the semiconductor layers, and the lower and upper sacrificial layers. With reference to FIGS. 5A to 5C, in some embodiments of block S103, an isolation dielectric 114 is formed to overfill the trenches TR1 and cover the mask layer 107. The isolation dielectric 114 in the trenches TR1 can be referred to as a shallow trench isolation (STI) structure. In some embodiments, the isolation dielectric 114 is made of silicon oxide, silicon nitride, silicon oxynitride, SiOC, fluoride-doped silicate glass (FSG), or other low-K dielectric materials. In some embodiments, the isolation dielectric 114 may be formed using a high-density-plasma (HDP) chemical vapor deposition (CVD) process, using silane ($SiH_4$) and oxygen ($O_2$) as reacting precursors. In some other embodiments, the isolation dielectric 114 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 114 may be formed using a spin-on-dielectric (SOD) process, such as hydrogen silsesquioxane (HSQ) or methyl silsesquioxane (MSQ). Other processes and materials may be used. In some embodiments, the isolation dielectric 114 can have a multilayer structure, for example, a thermal oxide liner layer with silicon nitride formed over the liner. Thereafter, a thermal annealing may be optionally performed to the isolation dielectric 114.

Figure 6A:
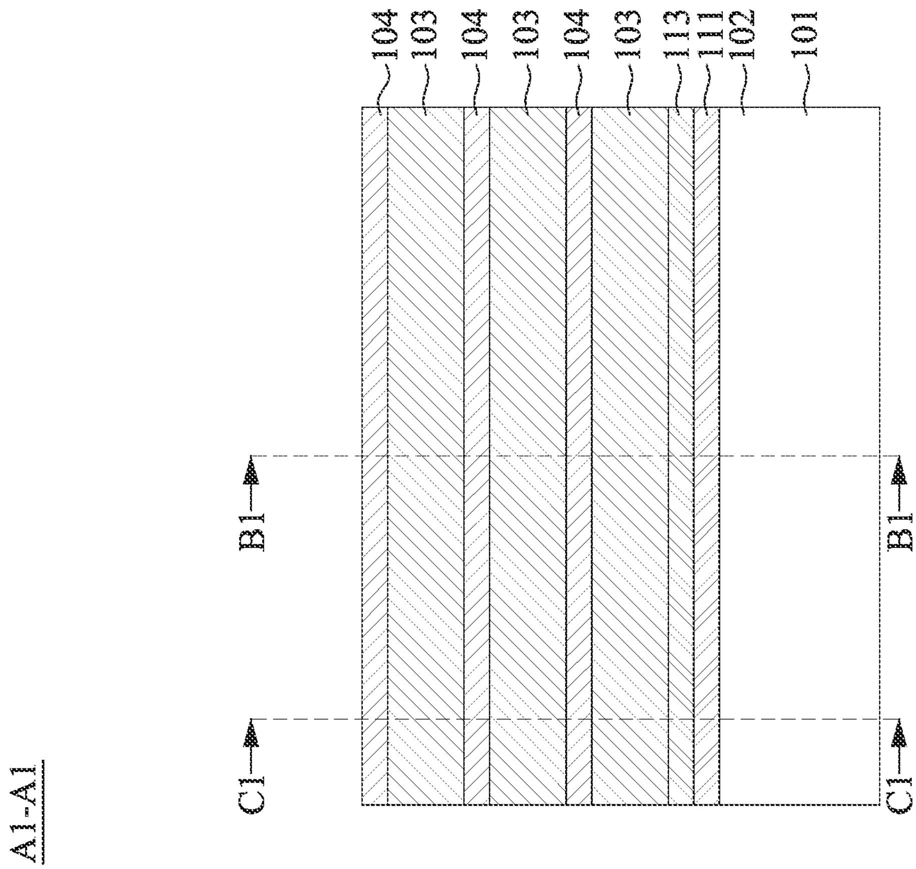
Figure 6C:
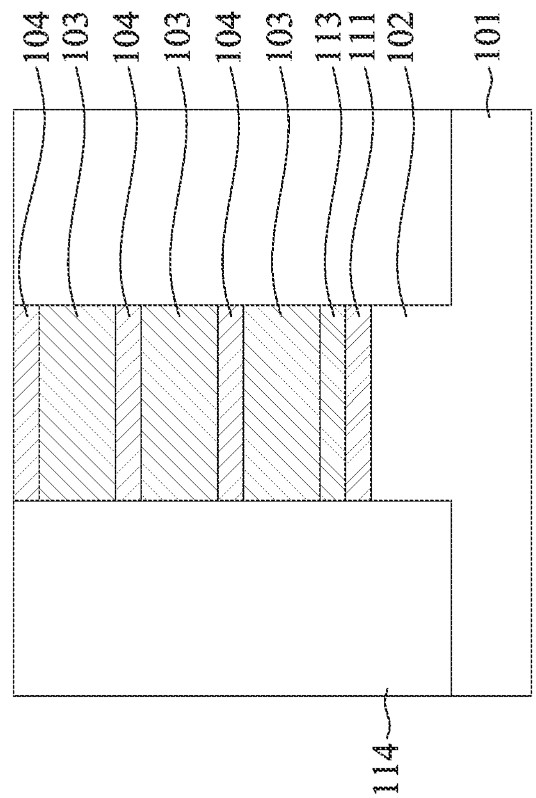
Figure 6B:
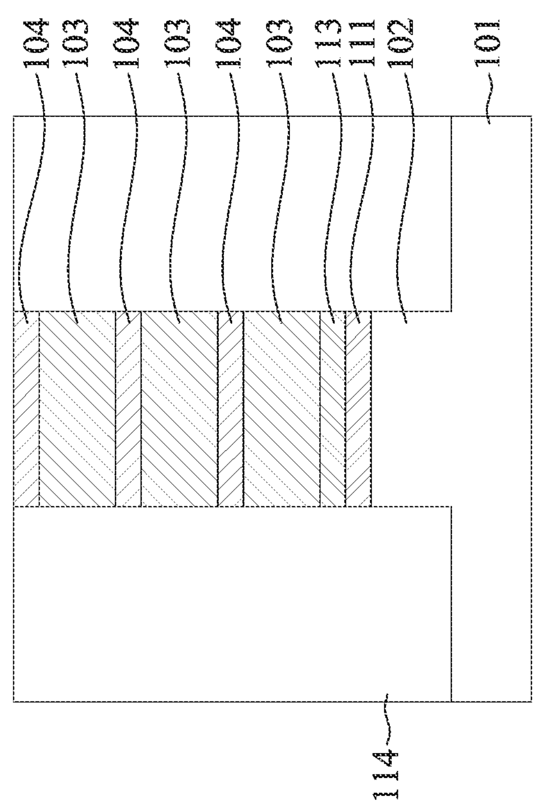

Returning to FIG. 2A, the method M1 then proceeds to block S104 where a planarization process is performed on the isolation dielectric to expose the upper channel layer. With reference to FIGS. 6A to 6C, in some embodiments of block S104, a planarization process such as chemical mechanical polish (CMP) is performed to remove the excess isolation dielectric 114 over the channel layer 104. In some embodiments, the planarization process may also remove the mask layer 107 and the pad layer 106 such that a top surface of the channel layer 104 is exposed. In some other embodiments, the planarization process stops when the mask layer 107 is exposed. In such embodiments, the mask layer 107 may act as the CMP stop layer in the planarization. If the mask layer 107 and the pad layer 106 are not removed by the planarization process, the mask layer 107, if formed of silicon nitride, may be remove by a wet process using hot $H_3PO_4$, and the pad layer 106, if formed of silicon oxide, may be removed using diluted HF.

Figure 7A:
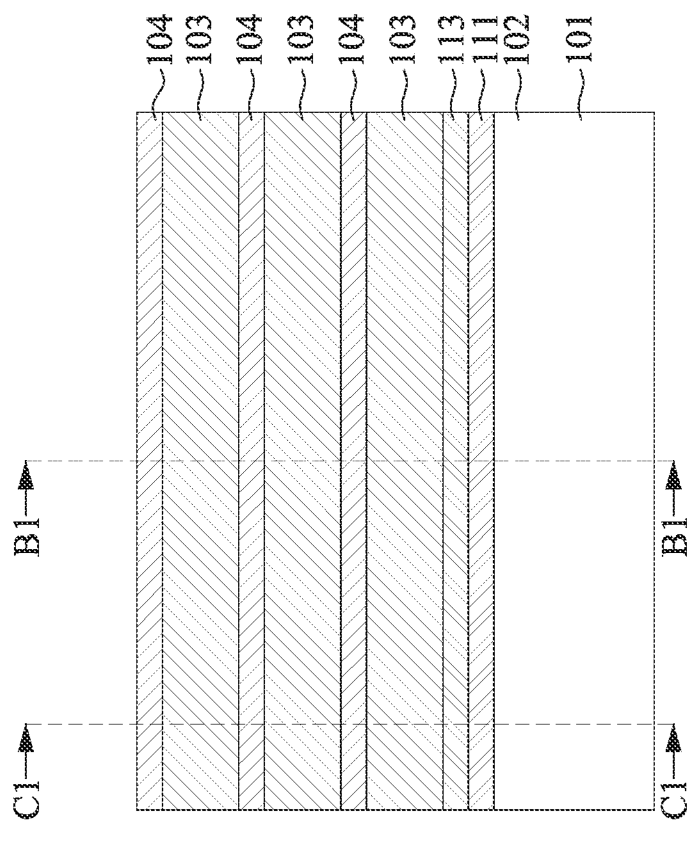
Figure 7B:
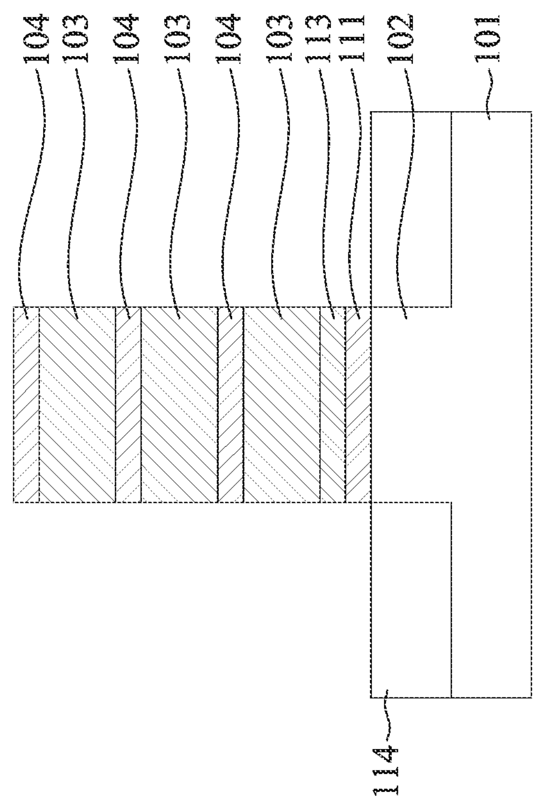
Figure 7C:
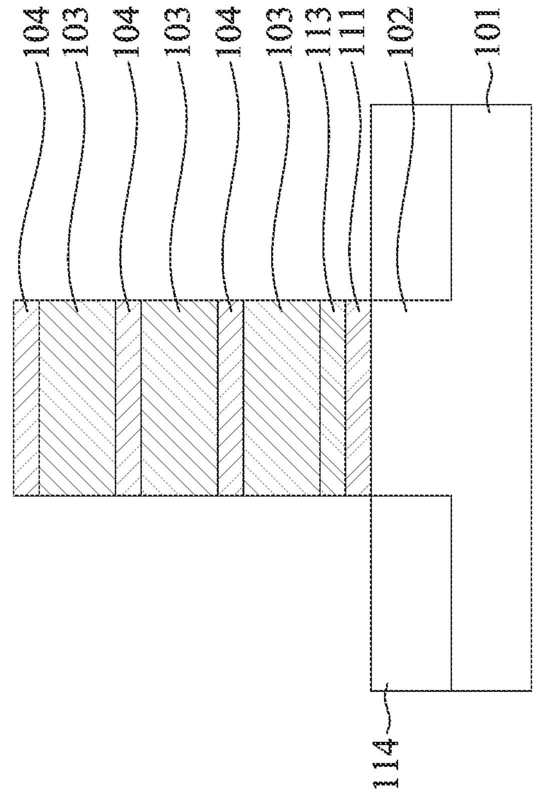

Returning to FIG. 2A, the method M1 then proceeds to block S105 where the isolation dielectric is recessed. With reference to FIGS. 7A to 7C, in some embodiments of block S105, the isolation dielectric 114 is recessed, for example, through an etching operation, in which diluted HF, SiCoNi (including HF and $NH_3$), or the like, may be used as the etchant and may be referred to as a shallow trench isolation (STI) structure. After recessing the isolation dielectric 114, the semiconductor strip 102 has a top surface in a level substantially the same as a top surface of the isolation dielectric 114. The semiconductor layers 103, the channel layers 104, and the sacrificial layers 111 and 113 are exposed above the isolation dielectric 114. In some embodiments, a portion of the semiconductor strip 102 is higher than a top surface of the isolation dielectric 114.

Figure 8A:
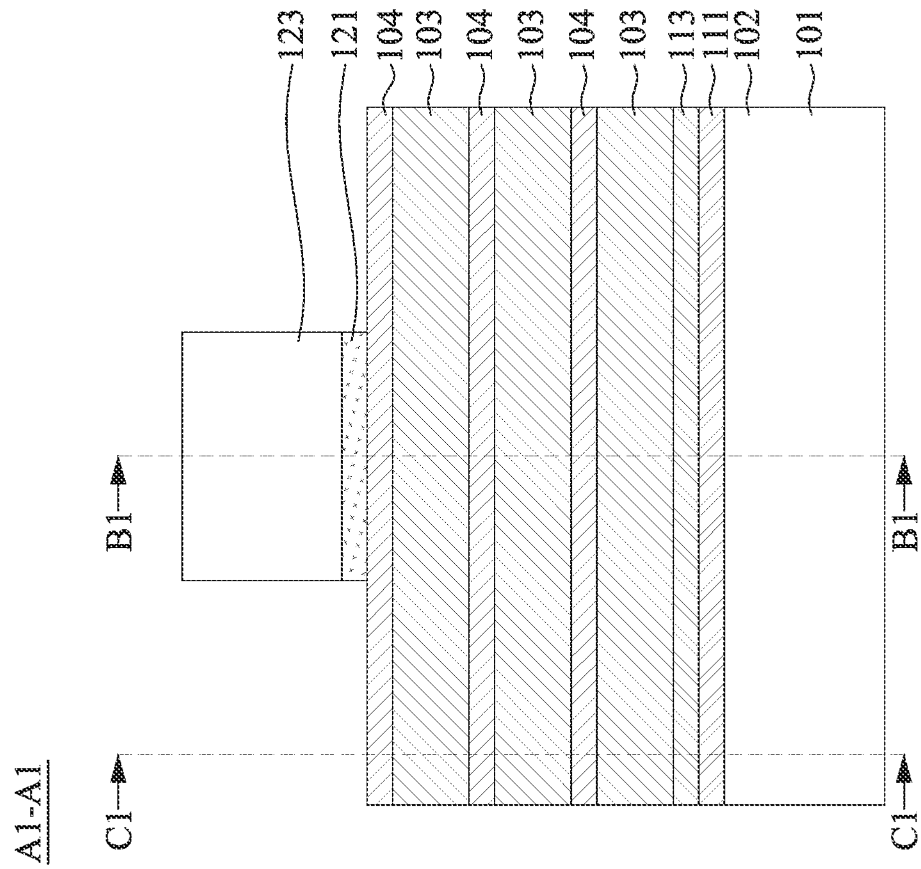
Figure 8C:
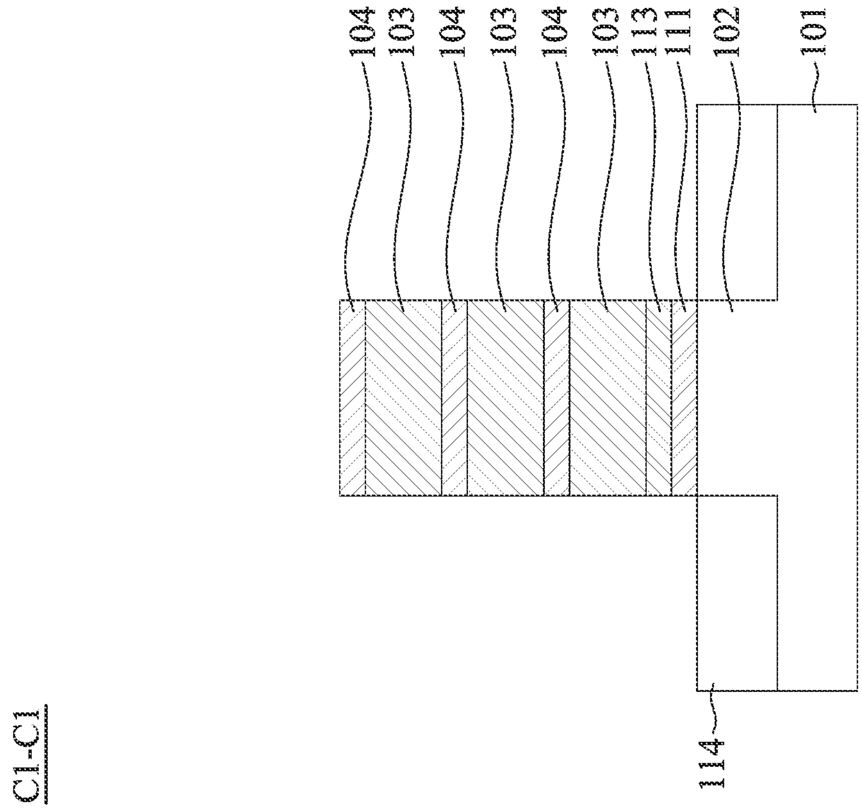
Figure 8B:
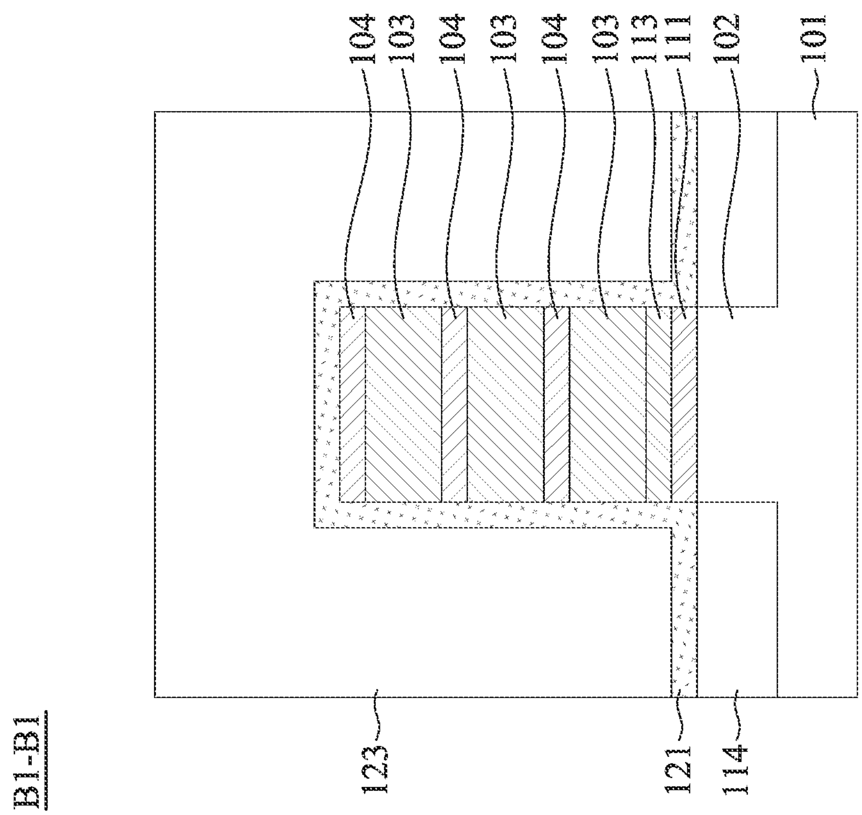

Returning to FIG. 2A, the method M1 then proceeds to block S106 where a hard mask layer and a dummy gate structure are formed in sequence to transverse the channel layers, the semiconductor layers, and the lower and upper sacrificial layers. With reference to FIGS. 8A to 8C, in some embodiments of block S106, a hard mask layer 121 and a dummy gate structure 123 are formed across the semiconductor layers 103 and the channel layers 104 and disposed on the isolation dielectric 114. In greater detail, the hard mask layer 121 is below the dummy gate structure 123 and in contact with the semiconductor layers 103, the channel layers 104, and the isolation dielectric 114. In some embodiments, the hard mask layer 121 and the dummy gate structure 123 are deposited as a blanket layer and then patterned. That is, the semiconductor layers 103, the channel layers 104, and the sacrificial layers 111 and 113 go along a first direction and the hard mask layer 121 and the dummy gate structure 123 go along a second direction. The first and second directions are different, and may be substantially perpendicular to each other.

In some embodiments, the hard mask layer 121 has different material and/or components than the semiconductor layers 103, the channel layers 104, and the sacrificial layers 111 and 113, such that the hard mask layer 121 of has different etching rate than the semiconductor layers 103, the channel layers 104, and the sacrificial layers 111 and 113. For example, the hard mask layer 121 may be made of a carbon-containing material, such as SiOC or any other suitable materials, and the semiconductor layers 103, the channel layers 104, and the sacrificial layers 111 and 113 may be free from carbon. In some embodiments, the dummy gate structure 123 may be made of polysilicon and any other suitable materials.

Figure 9A:
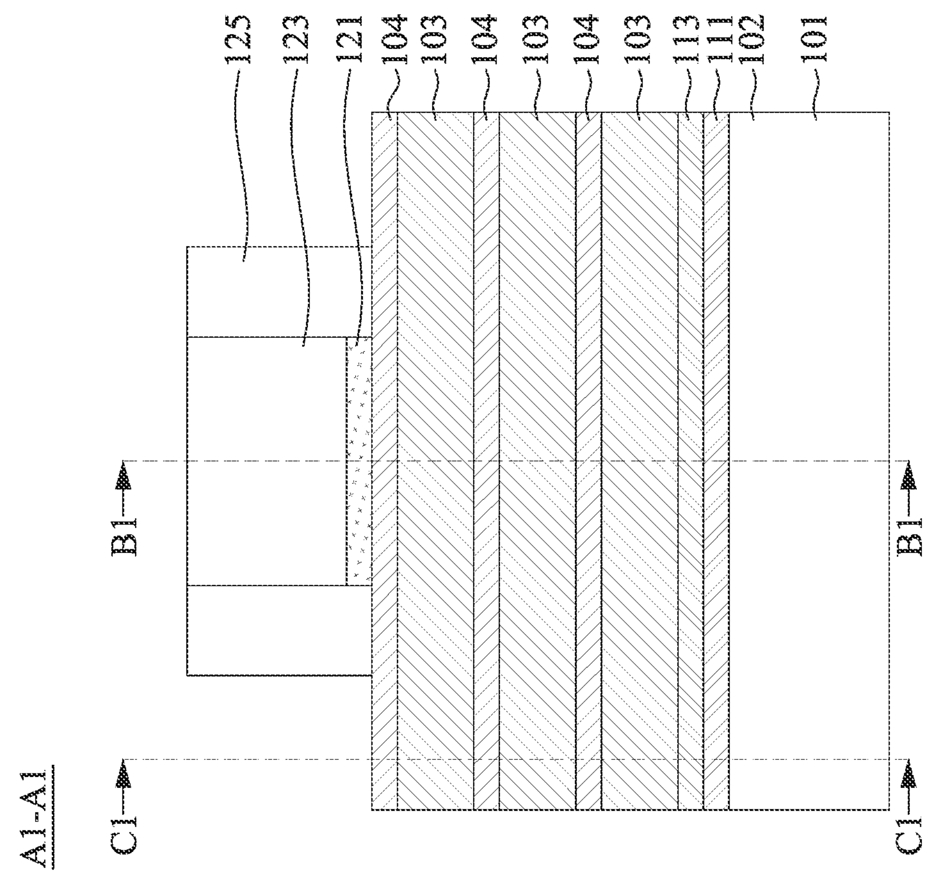
Figure 9C:
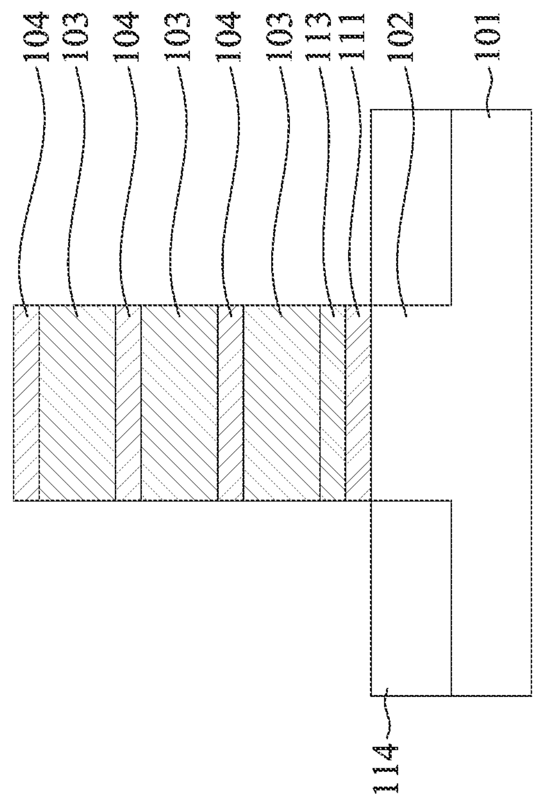
Figure 9B:
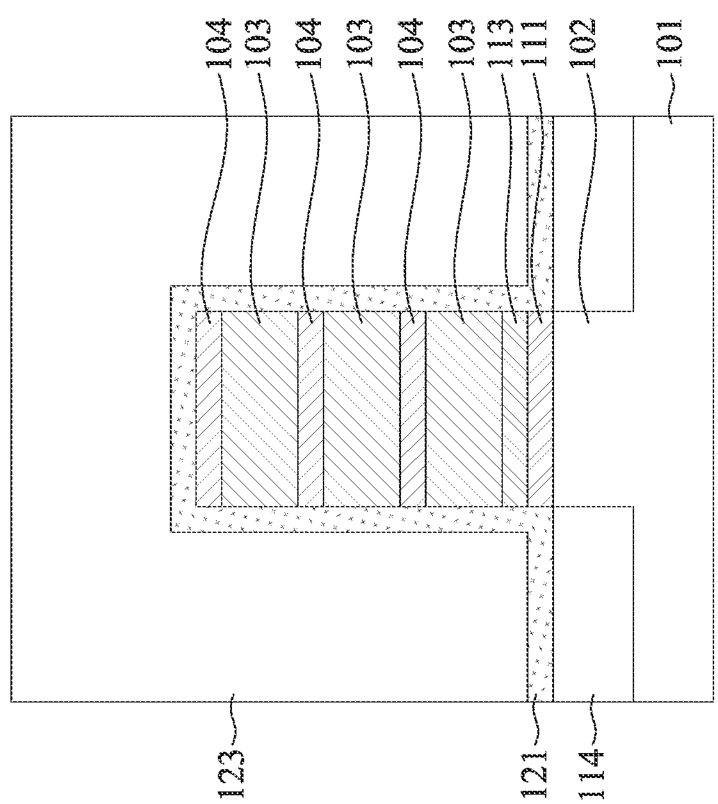

Returning to FIG. 2A, the method M1 then proceeds to block S107 where gate spacers are formed on opposite side walls of the hard mask layer and opposite side walls of the dummy gate structure. With reference to FIGS. 9A to 9C, in some embodiments of block S107, after the deposition of the hard mask layer 121 and the dummy gate structure 123 is complete, a spacer layer is deposited as a blanket layer, and is conformal formed over the hard mask layer 121, the dummy gate structure 123, the semiconductor layers 103, the channel layers 104, the sacrificial layers 111 and 113, and the isolation dielectric 114. The spacer layer may be made of a material, such as, oxide or nitride (e.g., $SiO_2$, SiN, $Si_3N_4$, $SiO_xN_y$, SiC, SiCN films, SiOC, SiOCN films, and/or combinations thereof), and the instant disclosure is not limited thereto. After the deposition of the spacer layer, an anisotropically etching is performed on the surface of the spacer layer to form gate spacers 125. Specifically, the etching process removes the spacer layer on the top portion of the dummy gate structures 123 and removes that on the semiconductor layers 103, the channel layers 104, and the sacrificial layers 111 and 113 exposed from the dummy gate structure 123. Then, the spacer layer is left on opposite side walls of the hard mask layer 121 and on opposite sidewalls of the dummy gate structure 123.

Figure 10A:
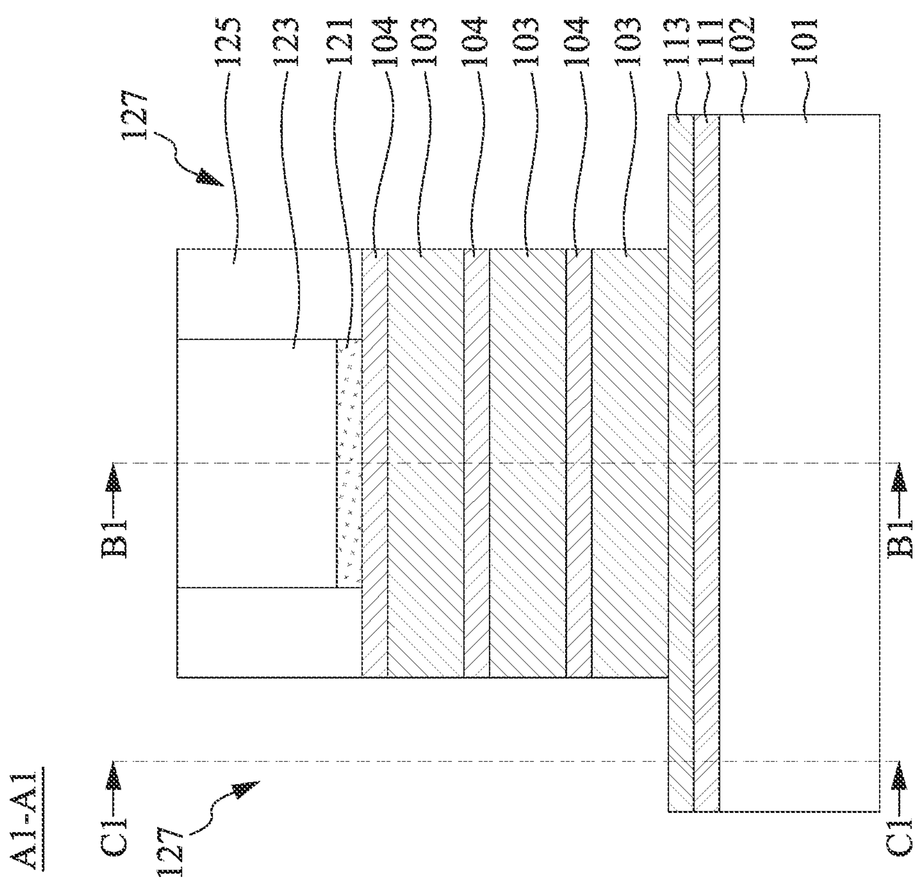
Figure 10C:
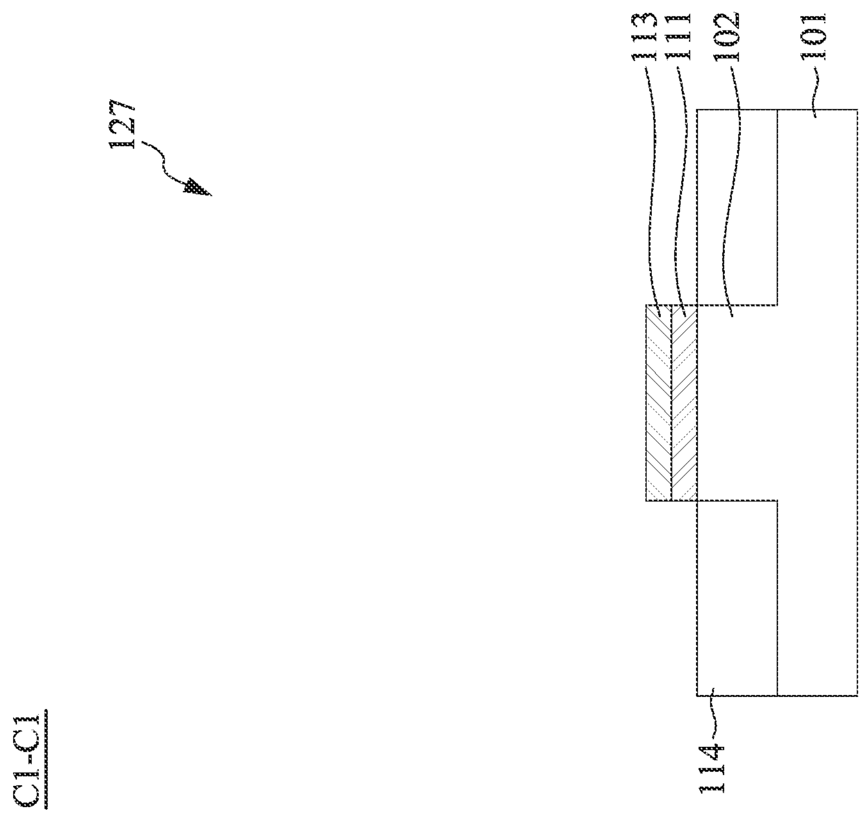
Figure 10B:
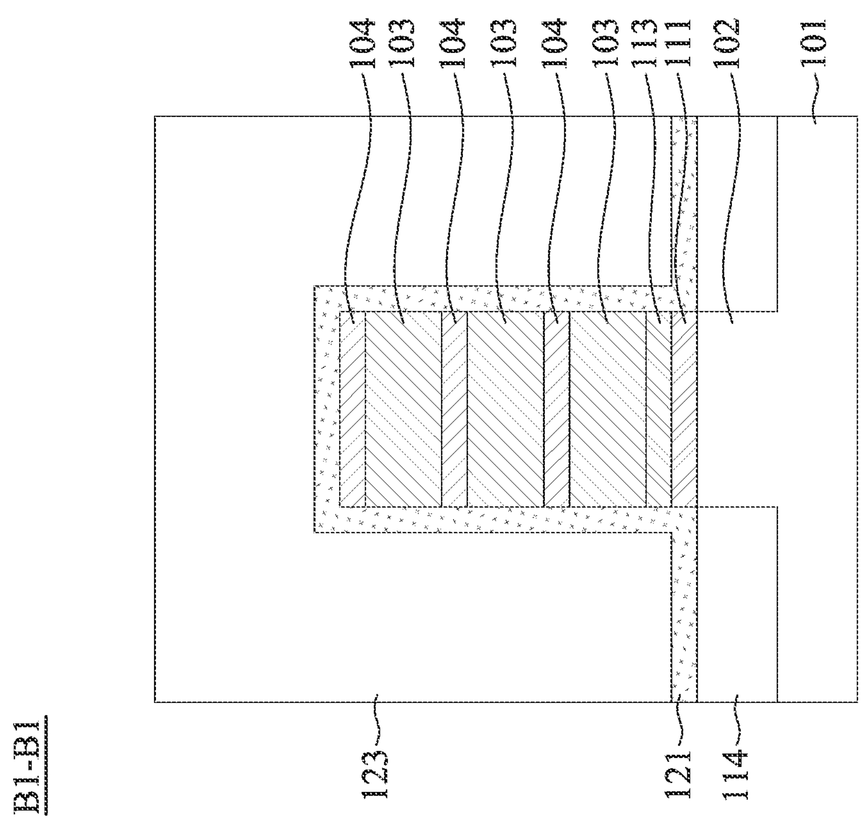

Returning to FIG. 2A, the method M1 then proceeds to block S108 where the channel layers and the semiconductor layers not overlapped by the gate spacers and the dummy gate structure are removed. With reference to FIGS. 10A to 10C, in some embodiments of block S108, an etch process may be performed on portions of the semiconductor layers 103 and the channel layers 104 (shown in FIGS. 9A to 9C) exposed from the dummy gate structure 123 and the gate spacers 125 (i.e., outside the dummy gate structure 123 and the gate spacers 125). As such, the exposed semiconductor layers 103 and the channel layers 104 are removed to expose the sacrificial layers 111 and 113 and the isolation dielectric 114. The recesses 127 are formed in the semiconductor layers 103 and the channel layers 104.

In some embodiments, the etching process is an anisotropic dry etching process (e.g., a reactive-ion etching process, RIE or atomic layer etching (ALE)). By way of example and not limitation, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $C_{12}$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 11A:
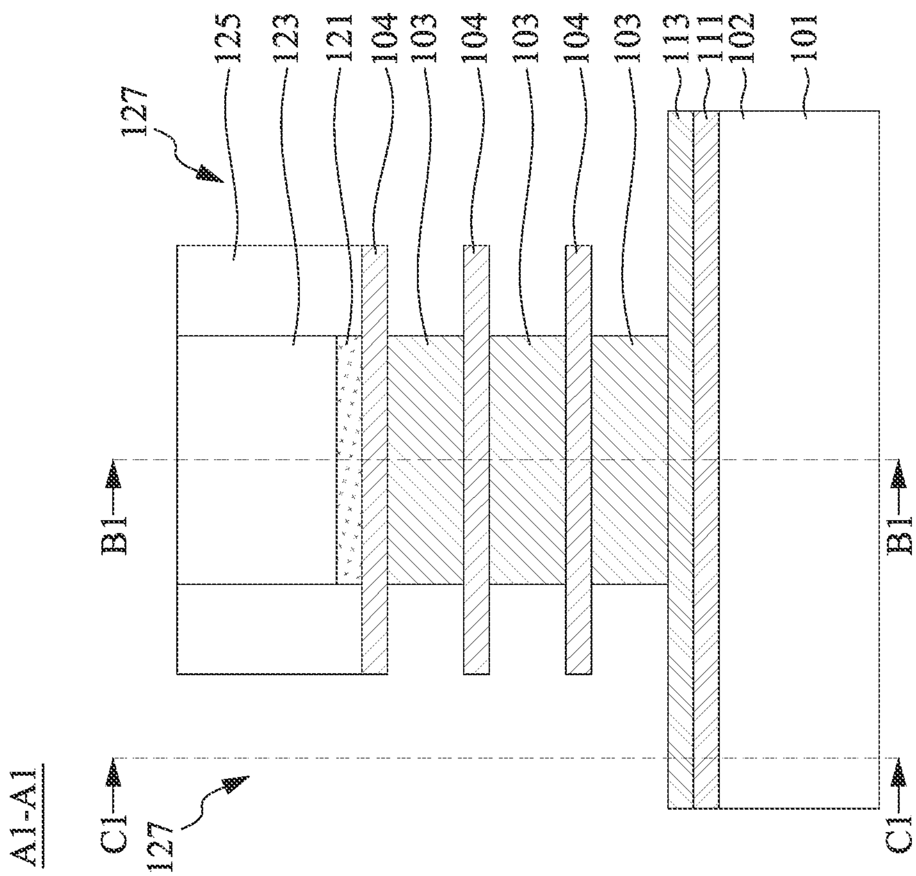
Figure 11C:
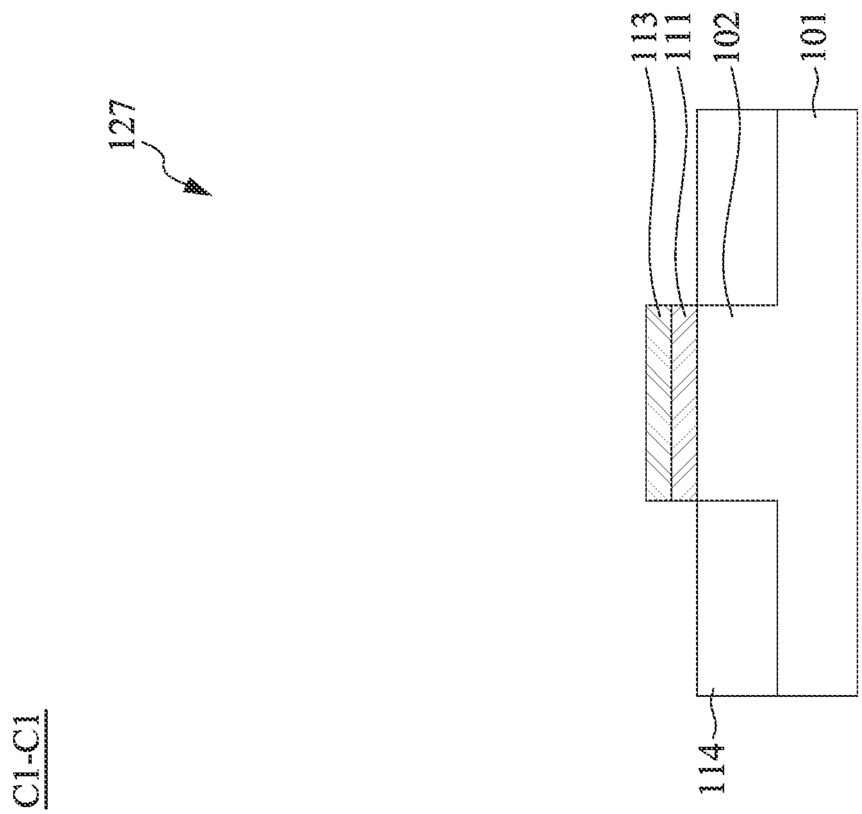
Figure 11B:
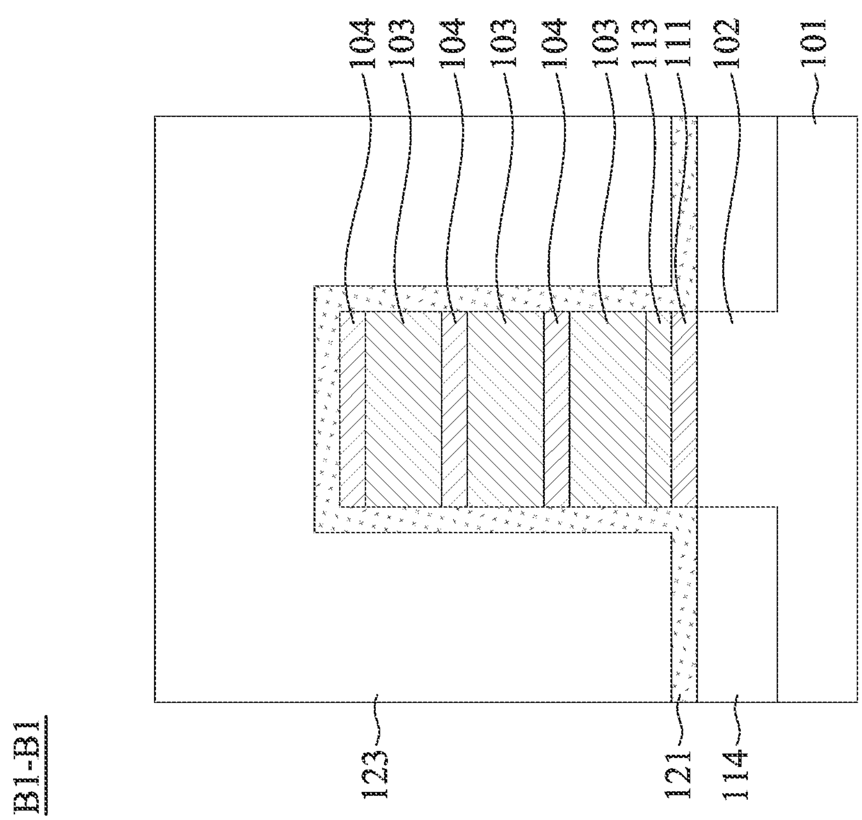

Returning to FIG. 2A, the method M1 then proceeds to block S109 where the semiconductor layers are laterally recessed relative to sidewalls of the channel layers to form recesses therein. With reference to FIGS. 11A to 11C, in some embodiments of block S109, an etch process is performed to laterally shorten the semiconductor layers 103 through the recesses 127, so as to form spaces adjacent to the channel layer 104. In some embodiments, the channel layers 104 remain substantially intact after removing the portions of the semiconductor layers 103 due to the nature of the anisotropic etching process that selectively etches the material of the semiconductor layers 103 at a faster etch rate than it etches the channel layers 104. The shortened length of the semiconductor layer 103 depends on process conditions of the anisotropic etching process (e.g., etching time duration and/or the like).

For example, the etch rate of the etching process to the semiconductor layer 103 may be greater than about 7 to about 300 times the etch rate of the etching process to the channel layer 104 in a case where the etching process is of a high temperature HCl gas etching process. The etch rate of the etching process to the semiconductor layer 103 may be greater than about 10 times the etch rate of the etching process to the channel layer 104 in a case where the etching process is of a $CF_4/O_2$ plasma etching process or a reactive-ion etching (RIE) process.

In some embodiments, the etching process is an anisotropic dry etching process (e.g., an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., HCl, $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 12A:
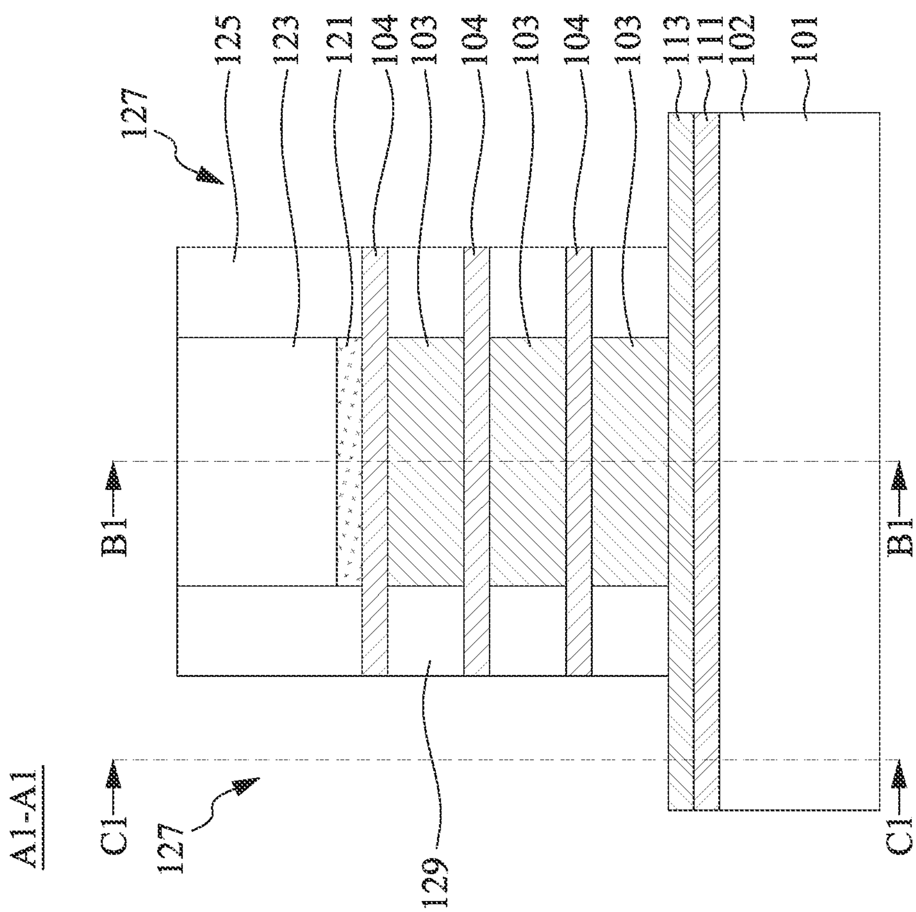
Figure 12B:
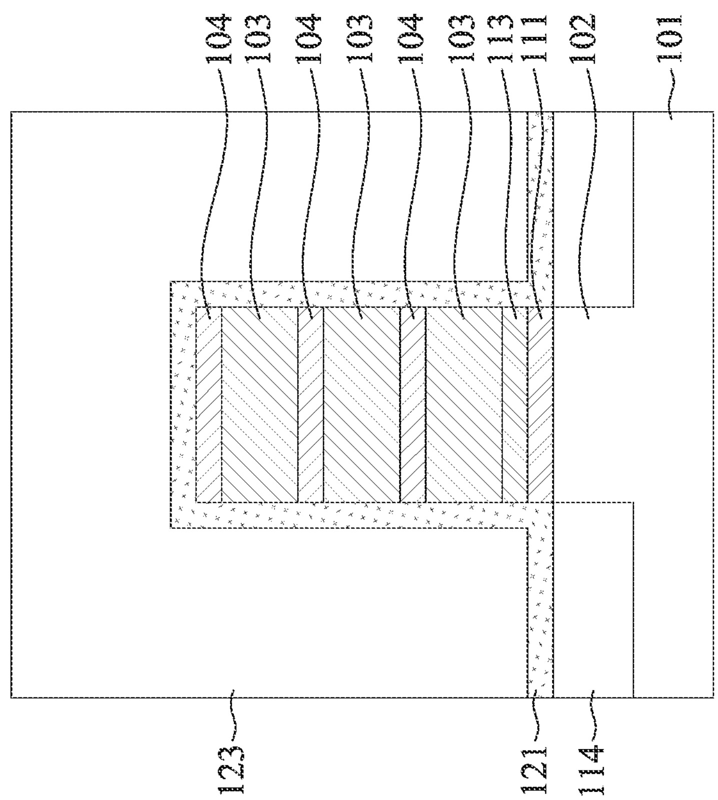
Figure 12C:
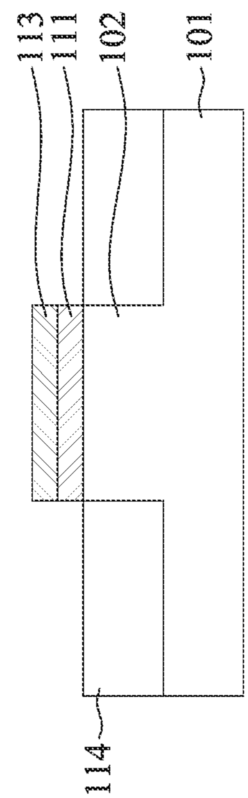

Returning to FIG. 2A, the method M1 then proceeds to block S110 where a plurality of inner spacers are formed in the recesses of the semiconductor layers by suitable deposition process. With reference to FIGS. 12A to 12C, in some embodiments of block S110, inner spacers 129 may be formed by depositing a spacer material blanket over the hard mask layer 121, the dummy gate structure 123, the semiconductor layers 103, the channel layers 104, the sacrificial layers 111 and 113, and the isolation dielectric 114 and followed by an etching process to remove portions of the spacer material, such that the remaining portions of the spacer material are left in the spaces between two adjacent channel layers 104 to form the inner spacers 129. In some embodiments, the inner spacers 129 may include $SiO_2$, $Si_3N_4$, $SiO_xN_y$, SiC, SiCN films, SiOC, SiOCN films, and/or combinations thereof.

In some embodiments, the channel layer 104 and the isolation dielectric 114 remain substantially intact after removing the portions of the spacer material due to the nature of the anisotropic etching process that selectively etches the spacer material at a faster etch rate than it etches the channel layer 104 and the isolation dielectric 114. For example, the etch rate of the etching process to the spacer material made of, such as $Si_3N_4$, may be greater than about 60 times the etch rate of the etching process to the isolation dielectric 114 made of, such as $SiO_2$, and greater than about 30 times the etch rate of the etching process to the channel layer 104 made of, such as Si, in a case where the etching process is of a reactive-ion etching (RIE) process and may implement an oxygen-containing gas (e.g., $O_2$), a nitrogen-containing gas (e.g., $N_2$), and/or a fluorine-containing gas (e.g., $CF_4$ and $NF_3$).

In some embodiments, the etching process is an anisotropic dry etching process (e.g., an atomic layer etching (ALE) process). By way of example and not limitation, a dry etching process may implement an oxygen-containing gas, a nitrogen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 13A:
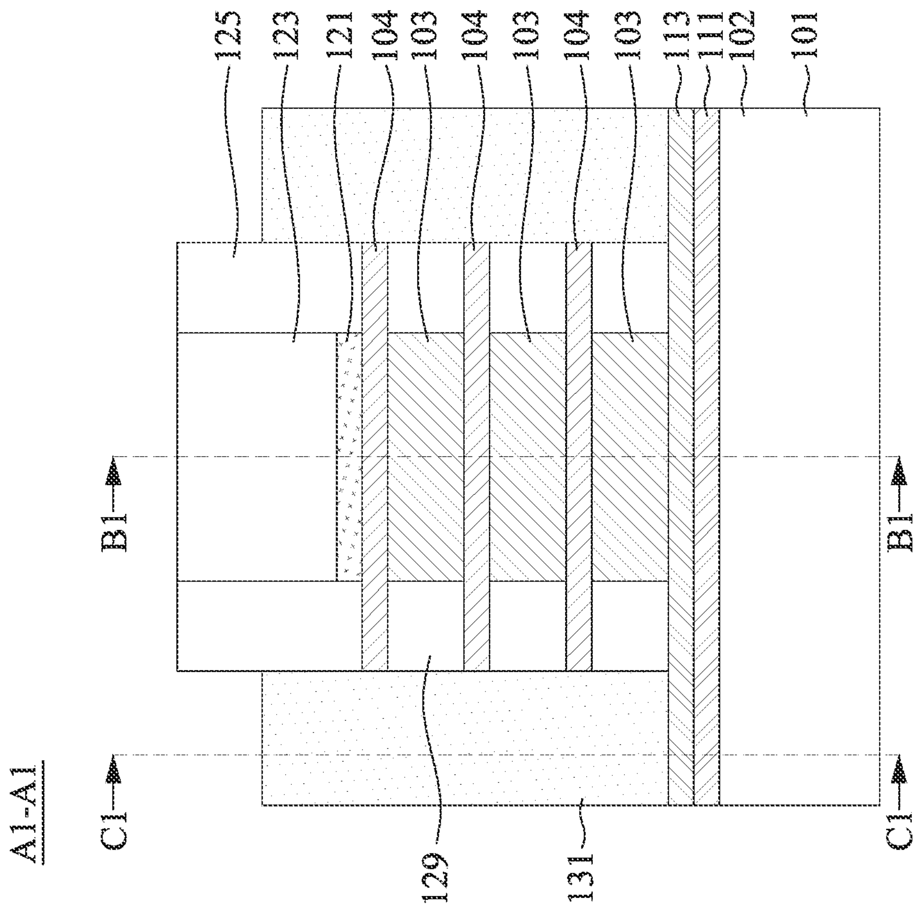
Figure 13C:
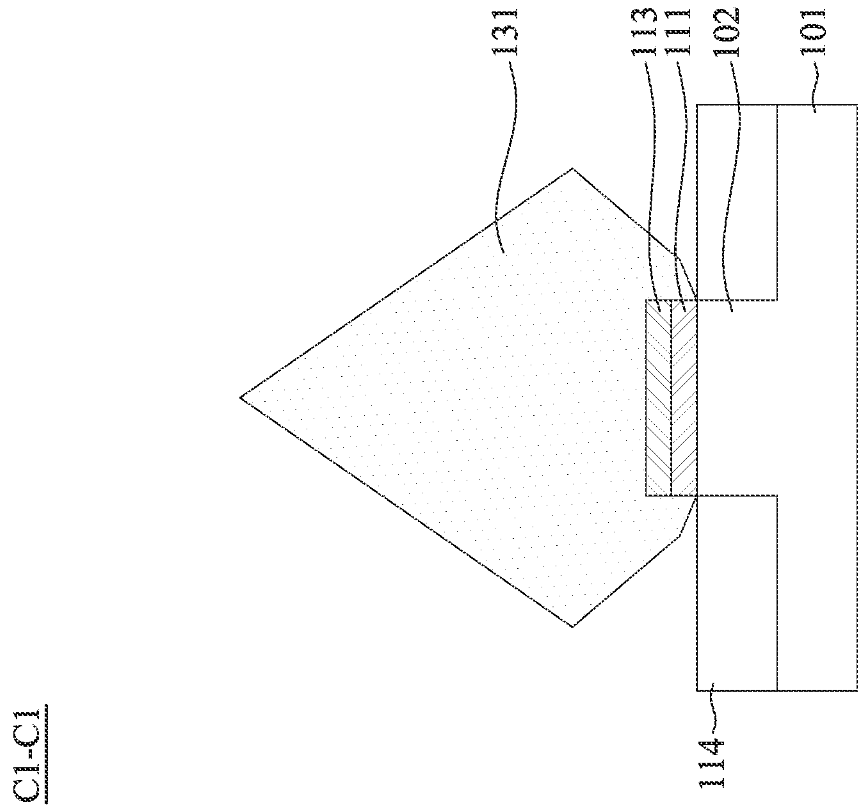
Figure 13B:
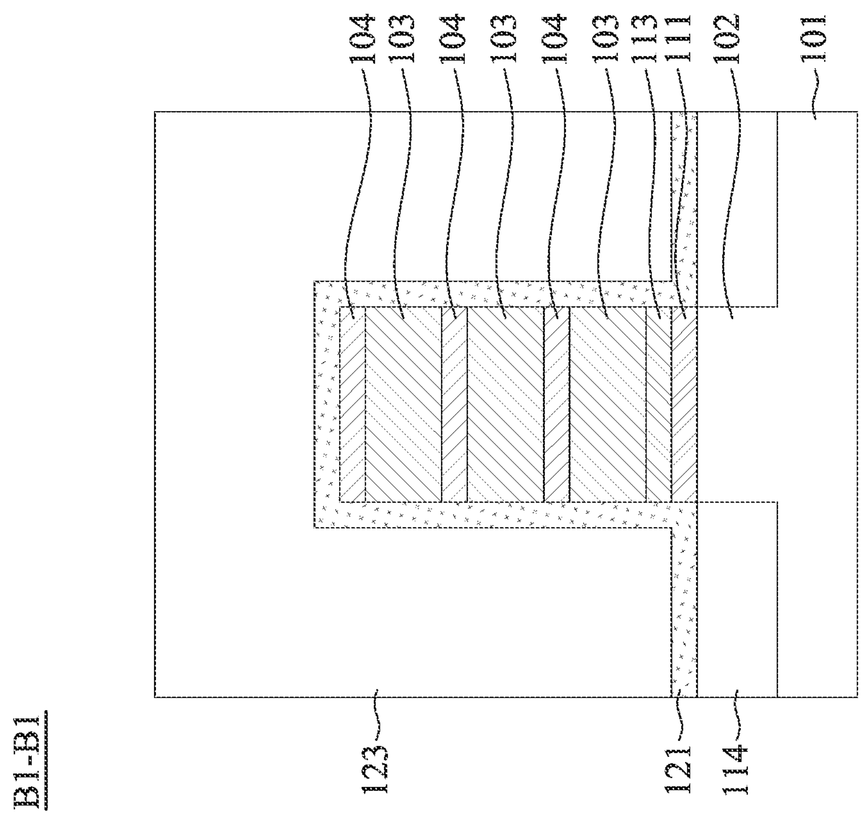

Returning to FIG. 2A, the method M1 then proceeds to block S111 where source/drain structures are formed adjacent to the channel layers. With reference to FIGS. 13A to 13C, in some embodiments of block S111, source/drain structures 131 are formed in the recesses 127 by, for example, an epitaxial growth process as source/drain structures. As such, the source/drain structures 131 are in contact with opposite ends of the channel layers 104. The epitaxial growth process is performed on the sacrificial layers 111 and 113. The source/drain structures 131 can also be interchangeably referred to as epitaxial structures. More specifically, the sacrificial layers 111 and 113 are embedded in (or being protruding into) the source/drain structures 131. In some embodiments, the source/drain structure 131 may be made of a material substantially the same as the sacrificial layers 111 and 113. For example, the source/drain structures 131 and the sacrificial layer 111 and the sacrificial layer 113 may be made from SiGe. In some embodiments, the source/drain structures 131 are made of a material different than the sacrificial layers 111 and 113.

In some embodiments, in situ doping (ISD) is applied to form doped source/drain structures 131. N-type and p-type FETs are formed by implanting different types of dopants to selected regions of the device to form the necessary junction (s). N-type devices may be formed by implanting arsenic (As) or phosphorous (P), and p-type devices may be formed by implanting boron (B). For example, the source/drain structures 131 may include materials such as SiP or SiGeB and any other suitable materials. The source/drain structures 131 may be formed conformally by CVD, or by monolayer doping (MLD). Alternatively, the source/drain structures 131 may be formed by an implantation with activation anneal step.

Figure 14A:
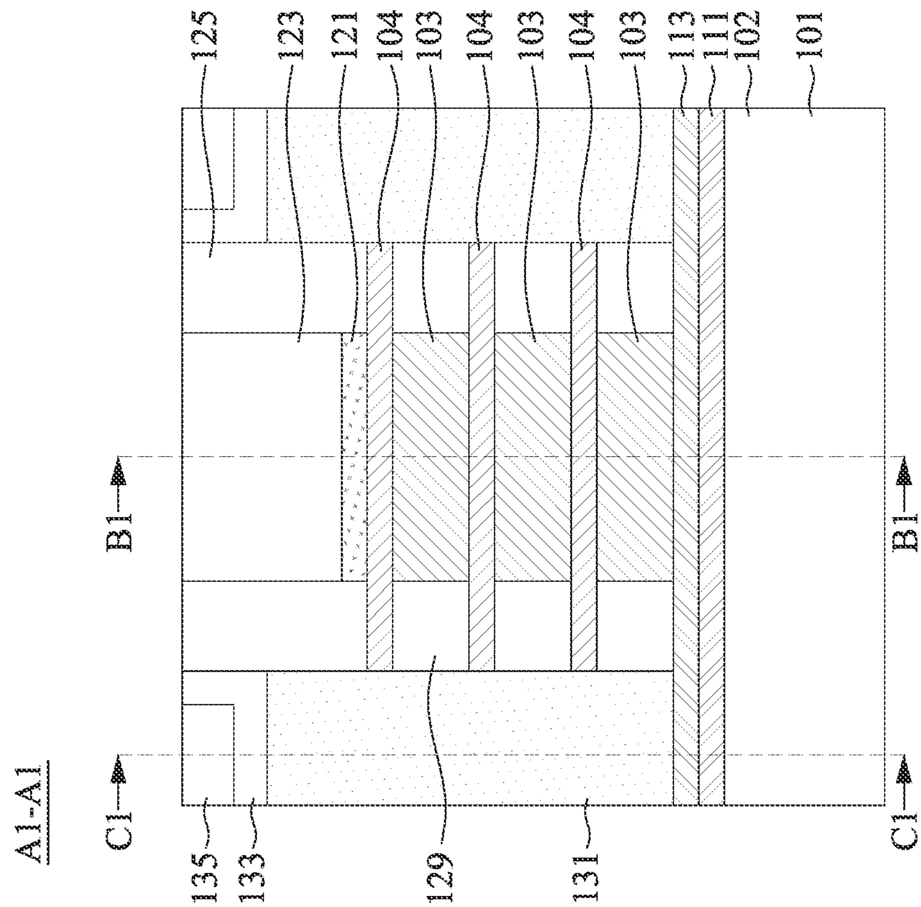
Figure 14C:
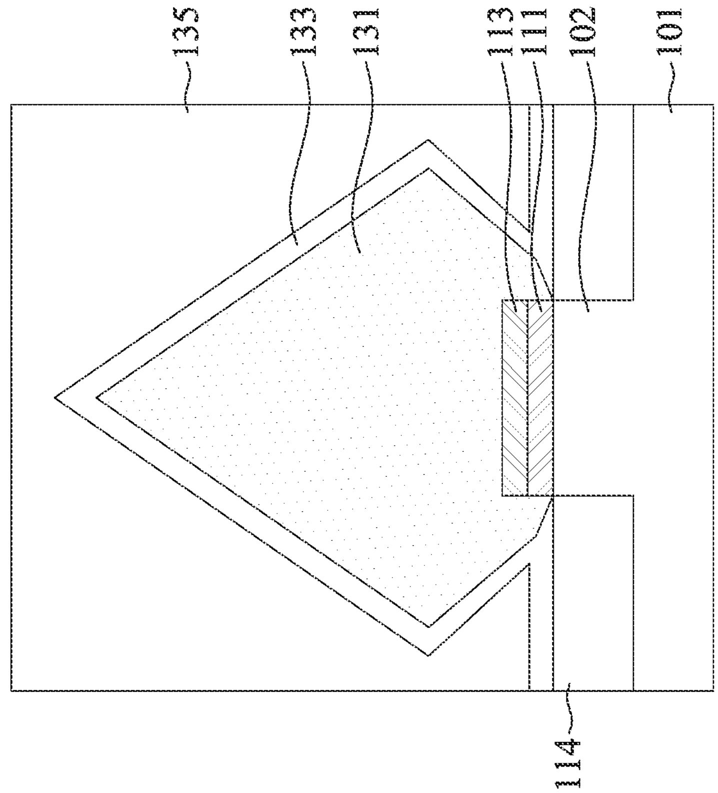
Figure 14B:
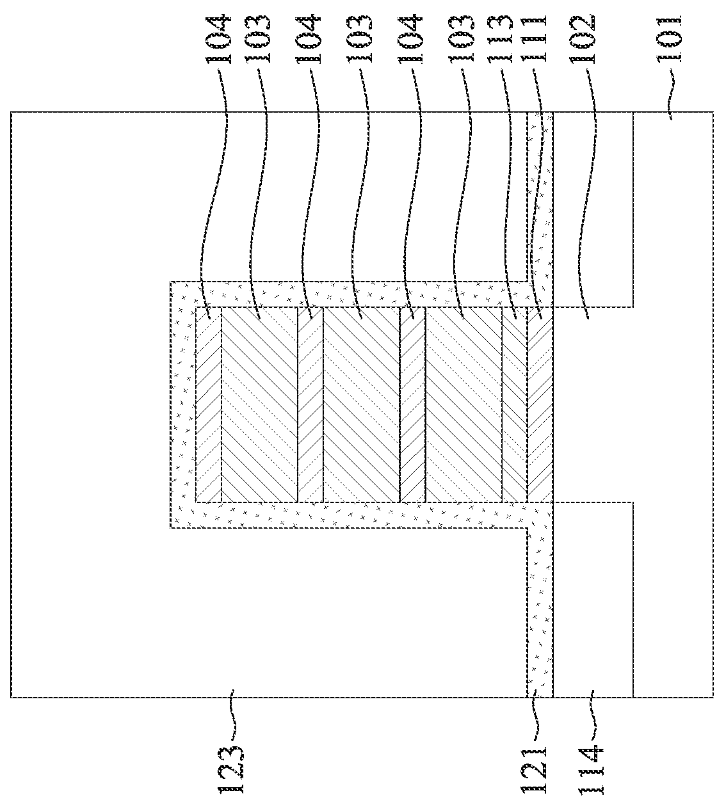

Returning to FIG. 2A, the method M1 then proceeds to block S112 where a contact etch stop layer (CESL) and an interlayer dielectric (ILD) layer are formed over the source/ drain structures. With reference to FIGS. 14A to 14C, in some embodiments of block S112, the CESL 133 extends from the top surface of the isolation dielectric 114 to the top surface of the source/drain structures 131 and may be referred to as a hard mask layer. In some embodiments, the CESL 133 and the ILD layer 135 may be formed by, for example, sequentially depositing a CESL material layer and an ILD material layer over the substrate 101 and followed by a CMP process to remove excessive CESL material layer and ILD material layer until a top surface of the dummy gate structure 123 is exposed. In some embodiments, the CESL 133 has different material and/or components than the source/drain structures 131, such that the CESL 133 of has different etching rate than the source/drain structures 131. For example, the hard mask layer 121 may be made of a carbon-containing material, such as SiOC, and any other suitable materials, and the source/drain structures 131 may be free from carbon. In some embodiments, the CESL 133 includes silicon nitride, silicon oxynitride or other suitable materials. In some embodiments, the ILD layer 135 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

Figure 15A:
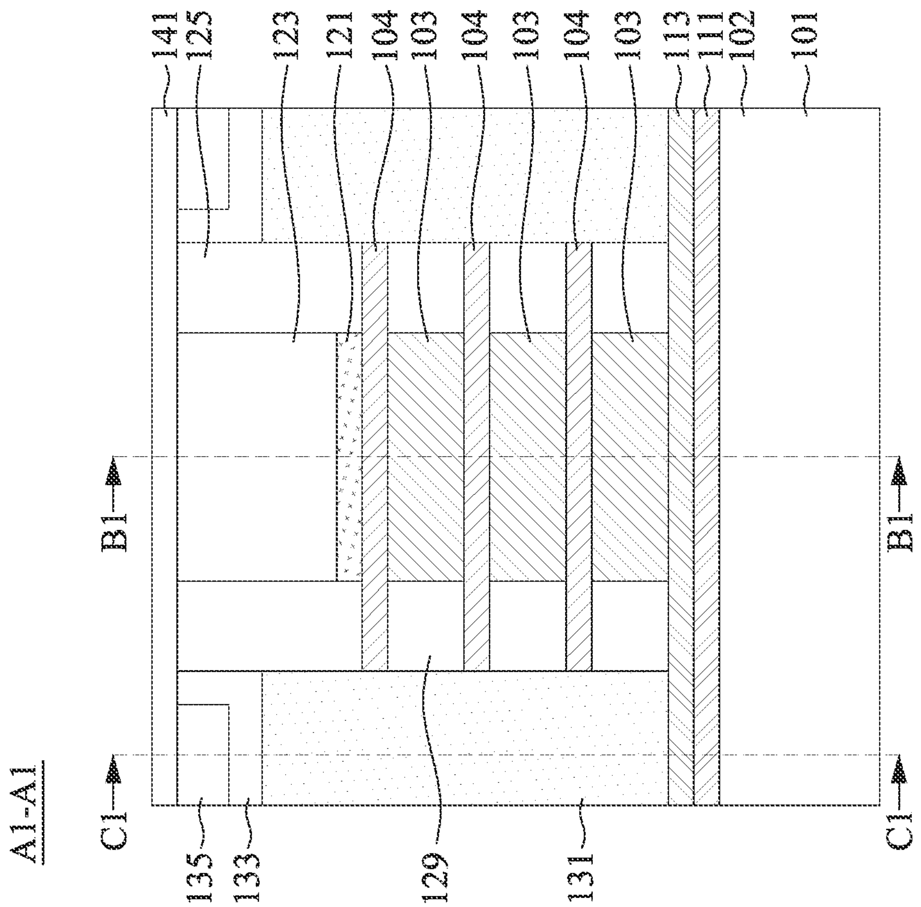
Figure 15C:
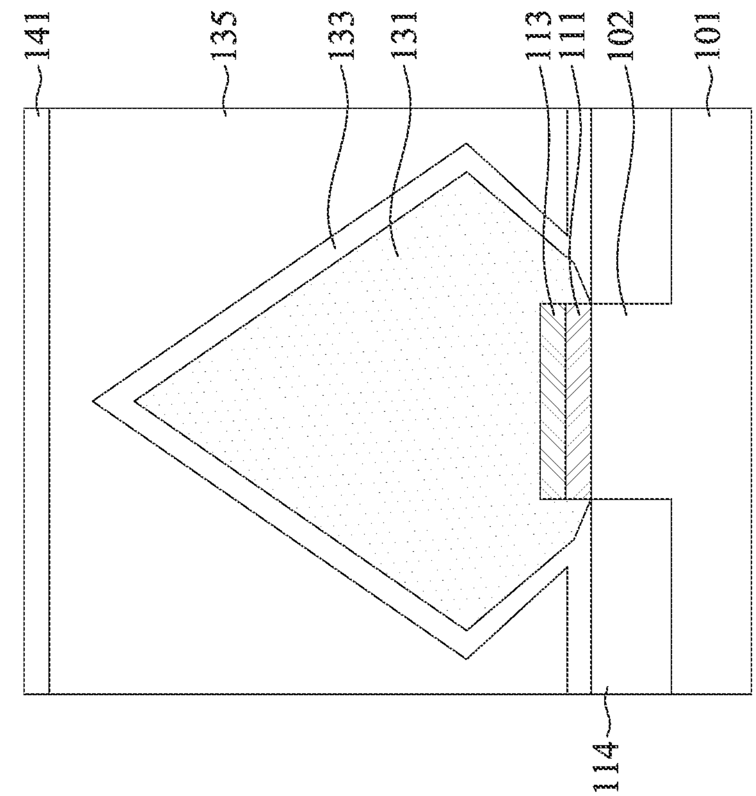
Figure 15B:
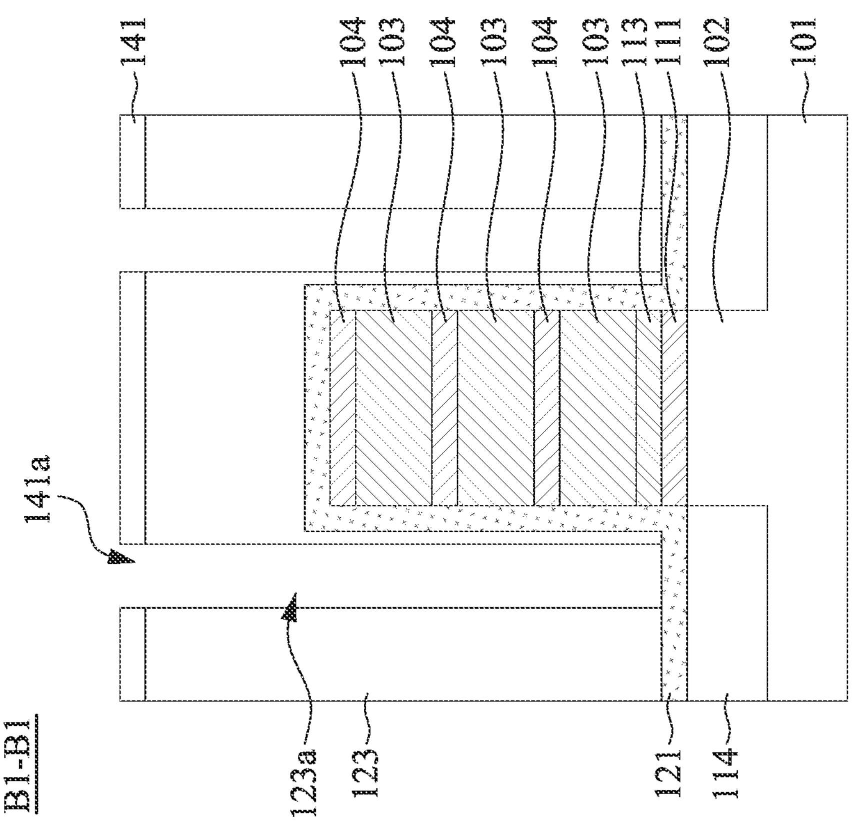

Returning to FIG. 2B, the method M1 then proceeds to block S113 where a patterned mask layer is formed over the dummy gate structure, the gate spacers, and the ILD layer, and the dummy gate structure is etched through the patterned mask layer to form an opening therein. With reference to FIGS. 15A to 15C, in some embodiments of block S113, a mask layer 141 is formed over the dummy gate structure 123, the gate spacers 125, and the ILD layer 135. In some embodiments, the mask layer 141 is formed by spin coating a resist material (e.g., the mask layer 141 may be also referred to as a photo resist layer), followed by a process, such as a soft baking process and a hard baking process (may be also referred to as a pre-exposure baking).

In some embodiments, the mask layer 141 is a DUV resist such as a krypton fluoride (KrF) resist or an argon fluoride (ArF) resist. In some embodiments, the mask layer 141 is an I-line resist, a EUV resist, an electron beam (e-beam) resist, or an ion beam resist. In some embodiments, the mask layer 141 is a positive resist. The positive resist is insoluble in a developer but becomes soluble upon radiation. One exemplary positive resist is a chemically amplified resist (CAR) that contains backbone polymer protected by acid labile groups (ALGs) and further contains photo-acid generators (PAGs). The PAGs can produce an acid upon radiation and the acid can catalyze the cleaving of the ALGs from the backbone polymer, increasing the polymer's solubility to a positive tone developer. In some embodiments, the mask layer 141 is a negative resist. The negative resist is soluble in a developer but becomes insoluble upon radiation.

After coating the mask layer 141 over the dummy gate structure 123, the gate spacers 125, and the ILD layer 135 is complete, the mask layer 141 is exposed to a radiation through a mask. After exposing the mask layer 141 to the radiation is complete, the exposed mask layer 141 undergoes one or more post-exposure baking (PEB) processes. Then, a developing process is performed, such that portions of the exposed mask layer 141 are removed, resulting in a patterned mask layer 141 as shown in FIGS. 15A to 15C with an opening 141*a* therein, and the mask layer 141 acts as an etch mask to protect the rest of the dummy gate structure 123 from the etching process. As shown in FIG. 1A, the opening 141*a* of the mask layer 141 overlaps the dummy gate structure 123 which will replace by the gate structure 160 thereafter and is adjacent to the semiconductor strip 102. Referring to FIGS. 15A to 15C, the dummy gate structure 123 shown in FIG. 15B is etched through the opening 141*a* of the mask layer 141 to form an opening 123*a* therein and extending from a top surface of the dummy gate structure 123 to a top surface of the hard mask layer 121 that is above the isolation dielectric 114.

In some embodiments, the opening 123*a* of the dummy gate structure 123 shown in FIG. 15B has a width in a range from about 10 nm to about 100 nm, e.g., about 20, 30, 40, 50, 60, 70, 80, 90 nm, along a lengthwise direction of the semiconductor strip 102, by way of example but not limitation. The hard mask layer 121 has a thickness in a range from about 2 nm to about 20 nm, e.g., about 2, 5, 10, 15 nm, by way of example but not limitation. A distance between a sidewall of the opening 123*a* of the dummy gate structure 123 and a vertical portion of the hard mask layer 121 is in a range from about 5 nm to about 50 nm, e.g., about 5, 10, 20, 30, 40 nm, by way of example but not limitation.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 16A:
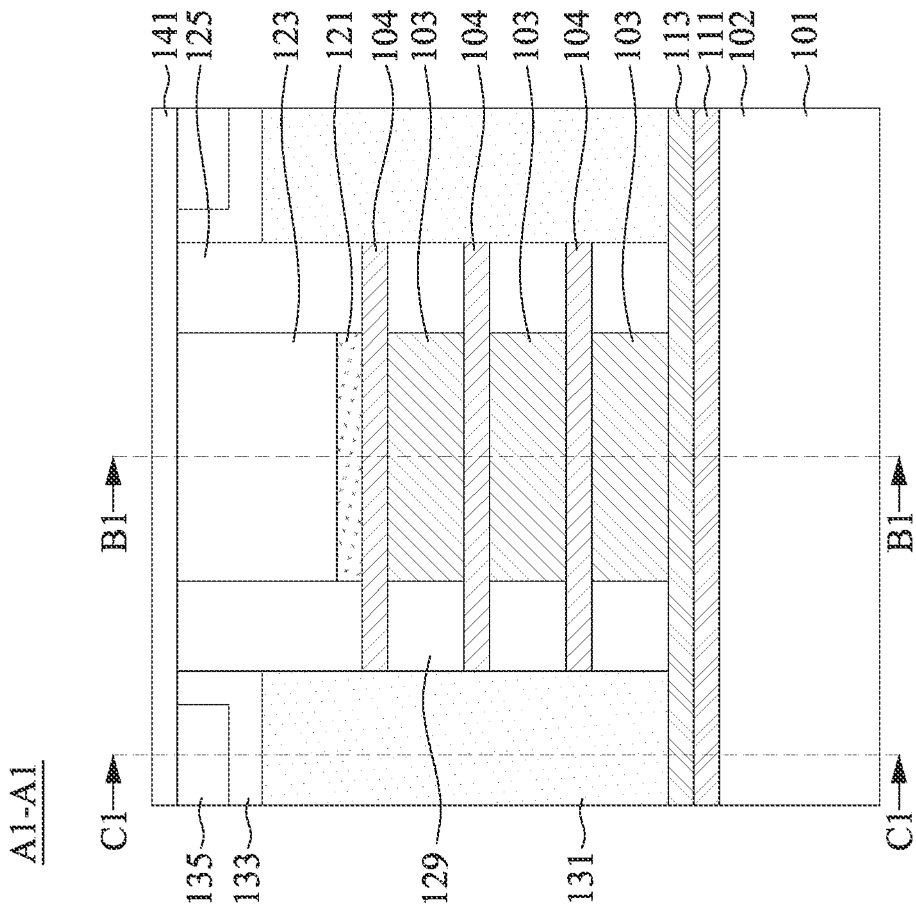
Figure 16C:
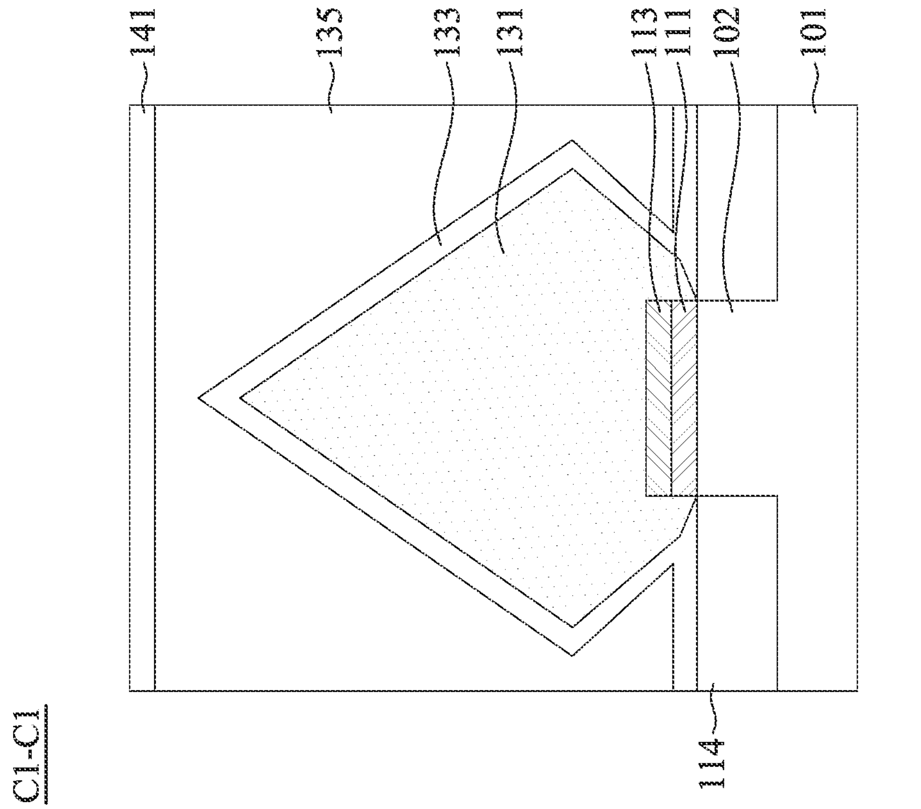
Figure 16B:
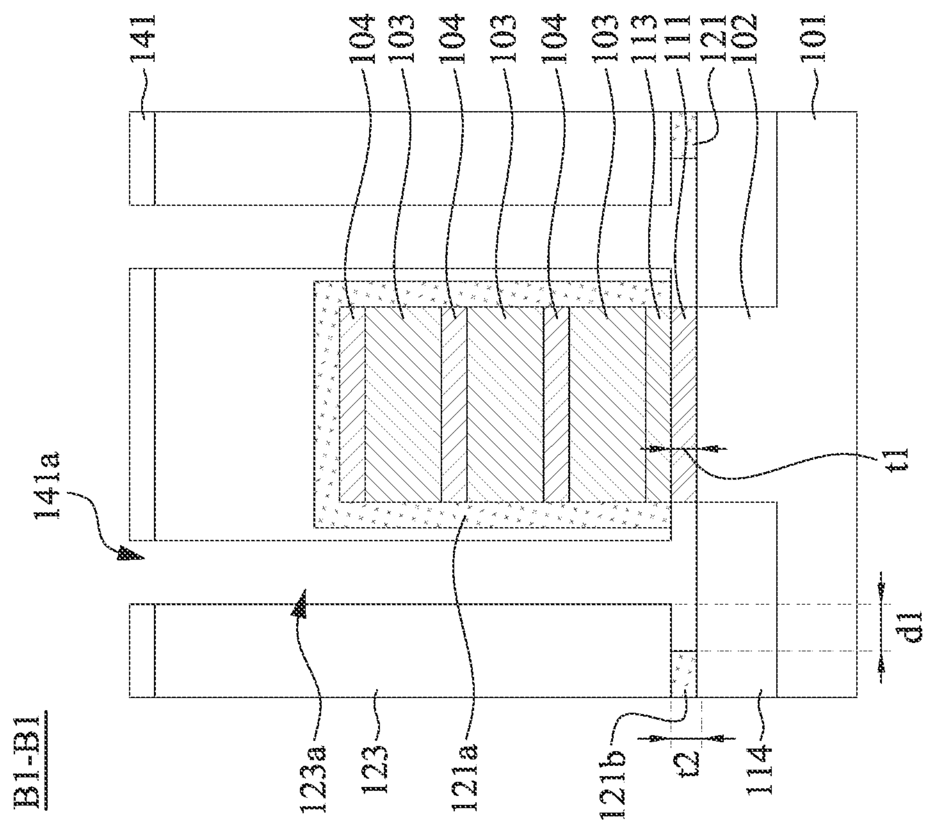

Returning to FIG. 2B, the method M1 then proceeds to block S114 where the hard mask layer is etched through the etched dummy gate structure to expose a sidewall of the lower sacrificial layer. With reference to FIGS. 16A to 16C, in some embodiments of block S114, the etching of the hard mask layer 121 through the etched dummy gate structure 123 may include a dry etching process or other suitable etching processes. In some embodiments, the etch process include using a technique and etchant selected to etch the hard mask layer 121 without significant etching of the surrounding structures. For example, the etch process selects to selectively etch the hard mask layer 121 made of a carbon-containing material, such as SiOC, without etching the sacrificial layers 111 and 113 made of a germanium-containing material and the dummy gate structure 123 made of polysilicon.

In FIG. 16B, the etching removes a portion of the hard mask layer 121 that is exposed from the patterned dummy gate structure 123, such that the hard mask layer 121 has a first portion 121*a* remaining on the semiconductor layer 103 and the channel layers 104 and a second portion 121*b* remaining on the isolation dielectric 114. By way of example and not limitation, the etching may be configured to resulting a distance d1 (may be also referred to as a lateral etch length) between the end surface of the hard mask layer 121 and the sidewall of the etched dummy gate structure 123. Therefore, the aforementioned etching may cause the sidewall of the sacrificial layer 111 be exposed. In some embodiments, the sacrificial layer 111 has a thickness t1 substantially same as the thickness t2 of the hard mask layer 121. Hence, after the hard mask layer 121 is removed, an entirety of the sidewall of the sacrificial layer 111 is exposed. In some embodiments, the sacrificial layer 111 has the thickness t1 thicker than the thickness t2 of the hard mask layer 121. Hence, after the hard mask layer 121 is removed, a part of the sidewall of the sacrificial layer 111 is exposed.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, $C_2F_6$, and/or $C_4F_8$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 17A:
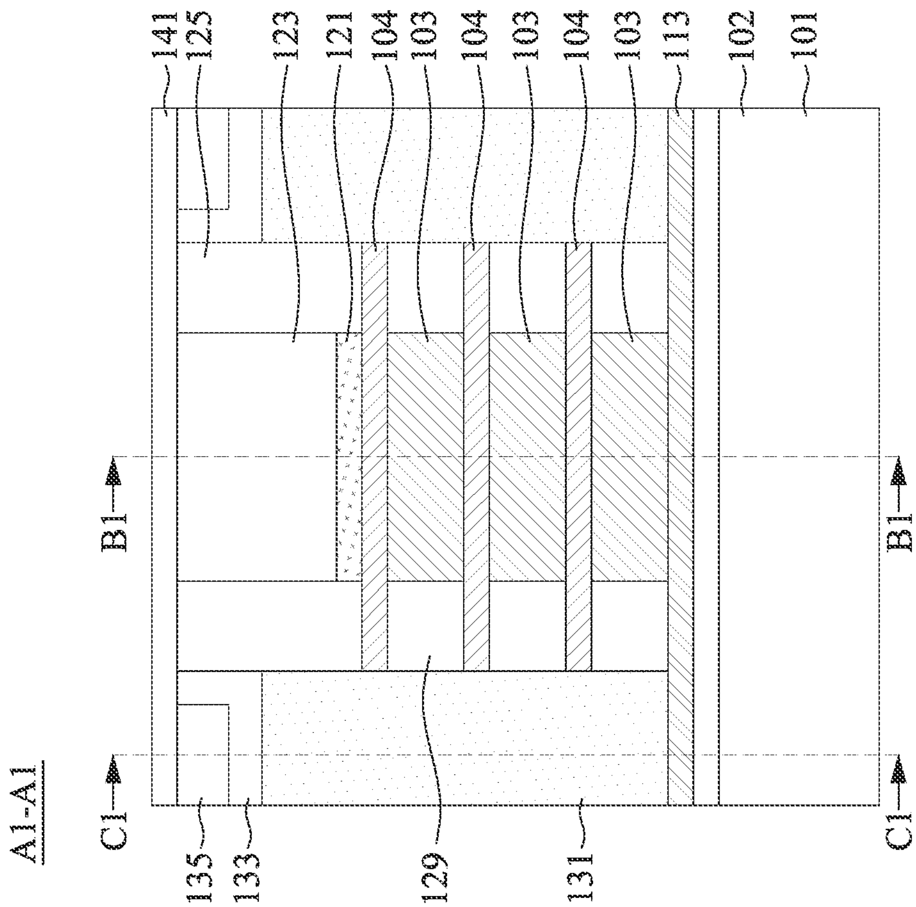
Figure 17C:
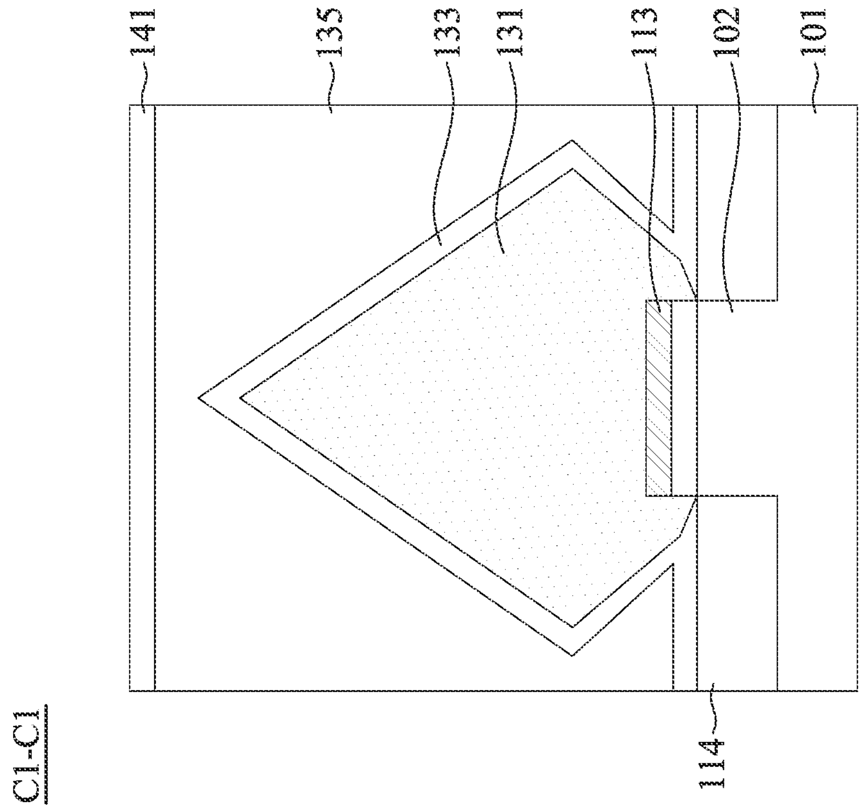
Figure 17B:
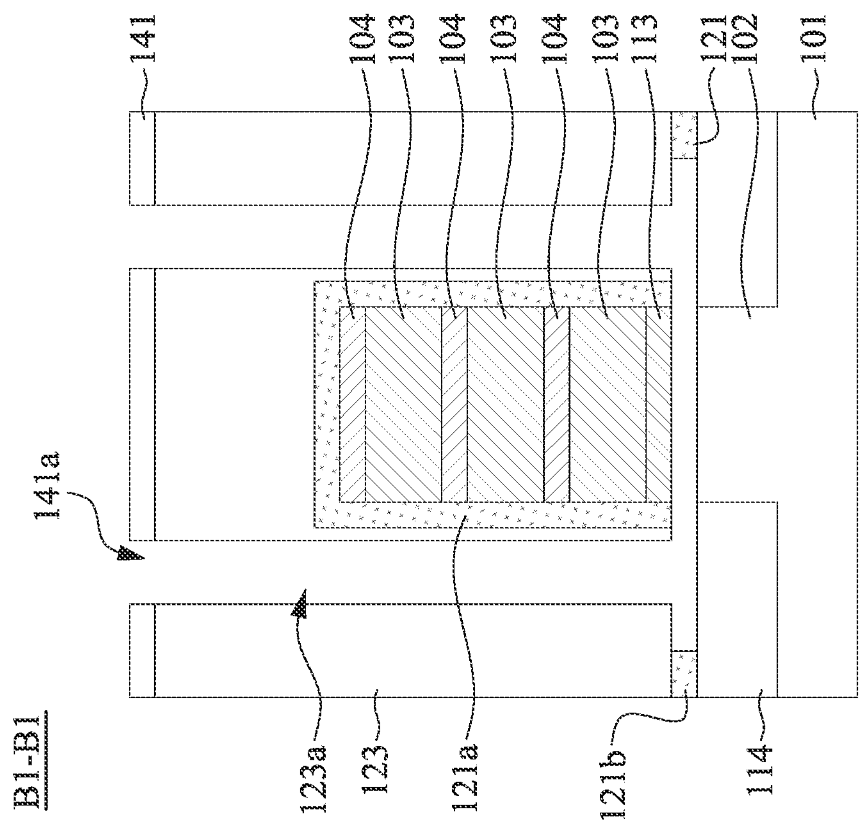

Returning to FIG. 2B, the method M1 then proceeds to block S115 where the lower sacrificial layer that is not covered by the hard mask layer is removed. With reference to FIGS. 17A to 17C, in some embodiments of block S115, the removing of the sacrificial layer 111 that is not covered by the hard mask layer 121 may include a dry etching process or other suitable etching processes. In some embodiments, the etch process include using a technique and etchant selected to etch the sacrificial layer 111 without significant etching of the surrounding structures, such that the top surface of the semiconductor strip 102 and the bottom surface of the sacrificial layer 113 are exposed.

For example, the sacrificial layers 111 and 113 are made of a germanium-containing material, such as SiGe, and the etch process selects to selectively etch the sacrificial layer 111 without etching the sacrificial layer 113 that has a lower germanium atomic percentage concentration than the sacrificial layer 111. The etch process selects to selectively etch the sacrificial layer 111 made of a germanium-containing material, such as SiGe, without etching the semiconductor strip 102 made of a germanium-free material, such as silicon. The etch process selects to selectively etch the sacrificial layer 111 made of a germanium-containing material, such as SiGe, without etching the hard mask layer 121 made of a carbon-containing material, such as SiOC, the dummy gate structure 123 made of polysilicon, and the semiconductor strip 102 made of a silicon-containing material.

In FIG. 17B, after the removing of the sacrificial layer 111, a bottom surface of the sacrificial layer 113 is coplanar with an end surface of the hard mask layer 121 that remains on the semiconductor layer 103. In some embodiments, the bottom surface of the sacrificial layer 113 is recessed from the end surface of the hard mask layer 121 toward the semiconductor layers 103. In some embodiments, the bottom surface of the sacrificial layer 113 protrudes from the end surface of the hard mask layer 121 toward the semiconductor strip 102.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $NF_3$, $SF_6$, $CH_2F_2$, $CHF_3$, $C_2F_6$, and/or $C_4F_8$), a chlorine-containing gas (e.g., $Cl_2$, HCl, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 18A:
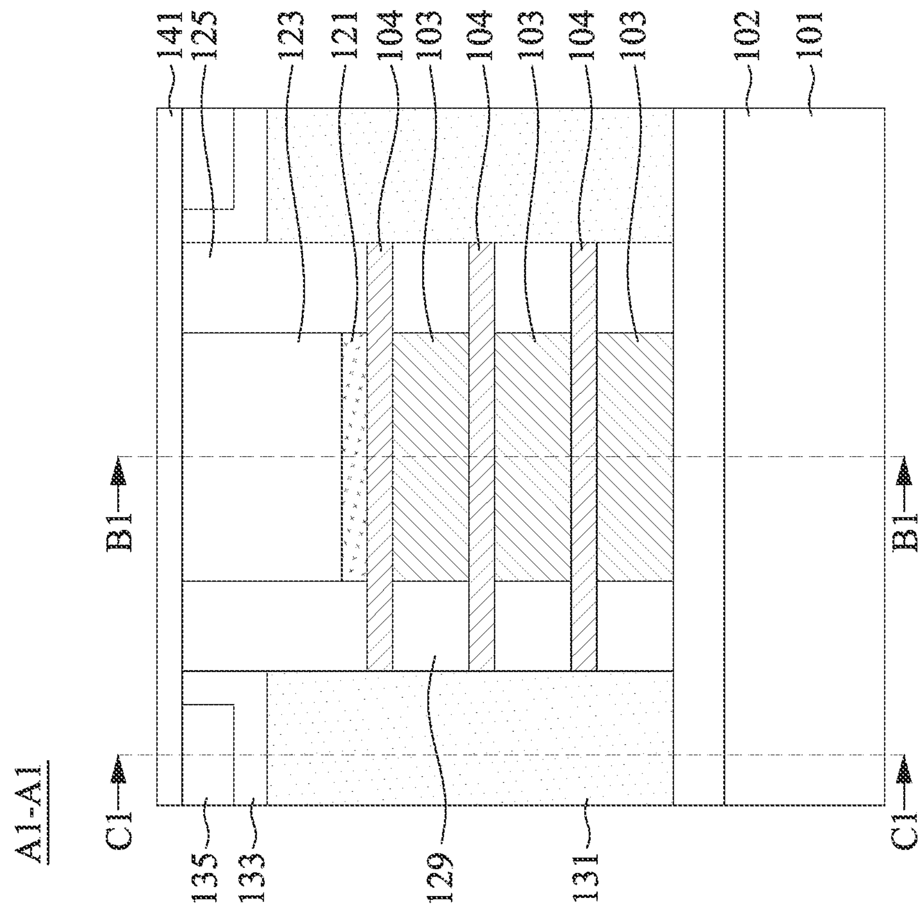
Figure 18C:
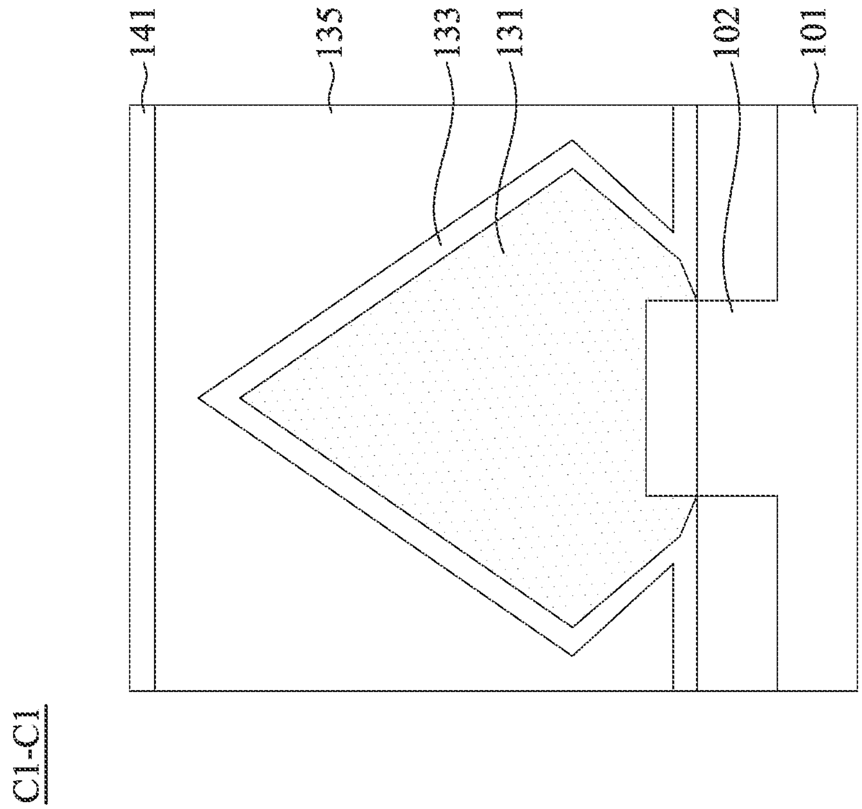
Figure 18B:
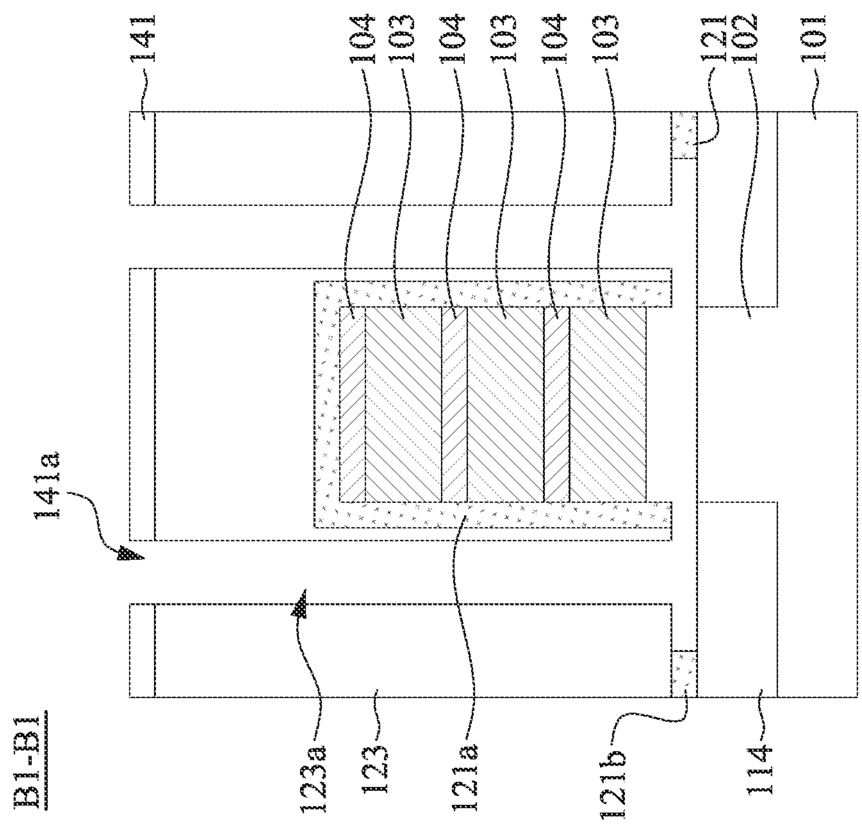

Returning to FIG. 2B, the method M1 then proceeds to block S116 where the upper sacrificial layer exposed from the hard mask layer is removed. With reference to FIGS. 18A to 18C, in some embodiments of block S116, the removing of the sacrificial layer 113 that is exposed from the hard mask layer 121 may include a dry etching process or other suitable etching processes. In some embodiments, the etch process include using a technique and etchant selected to etch the sacrificial layer 113 without significant etching of the surrounding structures, such that the lowest one of the semiconductor layers 103 is vertically spaced apart from the semiconductor strip 102 by a distance in a range from about 4 nm to about 60 nm, e.g., about 10, 20, 30, 40, 50 nm, by way of example but not limitation.

For example, the sacrificial layer 113 and the semiconductor layer 103 are made of a germanium-containing material, such as SiGe, and the etch process selects to selectively etch the sacrificial layer 113 having a lower germanium atomic percentage concentration than the semiconductor layer 103. For example, the etch process selects to selectively etch the sacrificial layer 113 made of a germanium-containing material, such as SiGe, without etching the hard mask layer 121 made of a carbon-containing material, such as SiOC, the dummy gate structure 123 made of polysilicon, and the semiconductor strip 102 made of a silicon-containing material.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $NF_3$, $SF_6$, $CH_2F_2$, $CHF_3$, $C_2F_6$, and/or $C_4F_8$), a chlorine-containing gas (e.g., $Cl_2$, HCl, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments, after etching the sacrificial layer 113, the patterned mask layer 141 is removed.

Figure 19A:
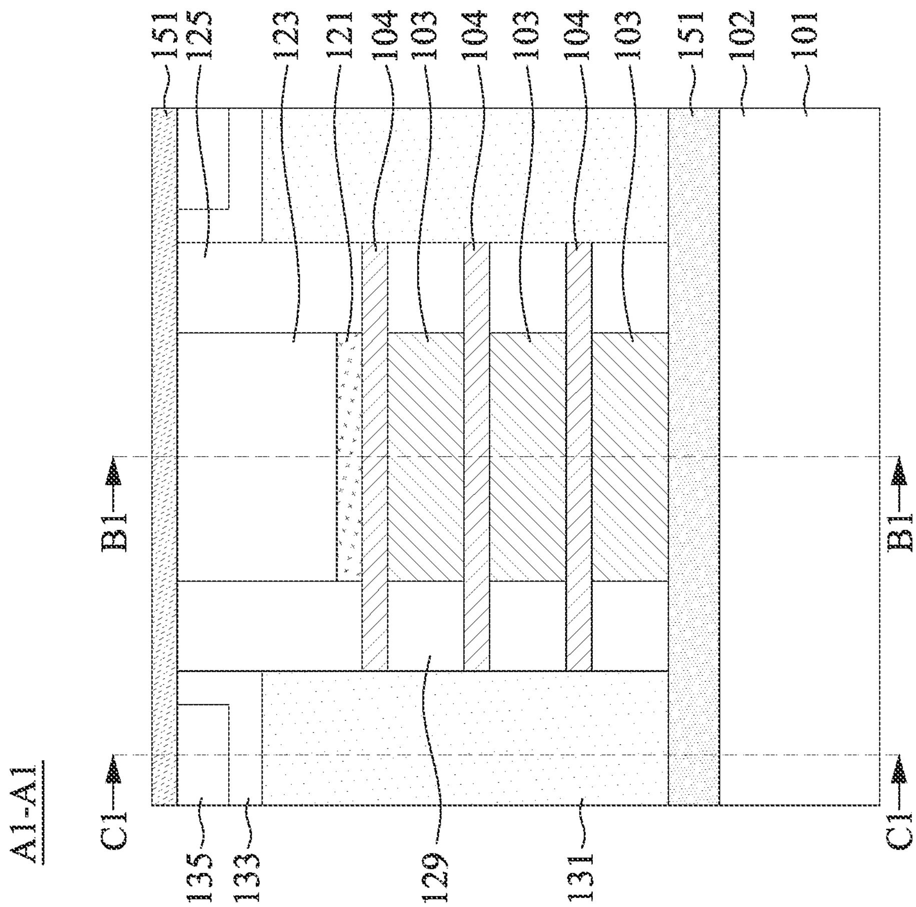
Figure 19C:
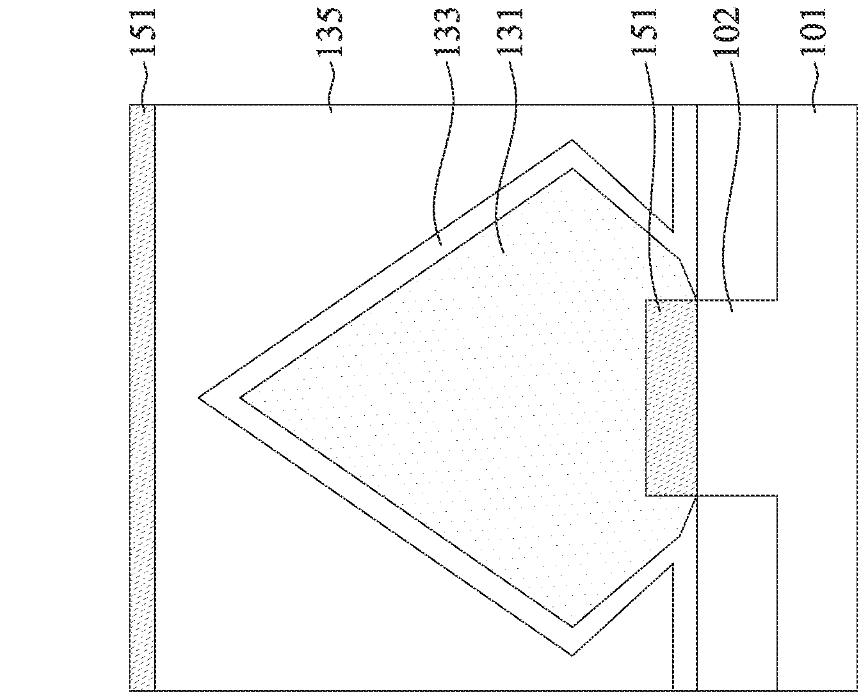
Figure 19B:
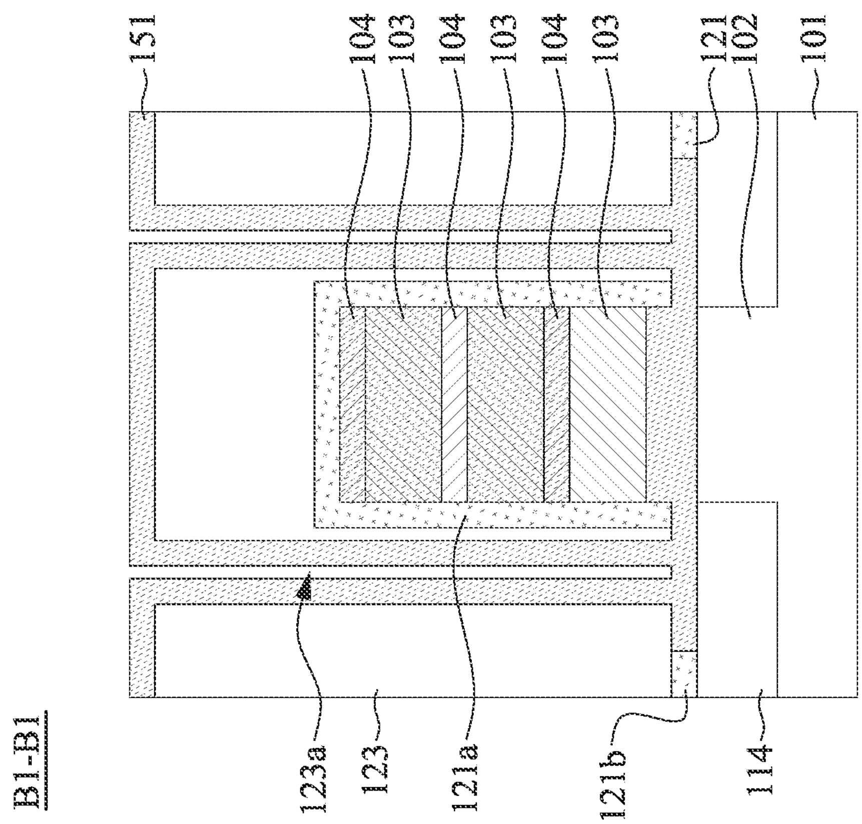

Returning to FIG. 2B, the method M1 then proceeds to block S117 where a dielectric layer is formed to line sidewalls of the opening of the dummy gate structure and fill into a space between the lowest one of the semiconductor layers and the semiconductor strip. With reference to FIGS. 19A to 19C, in some embodiments of block S117, a dielectric layer 151 is formed over the substrate 101 to line sidewalls of the opening 123*a* of the dummy gate structure 123 and fill into a space between the lowest one of the semiconductor layers 103 and the semiconductor strip 102. In some embodiments, the dielectric layer 151 may include $SiO_2$, $Si_3N_4$, $SiO_xN_y$, SiC, SiCN films, SiOC, SiOCN films, and/or combinations thereof. In some embodiments, the dielectric layer 151 may be formed by suitable deposition processes, for example, chemical vapor deposition (CVD), plasma enhanced chemical vapor deposition (PECVD), atomic layer deposition (ALD), evaporation, physical vapor deposition (PVD), chemical solution deposition, or other like processes.

Figure 20A:
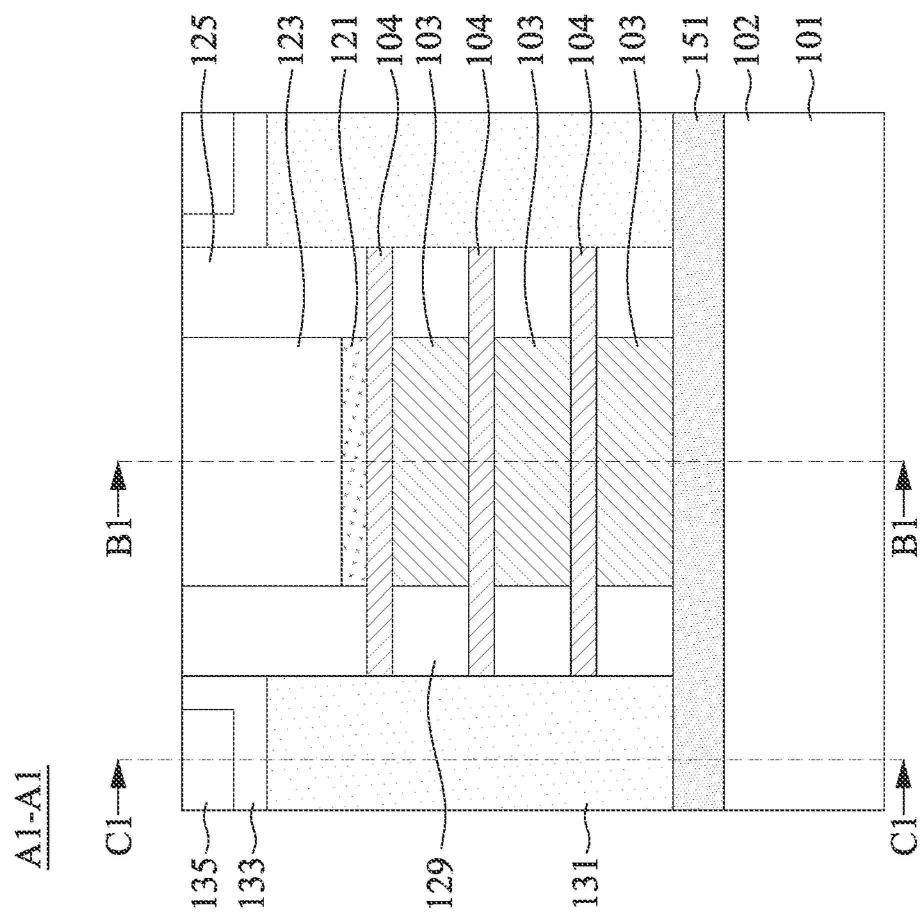
Figure 20C:
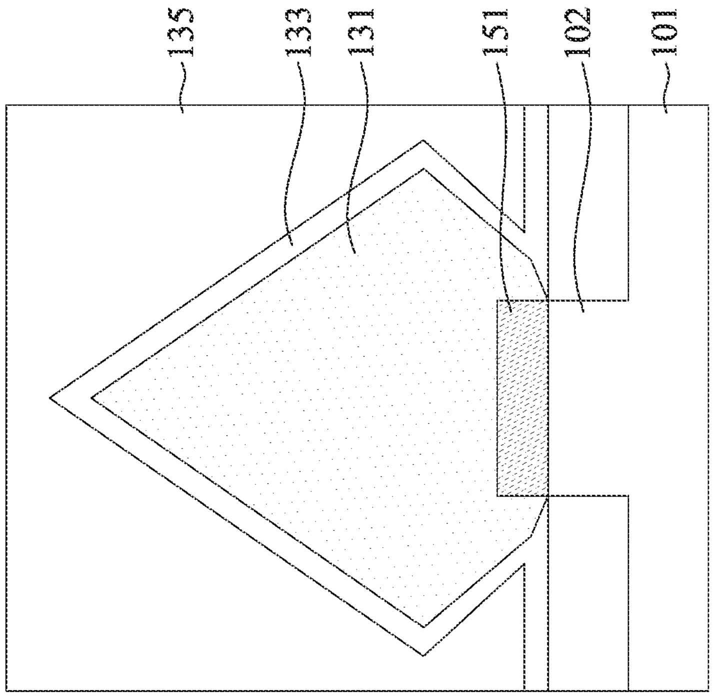
Figure 20B:
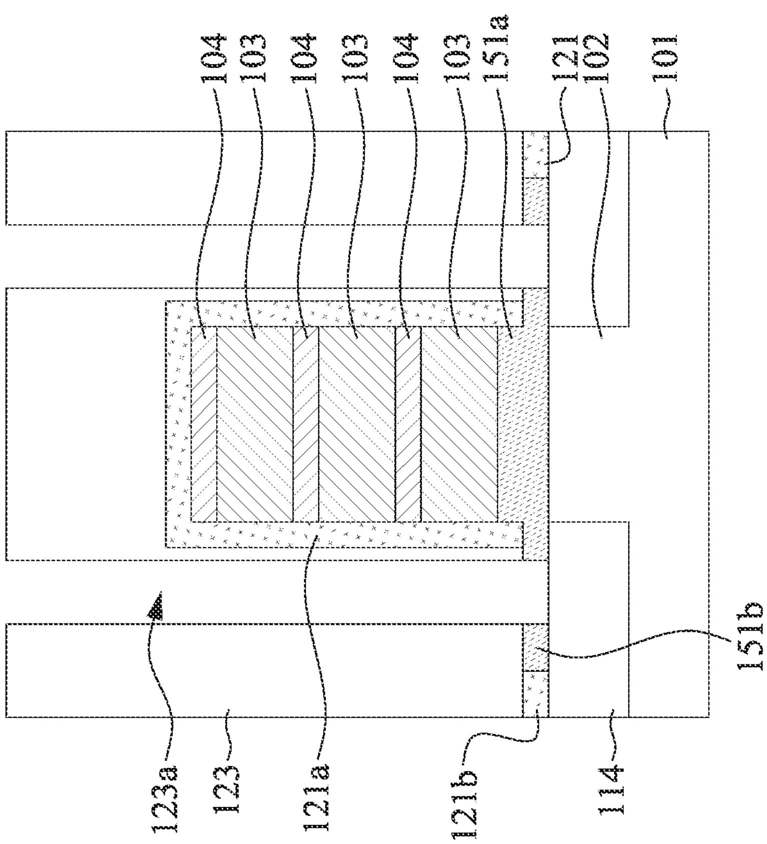

Returning to FIG. 2B, the method M1 then proceeds to block S118 where the dielectric layer formed on the sidewalls of the opening of the dummy gate structure is removed. With reference to FIGS. 20A to 20C, in some embodiments of block S118, the removing of the dielectric layer 151 formed on the sidewalls of the opening 123*a* of the dummy gate structure 123 may include a dry etching process or other suitable etching processes. As shown in a FIG. 20B, after the removing, the dielectric layer 151 has a first remainder 151*a* on the semiconductor strip 102 and a second remainder 151*b* spaced apart from the semiconductor strip 102 and on the isolation dielectric 114.

In some embodiments, the dummy gate structure 123 remain substantially intact after removing the dielectric layer 151 formed on the sidewalls of the opening 123*a* due to the nature of the anisotropic etching process that selectively etches the material of the dielectric layer 151 at a faster etch rate than it etches the dummy gate structure 123. For example, the etch rate of the etching process to the dielectric layer 151 made of, such as $SiO_2$, may be greater than about 20 times the etch rate of the etching process to the dummy gate structure 123 made of, such as Si, in a case where the etching process is of a SiCoNi (including HF and $NH_3$) etching process.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., HF, $CF_4$, $NF_3$, $SF_6$, $CH_2F_2$, $CHF_3$, $C_2F_6$, and/or $C_4F_8$), a chlorine-containing gas (e.g., $Cl_2$, HCl, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a dry etching process may implement with HF and $NH_3$ gas.

Figure 21A:
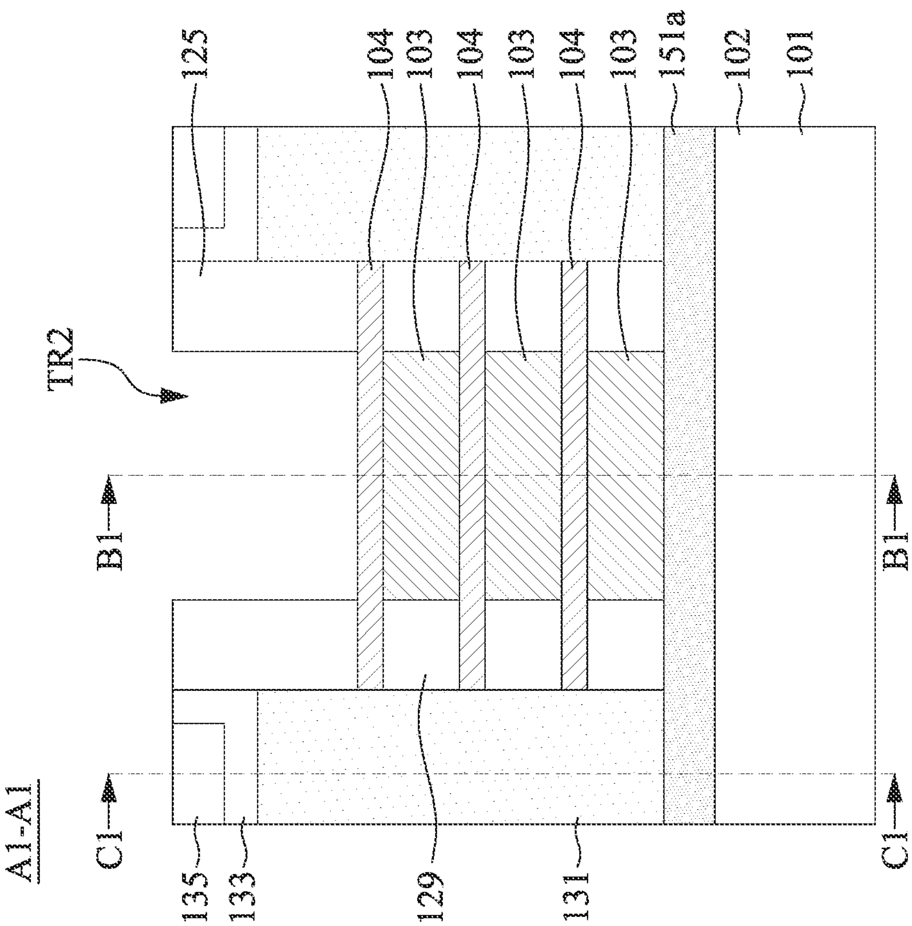
Figure 21C:
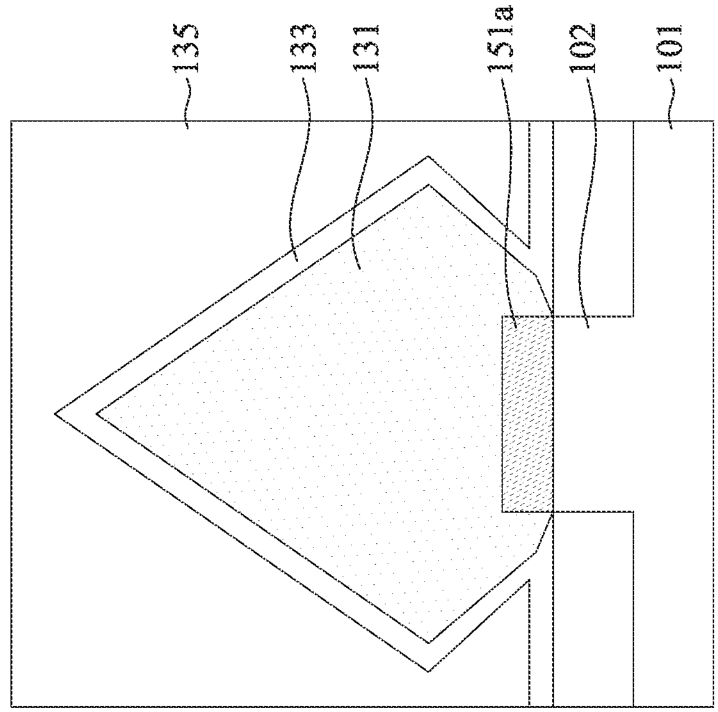
Figure 21B:
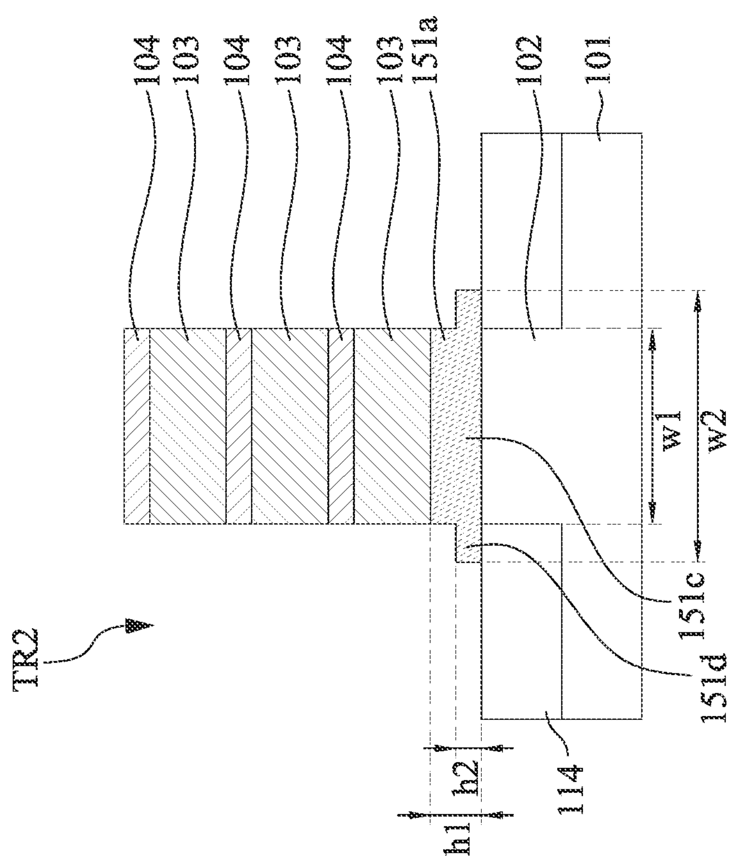

Returning to FIG. 2B, the method M1 then proceeds to block S119 where the dummy gate structure and the hard mask layer are removed. With reference to FIGS. 21A to 21C, in some embodiments of block S119, the dummy gate structure 123, the hard mask layer 121, and the second remainder 151*b* of the dielectric layer 151 are removed (shown in FIGS. 21A and 21B) to form a gate trench TR2 (shown in FIGS. 22A and 22B), but the semiconductor layers 103, the channel layers 104, the gate spacers 125, the inner spacers 129, and the first remainder 151*a* (may be also referred to as an isolation layer 151*a*) of the dielectric layer 151 remain. In some embodiments, since the second portion 151*d* of the dielectric layer 151 on the isolation dielectric 114 may be adhesive with the hard mask layer 121 and/or the dummy gate structure 123, the second portion 151*d* is removed with the removal of the hard mask layer 121 and/or the dummy gate structure 123.

As shown in FIG. 21B, the isolation layer 151*a* has a step-liked sidewall and a greater width w2 than a width w1 of the semiconductor strip 102. A ratio of the width w2 of the isolation layer 151*a* to the width w1 of the semiconductor strip 102 may be in a range from about 0.5 to about 20. The isolation layer 151*a* has a first portion 151*c* on the semiconductor strip 102 and a second portion 151*d* on the isolation dielectric 114. In FIG. 21B, the first portion 151*c* of the isolation layer 151*a* has a greater height h1 than the height h2 of the second portion 151*d* of the isolation layer 151*a*. In some embodiments, a height of the first portion 151*c* of the isolation layer 151*a* may be substantially equal to a height of the second portion 151*d* of the isolation layer 151*a*. In some embodiments, a height of the first portion 151*c* of the isolation layer 151*a* may be lower than a height of the second portion 151*d* of the isolation layer 151*a*. In FIG. 21B, the isolation layer 151*a* has a width w2 greater than a length of the channel layers 104.

In some embodiments, the dummy gate structure 123, the hard mask layer 121, and the second remainder 151*b* of the dielectric layer 151 are removed by suitable etch process. In some embodiments, the etch process include using a technique and etchant selected to etch the dummy gate structure 123 without significant etching of the surrounding structures. For example, the etch process selects to selectively etch the dummy gate structure 123, without etching the hard mask layer 121 and the dielectric layer 115. Then, the etch process include using a technique and etchant selected to etch the hard mask layer 121 without significant etching of the first remainder 151*a* of the dielectric layer 151 that is below the semiconductor layers 103 and the channel layers 104. In some embodiments, the second remainder 151*b* of the dielectric layer 151 spaced apart from the semiconductor strip 102 is removed with the hard mask layer 121.

In some embodiments, the etching process for the dummy gate structure 123 or the hard mask layer 121 is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $NF_3$, $SF_6$, $CH_2F_2$, $CHF_3$, $C_2F_6$, and/or $C_4F_8$), a chlorine-containing gas (e.g., $Cl_2$, HCl, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 22A:
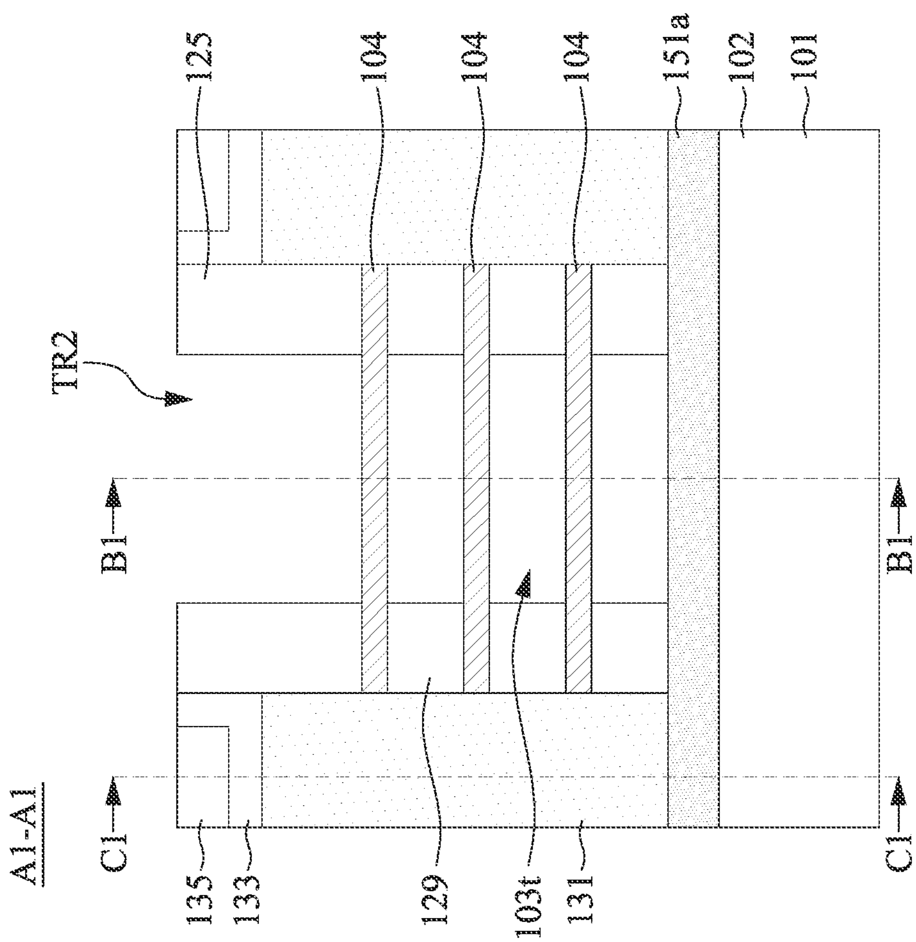
Figure 22C:
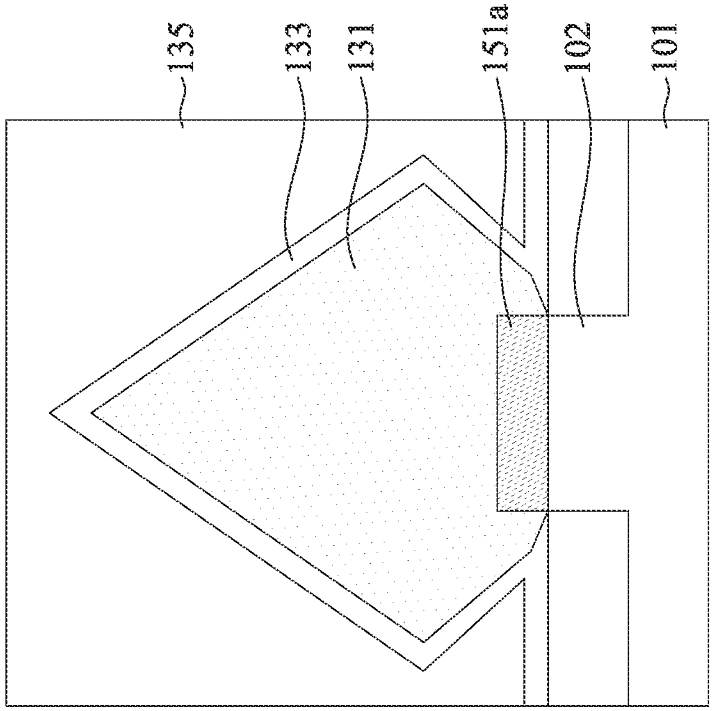
Figure 22B:
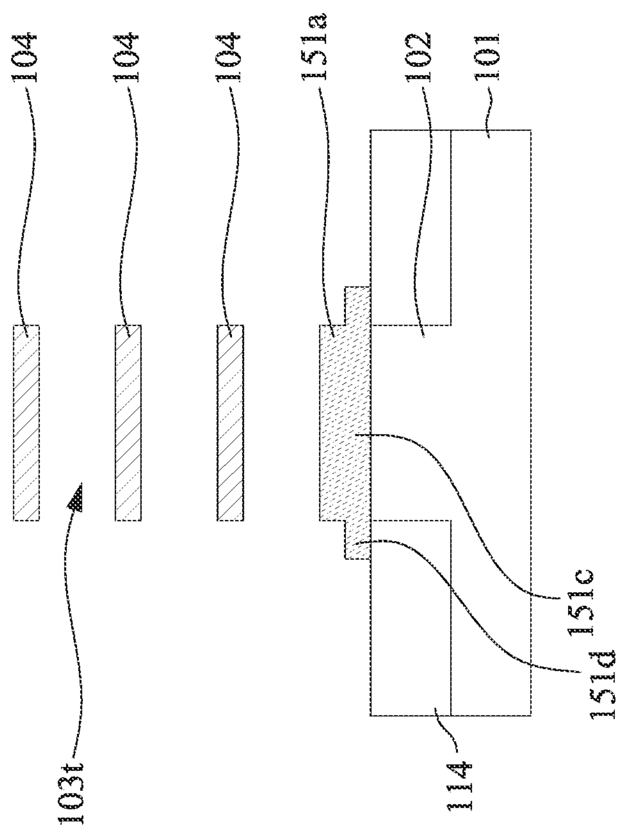

Returning to FIG. 2B, the method M1 then proceeds to block S120 where the semiconductor layers are removed. With reference to FIGS. 22A to 22C, in some embodiments of block S120, the semiconductor layers 103 are removed by suitable process, leaving spaces between the inner spacers 129 to form trenches 103*t* (shown in FIGS. 22A and 22B), but the channel layers 104, the gate spacers 125, and the inner spacers 129 remain. The channel layers 104 are released from the semiconductor strip 102 and the isolation layer 151*a* and spaced apart from each other. The isolation layer 151*a* is then exposed from the trenches 103*t*, while the source/drain structures 131 are still under the coverage of the CESL 133 and the ILD layer 135.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., HCl, $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 23A:
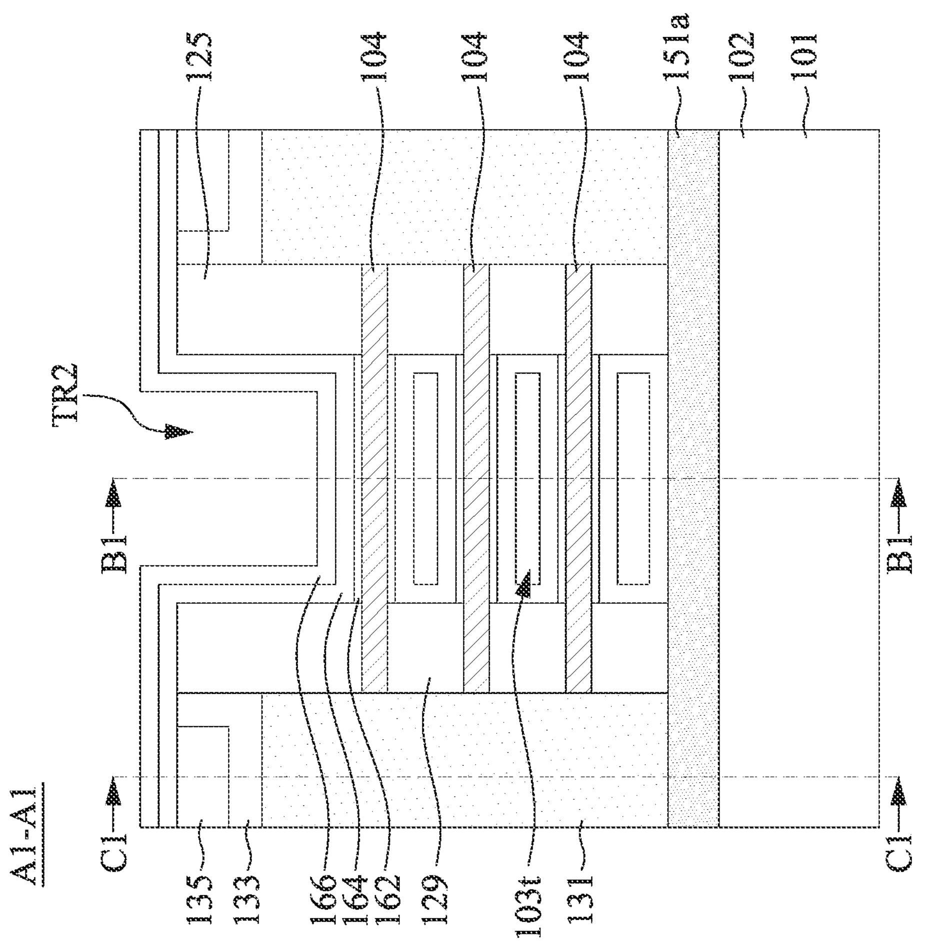
Figure 23C:
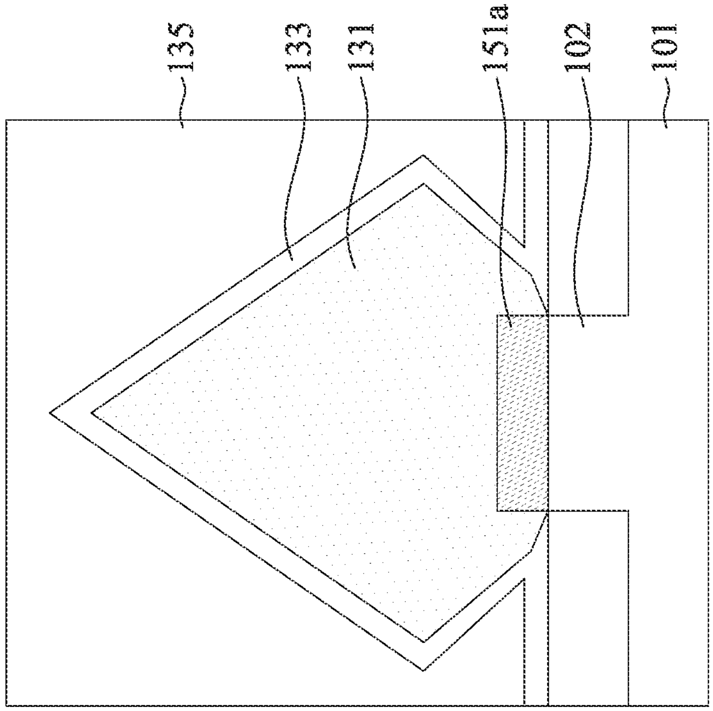
Figure 23B:
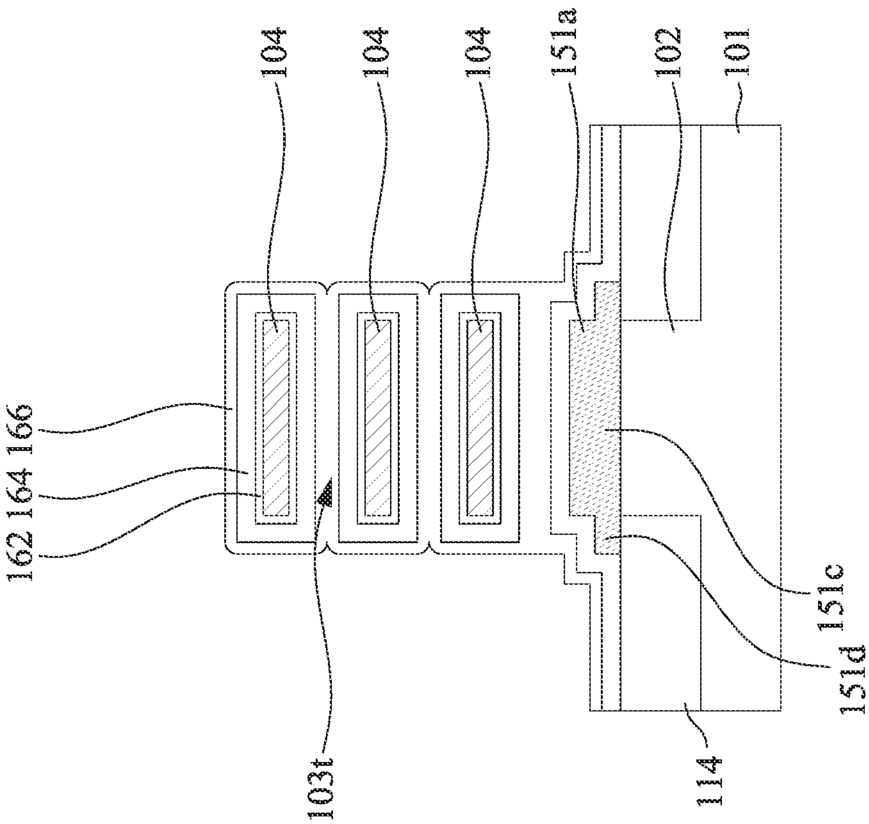

Returning to FIG. 2B, the method M1 then proceeds to block S121 where an interfacial layer is selectively formed on the channel layers, and then a high-k dielectric layer and a work function metal layer are formed over the interfacial layer and the dielectric layer. With reference to FIGS. 23A to 23C, in some embodiments of block S121, an interfacial layer 162 is selectively formed on the channel layer 104. In some embodiments, the interfacial layer 162 may be formed by an oxidation process, such as a thermal oxidation. The gate dielectric layer 164 may be formed by PVD, CVD, ALD, or other suitable deposition processes. The gate conductive layer may be formed by PVD, CVD, ALD, or other suitable deposition processes.

Then, a high-k dielectric layer 164 and a work function metal layer 166 are formed over the interfacial layer 162 and the isolation layer 151*a* to fill the trench 103*t*. As shown in FIG. 23A, the high-k dielectric layer 164 is a thin layer formed on sidewalls of the gate spacers 125, the inner spacers 129 and the channel layers 104. As shown in FIG. 23B, the high-k dielectric layer 164 wraps around the channel layer 104. In some embodiments, the high-k dielectric layer 164 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. The high-k dielectric layer 164 may be formed by suitable deposition processes, for example, chemical vapor deposition (CVD), plasma enhanced chemical vapor deposition (PECVD), atomic layer deposition (ALD), evaporation, physical vapor deposition (PVD), chemical solution deposition, or other like processes. The thickness of the high-k dielectric layer 164 may vary depending on the deposition process as well as the composition and number of the high-k dielectric layer 164 used.

Then, a work function metal layer 166 is formed. The work function metal layer 166 may be disposed over the high-k dielectric layer 164, and fill up the spaces between the channel layers 104 and between the isolation layer 151*a* and the channel layers 104. The type of work function metal layer 166 depends on the type of transistor. That is, the work function metal layer 166 may include p-type work function metal materials and n-type work function metal materials. P-type work function materials include compositions such as ruthenium (Ru), palladium (Pd), platinum (Pt), cobalt (Co), nickel (Ni), and conductive metal oxides, or any combination thereof. N-type metal materials include compositions such as hafnium (Hf), zirconium (Zr), titanium (Ti), tantalum (Ta), aluminum (Al), metal carbides (e.g., hafnium carbide (HfC), zirconium carbide (ZrC), titanium carbide (TiC), and aluminum carbide ($Al_4C_3$)), aluminides, or any combination thereof. The work function metal(s) may be deposited by a suitable deposition process, for example, chemical vapor deposition (CVD), plasma-enhanced chemical vapor deposition (PECVD), physical vapor deposition (PVD), plating, thermal or e-beam evaporation, and sputtering. For example, the work function metal layer 166 may include materials such as titanium nitride (TiN) or tantalum nitride (TaN).

Figure 24A:
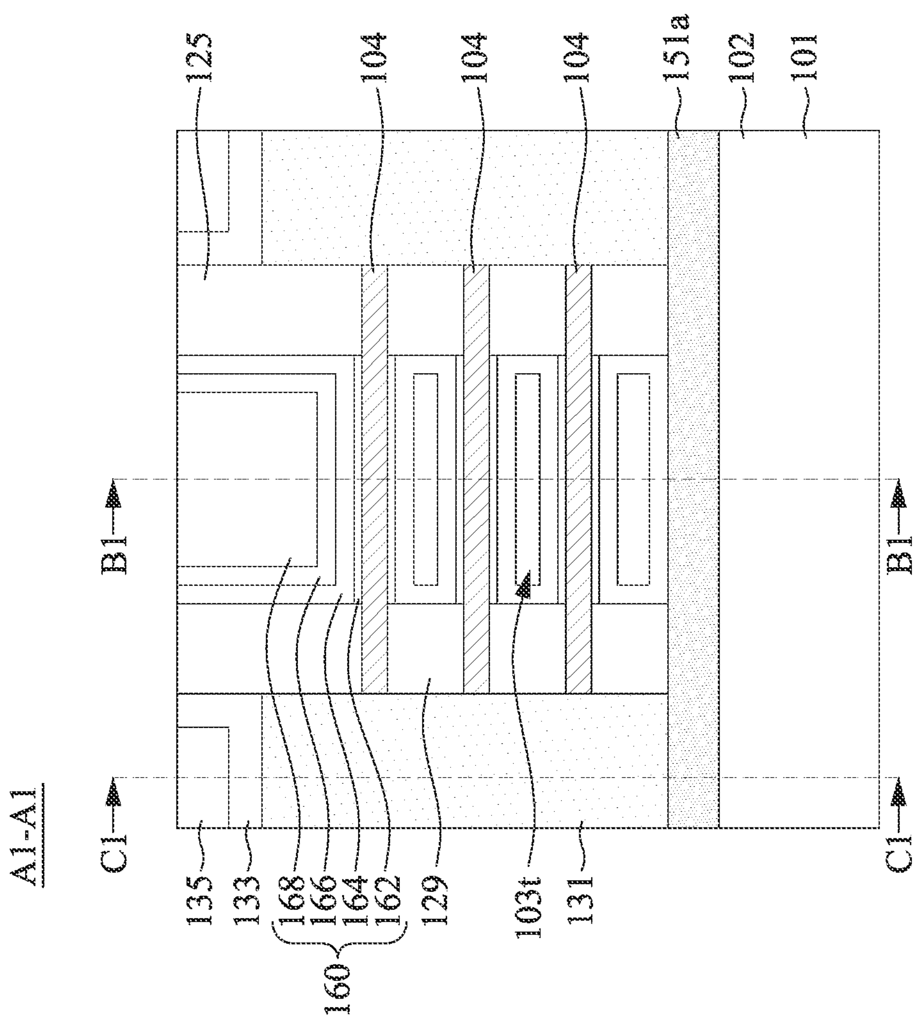
Figure 24C:
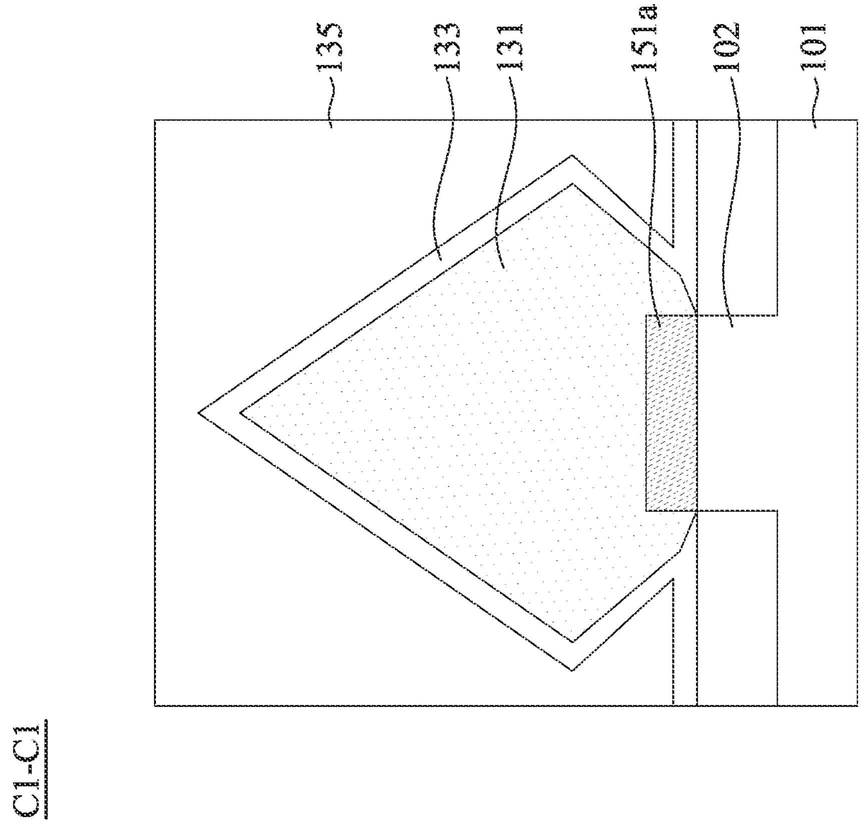
Figure 24B:
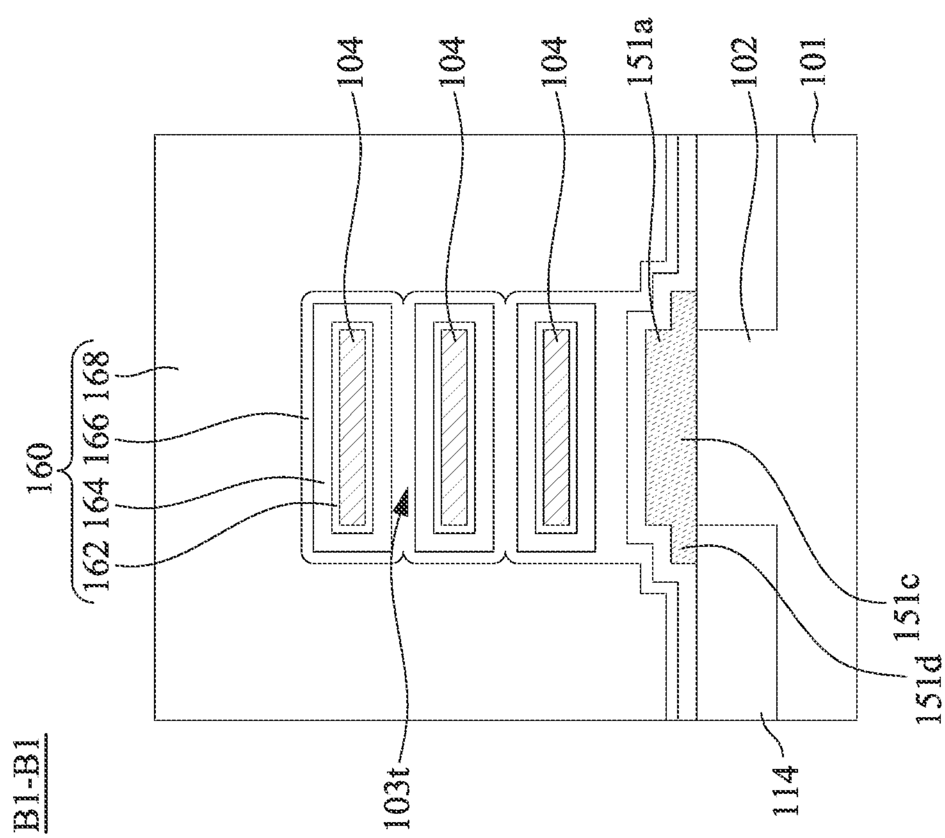

Returning to FIG. 2B, the method M1 then proceeds to block S122 where a gate electrode is formed over the work function metal layer to form a gate structure with the interfacial layer, the high-k dielectric layer, and the work function metal layer. With reference to FIGS. 24A to 24C, in some embodiments of block S122, a gate structure 160 are formed in the gate trench TR2 shown in FIGS. 21A and 21B. In some embodiments, the gate structure 160 includes the interfacial layer 162, the gate dielectric layer 164 over the interfacial layer 162, the work function metal layer 166 over the gate dielectric layer 164, and the gate electrode 168 over the work function metal layer 166. The gate electrode 168 may be formed by PVD, CVD, ALD, or other suitable deposition processes. In some embodiments, after depositing the gate electrode 168 over the work function metal layer 166, a planarization process, for example, chemical mechanical planarization (CMP), is performed to polish the gate electrode 168, the work function metal layer 166, and the gate dielectric layer 164 until a top surface of the ILD layer 135 is exposed to form the gate structure 160.

In some embodiments, the gate electrode 168 may include conductive material, such as, aluminum (Al), platinum (Pt), gold (Au), tungsten (W), titanium (Ti), or any combination thereof. The gate electrode 168 may be deposited by a suitable deposition process, for example, chemical vapor deposition (CVD), plasma-enhanced chemical vapor deposition (PECVD), physical vapor deposition (PVD), plating, thermal or e-beam evaporation, and sputtering.

As shown in FIG. 24A, the isolation layer 151*a* extends along a top surface of the semiconductor strip 102 and passes through a bottom of the gate structure 160 and bottoms of the source/drain structures 131. As shown in FIG. 24B, the isolation layer 151*a* is interposed between the semiconductor strip 102 and the lowest one of the semiconductor layers 103 and extends past opposite sidewalls of the semiconductor strip 102, and therefore the gate structure 160 is spaced apart from the semiconductor strip 102 by the isolation layer 151*a*. As shown in FIG. 24C, the isolation layer 151*a* extends from a top surface of the semiconductor strip 102 into the epitaxy structure 131. Hence, the parasitic leakage current and the parasitic capacitance (e.g., a fringing capacitance on the semiconductor strip 102) of the semiconductor device may be eliminated, which may improve the IOFF of the semiconductor device and in turn beneficial affects the gate control, thereby the device performance may be improved.

Figure 25A:
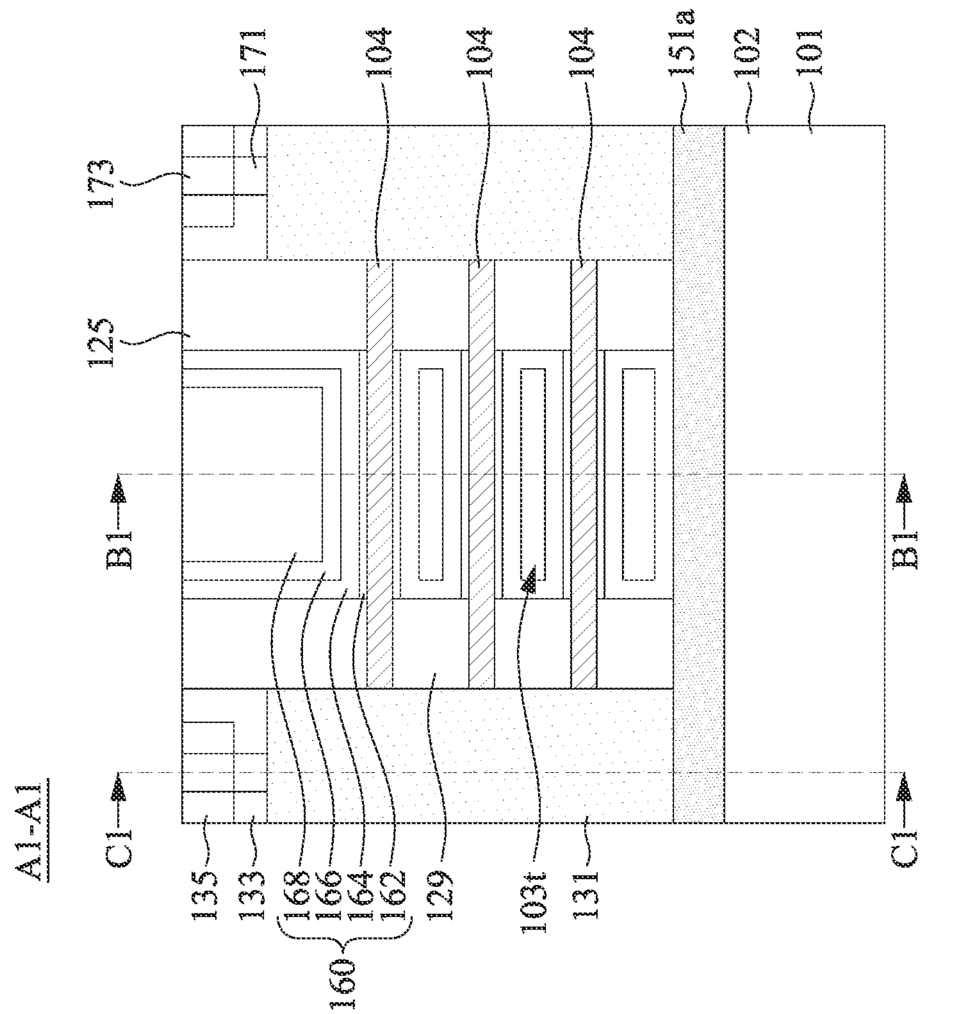
Figure 25B:
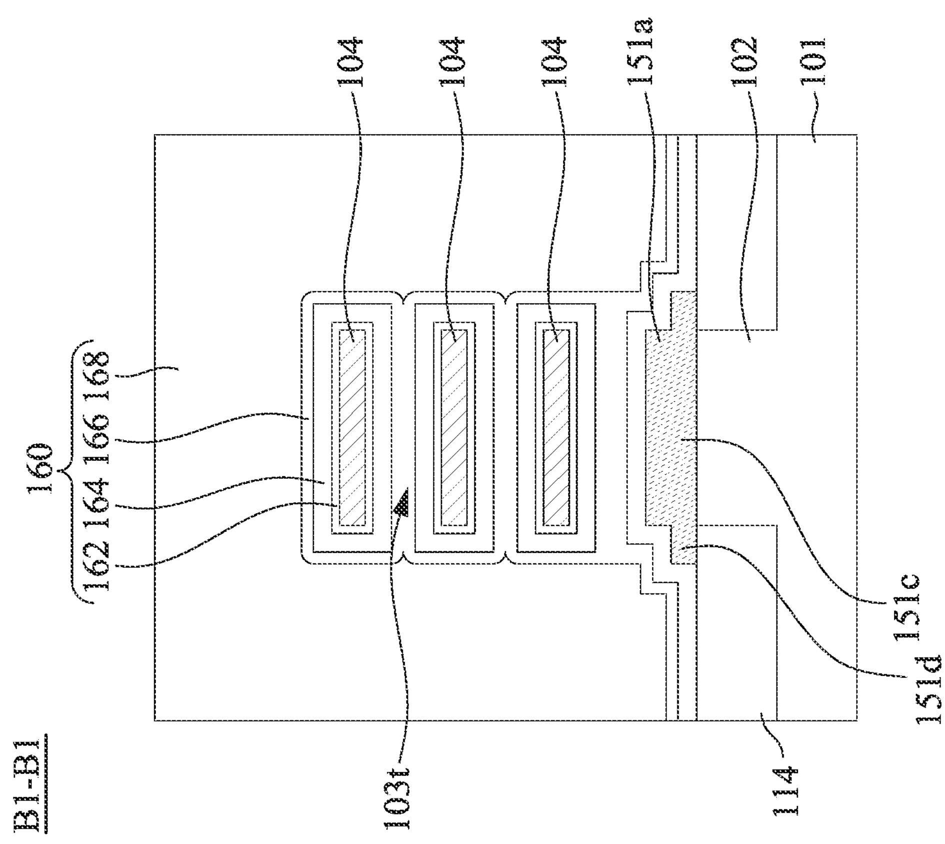
Figure 25C:
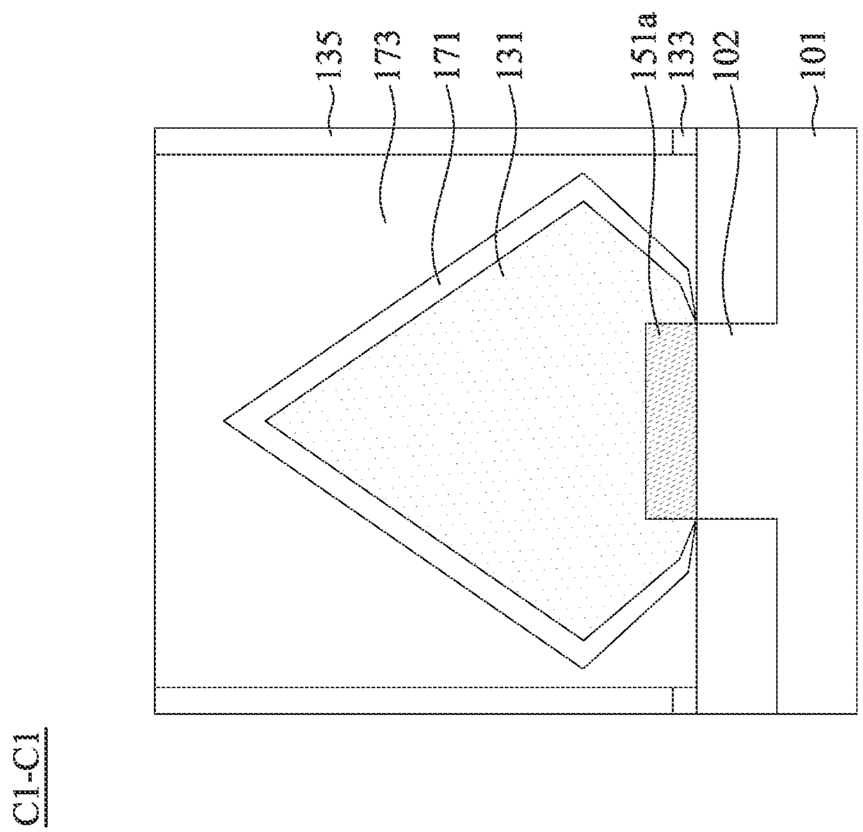
Figure 26A:
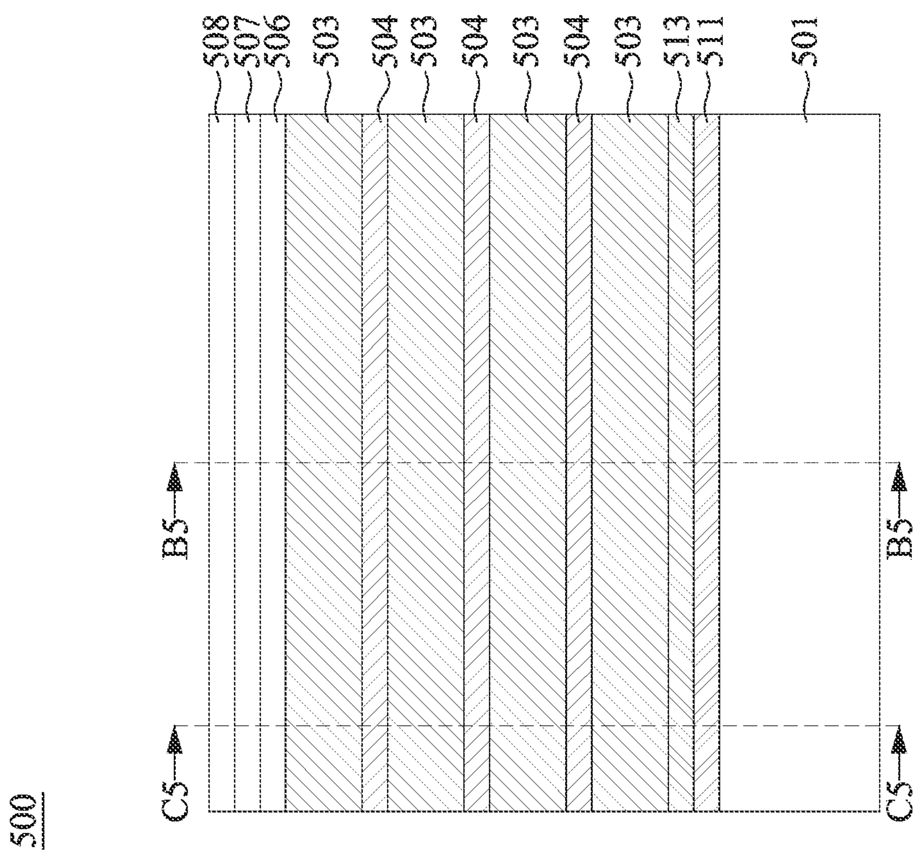
FIGS. 26A to 31C are schematic views of a semiconductor device in accordance with some embodiments of the present disclosure.
Figure 26C:
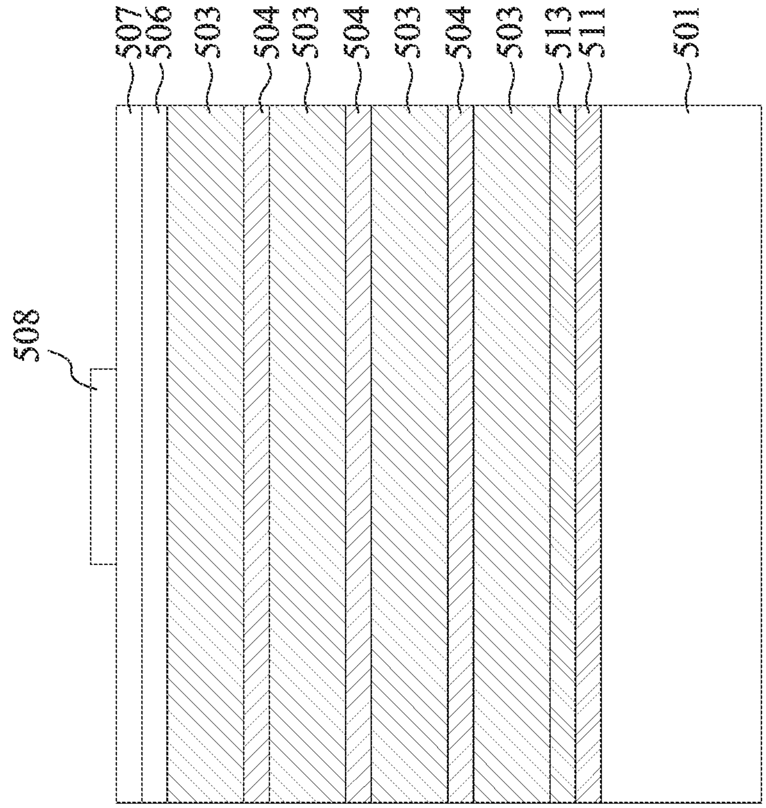
Figure 26B:
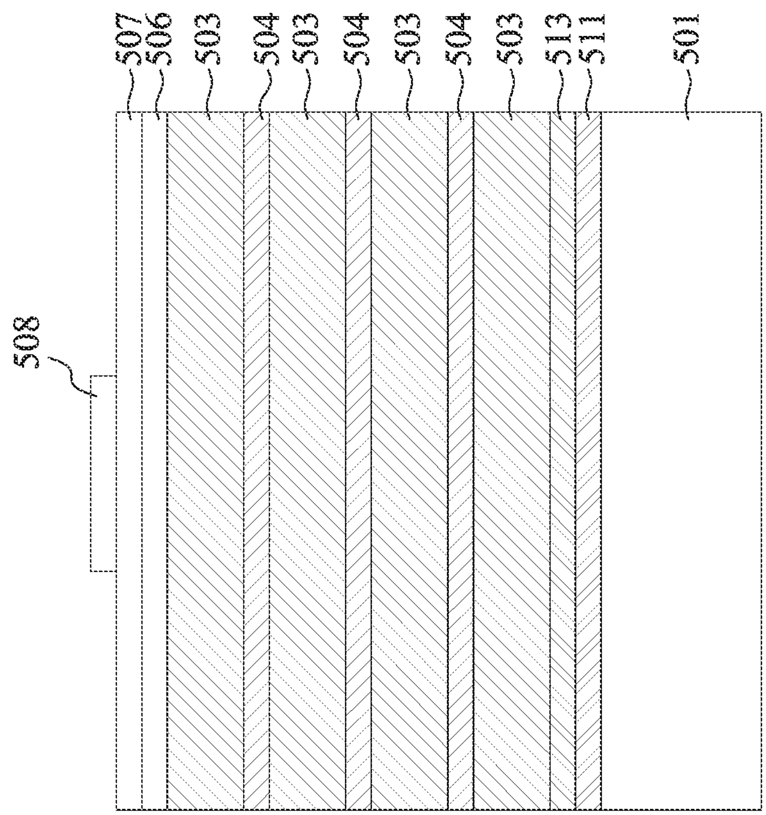

Returning to FIG. 2B, the method M1 then proceeds to block S123 where a plurality of silicide layers are formed over the source/drain structures, and a plurality of contacts are formed to land on the silicide layers. With reference to FIGS. 25A to 25C, in some embodiments of block S123, the silicide layers 171 may include metal silicide, such as $CoSi_2$, $TiSi_2$, $WSi_2$, $NiSi_2$, $MoSi_2$, $TaSi_2$, PtSi, or the like. Subsequently, the contacts 173 are formed to pass through the CESL 133 and the ILD layer 135 and land on the silicide layer 171. In some embodiments, the contacts 173 may include metal, such as tungsten (W), aluminum (Al), copper (Cu), Cobalt (Co), other suitable conductive material, or combinations thereof.

FIGS. 26A to 31C illustrate a method in various stages of fabricating the semiconductor device 500 in accordance with some embodiments of the present disclosure. FIGS. 26A-31A are cross-sectional views corresponding to line A1-A1 in FIG. 1A. FIGS. 26B-31B are cross-sectional views along line B5-B5 in FIGS. 26A-31A and corresponding to line B1-B1 in FIG. 1A. FIGS. 26C-31C are cross-sectional views along line C5-C5 in FIGS. 26A-31A and corresponding to line C1-C1 in FIG. 1A. Operations for forming the semiconductor device 500 are substantially the same as the operations for forming the semiconductor device described in foregoing descriptions and thus are not repeated herein for the sake of clarity. For example, material and manufacturing method of a substrate 501, a semiconductor strip 502, a semiconductor layer 503, a channel layer 504, a pad layer 506, a mask layer 507, a photoresist layer 508, an isolation dielectric 514, a sacrificial layer 511, a hard mask layer 521, a dummy gate structure 523, spacers 525 and 529, an source/drain structure 531, a contact etch stop layer (CESL) 533, an interlayer dielectric (ILD) layer 535, the mask layer 541, the dielectric layer, the gate structure 560 (including an interfacial layer 562, a gate dielectric layer 564, a work function metal layer 566, and a gate electrode 568), the silicide layer 571, and the contacts 573 may be substantially the same as that of the substrate 101, the semiconductor strip 102, the semiconductor layer 103, the channel layer 104, a pad layer 106, a mask layer 107, a photoresist layer 108, the isolation dielectric 114, a sacrificial layer 111, the hard mask layer 121, a dummy gate structure 123, the spacers 125 and 129, the source/drain structure 131, the contact etch stop layer (CESL) 133, the interlayer dielectric (ILD) layer 135, the mask layer 141, the dielectric layer 151, the gate structure 160, the silicide layer 171, and the contacts 173 as shown in FIGS. 3A to 25C, and the related detailed descriptions may refer to the foregoing paragraphs, and are not described again herein.

FIGS. 26A to 31C illustrate another profile of the semiconductor device 500 manufactured using the method M1. The difference between the present embodiment and the embodiment in FIGS. 3A to 25C is that the topmost layer in the stack of alternating semiconductor layers 503 and channel layers 504 over the semiconductor strip 502 is the semiconductor layer 503 not the channel layers 504 as shown in FIGS. 3A to 3C. Therefore, in FIGS. 26A to 26C, the semiconductor layer 503 is in contact with the pad layer 206. In other words, the topmost channel layer 504 in the stack is spaced apart from the pad layer 206 by the semiconductor layer 503.

Figure 27A:
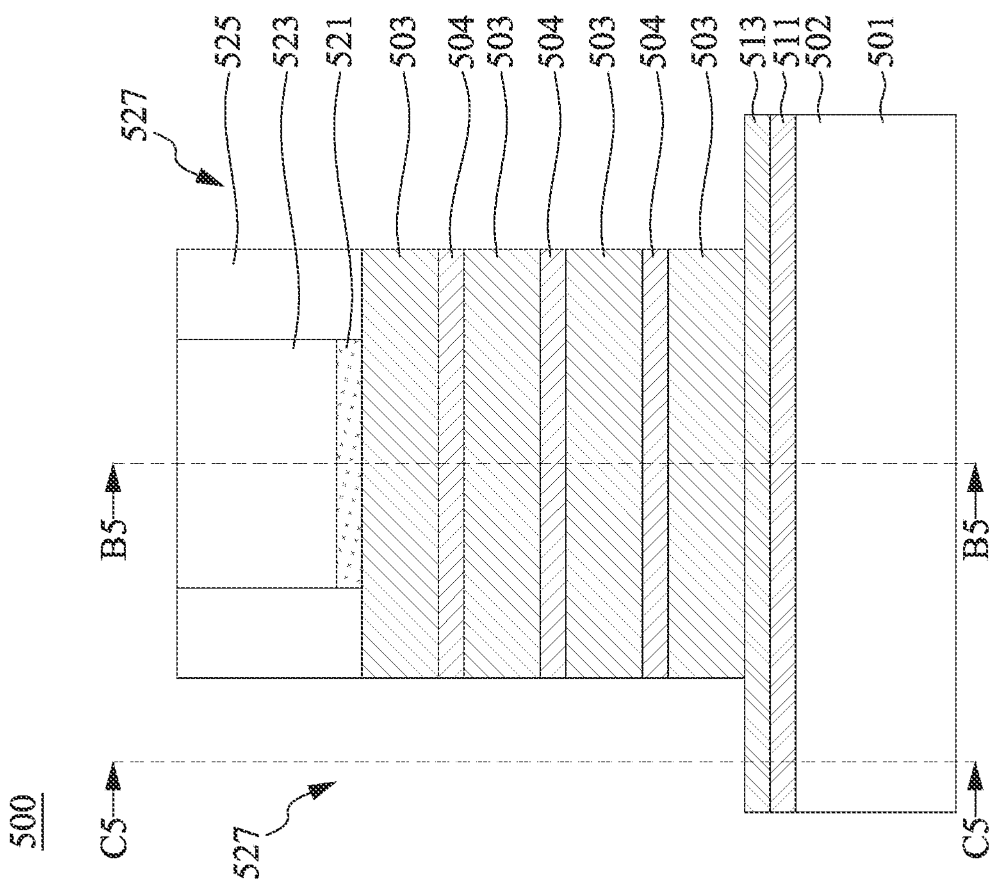
Figure 27C:
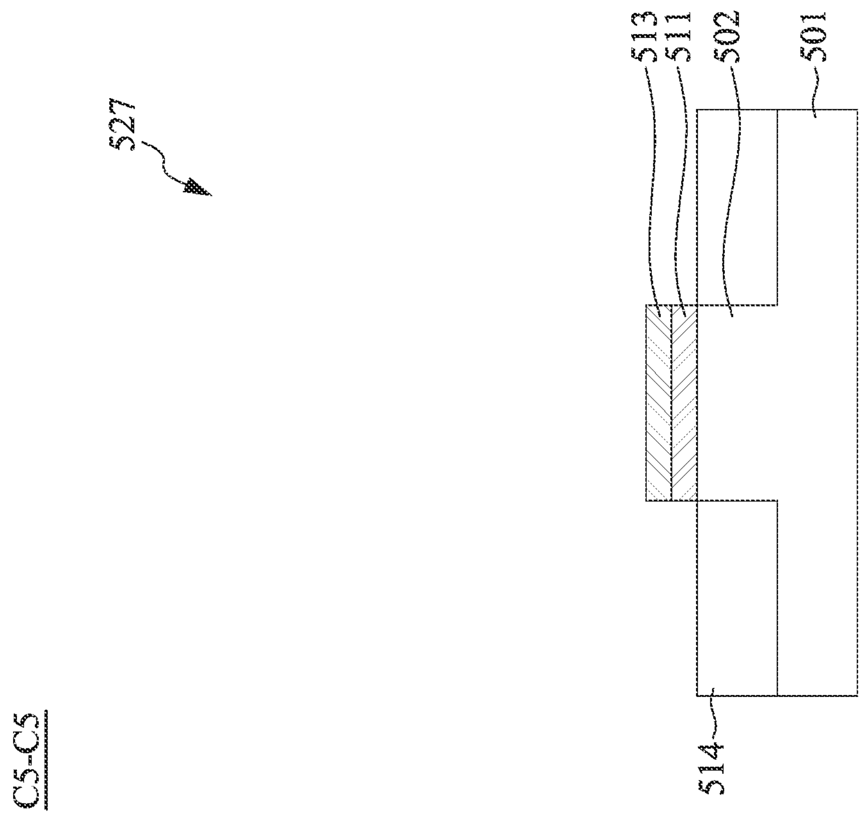
Figure 27B:
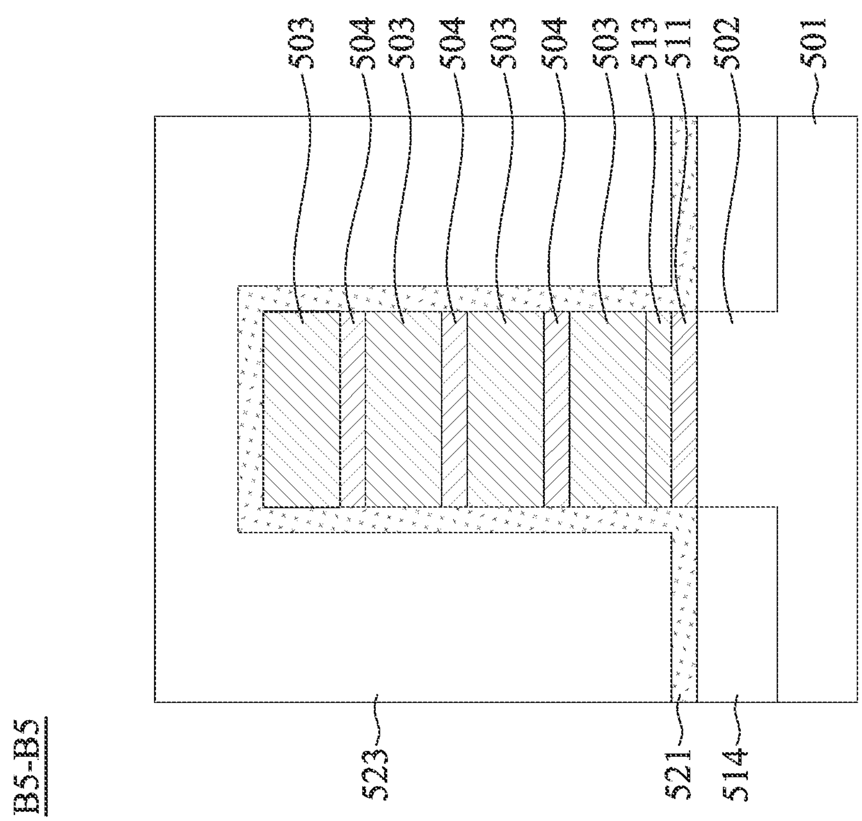

Reference is made to FIGS. 27A to 27C corresponding to FIGS. 10A to 10C where the channel layers 504 and the semiconductor layers 503 not overlapped by the gate spacers 525 and the dummy gate structure 523 are removed. An etch process may be performed on portions of the semiconductor layers 503 and the channel layers 504 exposed from the dummy gate structure 523 and the gate spacers 525 (i.e., outside the dummy gate structure 523 and the gate spacers 525). As such, the exposed semiconductor layers 503 and the channel layers 504 are removed to expose the sacrificial layers 511 and 513 and the isolation dielectric 514. The recesses 527 are formed in the semiconductor layers 503 and the channel layers 504.

Figure 28A:
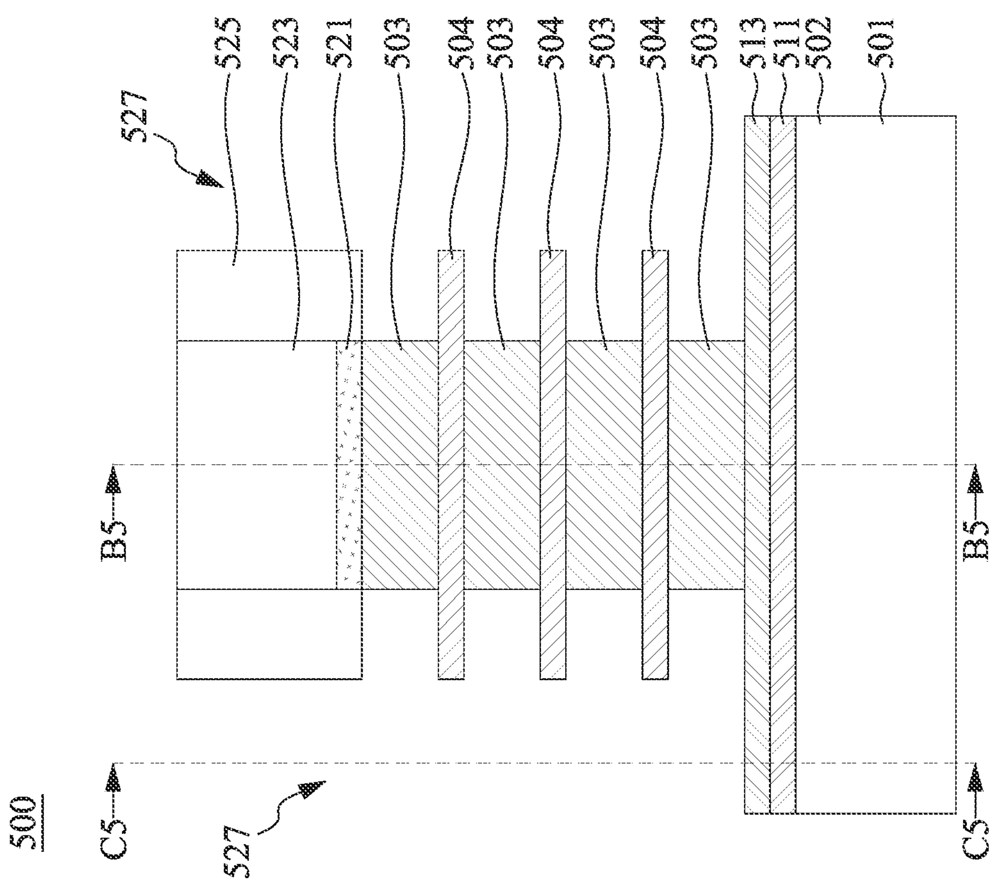
Figure 28C:
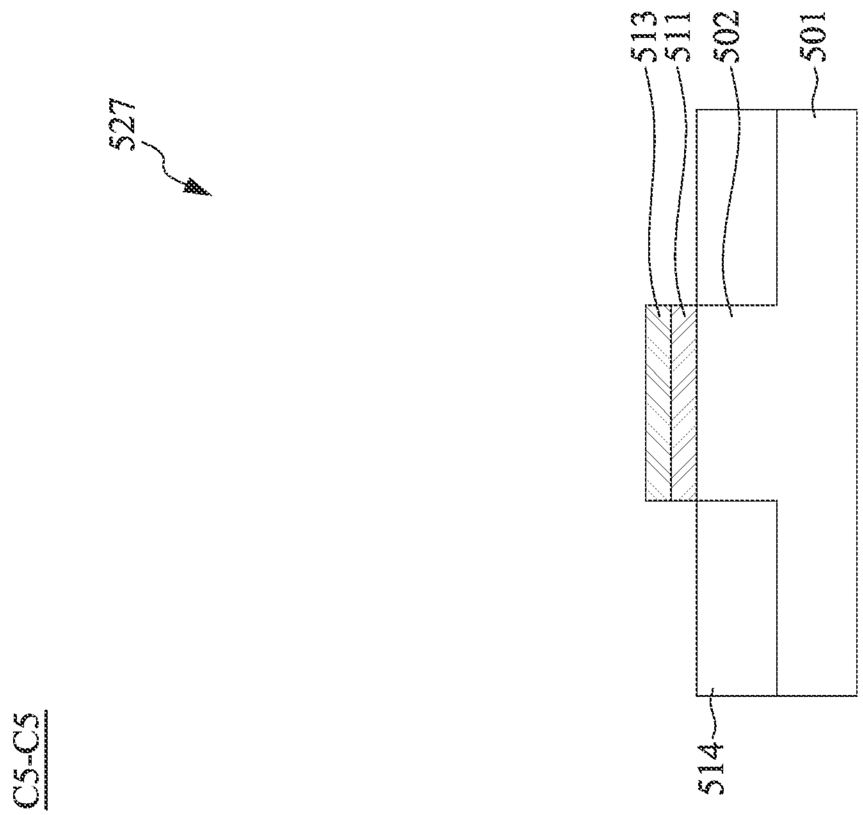
Figure 28B:
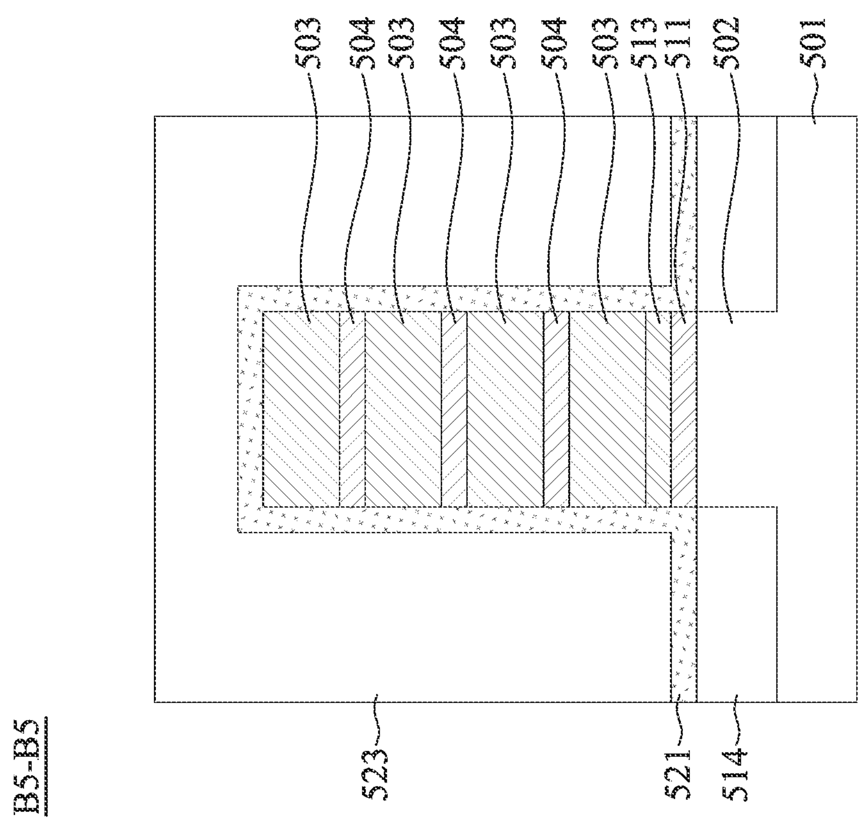

Reference is made to FIGS. 28A to 28C corresponding to FIGS. 11A to 11C where the semiconductor layers 503 are laterally recessed relative to sidewalls of the channel layers 504 to form recesses therein. An etch process is performed to laterally shorten the semiconductor layers 503 through the recesses 527, so as to form spaces adjacent to the channel layer 504. In some embodiments, the channel layers 504 remain substantially intact after removing the portions of the semiconductor layers 503 due to the nature of the anisotropic etching process that selectively etches the material of the semiconductor layers 503 at a faster etch rate than it etches the channel layers 504. The shortened length of the semiconductor layer 503 depends on process conditions of the anisotropic etching process (e.g., etching time duration and/or the like).

Figure 29A:
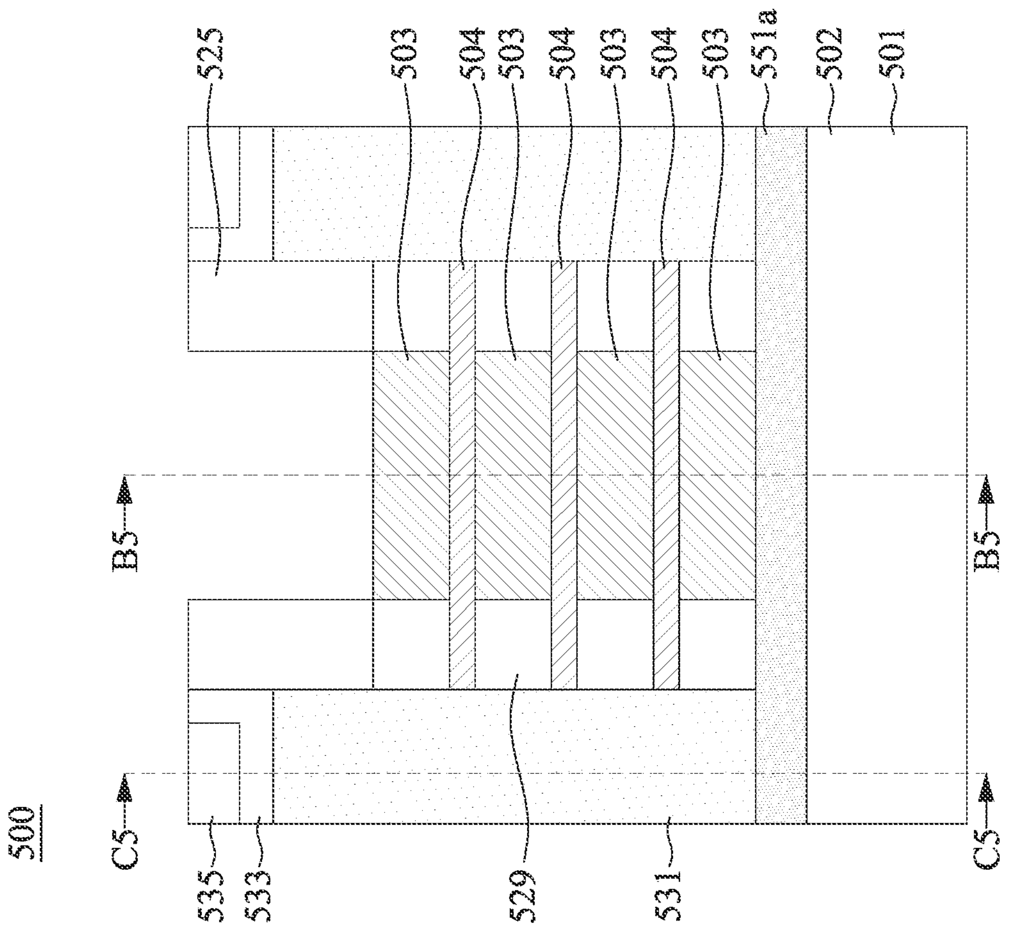
Figure 29C:
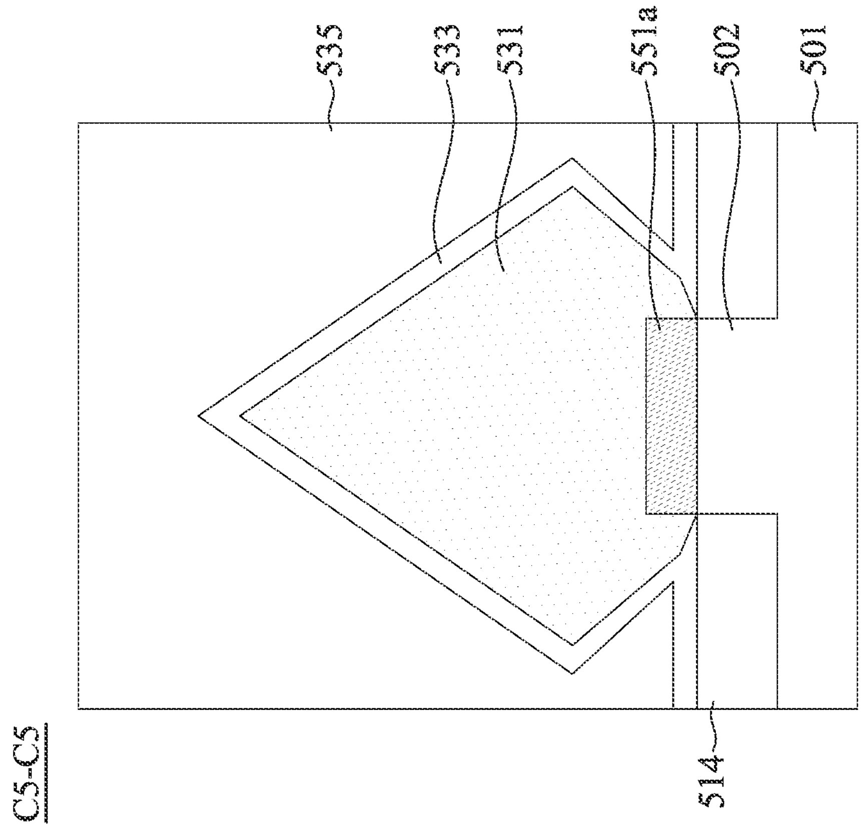
Figure 29B:
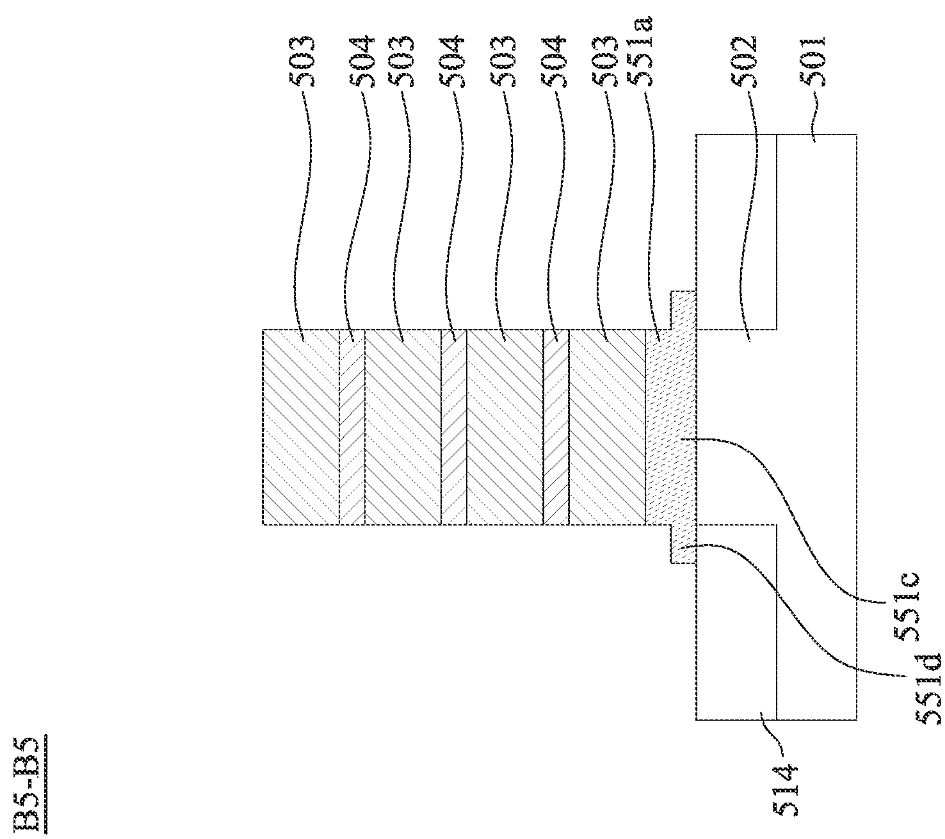

Reference is made to FIGS. 29A to 29C corresponding to FIGS. 21A to 21C where the dummy gate structure 523 and the hard mask layer 521 are removed (as shown in FIGS. 21A and 21B) to form a gate trench, but the semiconductor layers 503, the channel layers 504, the gate spacers 525, the inner spacers 529, and the first remainder 551*a* (may be also referred to as an isolation layer 551*a*) of the dielectric layer remain. In some embodiments, the isolation layer 551*a* may be replaced by an air gap. Because the topmost layer in the stack of alternating semiconductor layers 503 and channel layers 504 over the semiconductor strip 502 is the semiconductor layer 503, during the removing of the dummy gate structure 523 and the hard mask layer 521, the semiconductor layer 503 can protect the channel layers 504 underneath it from being damaged by the removal process.

Figure 30A:
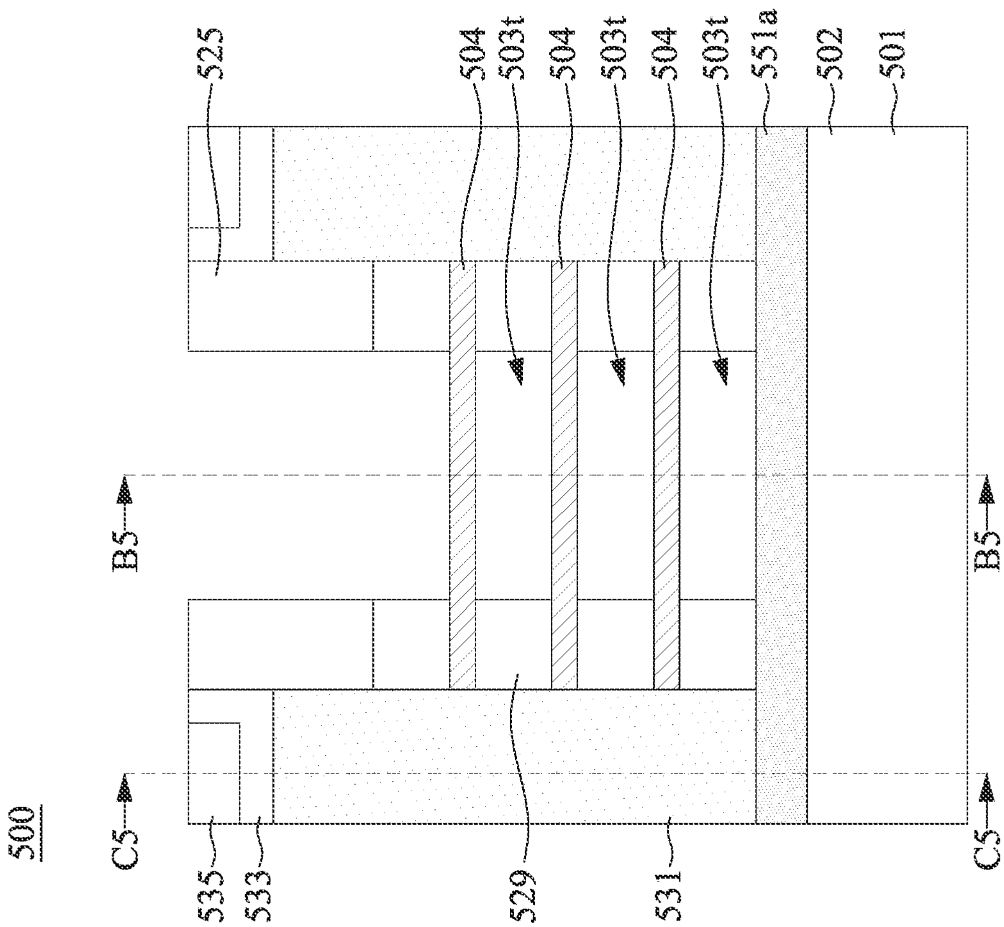
Figure 30B:
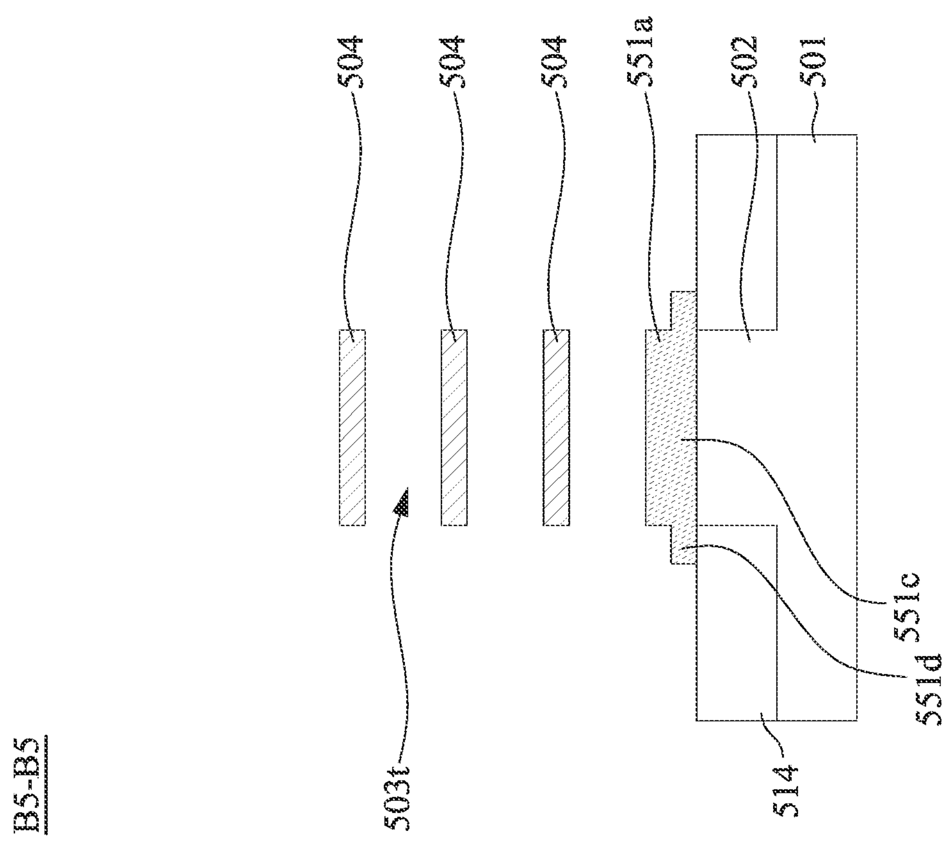
Figure 30C:
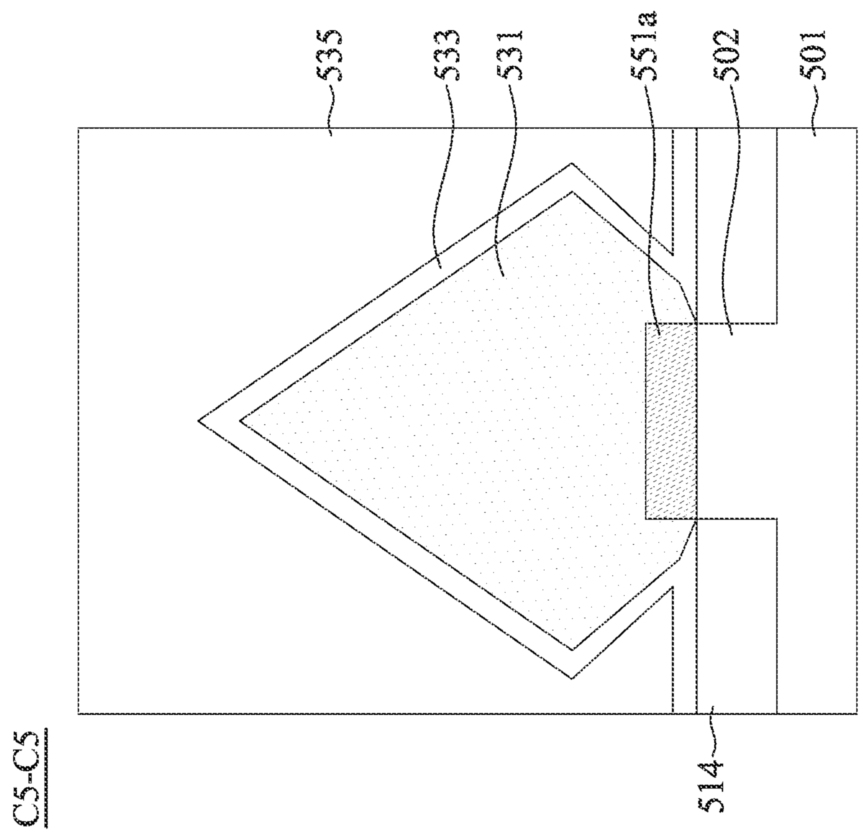

Reference is made to FIGS. 30A to 30C corresponding to FIGS. 22A to 22C where the semiconductor layers 503 are removed by suitable process, leaving spaces between the inner spacers 529 to form trenches 503*t* (shown in FIGS. 30A and 30B), but the channel layers 504, the gate spacers 525, and the inner spacers 529 remain. The channel layers 504 are released from the semiconductor strip 502 and the isolation layer 551*a* and spaced apart from each other. The isolation layer 551*a* is then exposed from the trenches 503*t*, while the source/drain structures 531 are still under the coverage of the CESL 533 and the ILD layer 535.

Figure 31A:
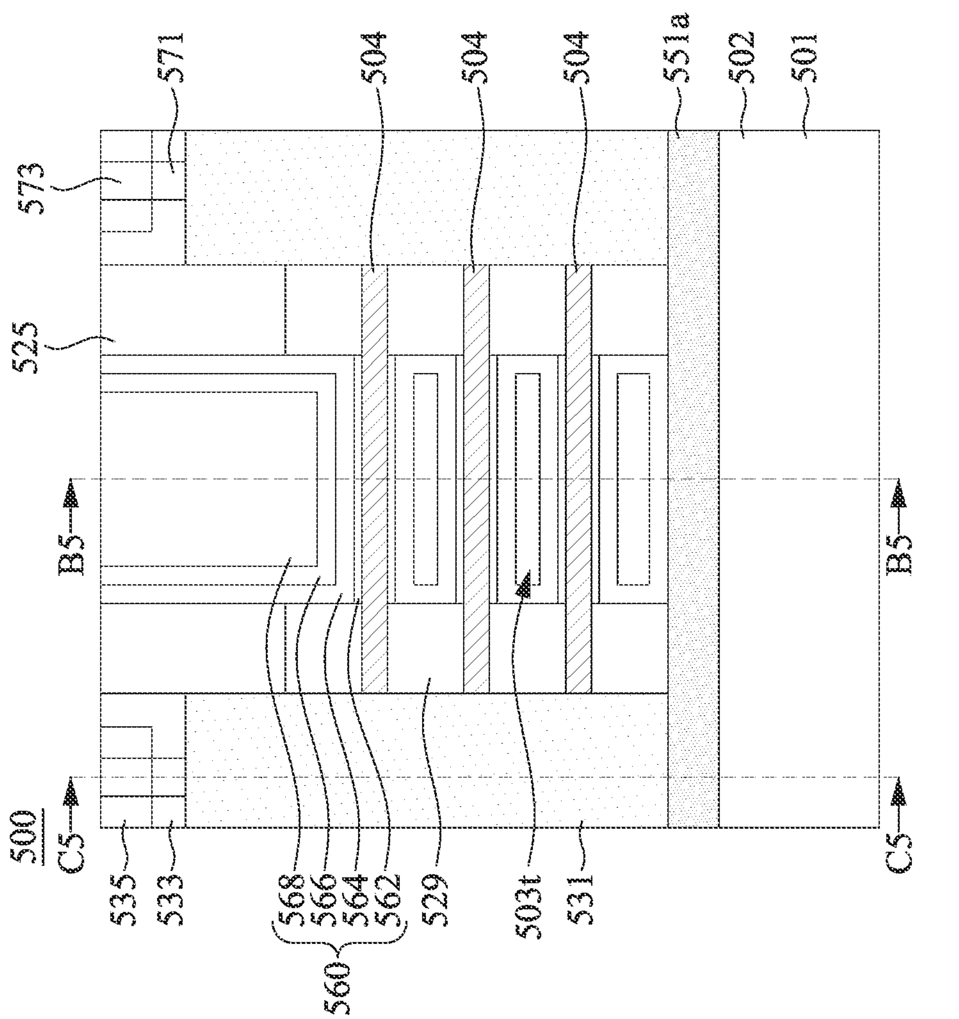
Figure 31C:
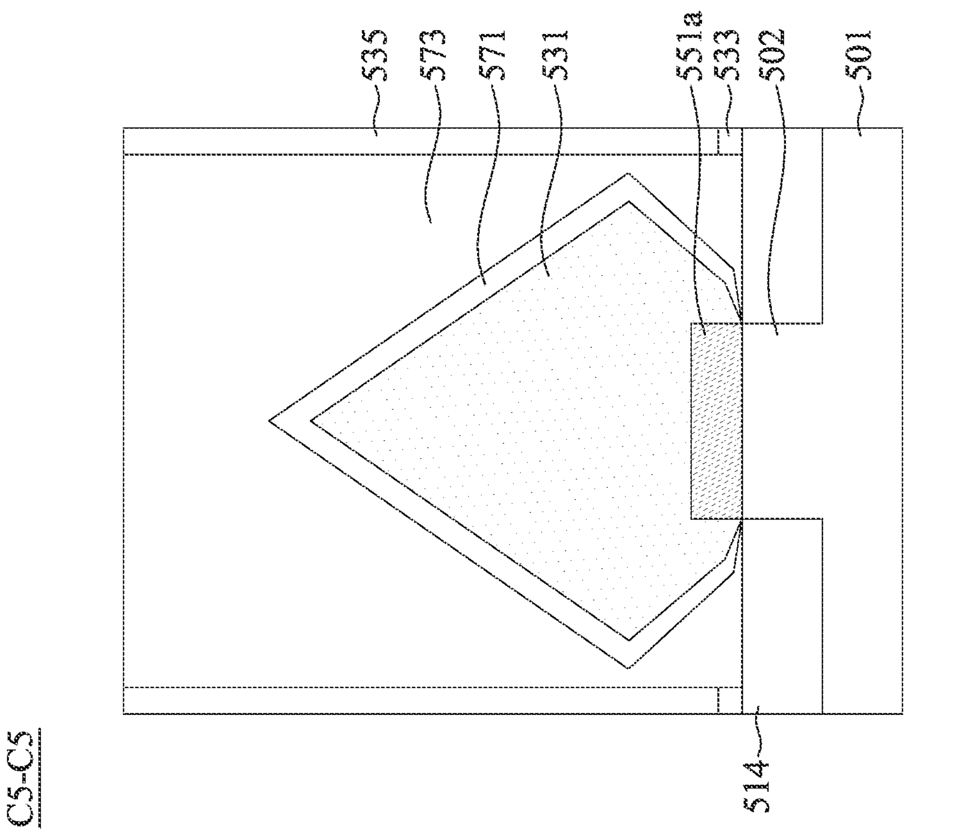
Figure 31B:
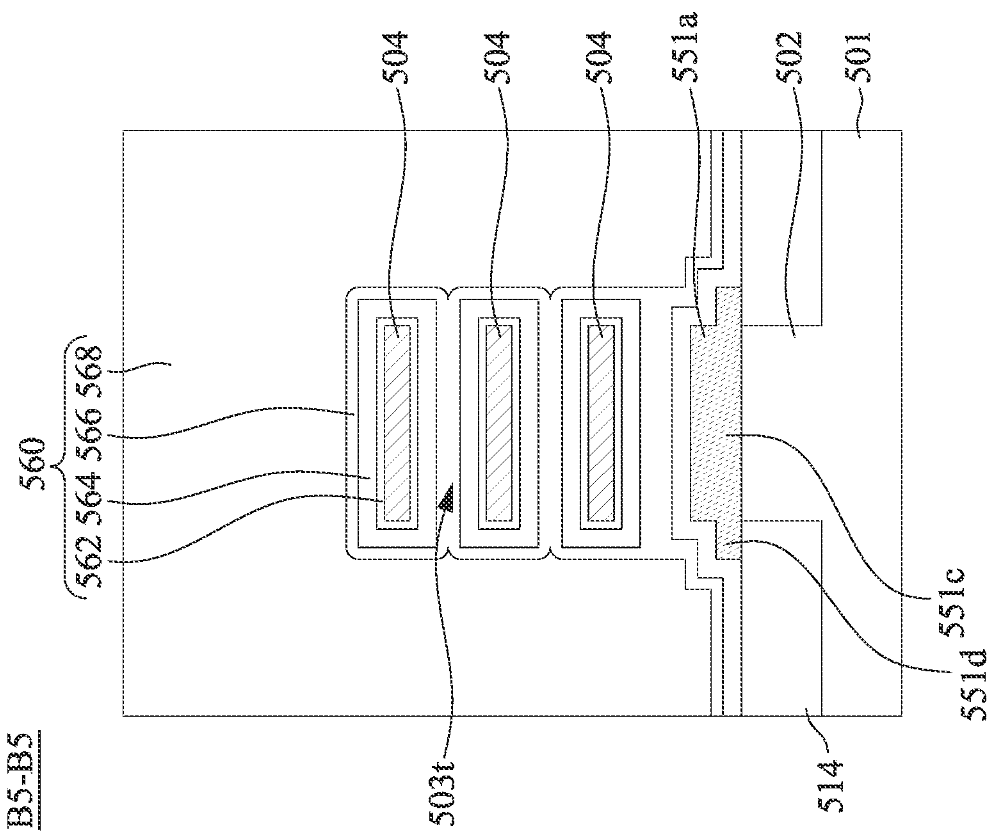

Reference is made to FIGS. 31A to 31C corresponding to FIGS. 25A to 25C. In FIG. 31A, the isolation layer 551*a* extends along a top surface of the semiconductor strip 502 and passes through a bottom of the gate structure 560 and bottoms of the source/drain structures 531. In FIG. 31B, the isolation layer 551*a* is interposed between the semiconductor strip 502 and the gate structure 560 and extends past opposite sidewalls of the semiconductor strip 502, and therefore the gate structure 560 is spaced apart from the semiconductor strip 502 by the isolation layer 551*a*. In greater detail, the isolation layer 551*a* has a greater width than the semiconductor strip 502. The isolation layer 551*a* has a first portion 551*c* on the semiconductor strip 502 and a second portion 551*d* on the isolation dielectric 514. The first portion 551*c* of the isolation layer 551*a* has a thicker thickness than the second portion 551*d* of the isolation layer 551*a*, such that the isolation layer 551*a* has a convex top surface. In FIG. 31C, the isolation layer 551*a* extends from a top surface of the semiconductor strip 502 into the epitaxy structure 531. Hence, the forming of the isolation layer 551*a* can not only reduce the parasitic leakage current but also reduce the parasitic capacitance of the semiconductor device.

Figure 32A:
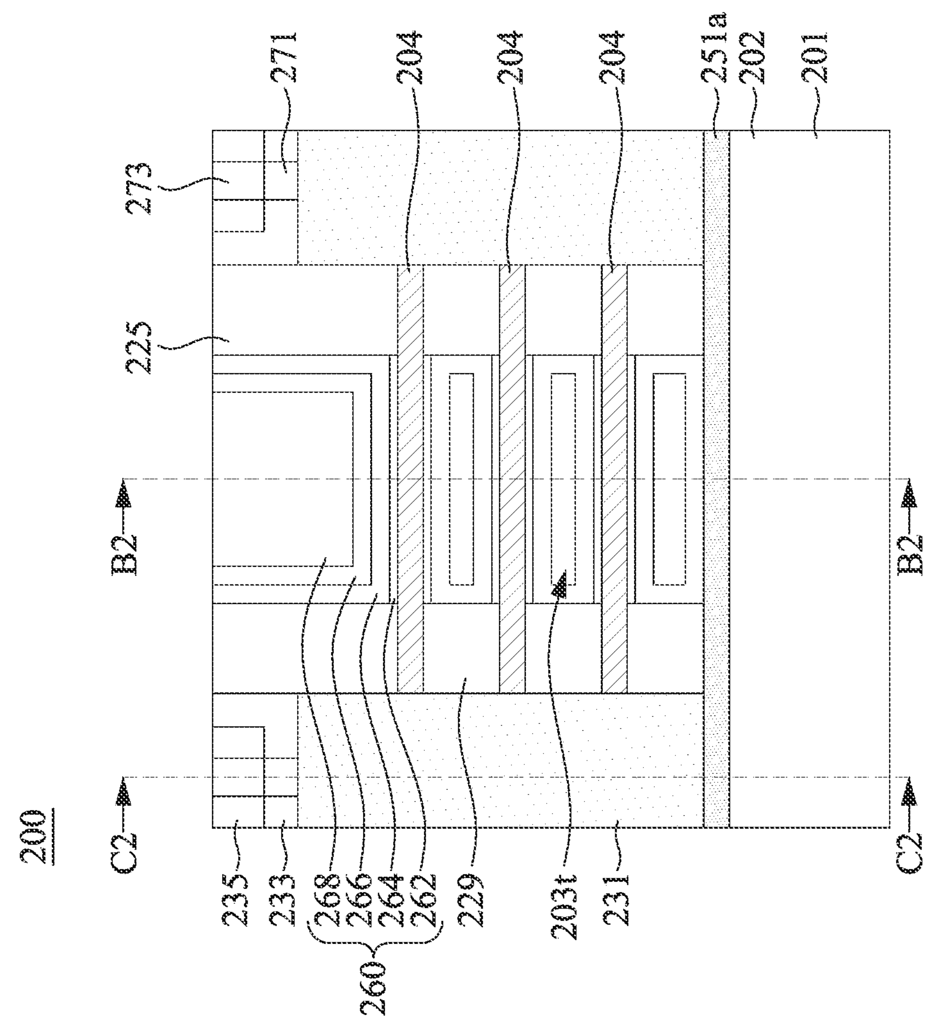
FIGS. 32A to 32C are schematic views of a semiconductor device in accordance with some embodiments of the present disclosure.
Figure 32B:
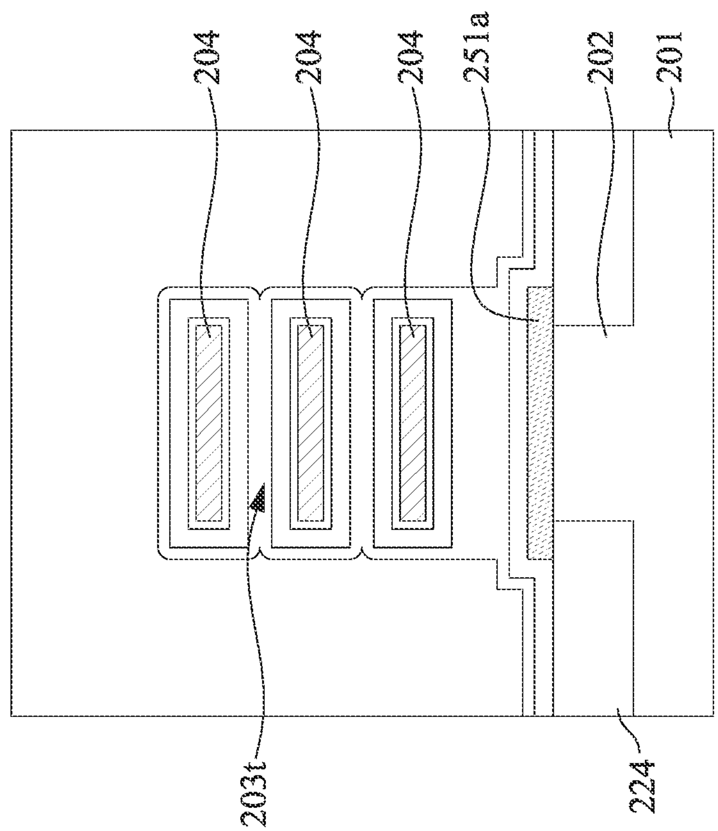
Figure 32C:
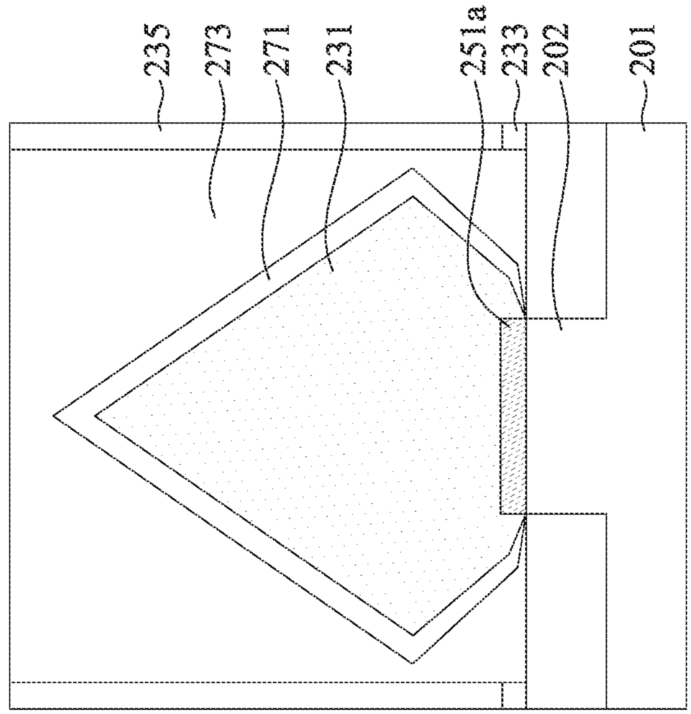

FIGS. 32A to 32C are schematic views of another semiconductor device in accordance with some embodiments of the present disclosure, in which FIG. 32A is a cross-sectional view corresponding to line A1-A1 in FIG. 1A, FIG. 32B is a cross-sectional view along line B2-B2 in FIG. 32A and corresponding to line B1-B1 in FIG. 1A, and FIG. 32C is a cross-sectional view along line C2-C2 in FIG. 32A corresponding to line C1-C1 in FIG. 1A. It is noted that some elements are not illustrated in in FIGS. 32A to 32C for brevity. The same or similar configurations and/or materials as described with FIGS. 1B to 1D may be employed in FIGS. 32A to 32C, and the detailed explanation may be omitted. In some embodiments, configurations and/or materials of a substrate 201, a semiconductor strip 202, trenches 203*t*, a channel layer 204, an isolation dielectric 224, a gate structure 260 (including an interfacial layer 262, a gate dielectric layer 264, a work function metal layer 266, and a gate electrode 268), spacers 225 and 229, a source/drain structure 231, a contact etch stop layer (CESL) 233, and an interlayer dielectric (ILD) layer 235 as shown in FIGS. 32A to 32C may be substantially the same as or comparable to that of the substrate 101, the semiconductor strip 102, trenches 103*t*, the channel layer 104, the isolation dielectric 114, the gate structure 160, spacers 125 and 129, source/drain structure 131, the CESL 133, and the ILD layer 135 as shown in FIGS. 1B and 1D, and the related detailed descriptions may refer to the foregoing paragraphs, and are not described again herein. The difference between the present embodiment and the embodiment in FIGS. 32A to 32C is that an isolation layer 251*a* of the present embodiment replaces the isolation layer 151*a* shown in FIGS. 1B to 1D.

In FIG. 32A, the isolation layer 251*a* extends along a top surface of the semiconductor strip 202 and passes through a bottom of the gate structure 260 and bottoms of the source/drain structures 231. In FIG. 32B, the isolation layer 251*a* is interposed between the semiconductor strip 202 and the gate structure 260 and extends past opposite sidewalls of the semiconductor strip 202, and therefore the gate structure 260 is spaced apart from the semiconductor strip 202 by the isolation layer 251*a*. In some embodiments, the isolation layer 251*a* has a flat top surface. In FIG. 32C, the isolation layer 251*a* extends from a top surface of the semiconductor strip 202 into the epitaxy structure 231. Hence, the forming of the isolation layer 251*a* can not only reduce the parasitic leakage current but also reduce the parasitic capacitance of the semiconductor device. In some embodiments, the isolation layer 251*a* may include $SiO_2$, $Si_3N_4$, $SiO_xN_y$, SiC, SiCN films, SiOC, SiOCN films, and/or combinations thereof. In some embodiments, the isolation layer 251*a* may be replaced by an air gap.

Figure 33A:
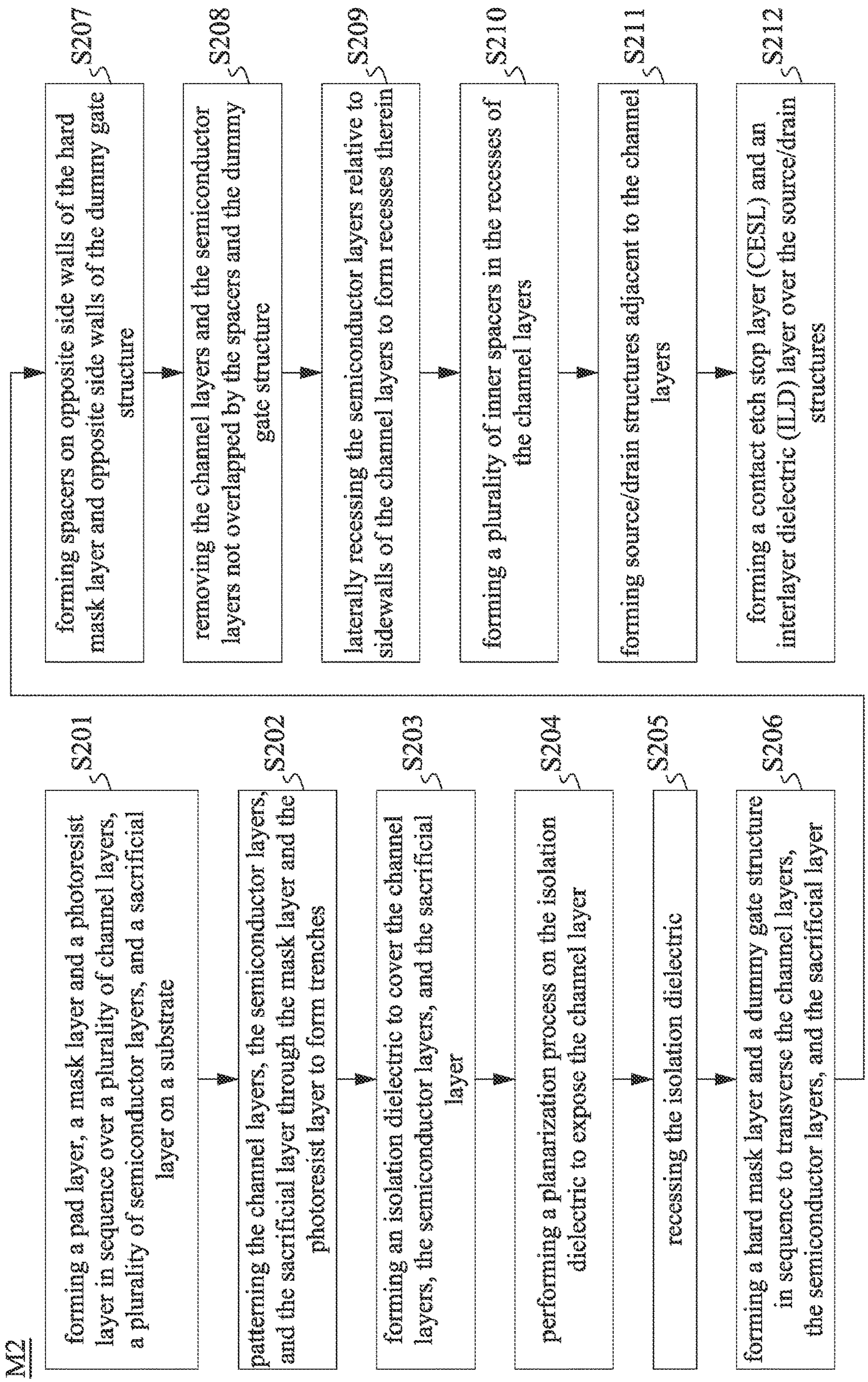
FIGS. 33A and 33B are a method M2 of manufacturing a semiconductor device in accordance with some embodiments of the present disclosure.
Figure 33B:
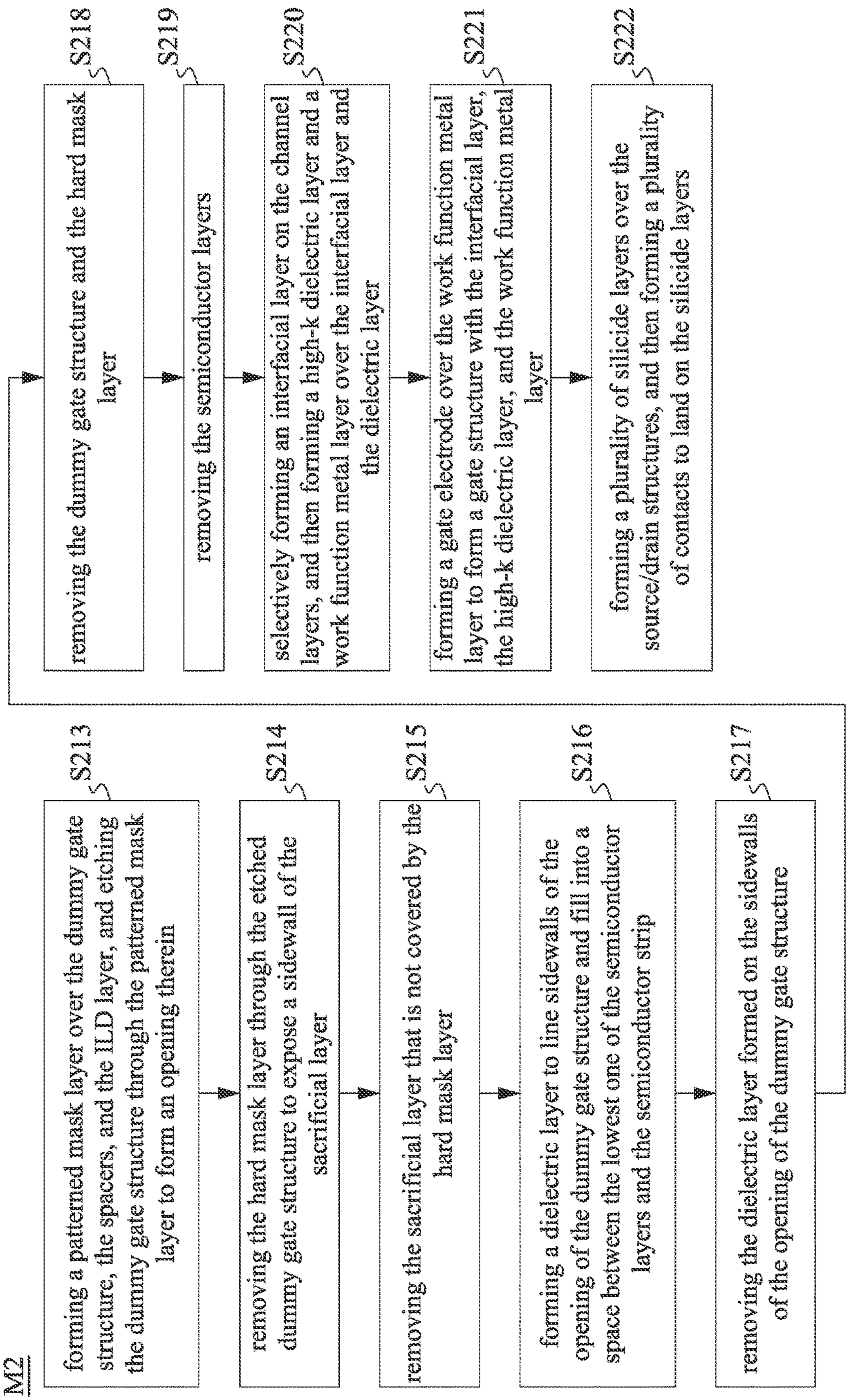

Referring now to FIGS. 33A and 33B, illustrated is an exemplary method M2 for fabrication of a semiconductor device in accordance with some embodiments. The method M2 includes a relevant part of the entire manufacturing process. It is understood that additional operations may be provided before, during, and after the operations shown by FIGS. 33A and 33B, and some of the operations described below can be replaced or eliminated for additional embodiments of the method. The order of the operations/processes may be interchangeable. It is noted that FIGS. 33A and 33B have been simplified for a better understanding of the disclosed embodiment.

FIGS. 34A to 41C illustrate a method in various stages of fabricating the semiconductor device 200 in accordance with some embodiments of the present disclosure. FIGS. 34A-41A are cross-sectional views corresponding to line A1-A1 in FIG. 1A. FIGS. 34B-41B are cross-sectional views along line B2-B2 in FIGS. 34A-41A and corresponding to line B1-B1 in FIG. 1A. FIGS. 34C-41C are cross-sectional views along line C2-C2 in FIGS. 34A-41A and corresponding to line C1-C1 in FIG. 1A.

Figure 34A:
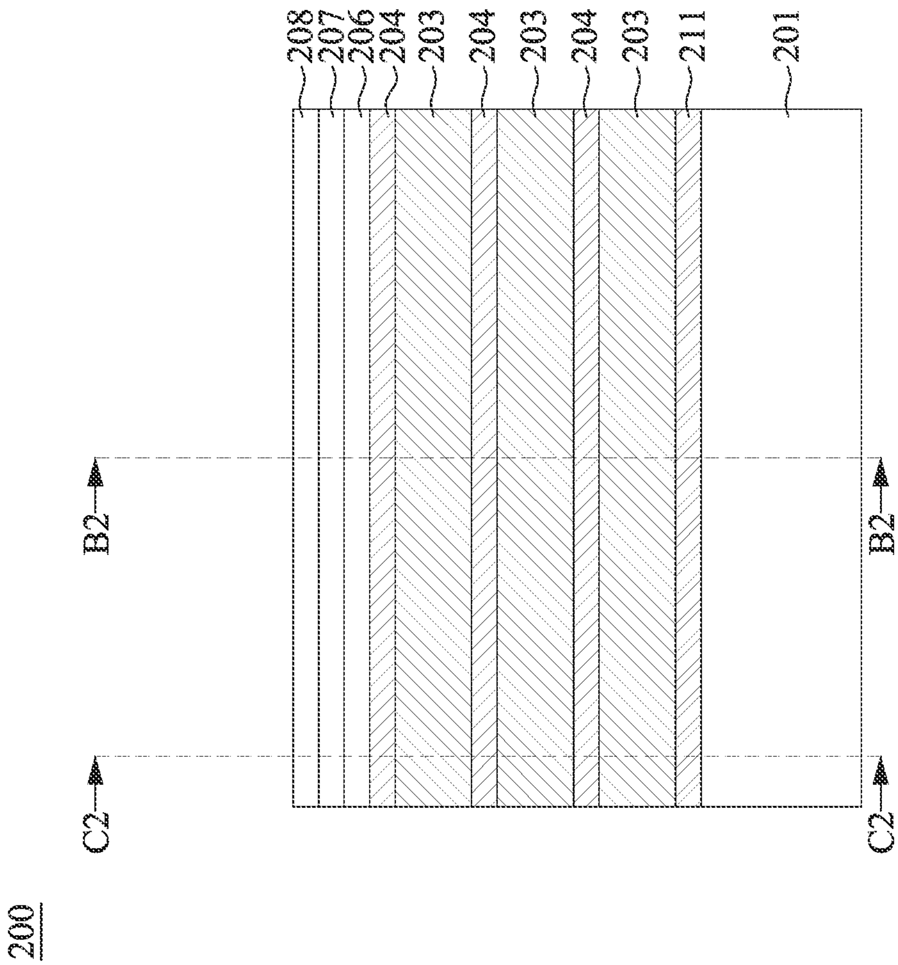
FIGS. 34A to 41C are schematic views of a semiconductor device in accordance with some embodiments of the present disclosure.
Figure 34C:
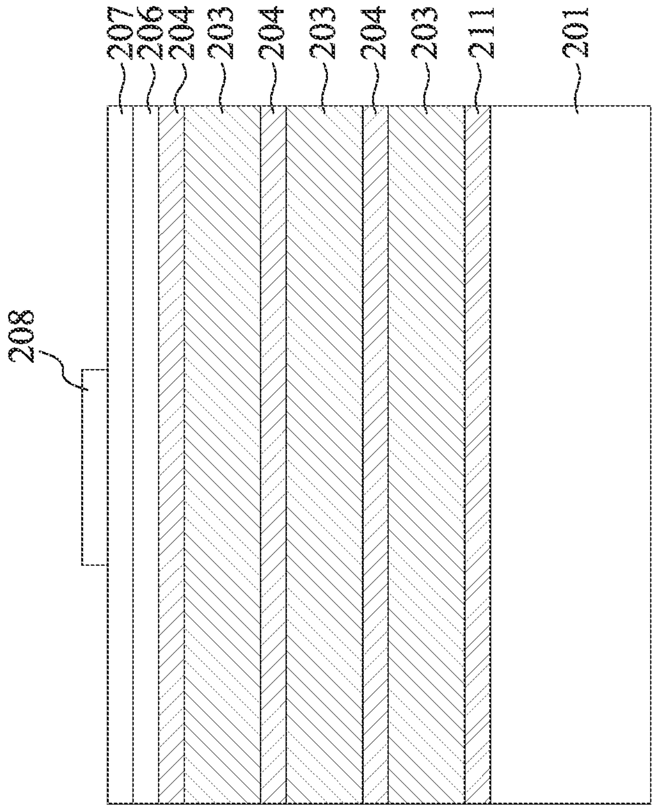
Figure 34B:
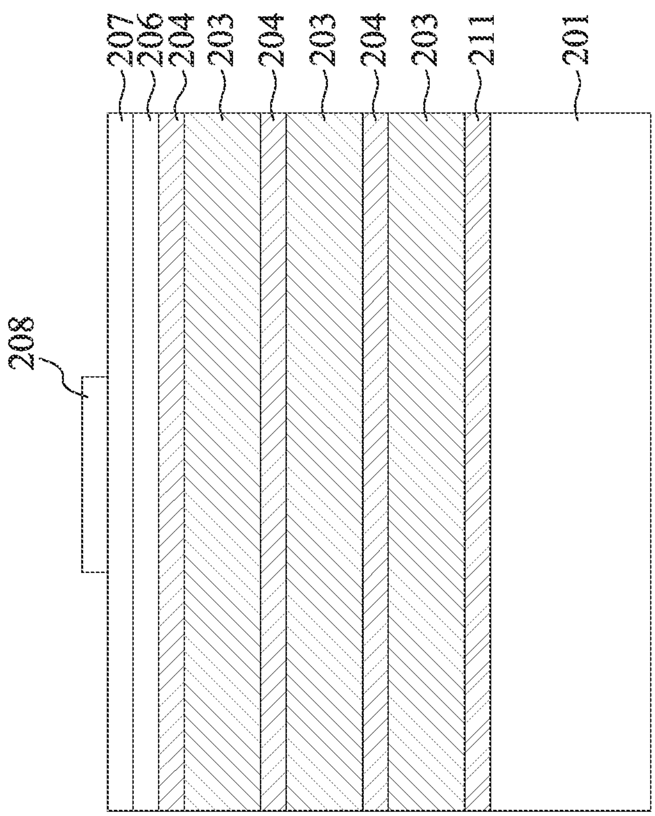

The method M2 begins at block S201 where a pad layer, a mask layer and a photoresist layer are formed in sequence over a sacrificial layer on a substrate and a plurality of channel layers and a plurality of semiconductor layers on the sacrificial layer, as illustrated in FIGS. 34A to 34C. In some embodiments, material and manufacturing method of the a substrate 201, a semiconductor layer 203, a channel layer 204, a pad layer 206, a mask layer 207 and a patterned photoresist layer 208 may be substantially the same as that of the substrate 101, a semiconductor layer 103, the channel layer 104, and the pad layer 106, the mask layer 107 and the patterned photoresist layer 108 as shown in FIGS. 3A to 3C, and the related detailed descriptions may refer to the foregoing paragraphs, and are not described again herein. The difference between the present embodiment and the embodiment in FIGS. 3A to 3C is that a single sacrificial layer of the present embodiment replaces a pair of sacrificial layers shown in FIGS. 3A to 3C.

As shown in FIGS. 34A to 34C, a sacrificial layer 211 is formed over the substrate 201 and a plurality of semiconductor layers 203 and a plurality of channel layers 204 are alternately formed over the sacrificial layer 211.

In some embodiments, the sacrificial layer 211 and the semiconductor layer 203 have the same material and/or components, but ratios of the material components thereof are different from each other, such that the sacrificial layer 211 and the semiconductor layers 203 have different etching rates. For example, the sacrificial layer 211 and the semiconductor layer 203 are made from SiGe. The sacrificial layer 211 has a different germanium atomic percentage concentration than the lowermost one of the semiconductor layer 203. In some embodiments, the sacrificial layer 211 has a lower germanium atomic percentage concentration than the lowermost one of the semiconductor layer 203. In FIGS. 34A to 34C, the germanium percentage (atomic percentage concentration) of the sacrificial layer 211 is in the range between about 5 percent and about 40 percent, e.g., about 15 percent, while higher or lower germanium percentages may be used, the proportion between Si and Ge may vary from embodiments, and the disclosure is not limited thereto. In some embodiments, the sacrificial layer 211 has a higher germanium atomic percentage concentration than the lowermost one of the semiconductor layer 203. In some embodiments, the sacrificial layer 211 and the semiconductor layers 203 may have different material and/or components, such that the sacrificial layer 211 and the semiconductor layers 203 have different etching rates.

In some embodiments, the sacrificial layer 211 may be formed by chemical vapor deposition (CVD), molecular beam epitaxy (MBE), or other suitable process(es). In some embodiments, the sacrificial layer 211 may be formed by an epitaxy growth process, and thus the sacrificial layer 211 can also be referred to as an epitaxial layer in this content.

Figure 35A:
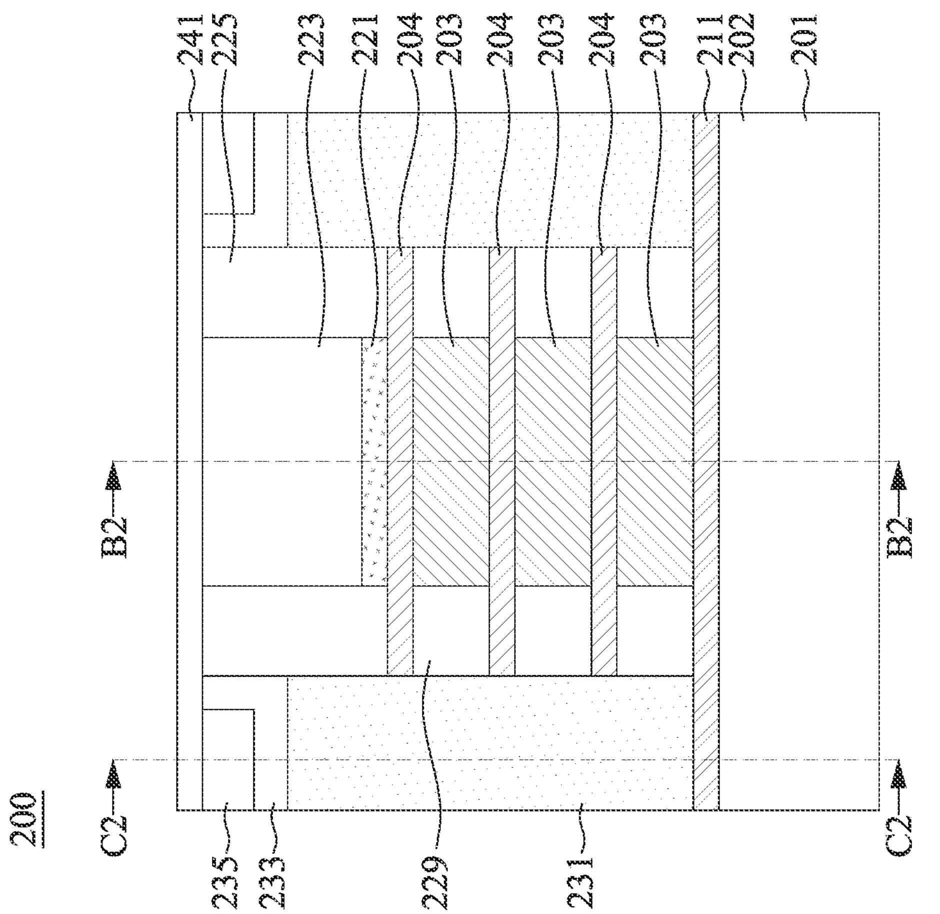
Figure 35C:
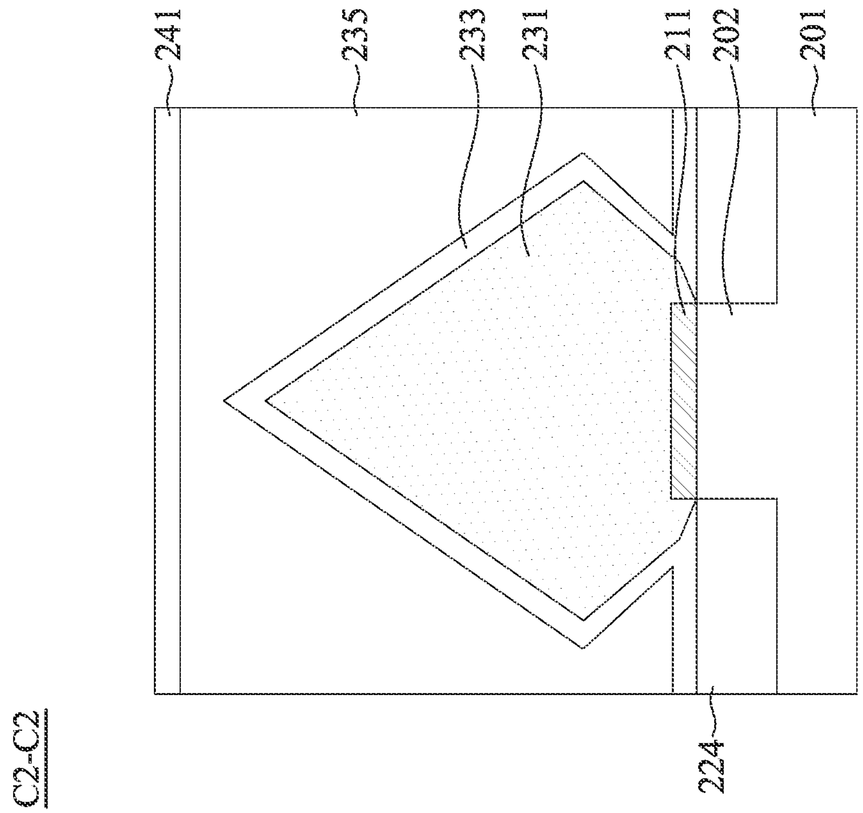
Figure 35B:
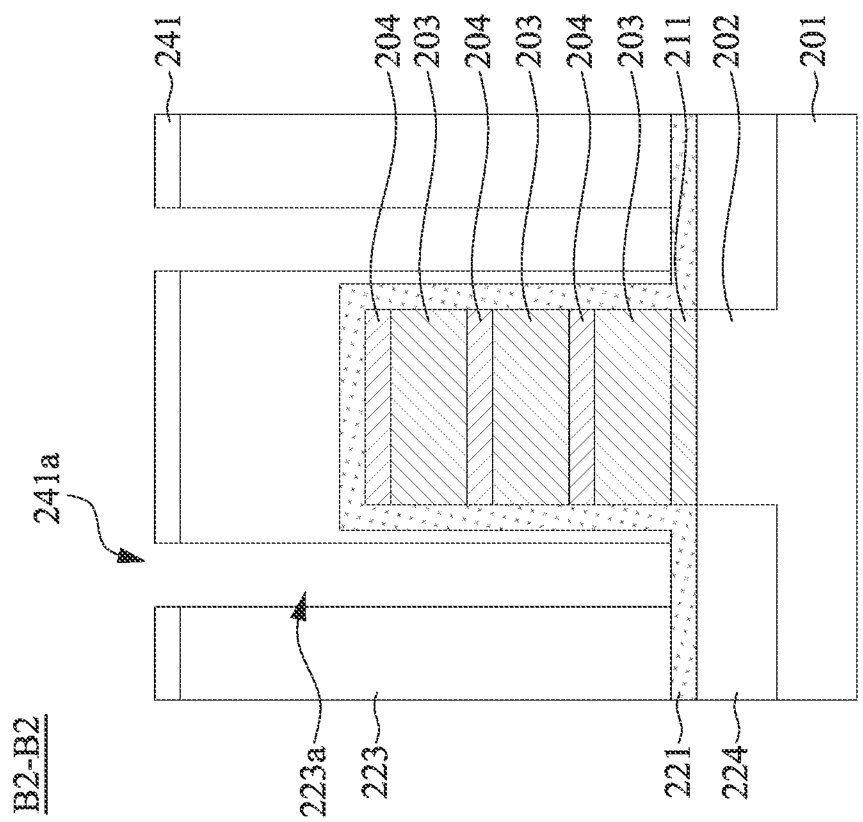

Operations for forming a semiconductor device 200 after the structure shown in FIGS. 34A to 34C and prior to the structure shown in FIGS. 35A to 35C at stages S202-S212 of the method M2 are substantially the same as the operations for forming the semiconductor device 100 shown in FIGS. 4A-15C at stages S102-S113 of the method M1, and reference may be made to the foregoing paragraphs for the related detailed descriptions and such descriptions are not provided again herein. For example, material and manufacturing method of the hard mask layer 221, dummy gate structure 223, the spacers 225 and 229, the CESL 233, and the ILD layer 235 may be substantially the same as that of the hard mask layer 121, dummy gate structure 123, the spacers 125 and 129, the CESL 133, and the ILD layer 135 as shown in FIGS. 4A to 15C, and the related detailed descriptions may refer to the foregoing paragraphs, and are not described again herein.

Returning to FIG. 34B, the method M2 then proceeds to block S213 where a patterned mask layer is formed over the dummy gate structure, the gate spacers, and the ILD layer, and the dummy gate structure is etched through the patterned mask layer to form an opening therein. With reference to FIGS. 35A to 35C, in some embodiments of block S213, a patterned mask layer 241 is formed over the dummy gate structure 223, the gate spacers 225, and the ILD layer 235. The dummy gate structure 223 shown in FIG. 35B is etched through an opening 241*a* of the mask layer 241 to form an opening 223*a* therein, such that the hard mask layer 221 is exposed. In some embodiments, material and manufacturing method of the patterned mask layer 241 may be substantially the same as that of the patterned mask layer 141 as shown in FIGS. 15A to 15C, the etching process may be substantially the same as that as shown in FIGS. 15A to 15C, and the related detailed descriptions may refer to the foregoing paragraphs, and are not described again herein. In FIG. 35B, the hard mask layer 221 has a thickness substantially the same as the thickness of the sacrificial layer 211. In some embodiments, the hard mask layer 221 has a thicker thickness than the sacrificial layer 211. In some embodiments, the hard mask layer 221 has a thinner thickness than the sacrificial layer 211.

Figure 36A:
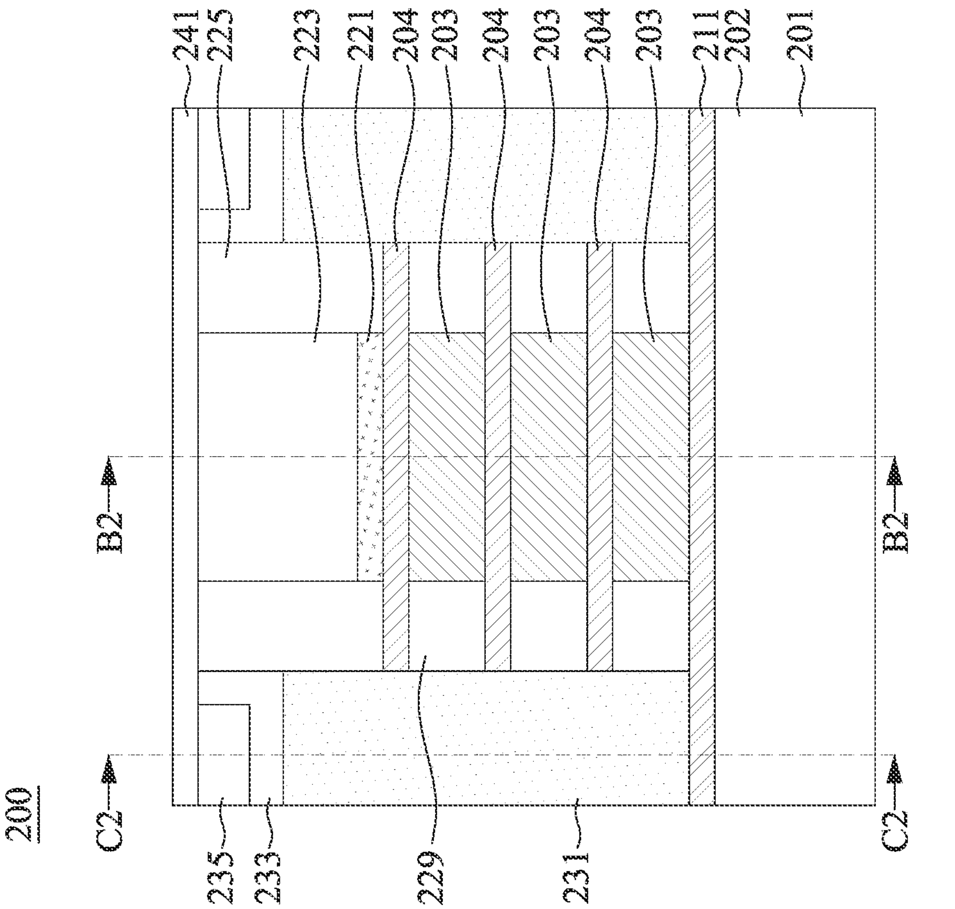
Figure 36C:
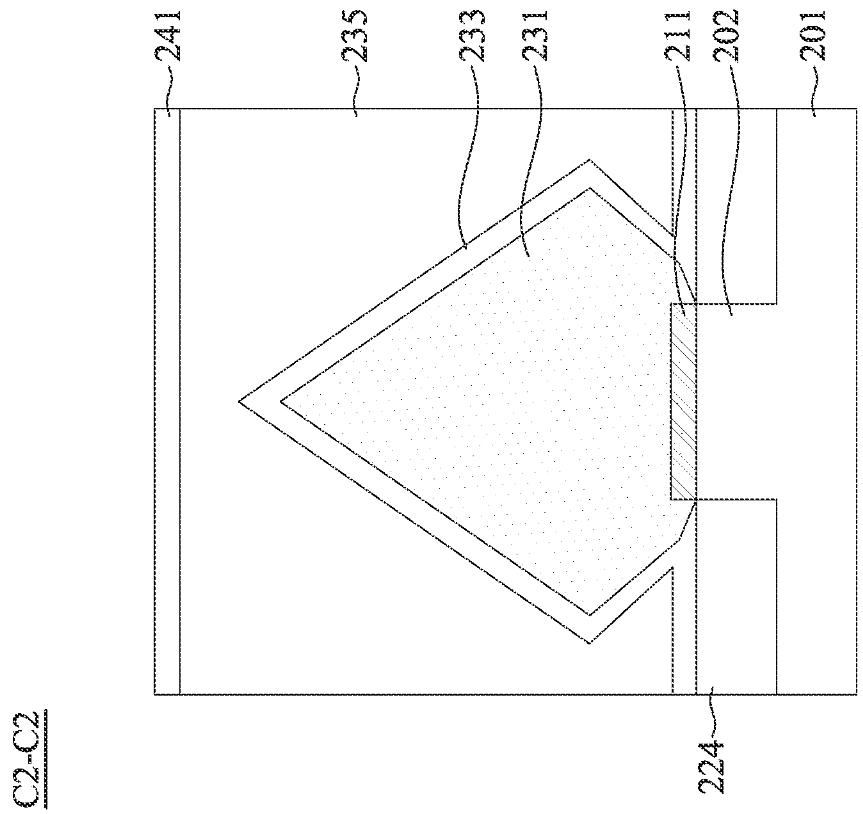
Figure 36B:
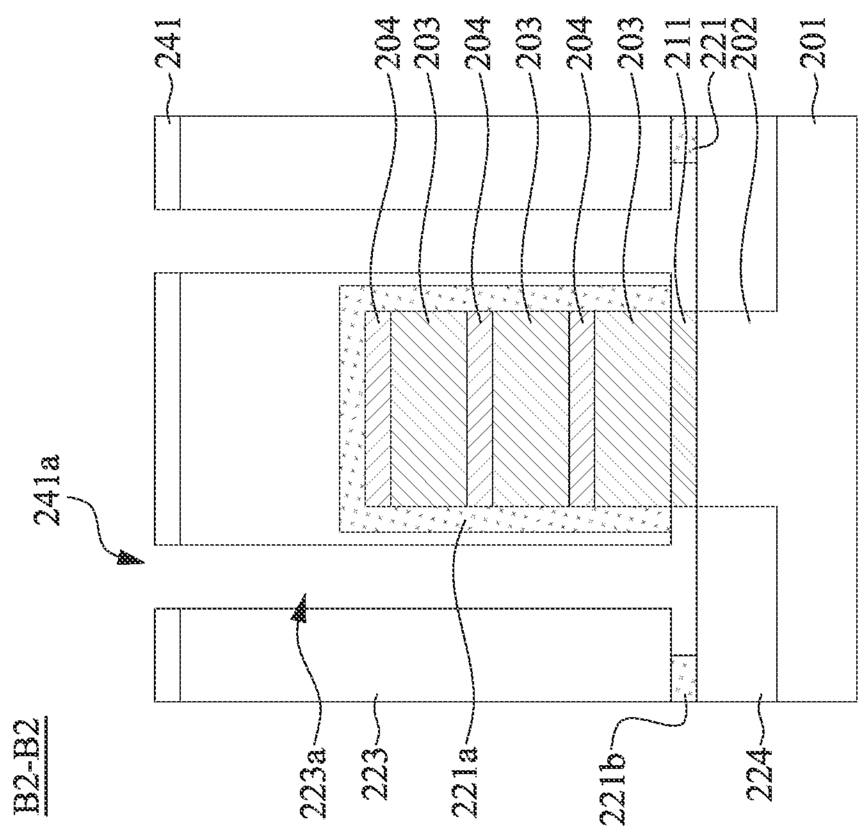

Returning to FIG. 33B, the method M2 then proceeds to block S214 where the hard mask layer is removed to expose a sidewall of the sacrificial layer. With reference to FIGS. 36A to 36C, in some embodiments of block S214, the removing of the hard mask layer 221 that is not covered by the etched dummy gate structure 223 may include a dry etching process or other suitable etching processes. In some embodiments, the etch process include using a technique and etchant selected to etch the hard mask layer 221 without significant etching of the surrounding structures. For example, the etch process selects to selectively etch the hard mask layer 221 made of a carbon-containing material, such as SiOC, without etching the sacrificial layer 211 made of a germanium-containing material and the dummy gate structure 223 made of polysilicon. In some embodiments, the etching process may be substantially the same as that as shown in FIGS. 16A to 16C, and the related detailed descriptions may refer to the foregoing paragraphs, and are not described again herein.

In FIG. 36B, the etching removes a portion of the hard mask layer 221 that direct below the etched dummy gate structure 223, such that the hard mask layer 221 has a first portion 221*a* remaining on the semiconductor layer 203 and the channel layers 204 and a second portion 221*b* remaining on the isolation dielectric 224. Therefore, the aforementioned etching may cause the sidewall of the sacrificial layer 211 that sandwiched between the lowermost one of the semiconductor layers 203 and the semiconductor strip 202 be exposed, in which the sacrificial layer 211 will be removed by a sequent process. In some embodiments, the sacrificial layer 211 has a thickness substantially same as the thickness of the hard mask layer 221. Hence, after the hard mask layer 221 is removed, an entirety of the sidewall of the sacrificial layer 211 is exposed. In some embodiments, the sacrificial layer 211 has a thicker thickness than the hard mask layer 221. Hence, after the hard mask layer 221 is removed, a part of the sidewall of the sacrificial layer 211 is exposed.

Figure 37A:
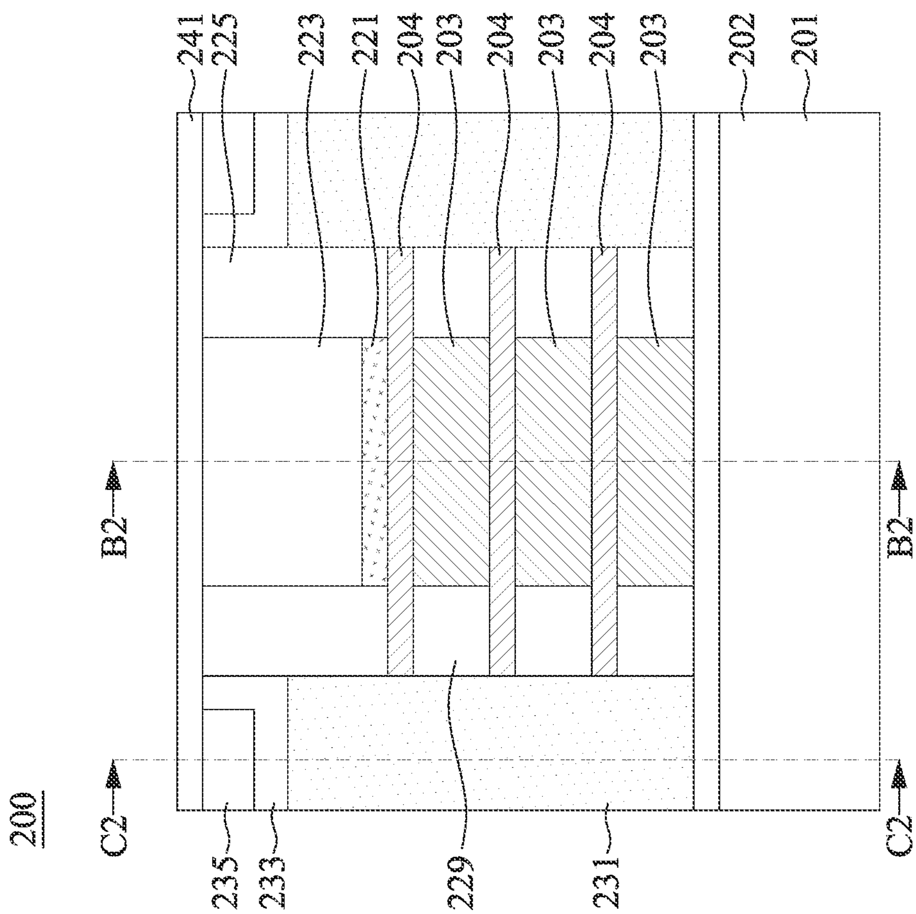
Figure 37C:
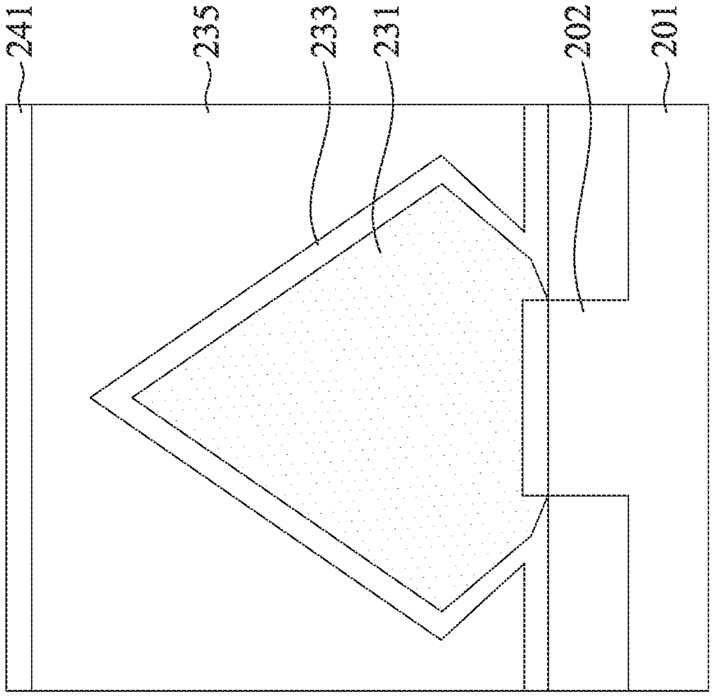
Figure 37B:
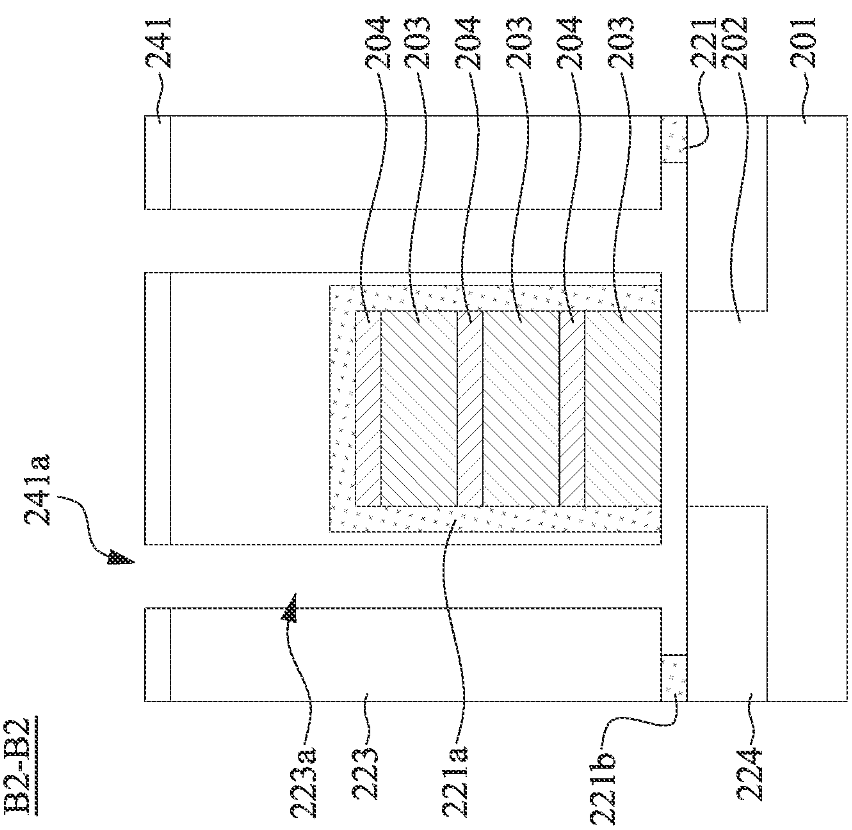

Returning to FIG. 33B, the method M2 then proceeds to block S215 where the lower sacrificial layer that is not covered by the hard mask layer is removed. With reference to FIGS. 37A to 37C, in some embodiments of block S215, the removing of the sacrificial layer 211 that is exposed from the hard mask layer 221 may include a dry etching process or other suitable etching processes. In some embodiments, the etch process include using a technique and etchant selected to etch the sacrificial layer 211 without significant etching of the surrounding structures. In some embodiments, the etching process may be substantially the same as that as shown in FIGS. 18A to 18C, and the related detailed descriptions may refer to the foregoing paragraphs, and are not described again herein.

For example, the sacrificial layer 211 and the semiconductor layer 203 are made of a germanium-containing material, such as SiGe, and the etch process selects to selectively etch the sacrificial layer 211 having a lower germanium atomic percentage concentration than the semiconductor layer 203. For example, the etch process selects to selectively etch the sacrificial layer 211 made of a germanium-containing material, such as SiGe, without etching the hard mask layer 221 made of a carbon-containing material, such as SiOC, the dummy gate structure 223 made of polysilicon, and the semiconductor strip 202 made of a silicon-containing material.

Figure 38A:
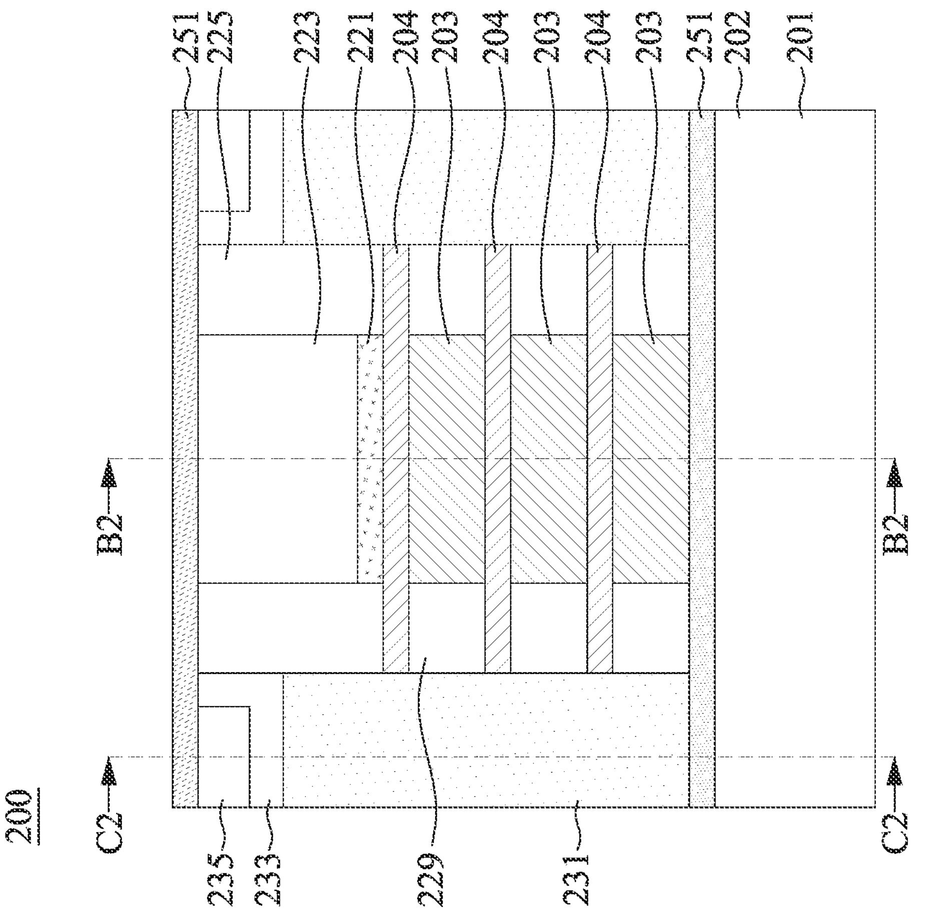
Figure 38C:
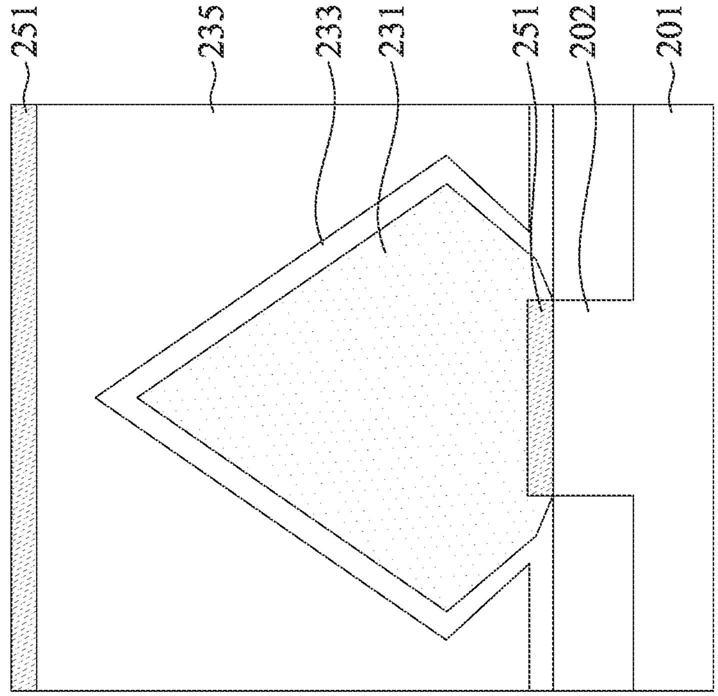
Figure 38B:
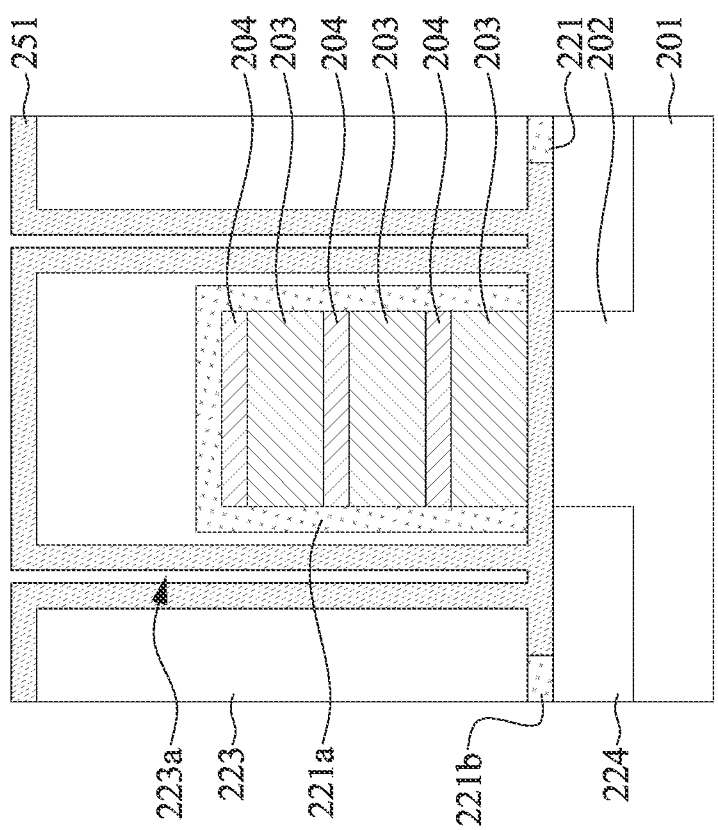

Returning to FIG. 33B, the method M2 then proceeds to block S216 where a dielectric layer is formed to line sidewalls of the opening of the dummy gate structure and fill into a space between the lowest one of the semiconductor layers and the semiconductor strip. With reference to FIGS. 38A to 38C, in some embodiments of block S216, a dielectric layer 251 is formed over the substrate 201 to line sidewalls of the opening 223*a* of the dummy gate structure 223 and fill into a space between the lowest one of the semiconductor layers 203 and the semiconductor strip 202. In some embodiments, material and manufacturing method of the dielectric layer 251 may be substantially the same as that of the dielectric layer 151 as shown in FIGS. 19A to 19C, and the related detailed descriptions may refer to the foregoing paragraphs, and are not described again herein.

Figure 39A:
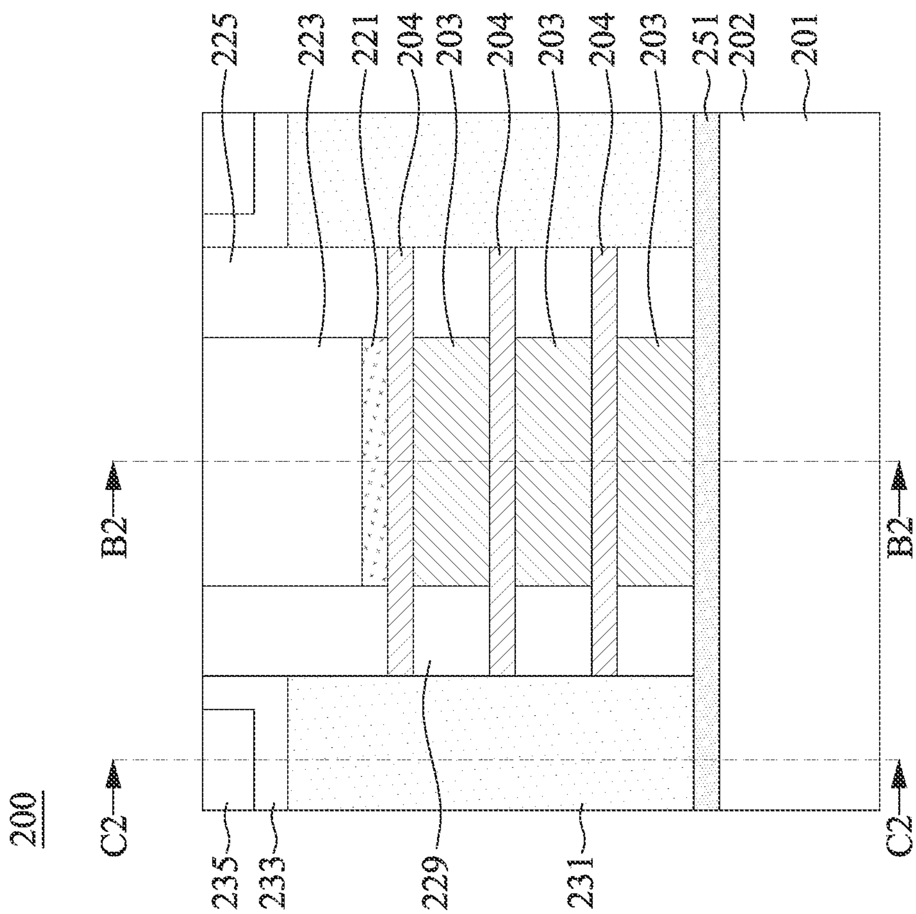
Figure 39B:
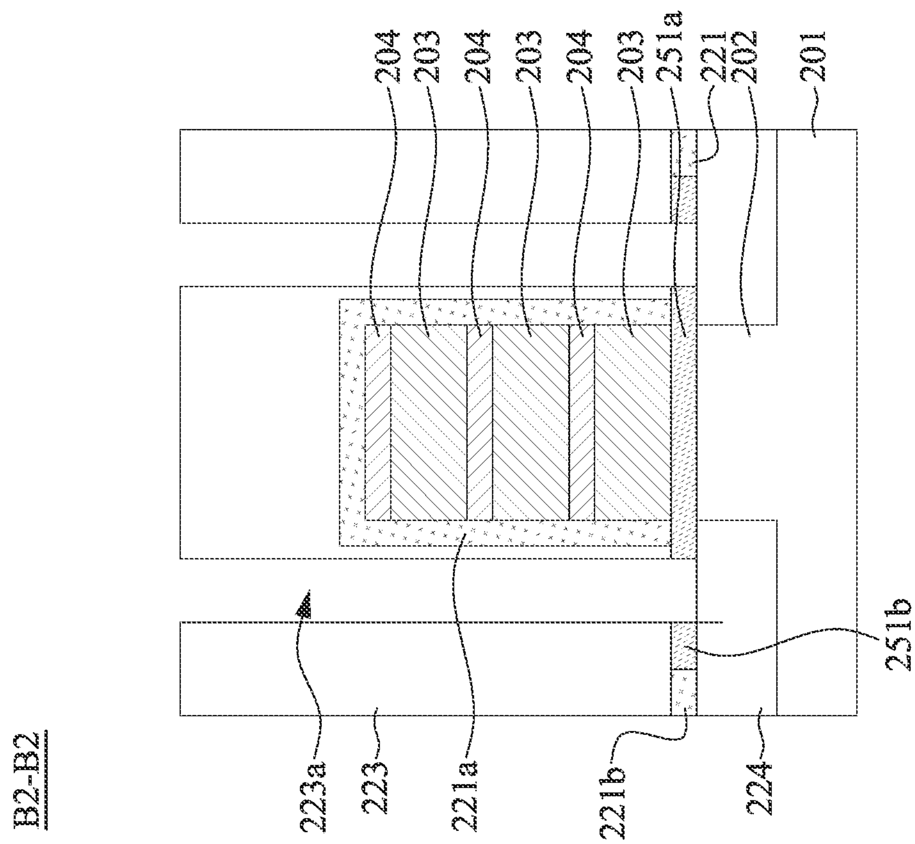
Figure 39C:
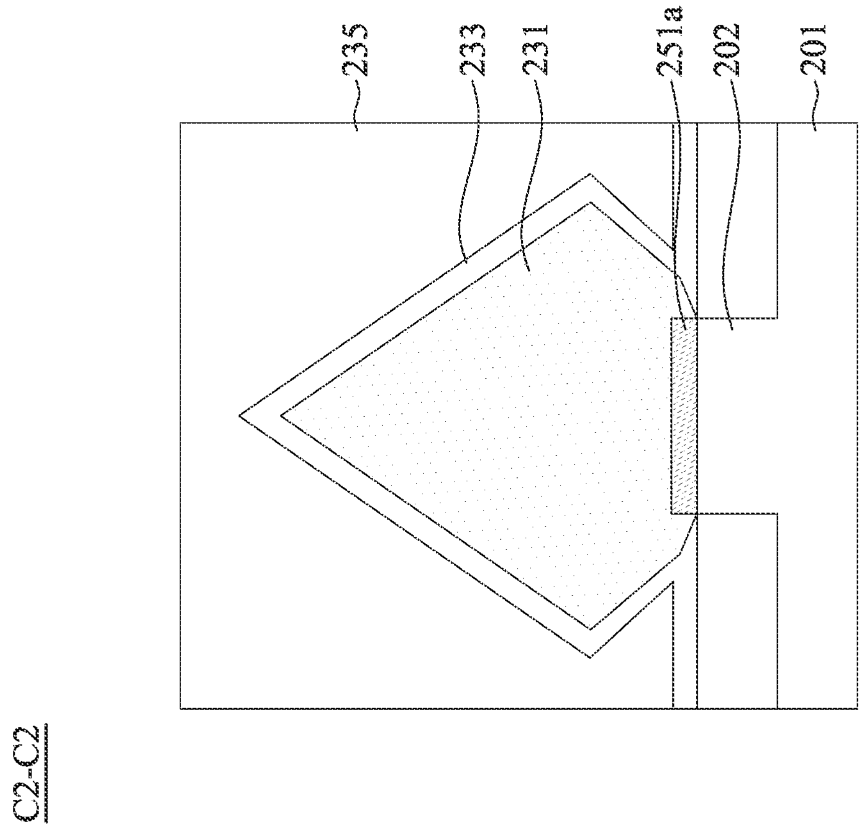

Returning to FIG. 33B, the method M2 then proceeds to block S217 where the dielectric layer formed on the sidewalls of the opening of the dummy gate structure is removed. With reference to FIGS. 39A to 39C, in some embodiments of block S217, the removing of the dielectric layer 251 formed on the sidewalls of the opening 223*a* of the dummy gate structure 223 may include a dry etching process or other suitable etching processes. In some embodiments, the etching process of the removing of the dielectric layer 251 may be substantially the same as that as shown in FIGS. 20A to 20C, and the related detailed descriptions may refer to the foregoing paragraphs, and are not described again herein. As shown in a FIG. 38B, after the removing, the dielectric layer 251 has a first remainder 251*a* on the semiconductor strip 202 and a second remainder 251*b* spaced apart from the semiconductor strip 202 and on the isolation dielectric 224.

Figure 40A:
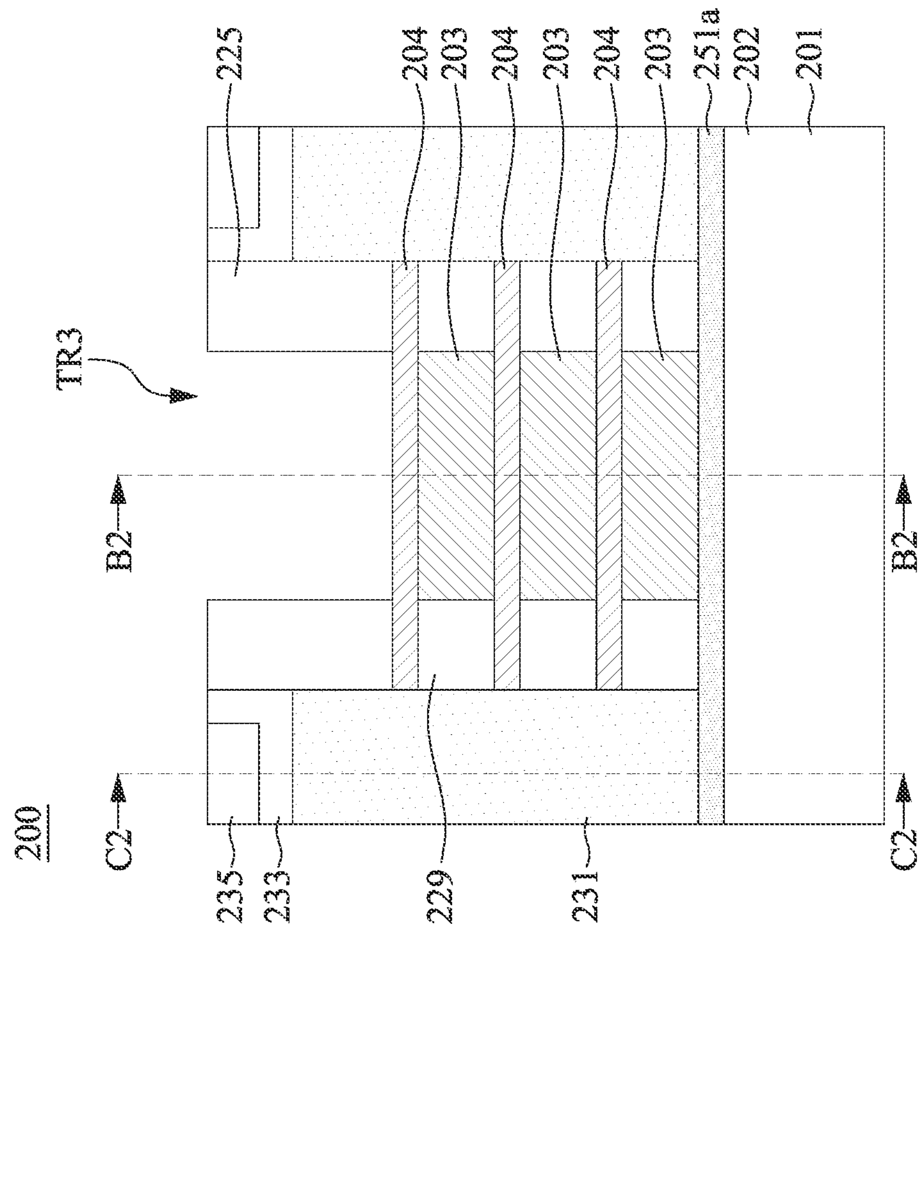
Figure 40C:
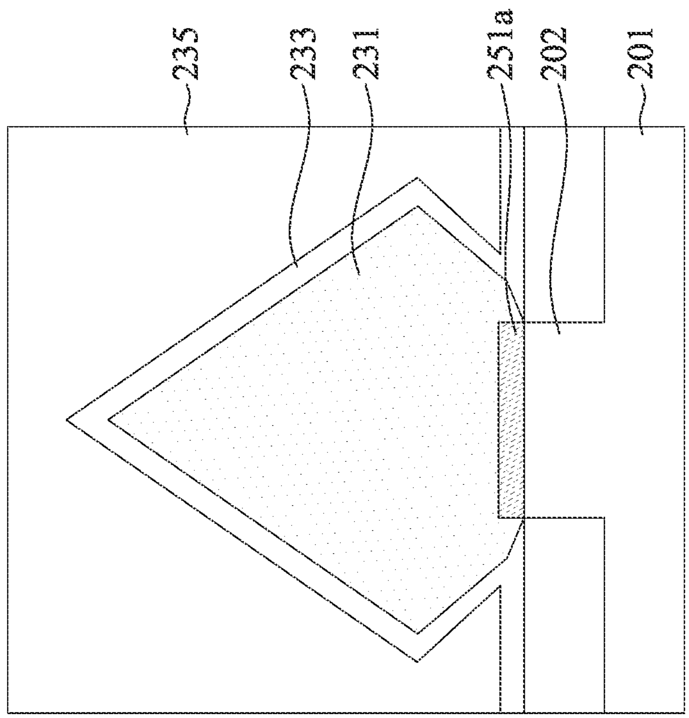
Figure 40B:
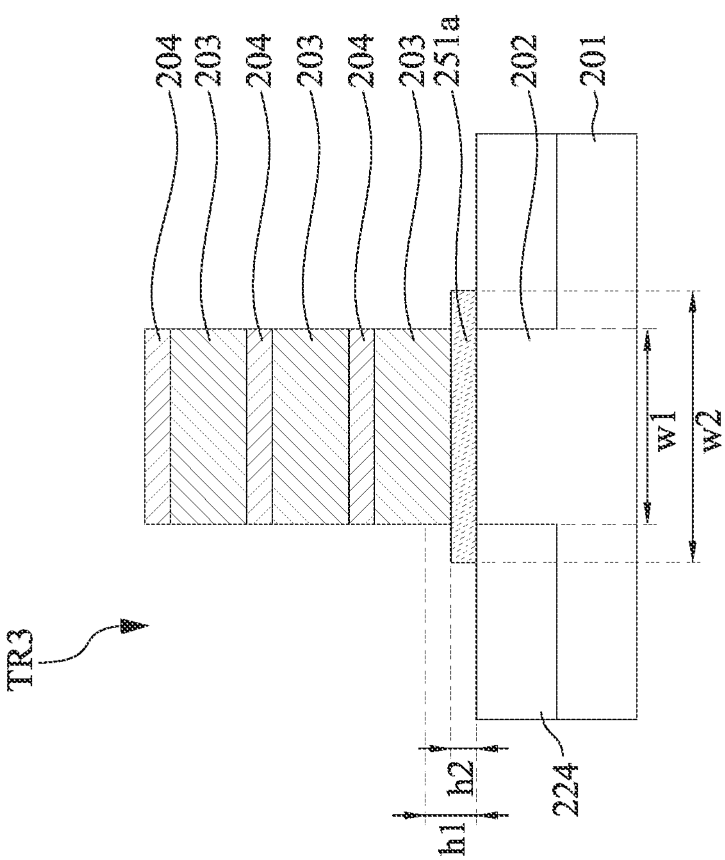

Returning to FIG. 33B, the method M2 then proceeds to block S218 where the dummy gate structure and the hard mask layer are removed. With reference to FIGS. 40A to 40C, in some embodiments of block S218, the dummy gate structure 223, the hard mask layer 221, and the second remainder 251*b* of the dielectric layer 251 are removed (shown in FIGS. 39A and 39B) to form a gate trench TR3, but the semiconductor layers 203, the channel layers 204, the gate spacers 225, the inner spacers 229, and the first remainder 251*a* (may be also referred to as an isolation layer 251*a*) of the dielectric layer 251 remain. In some embodiments, the isolation layer 251*a* may have a flat top surface and extends beyond opposite sidewalls of the semiconductor strip 202 to overlap the isolation dielectric 224. In some embodiments, the etching process for removing the dummy gate structure 223, the hard mask layer 221, and the second remainder 251*b* of the dielectric layer 251 may be substantially the same as that as shown in FIGS. 21A to 21C, and the related detailed descriptions may refer to the foregoing paragraphs, and are not described again herein.

Figure 41A:
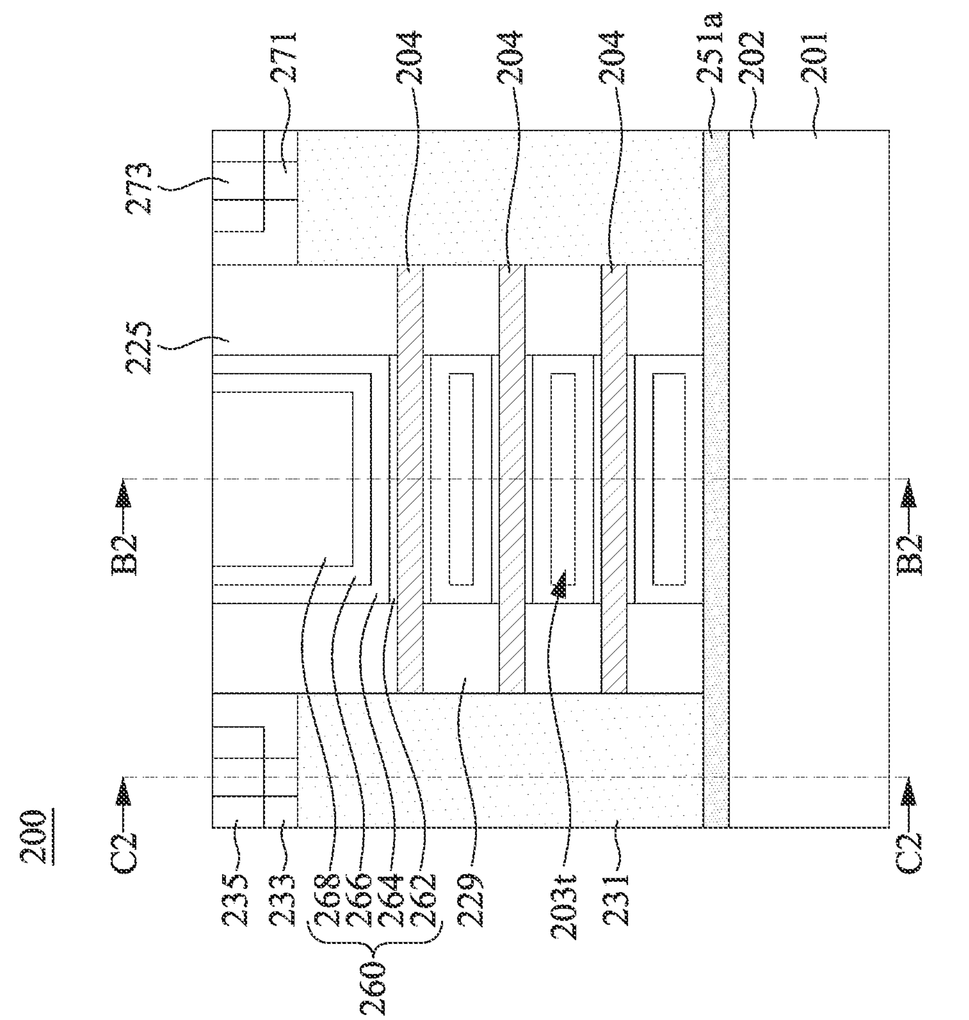
Figure 41B:
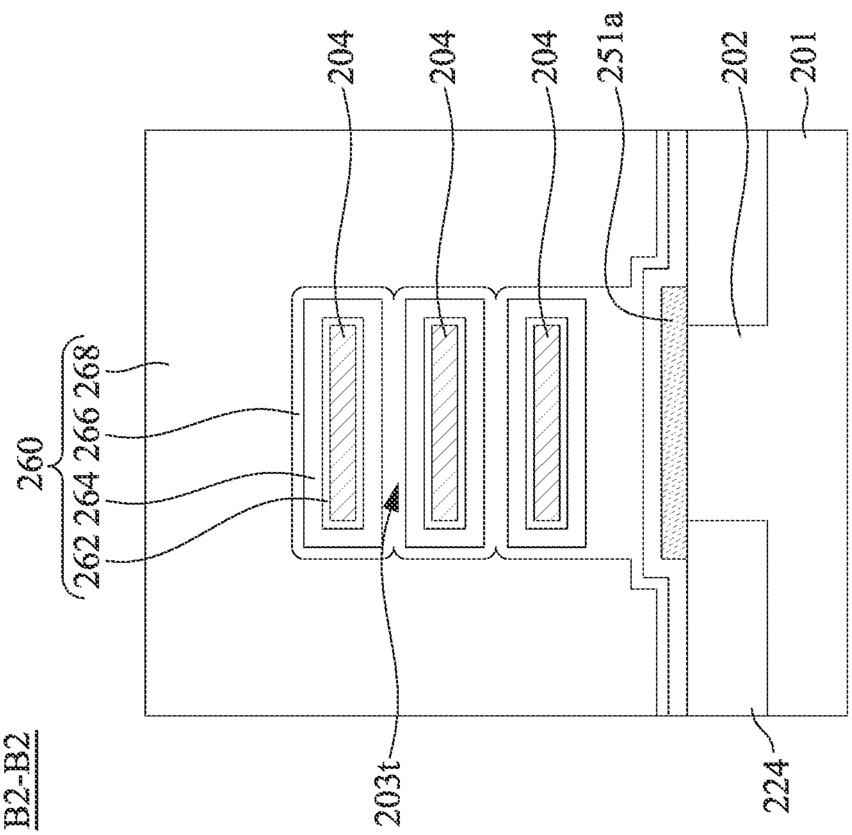
Figure 41C:
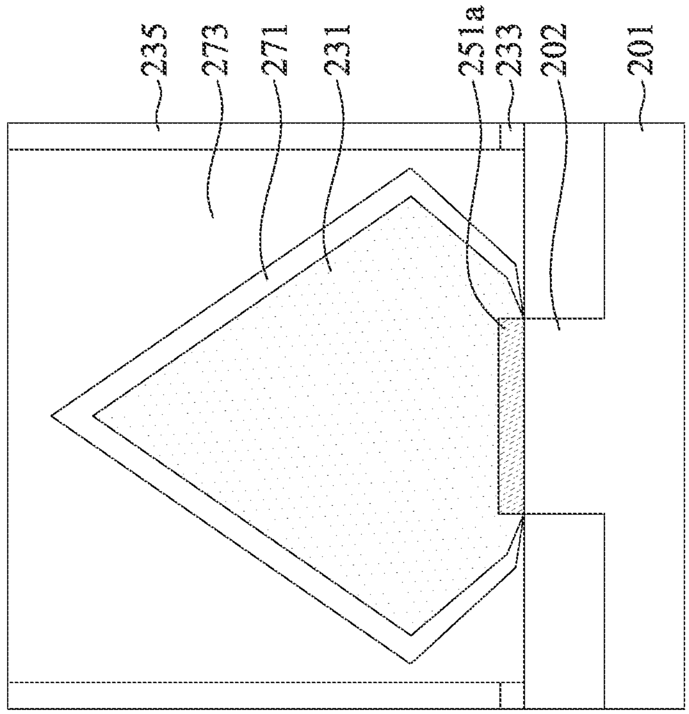

Operations for forming a semiconductor device 200 after the structure shown in FIGS. 40A to 40C and prior to the structure shown in FIGS. 41A to 41C at stages S220-S221 of the method M2 are substantially the same as the operations for forming the semiconductor device 100 shown in FIGS. 23A-24C at stages S121-S122 of the method M1, and reference may be made to the foregoing paragraphs for the related detailed descriptions and such descriptions are not provided again herein. For example, material and manufacturing method of the gate structure 260 may be substantially the same as that of the gate structure 160 as shown in FIGS. 23A to 24C, and the related detailed descriptions may refer to the foregoing paragraphs, and are not described again herein.

Returning to FIG. 33B, the method M2 then proceeds to block S222 where a plurality of silicide layers are formed over the source/drain structures, and a plurality of contacts are formed to land on the silicide layers. With reference to FIGS. 41A to 41C, in some embodiments of block S222, the silicide layers 271 may include metal silicide, such as $CoSi_2$, $TiSi_2$, $WSi_2$, $NiSi_2$, $MoSi_2$, $TaSi_2$, PtSi, or the like. Subsequently, the contacts 273 are formed to pass through the source/drain structure 231 and the ILD layer 235 and land on the silicide layer 271. In some embodiments, the contacts 173 may include metal, such as tungsten (W), aluminum (Al), copper (Cu), or other suitable conductive material.

Figure 42A:
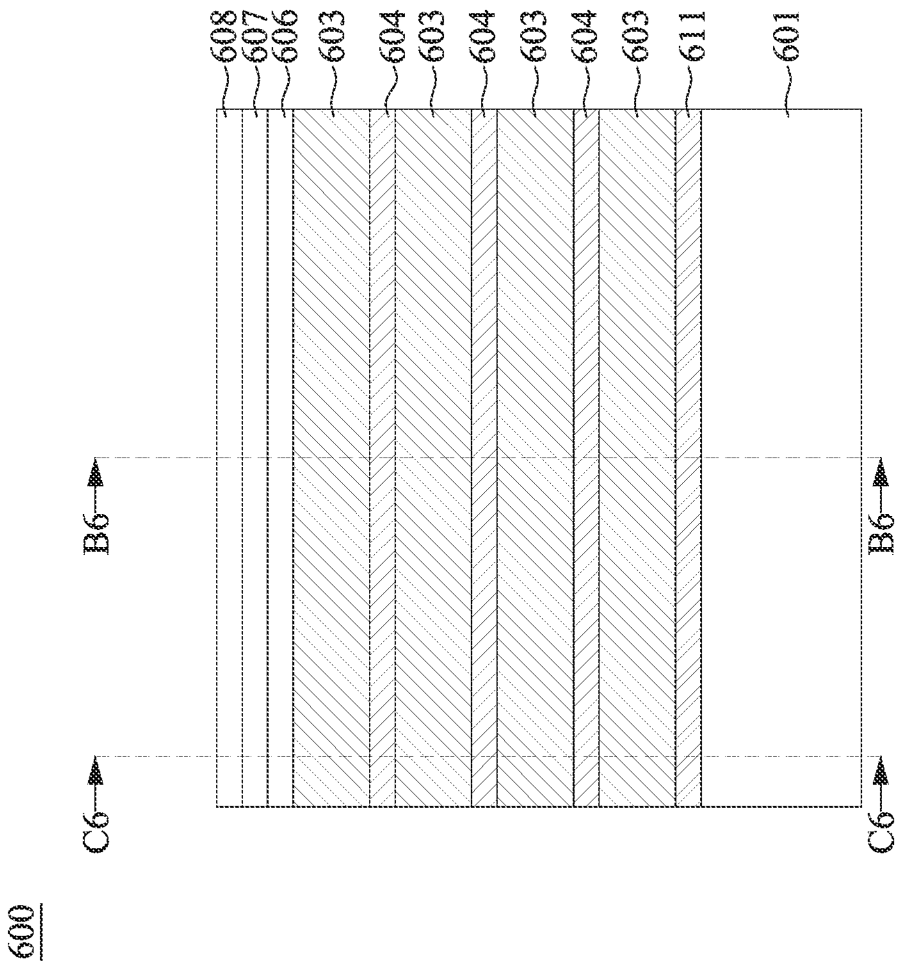
FIGS. 42A to 43C are schematic views of a semiconductor device in accordance with some embodiments of the present disclosure.
Figure 42C:
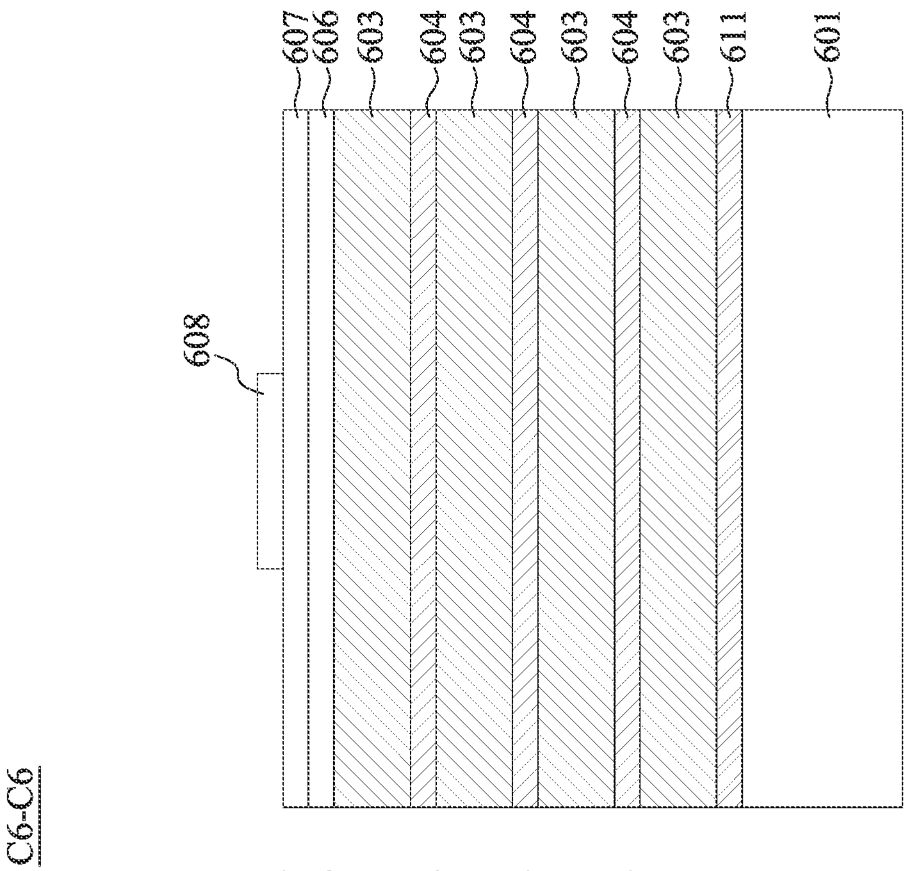
Figure 42B:
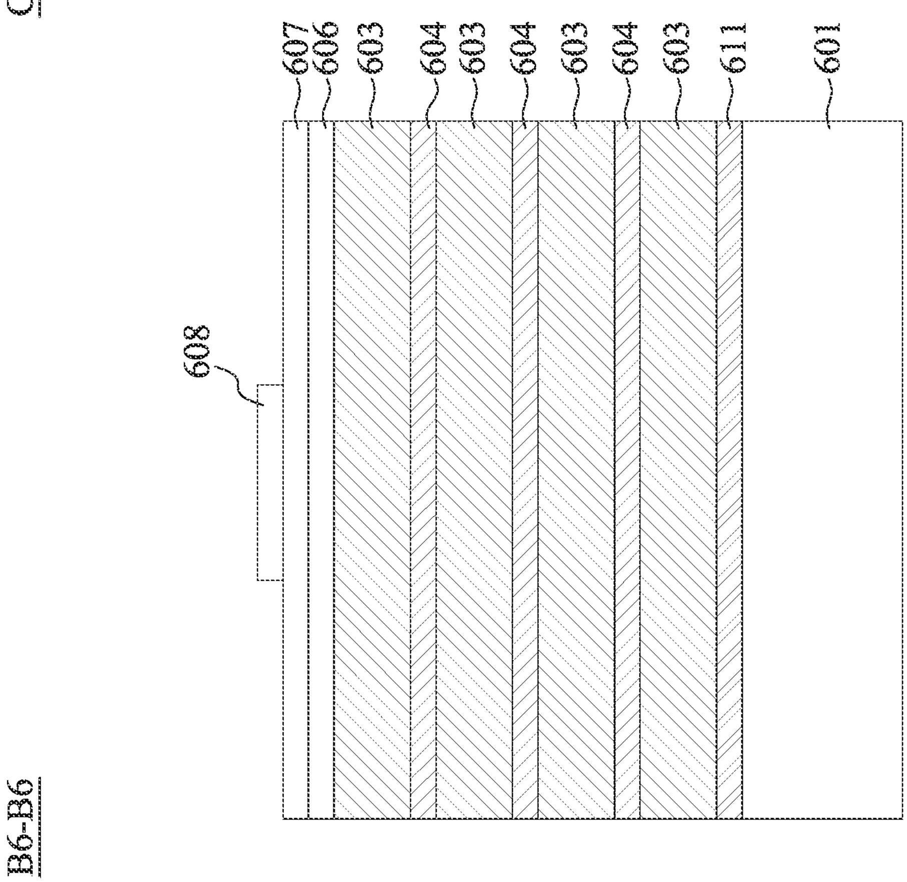
Figure 43A:
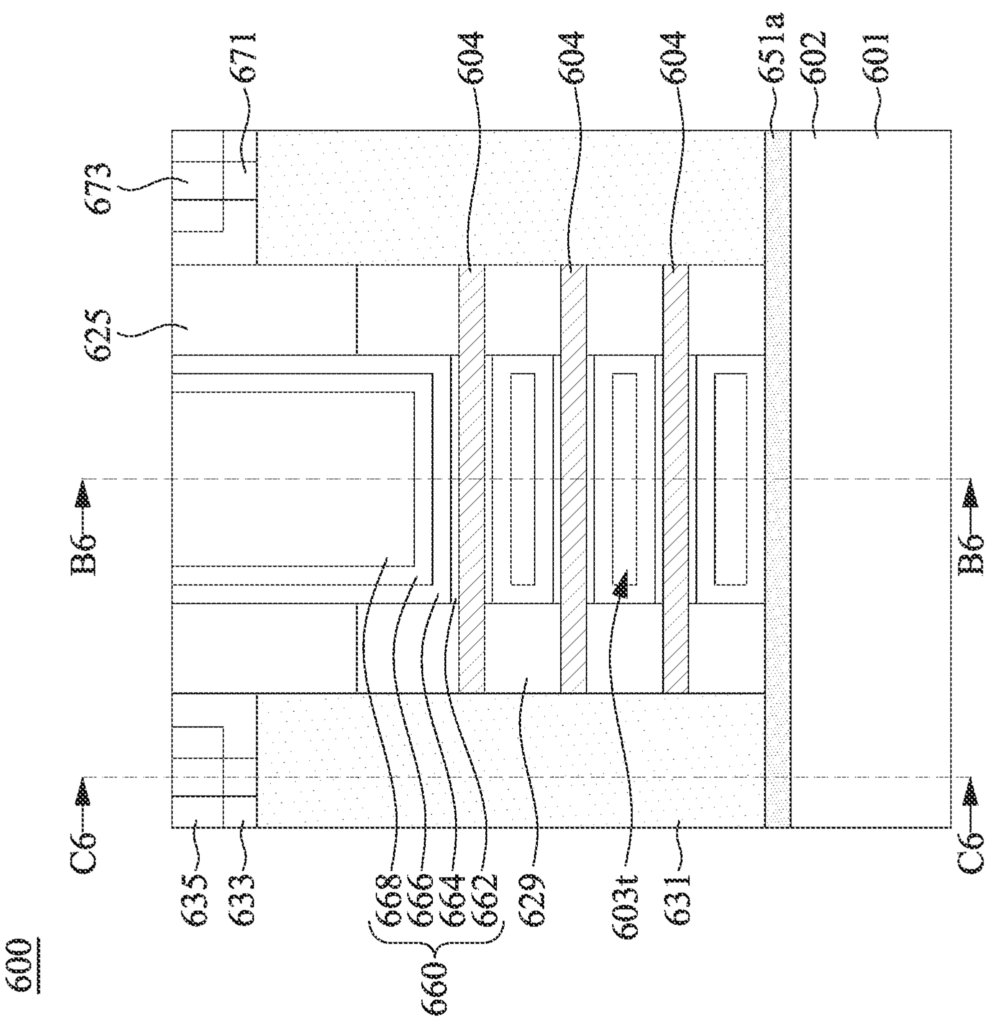
Figure 43C:
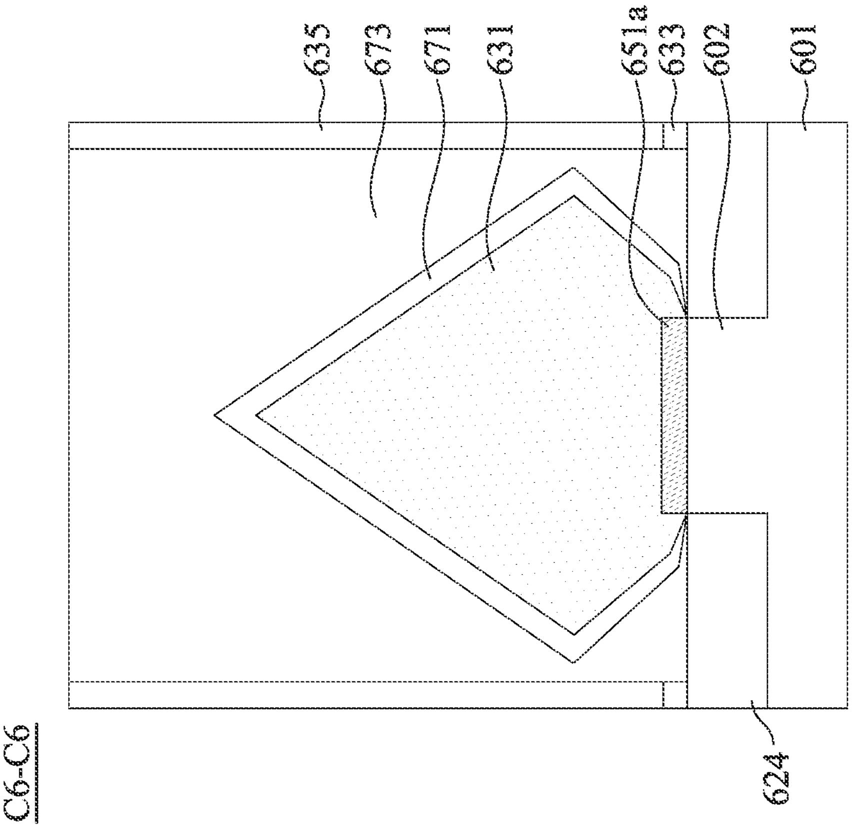

FIGS. 42A to 43C illustrate a method in various stages of fabricating the semiconductor device 600 in accordance with some embodiments of the present disclosure. FIGS. 42A and 43A are cross-sectional views corresponding to line A1-A1 in FIG. 1A. FIGS. 42B and 43B are cross-sectional views along line B6-B6 in FIGS. 42A and 43A and corresponding to line B1-B1 in FIG. 1A. FIGS. 42C and 43C are cross-sectional views along line C6-C6 in FIGS. 42A and 43A and corresponding to line C1-C1 in FIG. 1A. Operations for forming the semiconductor device 600 are substantially the same as the operations for forming the semiconductor device described in foregoing descriptions and thus are not repeated herein for the sake of clarity. For example, material and manufacturing method of a substrate 601, a semiconductor strip 602, a semiconductor layer 603, trenches 603*t*, a channel layer 604, a mask layer 607, a photoresist layer 608, an isolation dielectric 624, a sacrificial layer 611, a hard mask layer 621, a dummy gate structure 623, spacers 625 and 629, an source/drain structure 631, a contact etch stop layer (CESL) 633, an interlayer dielectric (ILD) layer 635, the mask layer 641, the dielectric layer 651, the gate structure 660 (including an interfacial layer 662, a gate dielectric layer 664, a work function metal layer 666, and a gate electrode 668), the silicide layer 671, and the contacts 673 may be substantially the same as that of the substrate 101, the semiconductor strip 102, the semiconductor layer 103, trenches 103*t*, the channel layer 104, a mask layer 107, a photoresist layer 108, the isolation dielectric 114, a sacrificial layer 111, the hard mask layer 121, a dummy gate structure 123, the spacers 125 and 129, the source/drain structure 131, the contact etch stop layer (CESL) 133, the interlayer dielectric (ILD) layer 135, the mask layer 141, the dielectric layer 151, the gate structure 160, the silicide layer 171, and the contacts 173 as shown in FIGS. 3A to 25C, and the related detailed descriptions may refer to the foregoing paragraphs, and are not described again herein.

FIGS. 42A to 43C illustrate another profile of the semiconductor device 600 manufactured using the method M2 than the semiconductor device 200. The difference between the present embodiment and the embodiment in FIGS. 34A to 41C is that the topmost layer in the stack of alternating semiconductor layers 603 and channel layers 604 over the semiconductor strip 602 is the semiconductor layer 603 not the channel layers 604 as shown in FIGS. 34A to 34C. Therefore, in FIGS. 42A to 42C, the semiconductor layer 603 is in contact with the pad layer 606. In other words, the topmost channel layer 604 in the stack is spaced apart from the pad layer 606 by the semiconductor layer 603.

Figure 43B:
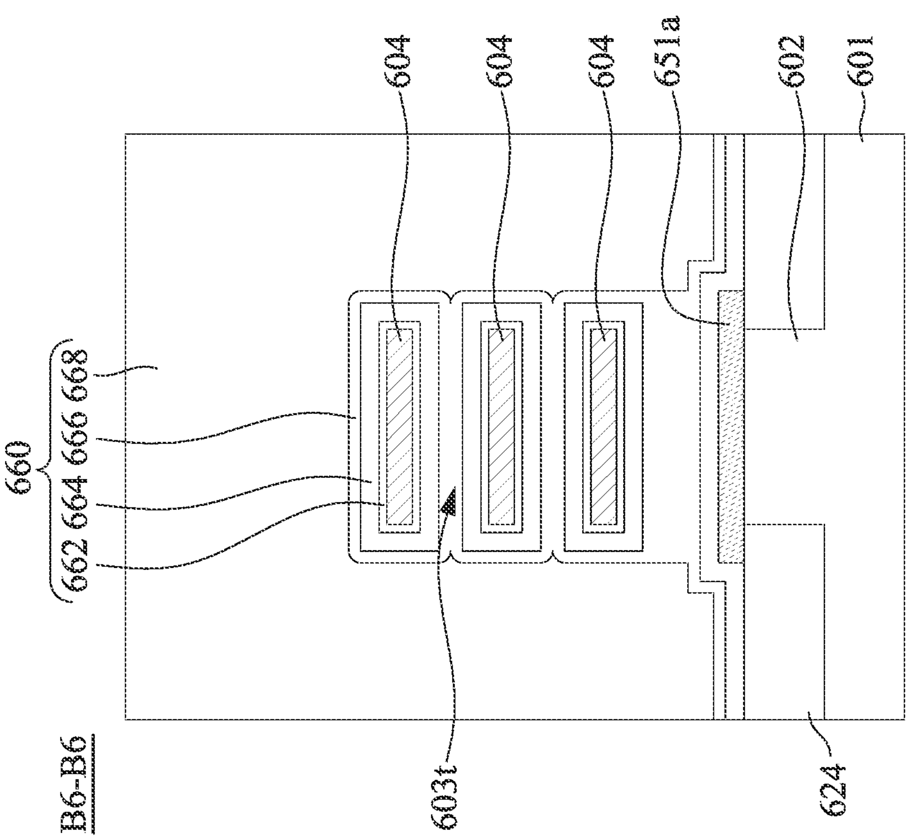

Reference is made to FIGS. 43A to 43C corresponding to FIGS. 41A to 41C. In FIG. 43A, the isolation layer 651*a* extends along a top surface of the semiconductor strip 602 and passes through a bottom of the gate structure 660 and bottoms of the source/drain structures 631. In FIG. 43B, the isolation layer 651*a* is interposed between the semiconductor strip 602 and the gate structure 660 and extends past opposite sidewalls of the semiconductor strip 602, and therefore the gate structure 660 is spaced apart from the semiconductor strip 602 by the isolation layer 651*a*. In greater detail, the isolation layer 651*a* has a greater width than the semiconductor strip 602. The isolation layer 651*a* has a first portion 651*c* on the semiconductor strip 602 and a second portion 651*d* on the isolation dielectric 624. The first portion 651*c* of the isolation layer 651*a* has a thickness substantially the same as the second portion 651*d* of the isolation layer 651*a*, such that the isolation layer 651*a* has a flat top surface. In FIG. 43C, the isolation layer 651*a* extends from a top surface of the semiconductor strip 602 into the epitaxy structure 631. In some embodiments, the isolation layer 651*a* may be replaced by an air gap. Hence, the forming of the isolation layer 651*a* can not only reduce the parasitic leakage current but also reduce the parasitic capacitance of the semiconductor device.

FIGS. 44A to 47C illustrate a method in various stages of fabricating the semiconductor device 300 in accordance with some embodiments of the present disclosure. FIGS. 44A-47A are cross-sectional views corresponding to line A1-A1 in FIG. 1A. FIGS. 44B-47B are cross-sectional views along line B3-B3 in FIGS. 44A-47A and corresponding to line B1-B1 in FIG. 1A. FIGS. 44C-47C are cross-sectional views along line $C_3$-$C_3$ in FIGS. 44A-47A and corresponding to line C1-C1 in FIG. 1A. Operations for forming the semiconductor device 300 are substantially the same as the operations for forming the semiconductor device 200 described in foregoing descriptions and thus are not repeated herein for the sake of clarity. For example, material and manufacturing method of a substrate 301, a semiconductor strip 302, a semiconductor layer 303, trenches 303*t*, a channel layer 304, an isolation dielectric 334, a sacrificial layer 311, a hard mask layer 321, a dummy gate structure 323, spacers 325 and 329, an source/drain structure 331, a contact etch stop layer (CESL) 333, an interlayer dielectric (ILD) layer 335, the mask layer 341, opening 341*a*, the dielectric layer 351, the gate structure 360 (including an interfacial layer 362, a gate dielectric layer 364, a work function metal layer 366, and a gate electrode 368), the silicide layer 371, and the contacts 373 may be substantially the same as that of the substrate 201, the semiconductor strip 202, the semiconductor layer 203, trenches 203*t*, the channel layer 204, the isolation dielectric 224, a sacrificial layer 211, the hard mask layer 221, a dummy gate structure 223, the spacers 225 and 229, the source/drain structure 231, the contact etch stop layer (CESL) 233, the interlayer dielectric (ILD) layer 235, the mask layer 241, opening 241*a*, the dielectric layer 251, the gate structure 260, the silicide layer 271, and the contacts 273 as shown in FIGS. 34A to 34C, and the related detailed descriptions may refer to the foregoing paragraphs, and are not described again herein.

Figure 44A:
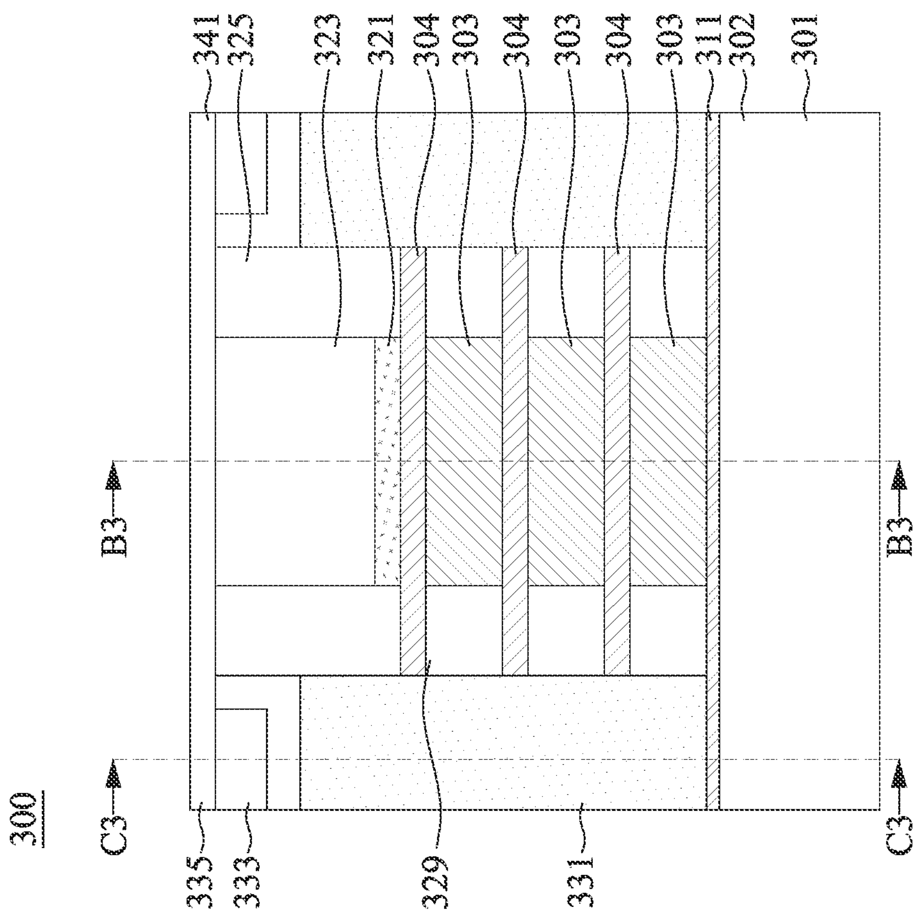
FIGS. 44A to 47C are schematic views of a semiconductor device in accordance with some embodiments of the present disclosure.
Figure 44C:
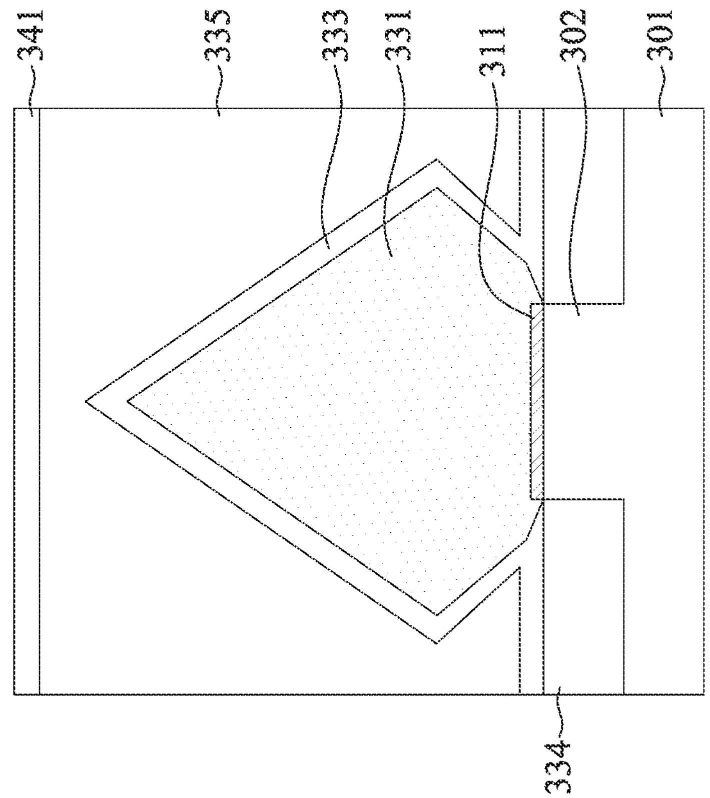
Figure 44B:
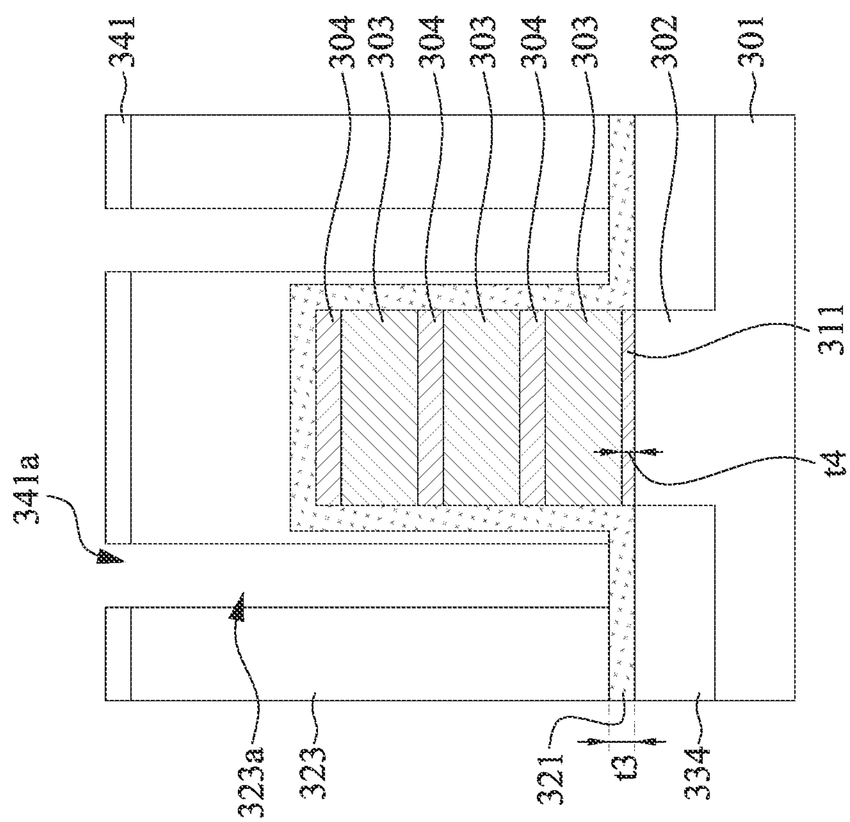

FIGS. 44A to 47C illustrate another profile of the semiconductor device 300 manufactured using the method M2 than the semiconductor device 200. Reference is made to FIGS. 44A to 44C corresponding to FIGS. 34A to 35C where the patterned mask layer 341 is formed over the dummy gate structure 323, the gate spacers 325, and the ILD layer 335, and the dummy gate structure 323 is etched through the patterned mask layer 341 to form an opening 323*a* therein. In FIG. 44B, the hard mask layer 321 has thicker thickness t3 than the thickness t4 of the sacrificial layer 311. In some embodiments, a lateral portion of the hard mask layer 321 on the isolation dielectric 334 has a top surface higher than a top surface of the sacrificial layer 311.

Figure 45A:
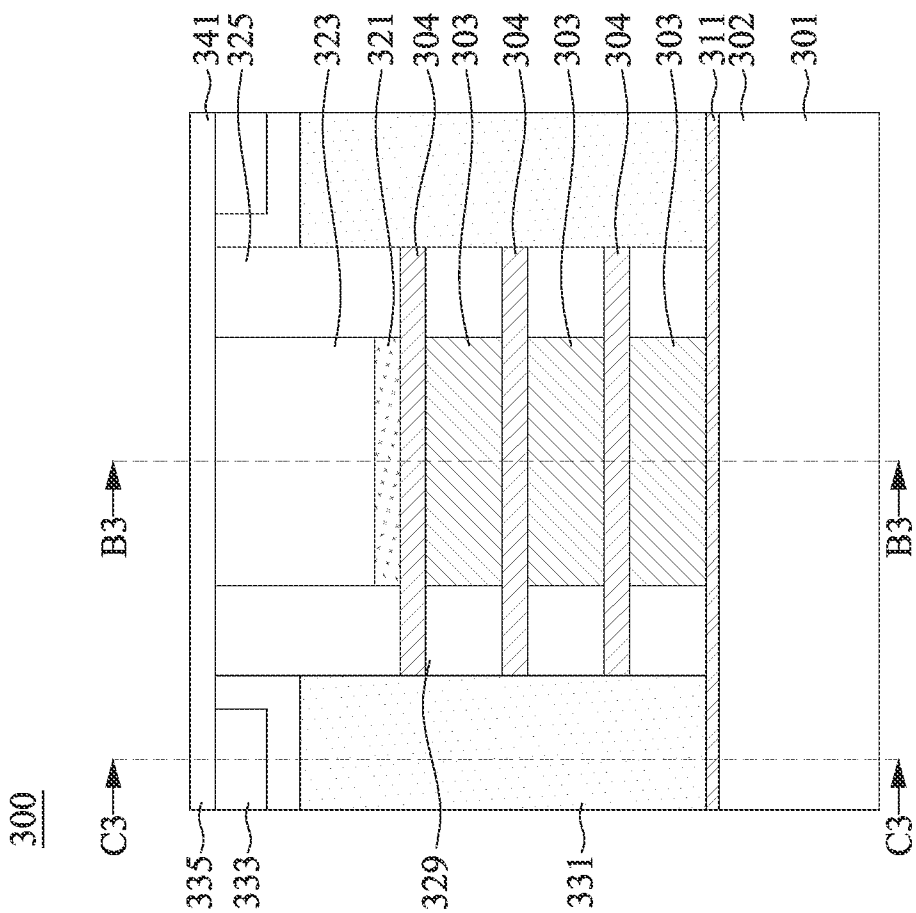
Figure 45C:
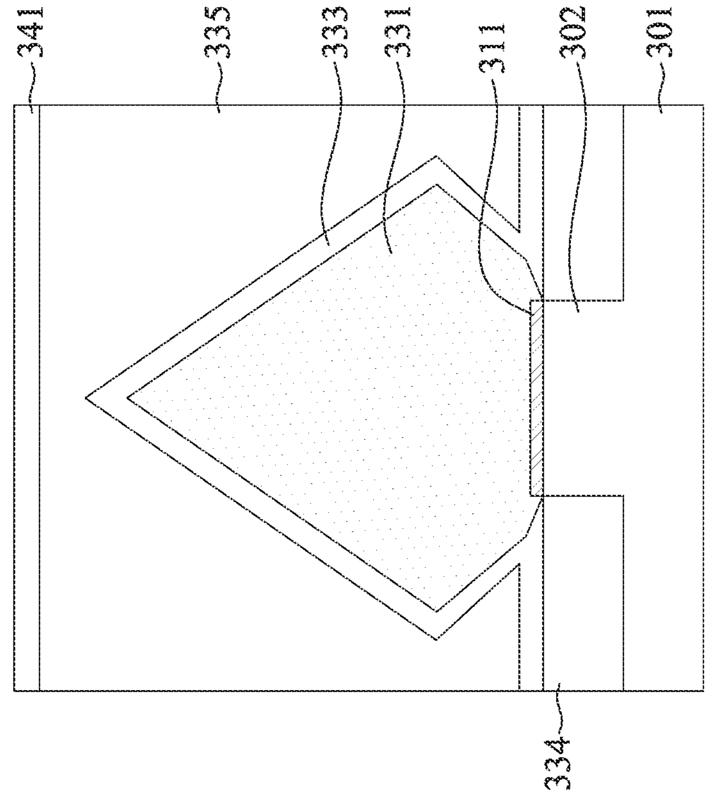
Figure 45B:
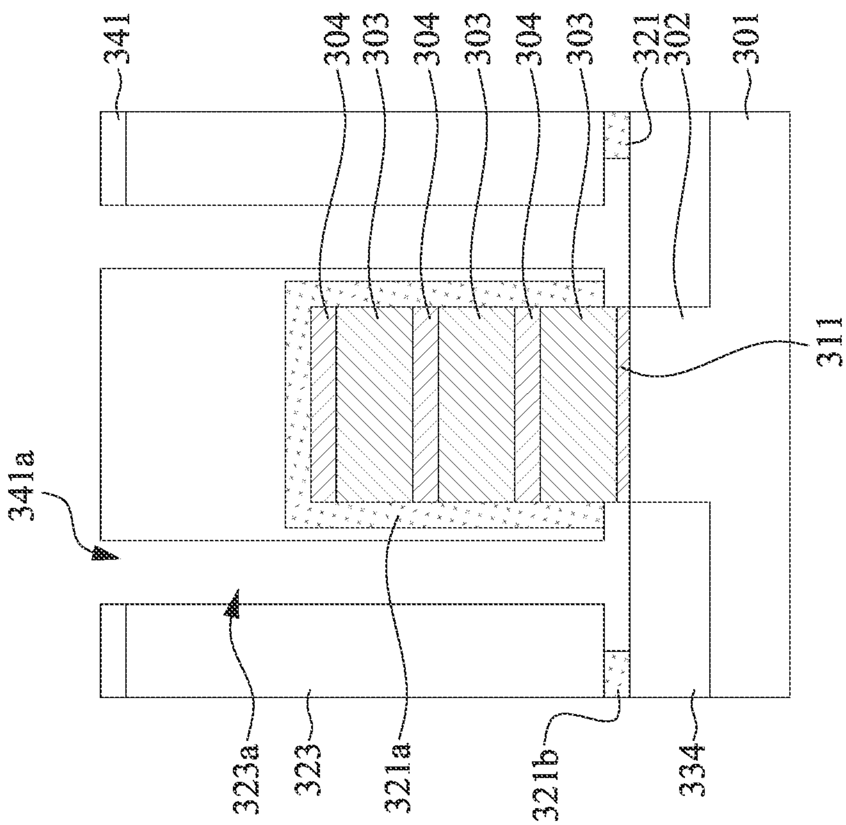

Reference is made to FIGS. 45A to 45C corresponding to FIGS. 36A to 36C where the hard mask layer 321 that is not covered by the etched dummy gate structure 323 is removed, such that a sidewall of the sacrificial layer 311 and the isolation dielectric 334 laterally surrounding the semiconductor strip 302 are exposed as shown in FIG. 45B, such that the hard mask layer 321 has a first portion 321*a* remaining on the semiconductor layer 303 and the channel layers 304 and a second portion 321*b* remaining on the isolation dielectric 334, in which the sacrificial layer 311 will be removed by a sequent process. After the removing of the hard mask layer 321, in FIG. 45B, an entirety of the sidewall of the sacrificial layer 311 is exposed. In FIG. 45B, a bottom of the lowest one of the semiconductor layers 303 protrudes downwardly from the second portion 321*b* of the hard mask layer 321. On the other hand, the sacrificial layer 311 has a top surface in a positon lower than a bottom surface of the dummy gate structure 323.

Figure 46A:
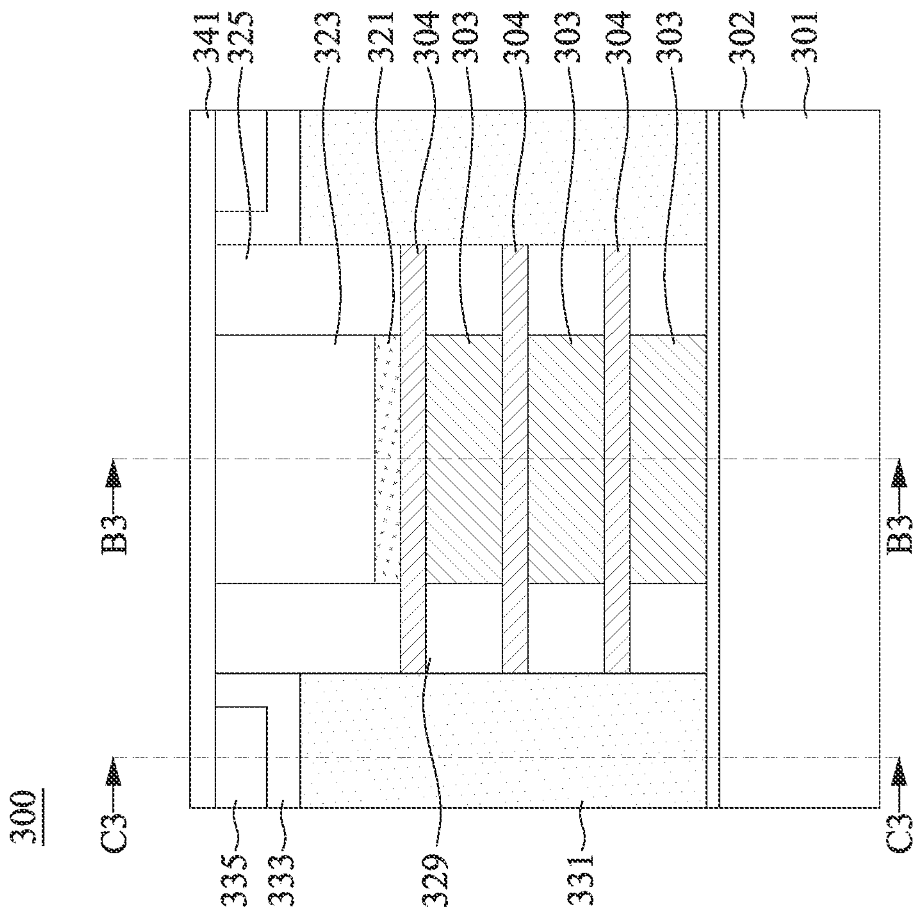
Figure 46C:
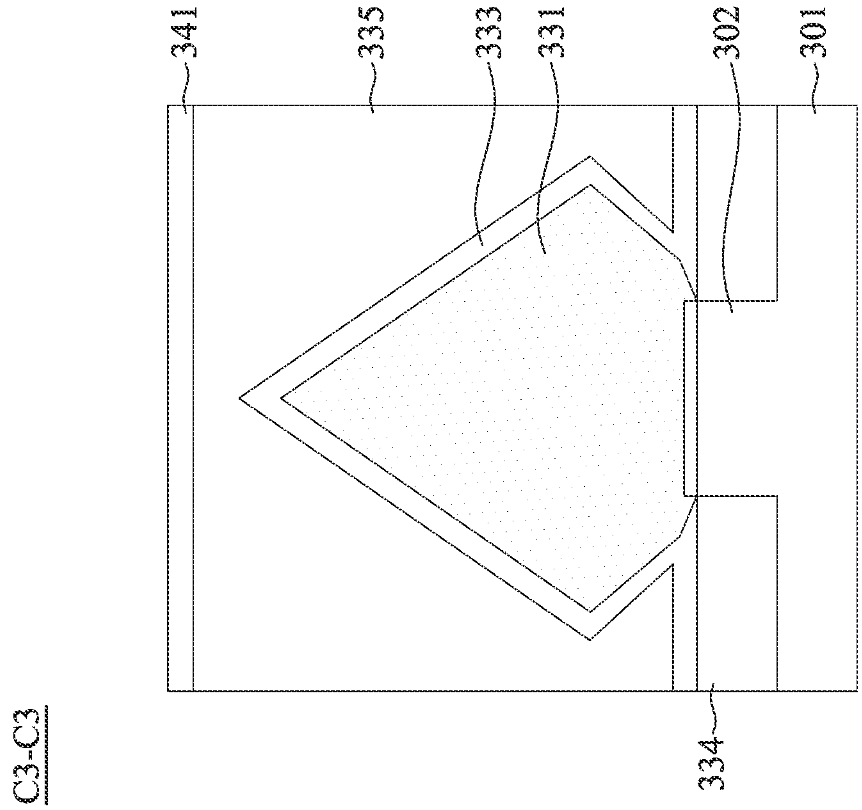
Figure 46B:
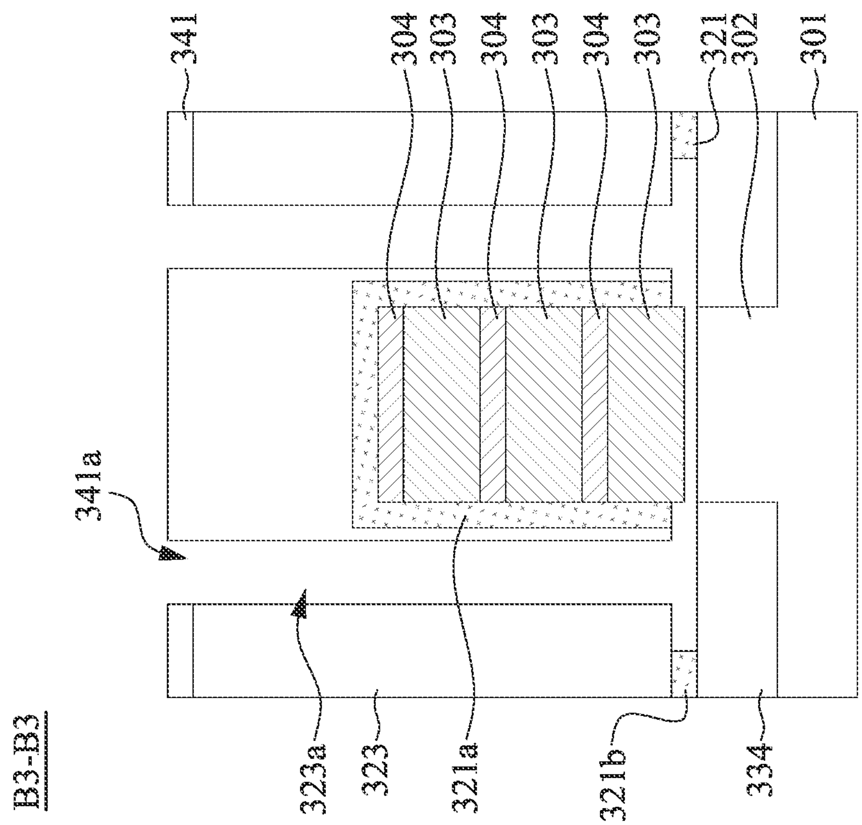

Reference is made to FIGS. 46A to 46C corresponding to FIGS. 37A to 37C where the sacrificial layer 311 that is not covered by the hard mask layer 321 is removed.

Figure 47A:
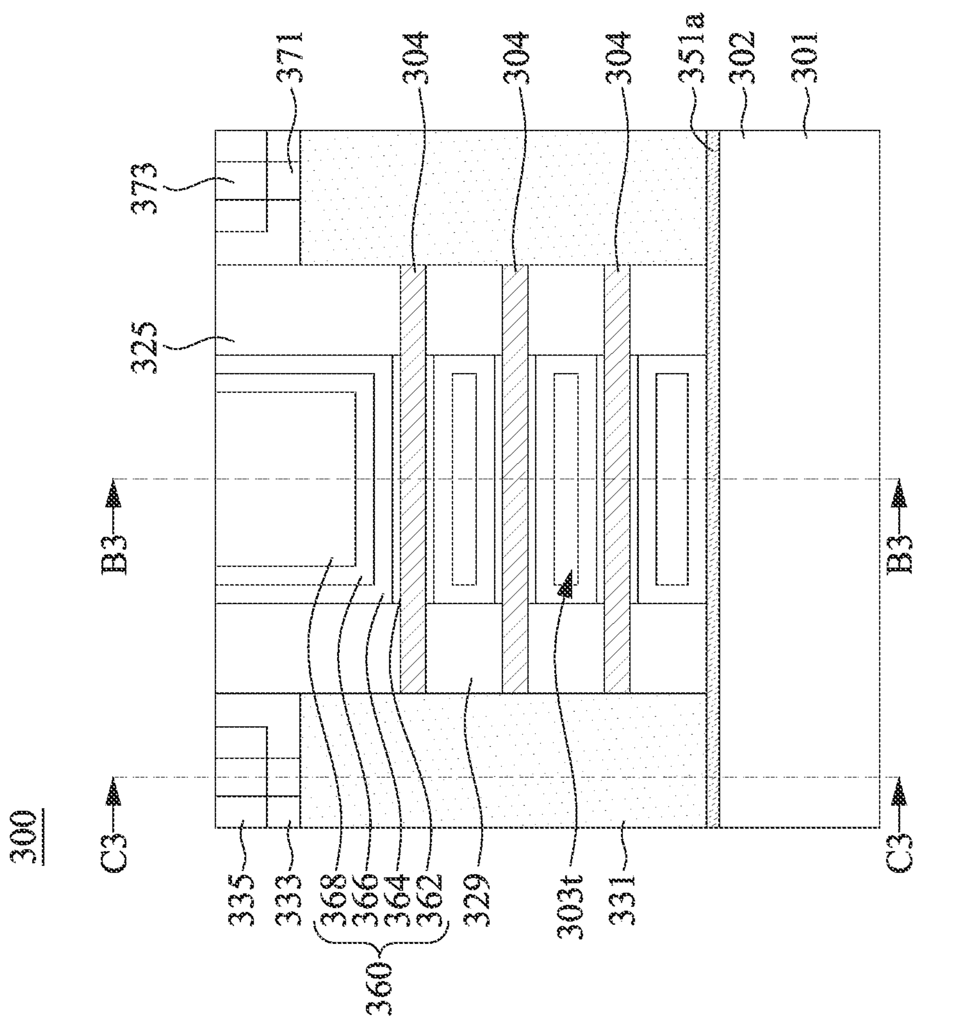
Figure 47C:
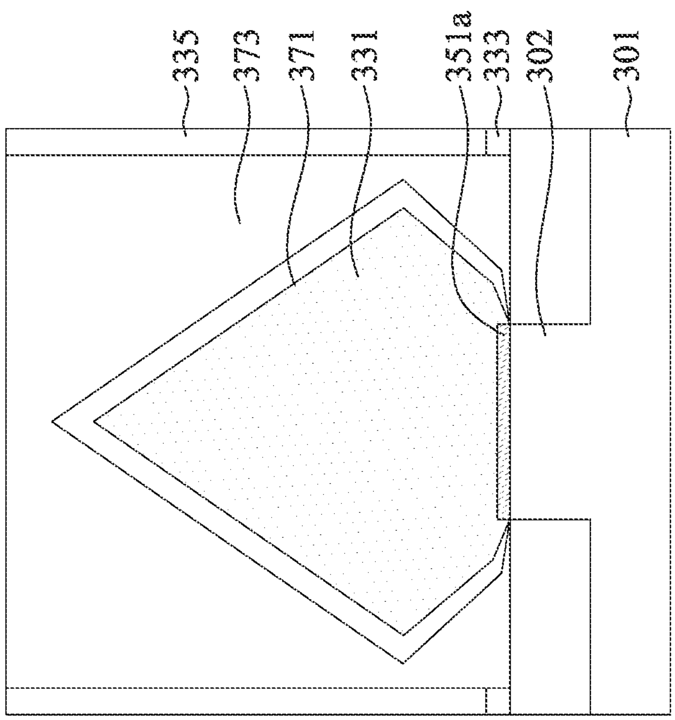
Figure 47B:
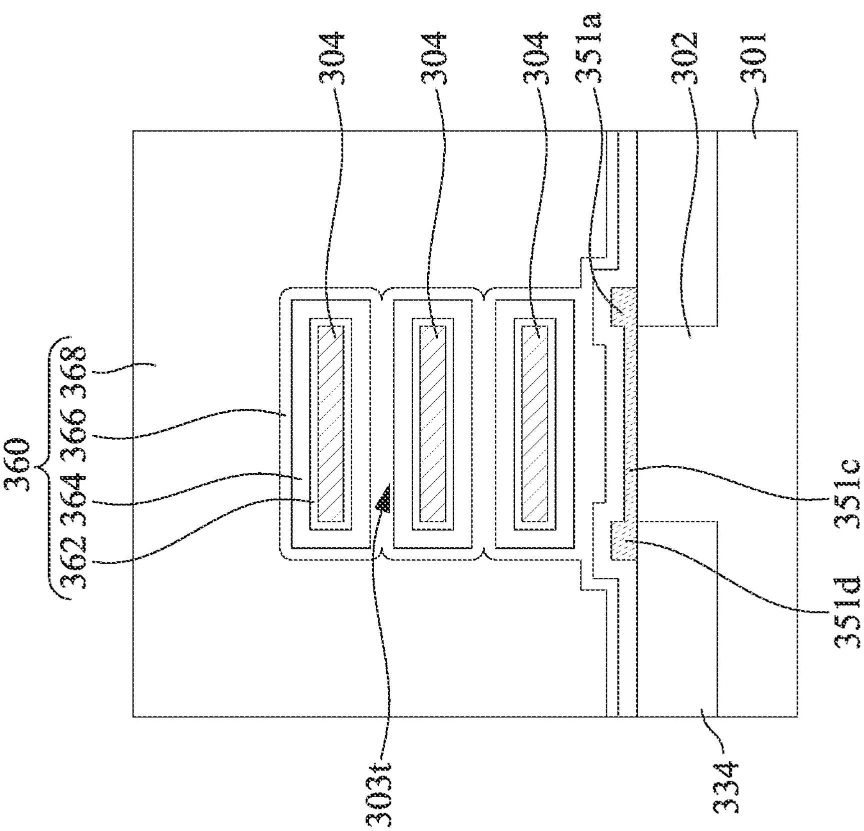

Reference is made to FIGS. 47A to 47C corresponding to FIGS. 41A to 41C. In FIG. 47A, the isolation layer 351*a* extends along a top surface of the semiconductor strip 302 and passes through a bottom of the gate structure 360 and bottoms of the source/drain structures 331. In FIG. 47B, the isolation layer 351*a* is interposed between the semiconductor strip 302 and the gate structure 360 and extends past opposite sidewalls of the semiconductor strip 302, and therefore the gate structure 360 is spaced apart from the semiconductor strip 302 by the isolation layer 351*a*. In greater detail, the isolation layer 351*a* has a greater width than the semiconductor strip 302. The isolation layer 351*a* has a first portion 351*c* on the semiconductor strip 302 and a second portion 351*d* on the isolation dielectric 334. The first portion 351*c* of the isolation layer 351*a* has a thinner thickness than the second portion 351*d* of the isolation layer 351*a*, such that the isolation layer 351*a* has a concave top surface. In FIG. 47C, the isolation layer 351*a* extends from a top surface of the semiconductor strip 302 into the epitaxy structure 331. Hence, the forming of the isolation layer 351*a* can not only reduce the parasitic leakage current but also reduce the parasitic capacitance of the semiconductor device. In some embodiments, the isolation layer 351*a* may be replaced by an air gap.

Figure 48A:
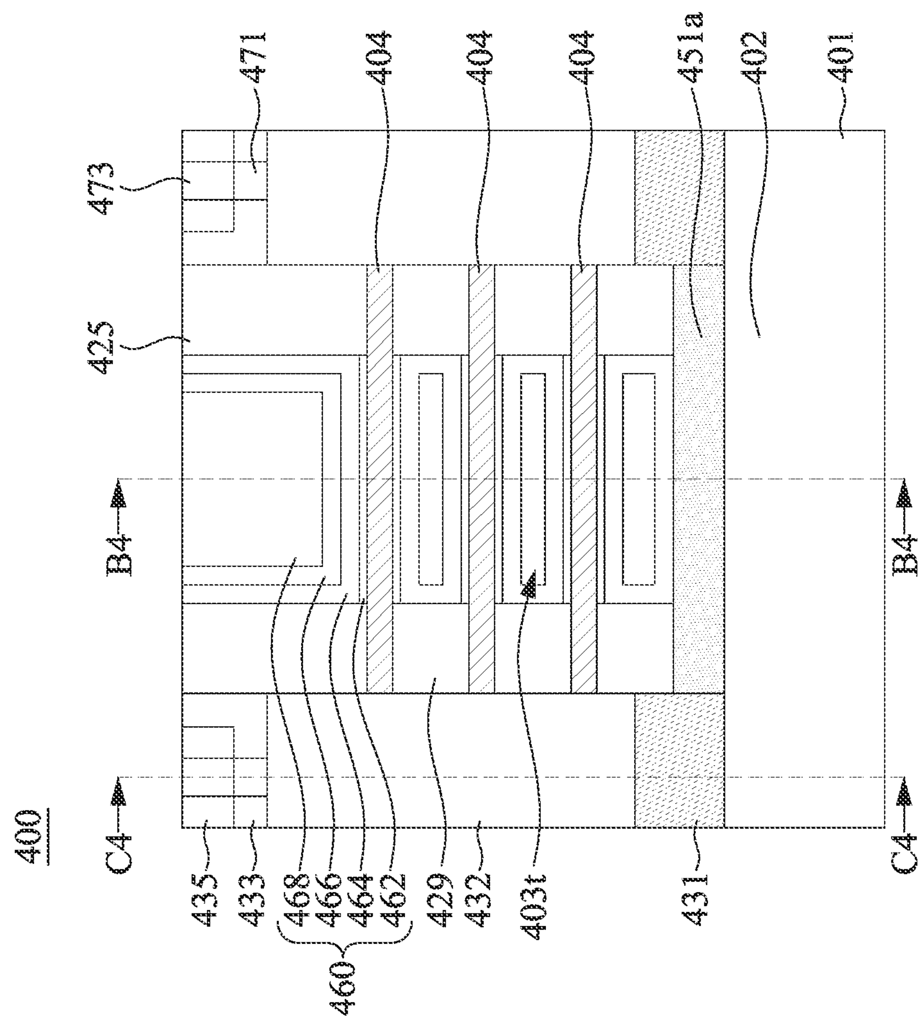
FIGS. 48A to 48C are schematic views of a semiconductor device in accordance with some embodiments of the present disclosure.
Figure 48C:
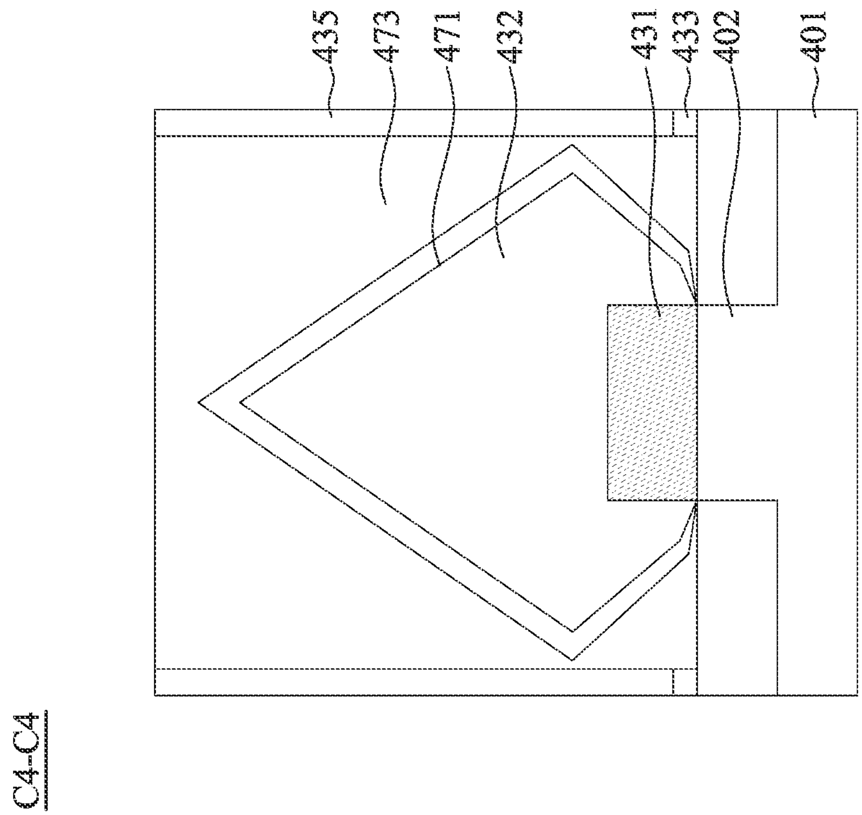
Figure 48B:
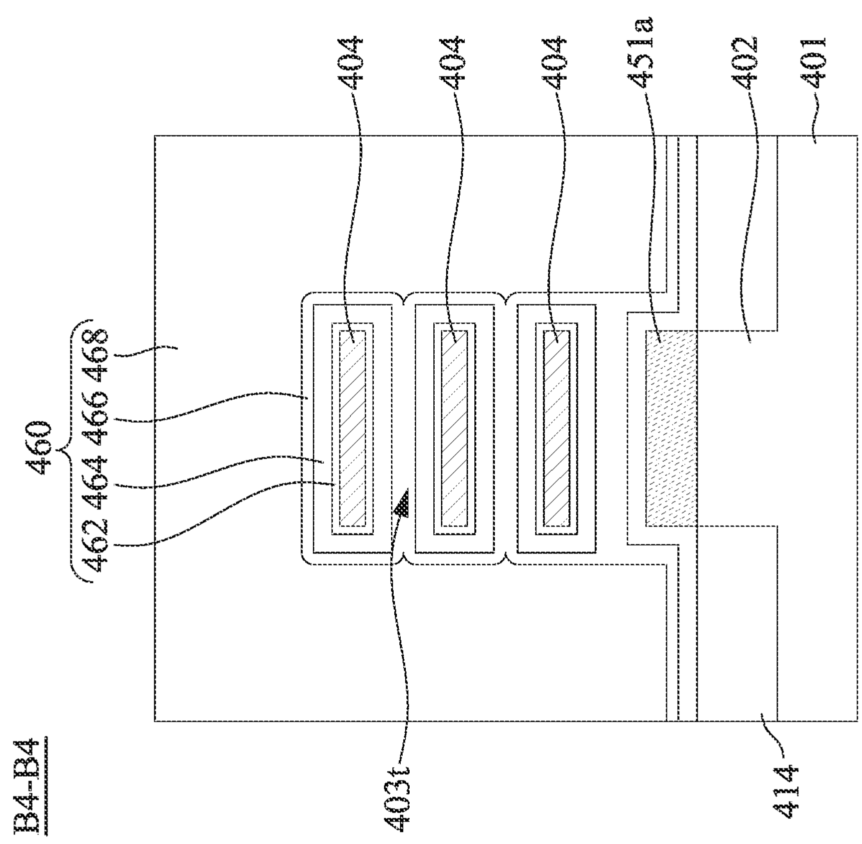

FIGS. 48A to 48C are schematic views of another semiconductor device in accordance with some embodiments of the present disclosure, in which FIG. 48A is a cross-sectional view corresponding to line A1-A1 in FIG. 1A, FIG. 48B is a cross-sectional view along line B4-B4 in FIG. 48A and corresponding to line B1-B1 in FIG. 1A, and FIG. 48C is a cross-sectional view along line C4-C4 in FIG. 48A corresponding to line C1-C1 in FIG. 1A. It is noted that some elements are not illustrated in in FIGS. 48A to 48C for brevity. The same or similar configurations and/or materials as described with FIGS. 1B to 1D may be employed in FIGS. 48A to 48C, and the detailed explanation may be omitted. In some embodiments, configurations and/or materials of a substrate 401, a semiconductor strip 402, trenches 403*t*, a channel layer 404, an isolation dielectric 414, a gate structure 460 (including an interfacial layer 462, a gate dielectric layer 464, a work function metal layer 466, and a gate electrode 468), spacers 425 and 429, a source/drain structure 432, a contact etch stop layer (CESL) 433, and an interlayer dielectric (ILD) layer 435 as shown in FIGS. 48A to 48C may be substantially the same as or comparable to that of the substrate 101, the semiconductor strip 102, trenches 103*t*, the channel layer 104, the isolation dielectric 114, the gate structure 160, spacers 125 and 129, the source/drain structure 131, the CESL 133, and the ILD layer 135 as shown in FIGS. 1B and 1D, and the related detailed descriptions may refer to the foregoing paragraphs, and are not described again herein. The difference between the present embodiment and the embodiment in FIGS. 48A to 48C is that an isolation layer 451*a* and the isolation structure 431 of the present embodiment replace the isolation layer 151*a* shown in FIGS. 1B to 1D.

In FIGS. 48A and 48B, the isolation layer 451*a* extends along a top surface of the semiconductor strip 402 and passes through a bottom of the gate structure 460 and the inner spacers 429. The isolation layer 451*a* is interposed between the semiconductor strip 402 and the gate structure 460, and therefore the gate structure 460 is spaced apart from the semiconductor strip 402 by the isolation layer 451*a*. Hence, the parasitic leakage current and the parasitic capacitance of the semiconductor device may be eliminated, which may improve the IOFF of the semiconductor device and in turn beneficial affects the gate control, thereby the device performance may be improved. In some embodiments, the isolation layer 451*a* has a flat top surface. In some embodiments, the isolation layer 451*a* may include $SiO_2$, $Si_3N_4$, $SiO_xN_y$, SiC, SiCN films, SiOC, SiOCN films, and/or combinations thereof. In some embodiments, the isolation layer 451*a* may be replaced by an air gap.

In FIGS. 48A and 48C, the isolation structure 431 is formed to extend from the semiconductor strip 402 to a position level with the bottommost position of the isolation structure 431 to be embedded in the source/drain structure 432, such that the source/drain structure 432 is spaced apart from the semiconductor strip 402 by the isolation structure 431. In some embodiments, the isolation structure 431 may have a height in a range from about 25 nm to about 500 nm, by way of example but not limitation.

In some embodiments, the epitaxial growth process may be performed on the semiconductor strip 402. The isolation structures 431 can also be interchangeably referred to as epitaxial structures. The isolation structure 431 and the source/drain structures 432 have oppositely doped epitaxial source/drain features. In some embodiments, the isolation structure 431 may include a p-type dopant in a case where the semiconductor device 400 is of an nFET device, and the isolation structure 431 may include an n-type dopant in a case where the semiconductor device 400 is of a pFET device. Hence, the parasitic leakage current and the parasitic capacitance of the semiconductor device may be eliminated due to the forming of the epitaxial structure, which may also improve the IOFF of the semiconductor device and in turn beneficial affects the gate control, thereby the device performance may be improved.

By way of example and not limitation, for the semiconductor device 400 as nFET device, the isolation structure 431 may be an epitaxial layer including silicon and/or germanium, where the silicon germanium containing epitaxial layers are doped with boron, carbon, other p-type dopant, or combinations thereof (for example, forming a Si:Ge:B epitaxial layer or a Si:Ge:C epitaxial layer). In furtherance of the example, for the semiconductor device 400 as the pFET device, the isolation structure 431 may be an epitaxial layer including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer, a Si:C epitaxial layer, or a Si:C:P epitaxial layer).

Figure 49A:
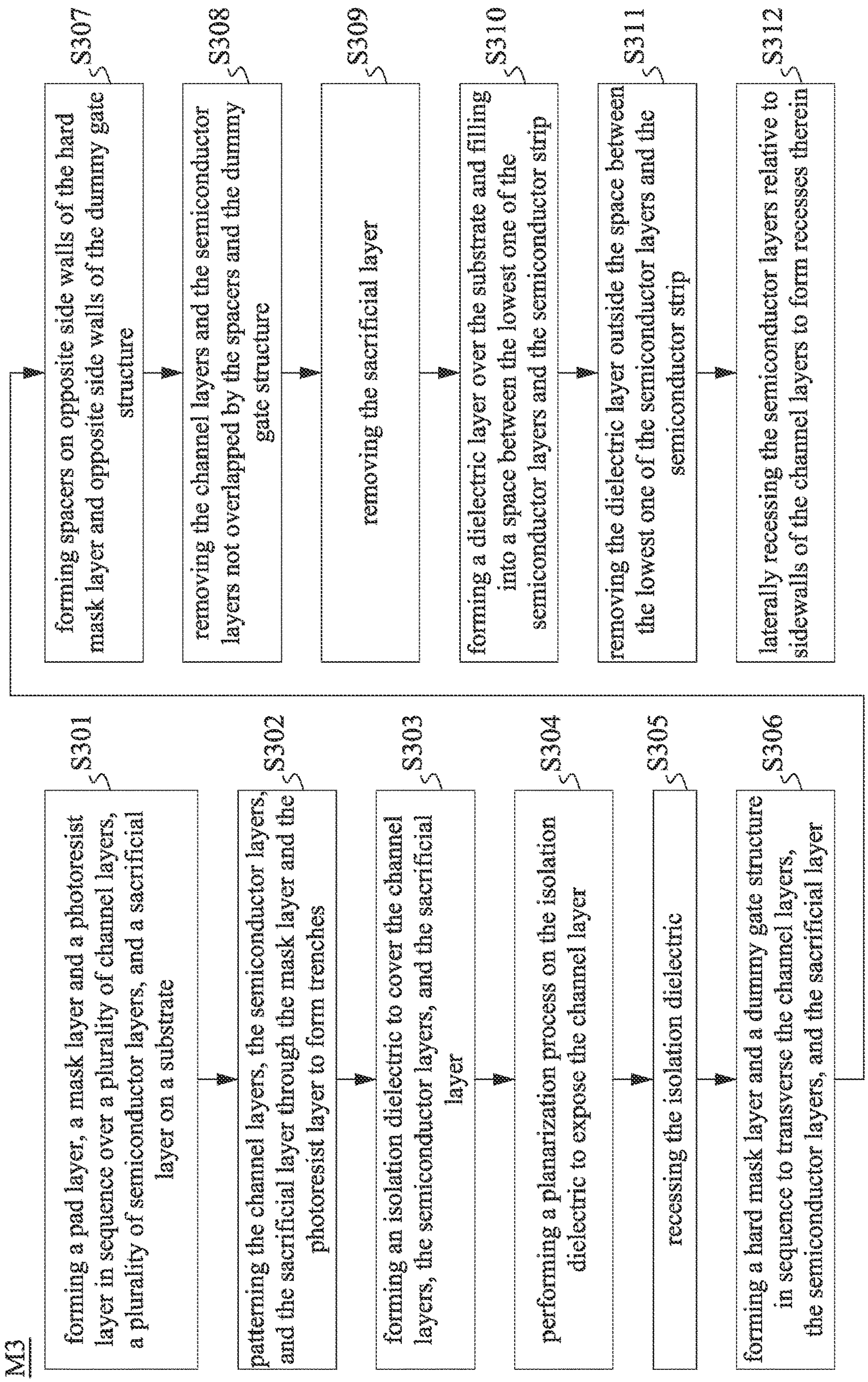
FIGS. 49A to 49C are a method M3 of manufacturing a semiconductor device in accordance with some embodiments of the present disclosure.
Figure 49B:
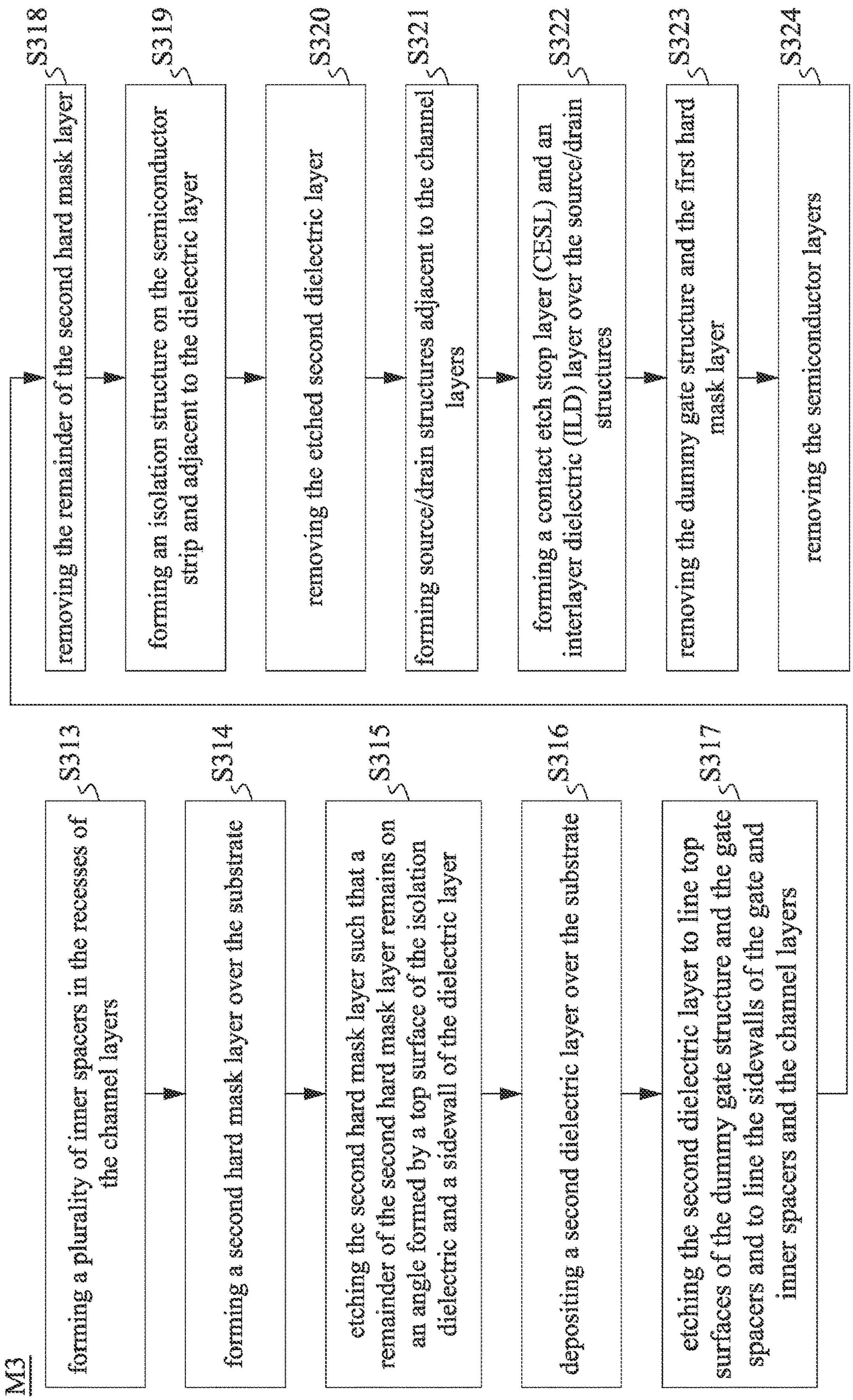

Referring now to FIGS. 49A and 49B, illustrated is an exemplary method M3 for fabrication of a semiconductor device in accordance with some embodiments. The method M3 includes a relevant part of the entire manufacturing process. It is understood that additional operations may be provided before, during, and after the operations shown by FIGS. 49A and 49B, and some of the operations described below can be replaced or eliminated for additional embodiments of the method. The order of the operations/processes may be interchangeable. It is noted that FIGS. 49A and 49B have been simplified for a better understanding of the disclosed embodiment.

FIGS. 50A to 65C illustrate a method in various stages of fabricating the semiconductor device 400 in accordance with some embodiments of the present disclosure. FIGS. 50A-65A are cross-sectional views corresponding to line A1-A1 in FIG. 1A. FIGS. 50B-65B are cross-sectional views along line B4-B4 in FIGS. 50A-65A and corresponding to line B1-B1 in FIG. 1A. FIGS. 50C-65C are cross-sectional views along line C4-C4 in FIGS. 50A-65A and corresponding to line C1-C1 in FIG. 1A.

Figure 50A:
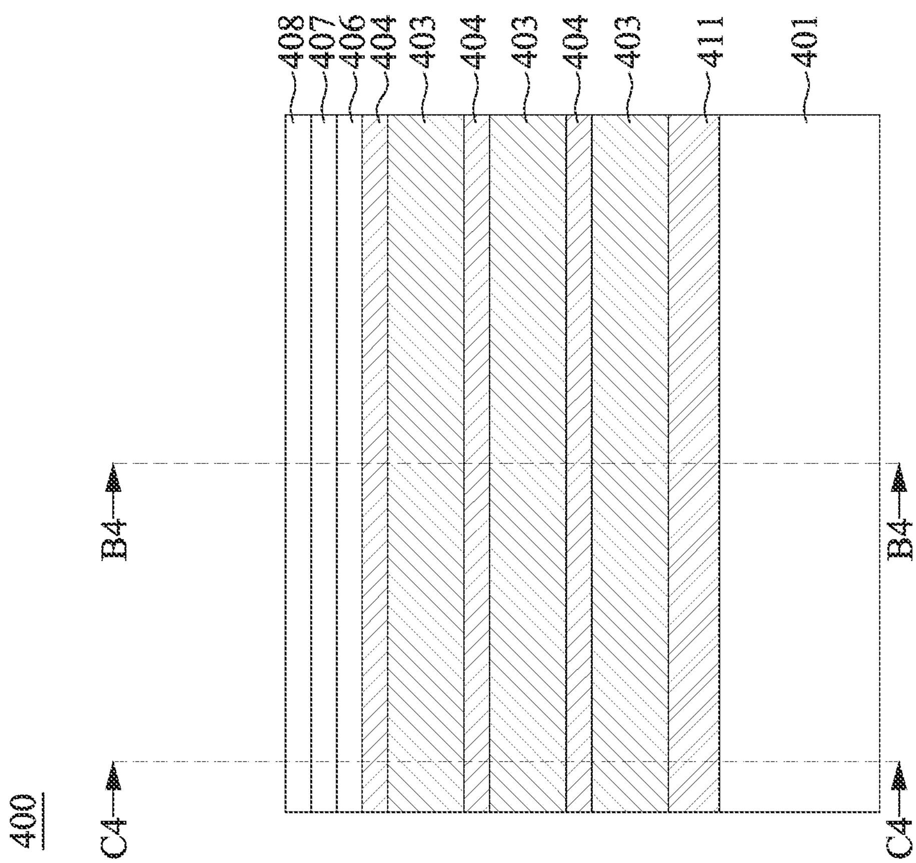
FIGS. 50A to 65C illustrate a method in various stages of fabricating the semiconductor device in accordance with some embodiments of the present disclosure.
Figure 50C:
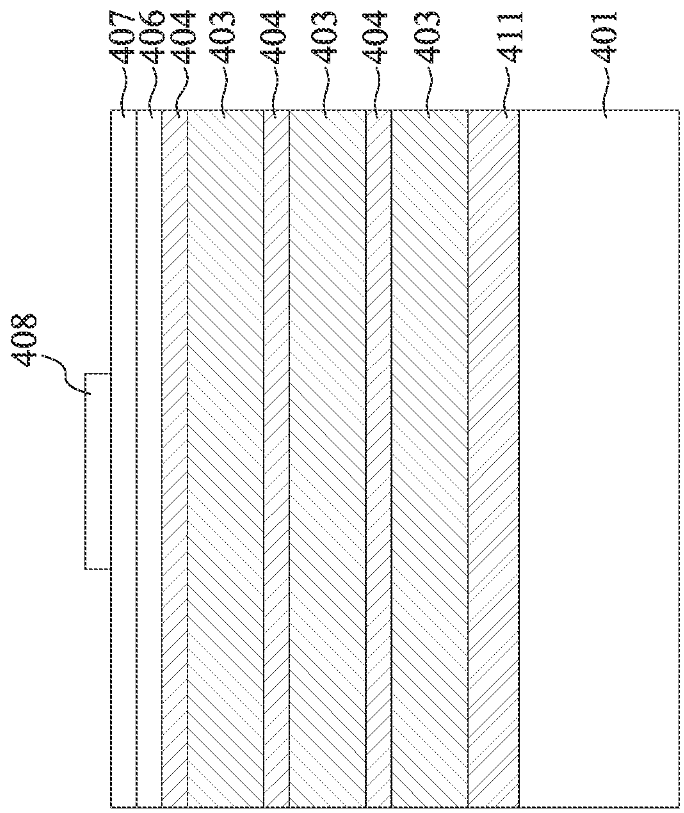
Figure 50B:
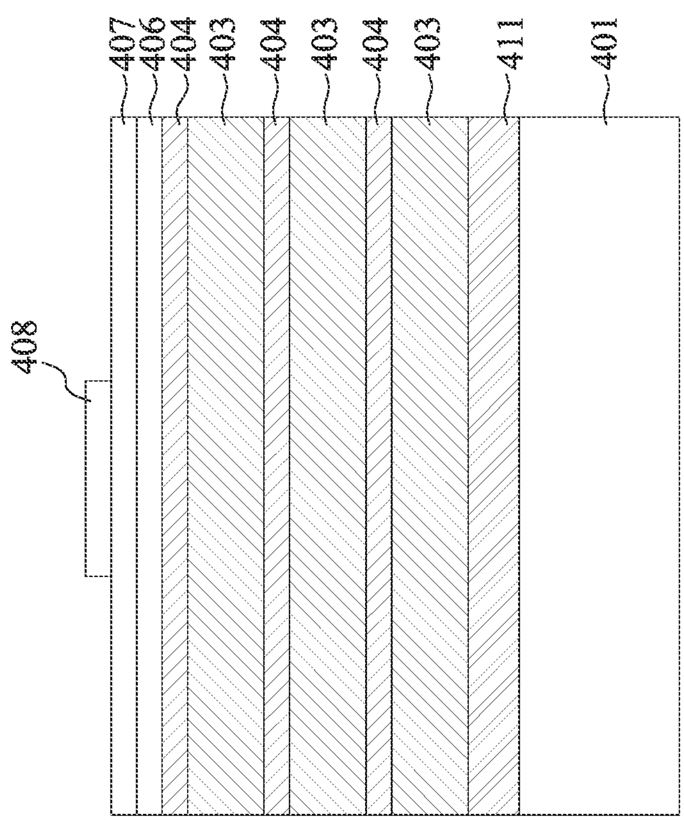

The method M3 begins at block S301 where a pad layer, a mask layer and a photoresist layer are formed in sequence over a plurality of channel layers, a plurality of semiconductor layers, and a sacrificial layer on a substrate, as illustrated in FIGS. 50A to 50C. In some embodiments, material and manufacturing method of the a substrate 401, a pad layer 406, a mask layer 407 and a patterned photoresist layer 408 may be substantially the same as that of the substrate 101, a semiconductor layer 103, the channel layer 104, and the pad layer 106, the mask layer 107 and the patterned photoresist layer 108 as shown in FIGS. 3A to 3C, and the related detailed descriptions may refer to the foregoing paragraphs, and are not described again herein. The difference between the present embodiment and the embodiment in FIGS. 3A to 3C is that a single sacrificial layer of the present embodiment replaces a pair of sacrificial layers shown in FIGS. 3A to 3C.

As shown in FIGS. 50A to 50C, a sacrificial layer 411 is formed over the substrate 401 and a plurality of semiconductor layers 403 and a plurality of channel layers 404 are alternately formed over the sacrificial layer 411. In some embodiments, the sacrificial layer 411 and the semiconductor layer 403 have the same material and/or components, but ratios of the material components thereof are different from each other, such that the sacrificial layer 411 and the semiconductor layers 403 have different etching rates. For example, the sacrificial layer 411 and the semiconductor layer 403 are made from SiGe. The sacrificial layer 411 has a different germanium atomic percentage concentration than the lowermost one of the semiconductor layer 403. In some embodiments, the sacrificial layer 411 has a higher germanium atomic percentage concentration than the lowermost one of the semiconductor layer 403.

In FIGS. 50A to 50C, the germanium percentage (atomic percentage concentration) of the sacrificial layer 411 is in the range between about 30 percent and about 80 percent, e.g., about 60 percent, while higher or lower germanium percentages may be used, the proportion between Si and Ge may vary from embodiments, and the disclosure is not limited thereto. The germanium percentage (atomic percentage concentration) of the lowermost one of the semiconductor layer 103 is in the range between about 10 percent and about 30 percent, e.g., about 15 percent, while higher or lower germanium percentages may be used, the proportion between Si and Ge may vary from embodiments, and the disclosure is not limited thereto. In some embodiments, the sacrificial layer 411 has a lower germanium atomic percentage concentration than the lowermost one of the semiconductor layer 403. In some embodiments, the sacrificial layer 411 and the semiconductor layers 403 may have different material and/or components, such that the sacrificial layer 411 and the semiconductor layers 403 have different etching rates. In some embodiments, the sacrificial layer 411 has a thickness in a range from about 4 nm to about 60 nm, e.g., 10, 20, 30, 40, 50 nm, and the disclosure is not limited thereto.

In some embodiments, the semiconductor layers 403 and the channel layers 404 have different materials and/or components, such that the semiconductor layers 403 and the channel layers 404 have different etching rates. The channel layers 404 may be pure silicon layers that are free from germanium. The channel layers 404 may also be substantially pure silicon layers, for example, with a germanium percentage lower than about 1 percent, such that the semiconductor layers 403 have a higher germanium atomic percentage concentration than the channel layers 404.

The sacrificial layer 411, the semiconductor layers 103, and the channel layers 104 may be formed by chemical vapor deposition (CVD), molecular beam epitaxy (MBE), or other suitable process(es). In some embodiments, the sacrificial layer 411, the semiconductor layers 403, and the channel layers 404 are formed by an epitaxy growth process, and thus the sacrificial layer 411, the semiconductor layers 403, and the channel layers 404 can also be referred to as epitaxial layers in this content. In some embodiments, a ground plane doping process may be performed on the channel layers 104 (e.g., an n-doping process for pFET device, and a p-doping process for nFET device). For example, the grown materials may be in-situ doped during growth, which may obviate prior implanting of the channel layers 404 although in-situ and implantation doping may be used together. In some embodiments, the semiconductor layers 403 and the channel layers 404 may include silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, or the like.

Figure 51A:
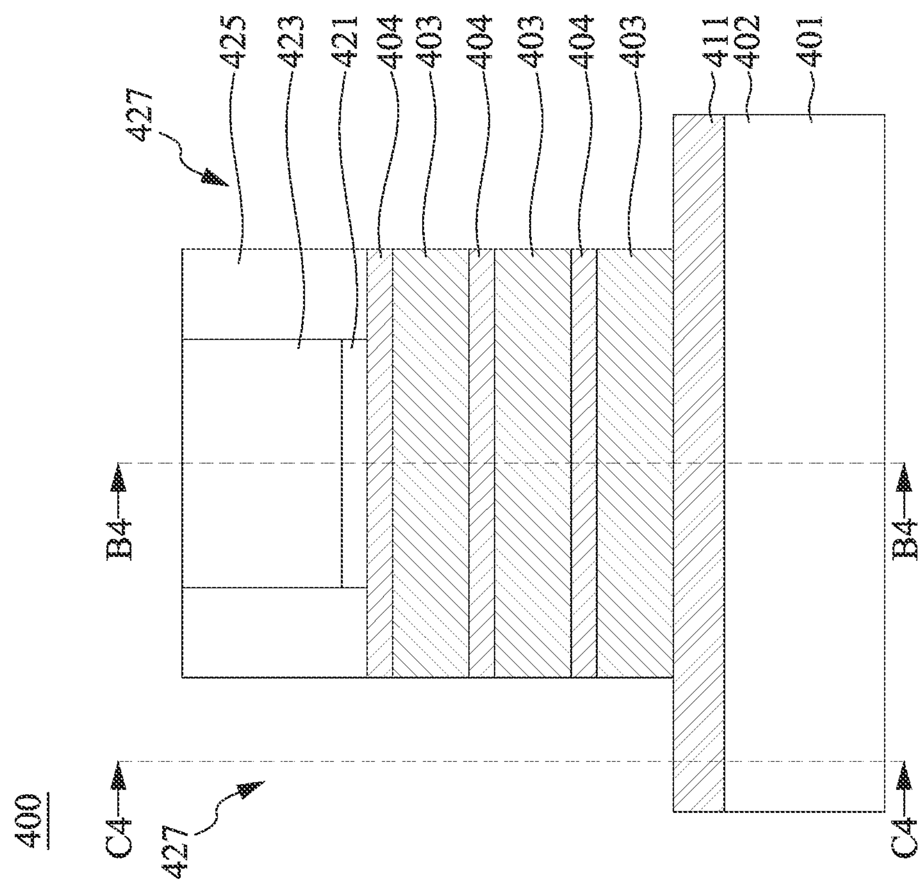
Figures 51B, 51C:
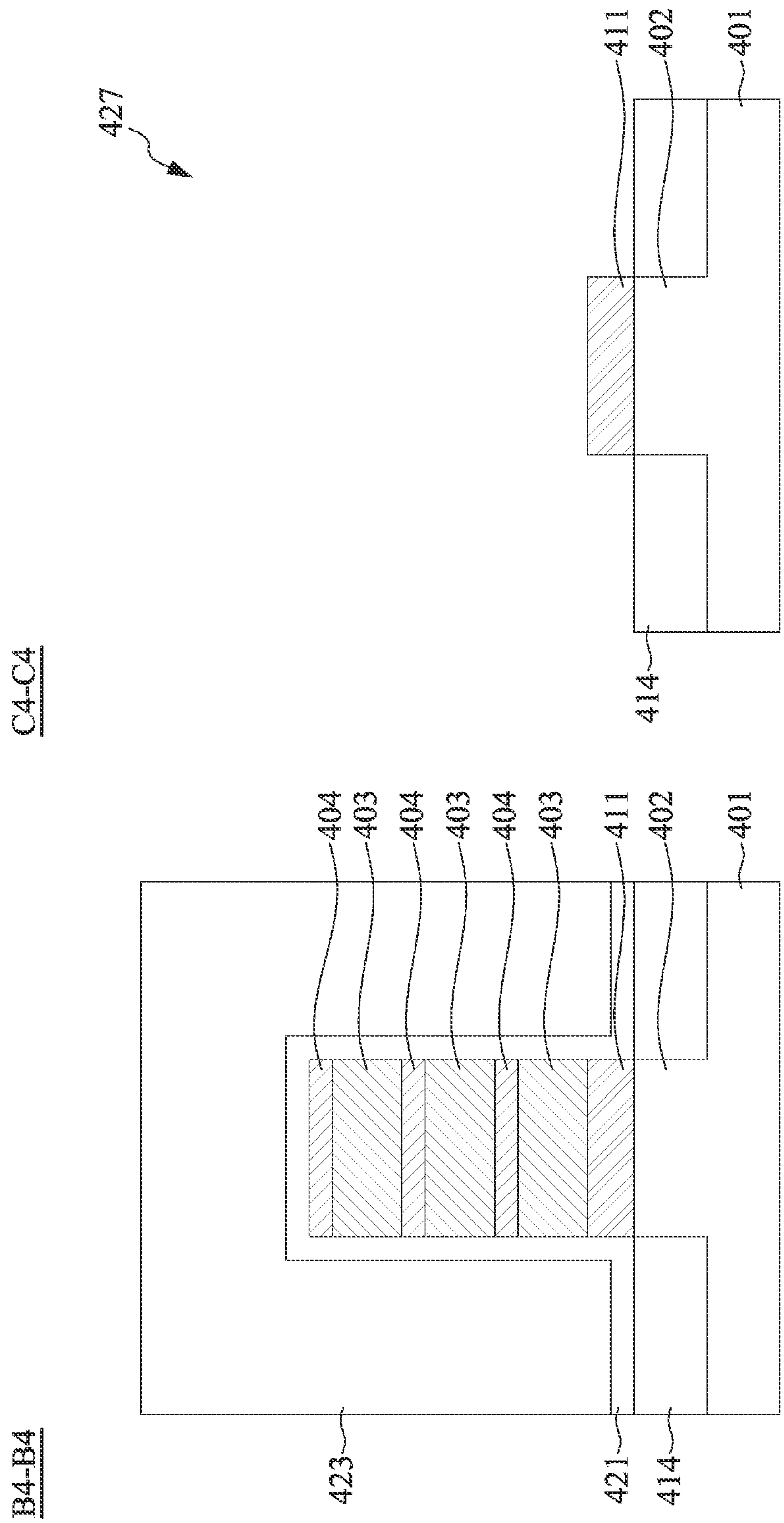

Operations for forming a semiconductor device 400 after the structure shown in FIGS. 50A to 50C and prior to the structure shown in FIGS. 51A to 51C at stages S302-S308 of the method M3 are substantially the same as the operations for forming the semiconductor device 100 shown in FIGS. 4A-10C at stages S102-S108 of the method M1, and reference may be made to the foregoing paragraphs for the related detailed descriptions and such descriptions are not provided again herein. For example, material and manufacturing method of the semiconductor strip 402, the hard mask layer 421, dummy gate structure 423, and the gate spacer 425 may be substantially the same as that of the semiconductor strip 102, the hard mask layer 121, dummy gate structure 123, and the gate spacer 125 as shown in FIGS. 4A to 10C, and the related detailed descriptions may refer to the foregoing paragraphs, and are not described again herein.

Returning to FIG. 49A, the method M3 then proceeds to block S308 where the channel layers and the semiconductor layers not overlapped by the gate spacers and the dummy gate structure are removed. With reference to FIGS. 51A to 51C, in some embodiments of block S308, an etch process, such as, reactive ion etching (RIE), atomic layer etching (ALE), or a combination thereof, may be performed on portions of the semiconductor layers 403 and the channel layers 404 (shown in FIGS. 9A to 9C) exposed from the dummy gate structure 423 and the gate spacers 425 (i.e., outside the dummy gate structure 423 and the gate spacers 425). As such, the exposed semiconductor layers 403 and the channel layers 404 are removed to expose the sacrificial layer 411 and the isolation dielectric 414. The recesses 427 are formed in the semiconductor layers 403 and the channel layers 404.

Figure 52A:
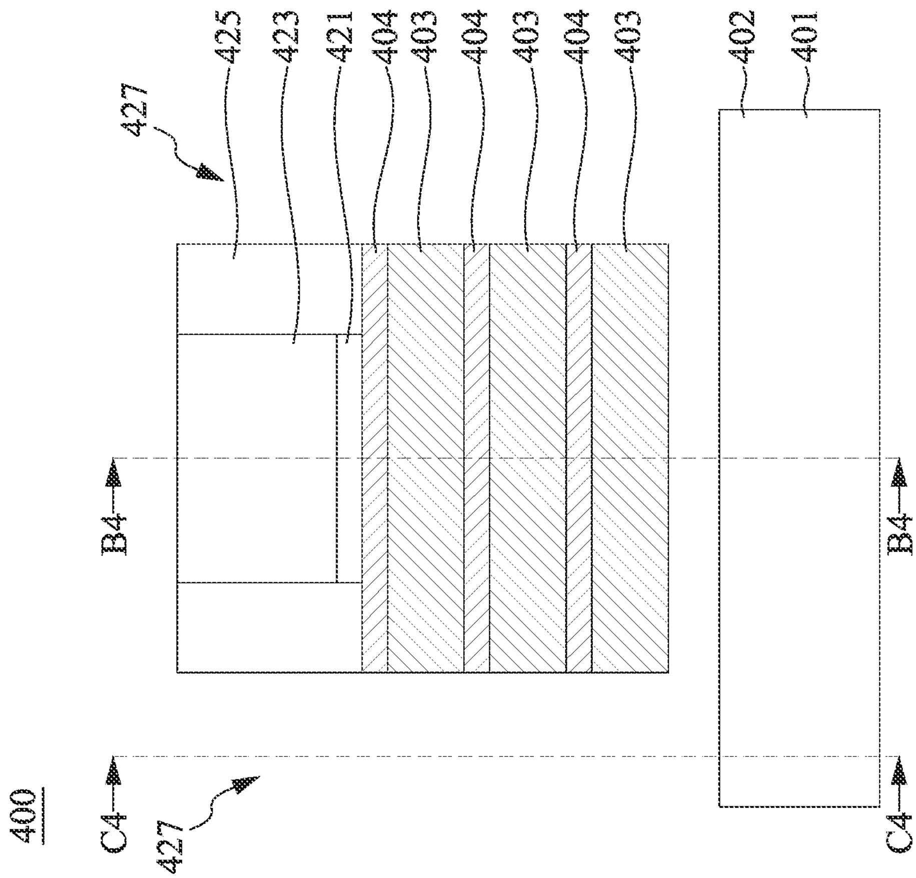
Figure 52C:
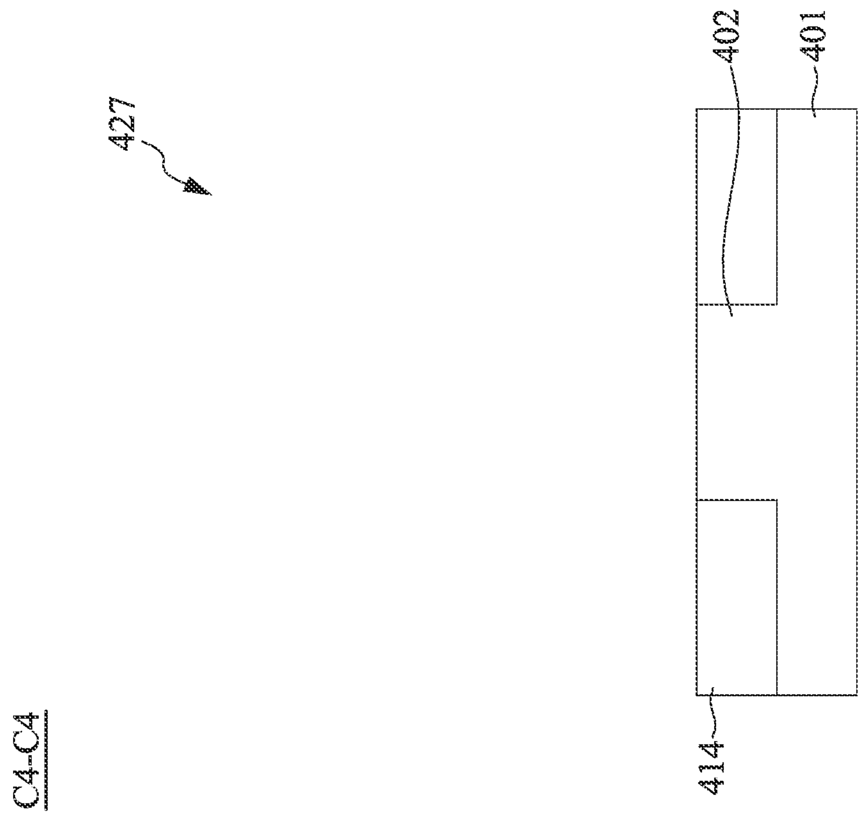
Figure 52B:
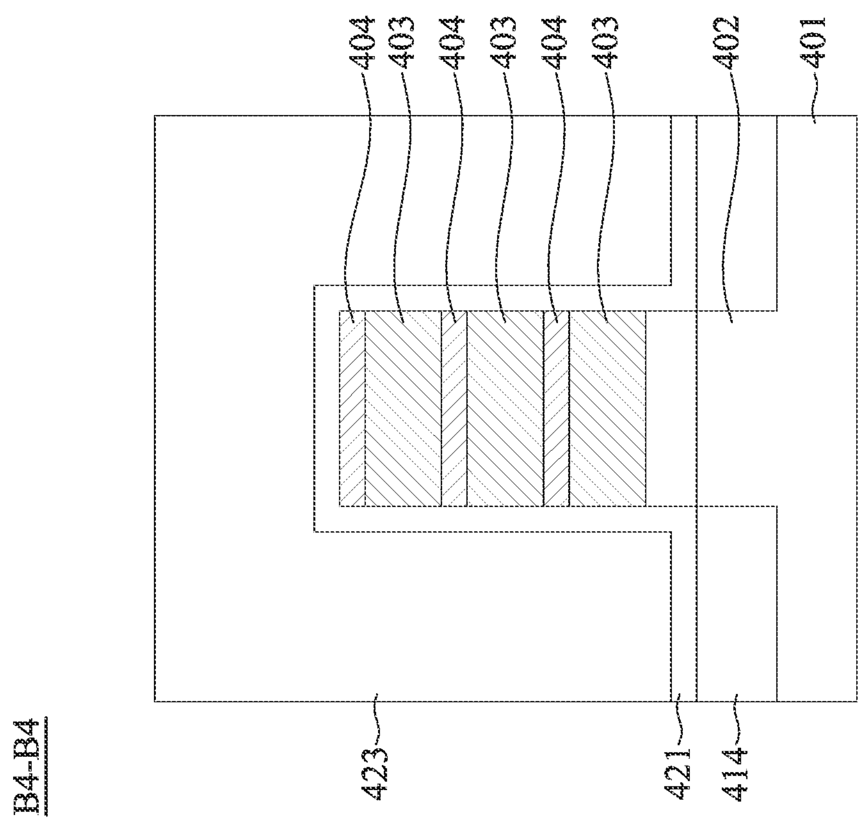

Returning to FIG. 49A, the method M3 then proceeds to block S309 where the sacrificial layer is removed. With reference to FIGS. 52A to 52C, in some embodiments of block S309, the removing of the sacrificial layer 411 may include a dry etching process or other suitable etching processes. In some embodiments, the etch process include using a technique and etchant selected to etch the sacrificial layer 411 without significant etching of the surrounding structures, such that the lowest one of the semiconductor layers 403 is vertically spaced apart from the semiconductor strip 402 by a distance in a range from about 4 nm to about 60 nm, e.g., about 10, 20, 30, 40, 50 nm, by way of example but not limitation.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $NF_3$, $SF_6$, $CH_2F_2$, $CHF_3$, $C_2F_6$, and/or $C_4F_8$), a chlorine-containing gas (e.g., $Cl_2$, HCl, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 53A:
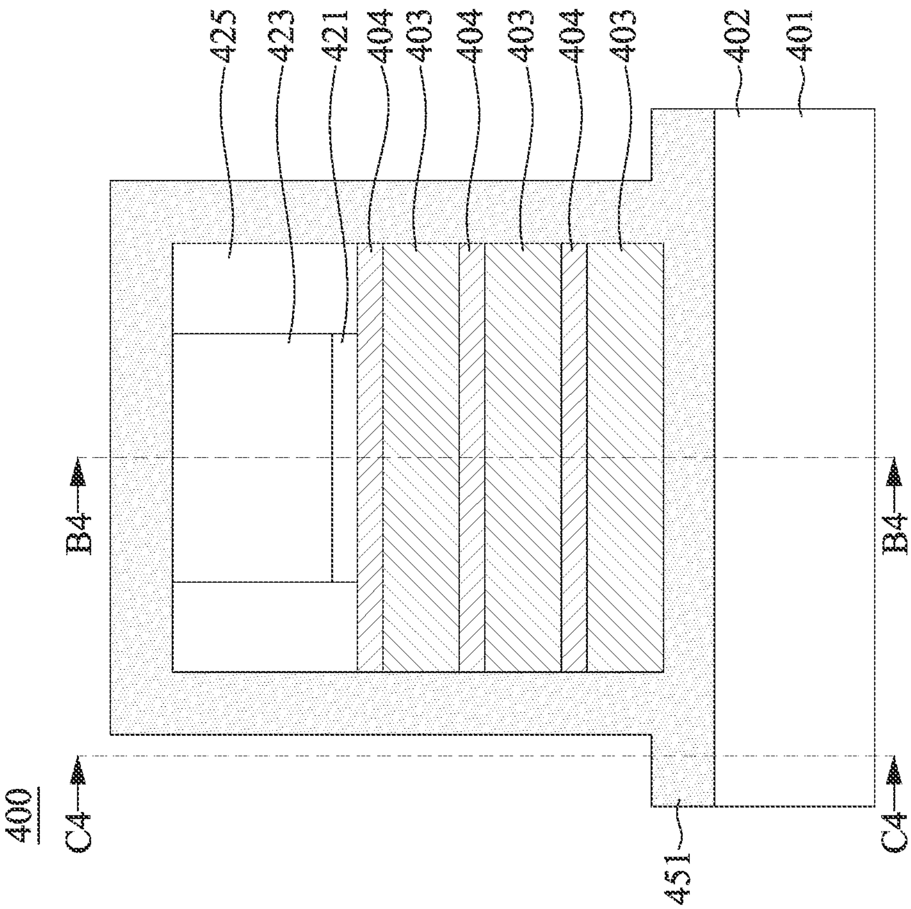
Figure 53C:
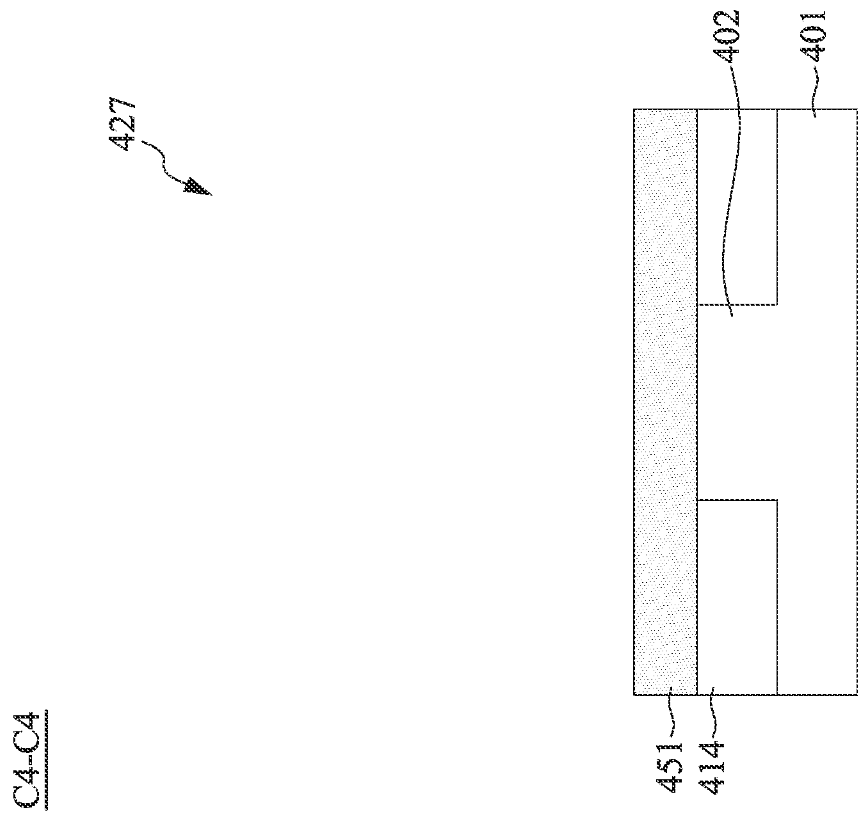
Figure 53B:
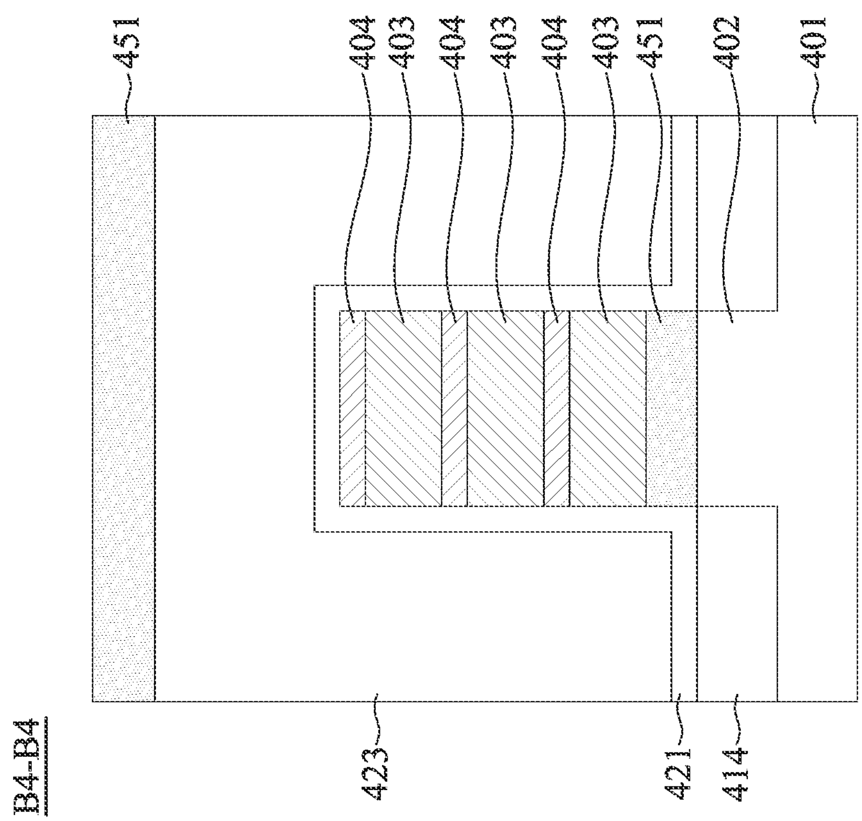

Returning to FIG. 49A, the method M3 then proceeds to block S310 where a first dielectric layer is formed over the substrate and fill into a space between the lowest one of the semiconductor layers and the semiconductor strip. With reference to FIGS. 53A to 53C, in some embodiments of block S310, a dielectric layer 451 is formed to cover the dummy gate structure 423, the gate spacer 425, the semiconductor layers 403, and the channel layers 404 and fill into a space between the lowest one of the semiconductor layers 403 and the semiconductor strip 402. In some embodiments, the dielectric layer 451 may include $SiO_2$, $Si_3N_4$, $SiO_xN_y$, SiC, SiCN films, SiOC, SiOCN films, and/or combinations thereof. In some embodiments, the dielectric layer 451 may be formed by suitable deposition processes, for example, chemical vapor deposition (CVD), plasma enhanced chemical vapor deposition (PECVD), atomic layer deposition (ALD), evaporation, physical vapor deposition (PVD), chemical solution deposition, or other like processes.

Figure 54A:
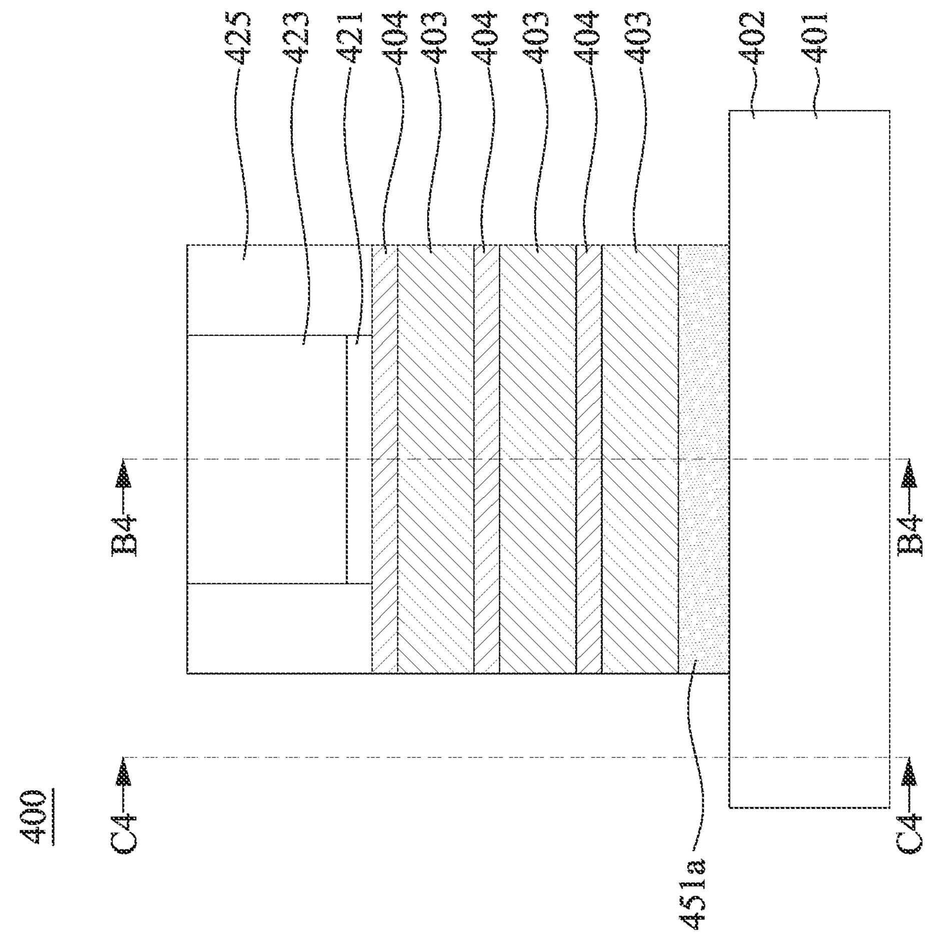
Figure 54C:
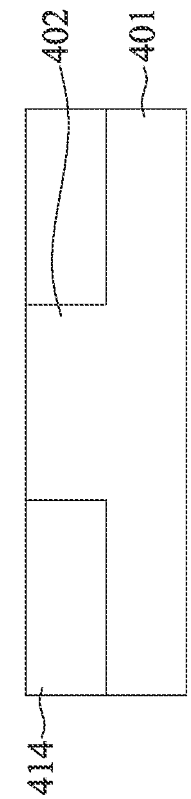
Figure 54B:
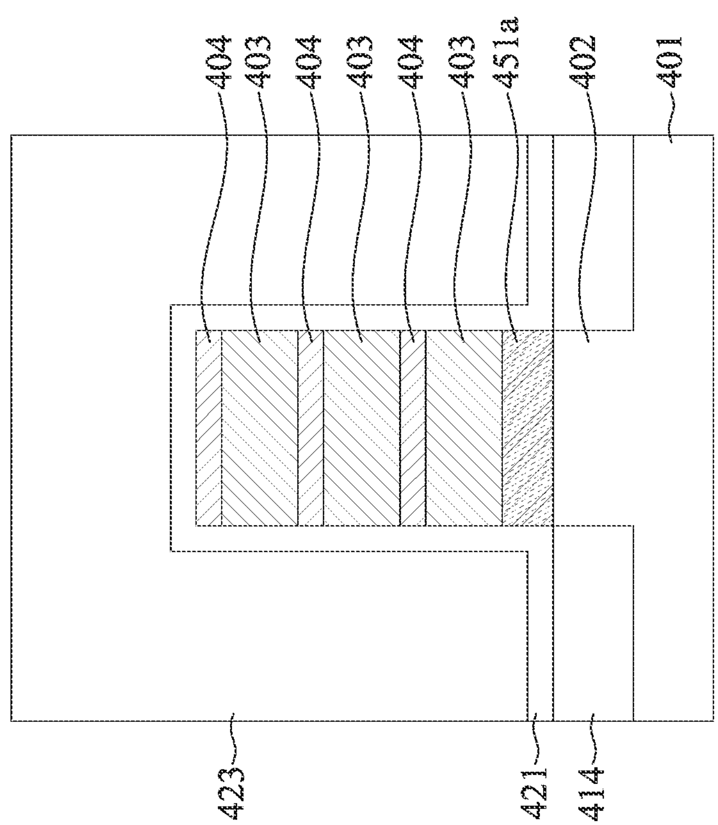

Returning to FIG. 49A, the method M3 then proceeds to block S311 where the first dielectric layer outside the space between the lowest one of the semiconductor layers and the semiconductor strip is removed. With reference to FIGS. 54A to 54C, in some embodiments of block S311, the dielectric layer 451 outside the space between the lowest one of the semiconductor layers 403 and the semiconductor strip 402 is removed, and a remainder of the dielectric layer 451 between the lowest one of the semiconductor layers 403 and the semiconductor strip 402 may be also referred to as an isolation layer 451*a*. In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., HF, $CF_4$, $NF_3$, $SF_6$, $CH_2F_2$, $CHF_3$, $C_2F_6$, and/or $C_4F_8$), a chlorine-containing gas (e.g., $Cl_2$, HCl, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a dry etching process may implement with HF and $NH_3$ gas.

Figure 55A:
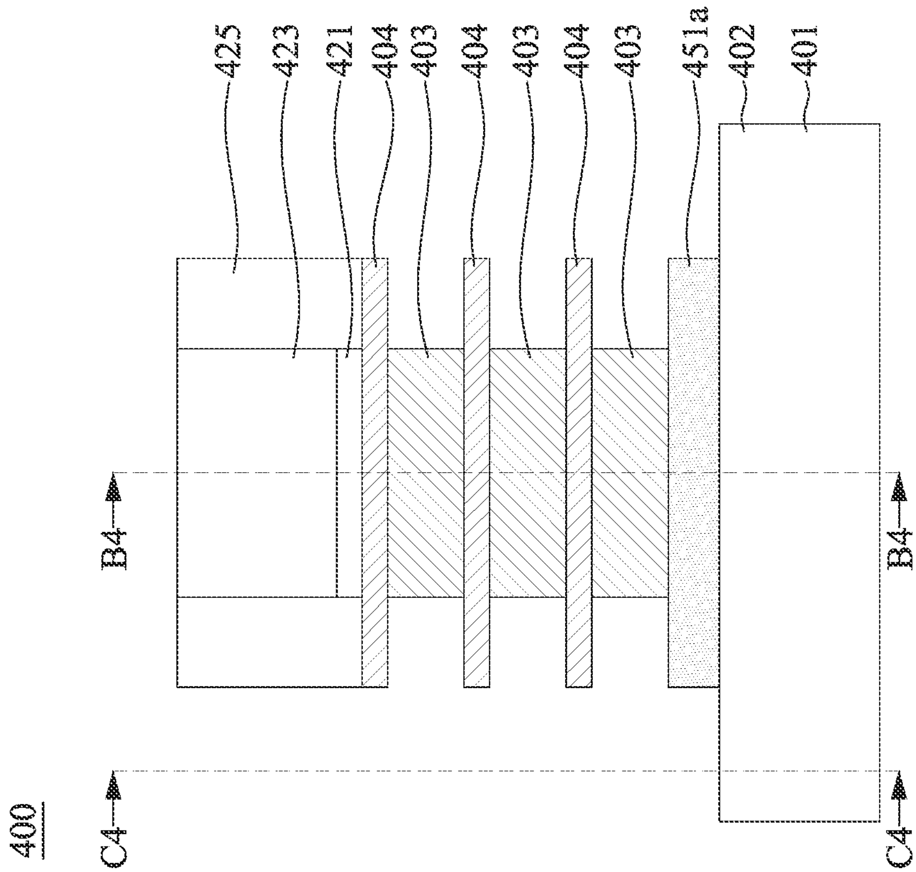
Figure 55B:
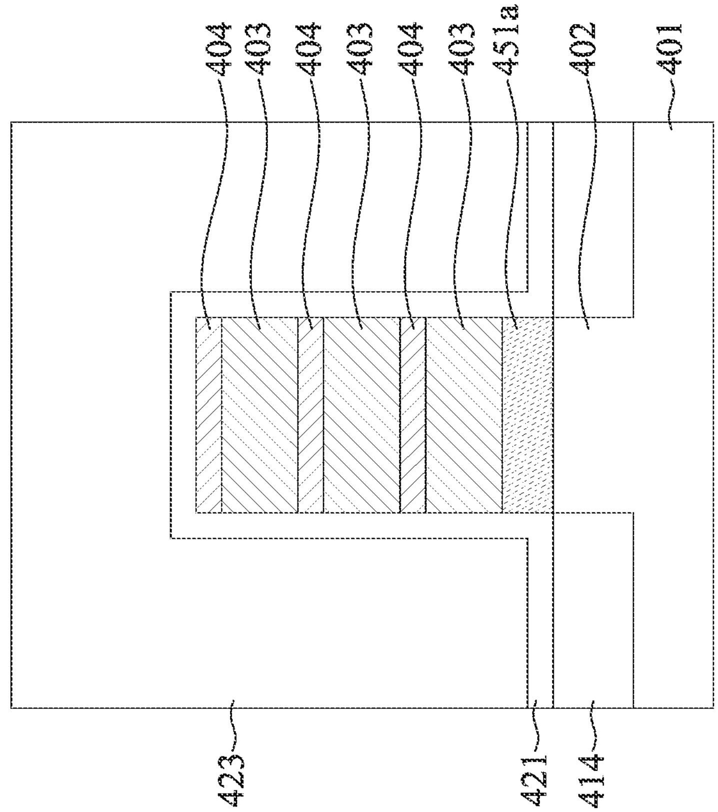
Figure 55C:
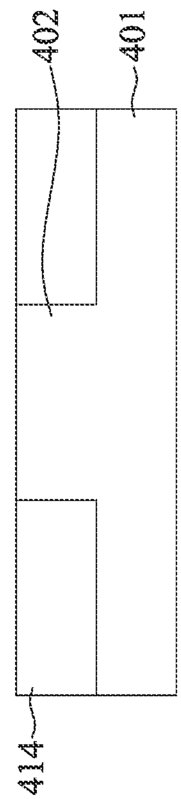

Returning to FIG. 49A, the method M3 then proceeds to block S312 where the semiconductor layers are laterally recessed relative to sidewalls of the channel layers to form recesses therein. With reference to FIGS. 55A to 55C, in some embodiments of block S312, an etch process is performed to laterally shorten the semiconductor layers 403 through the recesses 427, so as to form spaces adjacent to the channel layer 404.

In some embodiments, the channel layers 404 remain substantially intact after removing the portions of the semiconductor layers 403 due to the nature of the anisotropic etching process that selectively etches the material of the semiconductor layers 403 at a faster etch rate than it etches the channel layers 404. The shortened length of the semiconductor layer 403 depends on process conditions of the anisotropic etching process (e.g., etching time duration and/or the like). In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., HCl, $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 56A:
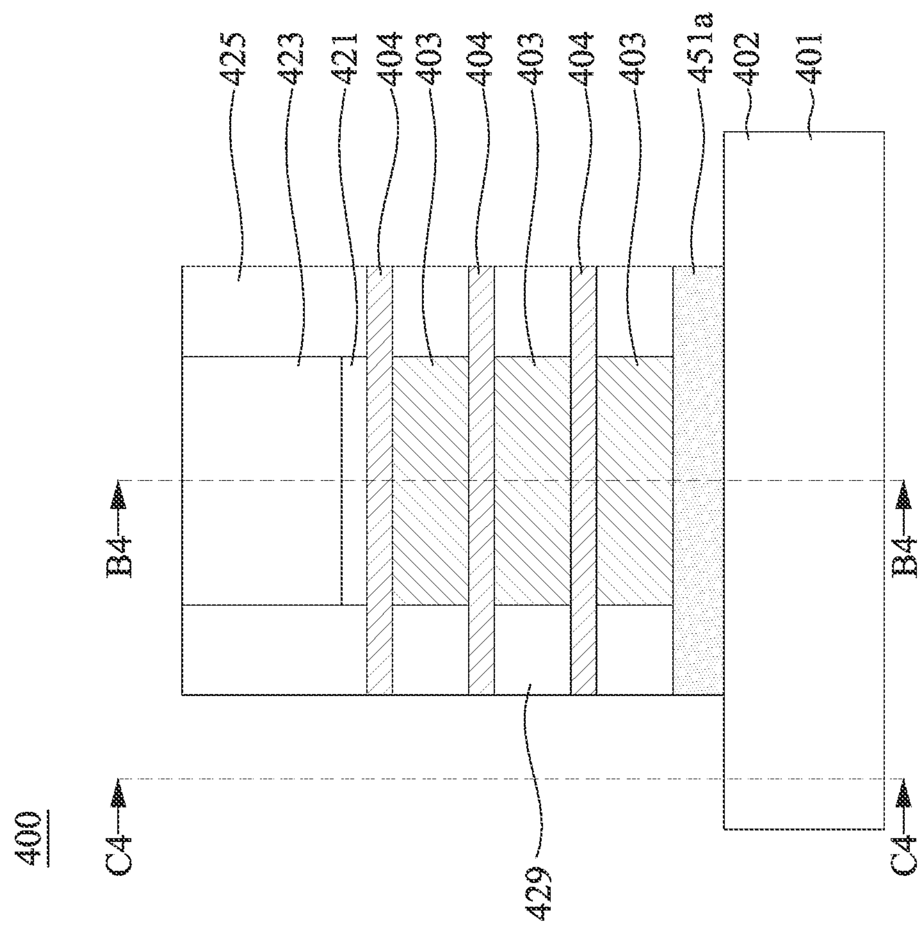
Figure 56C:
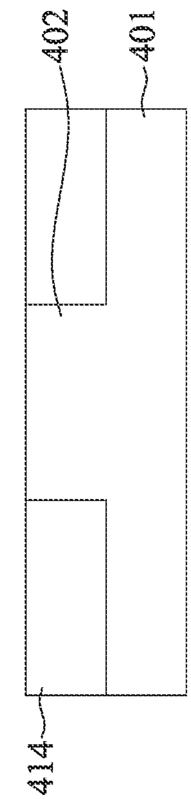
Figure 56B:
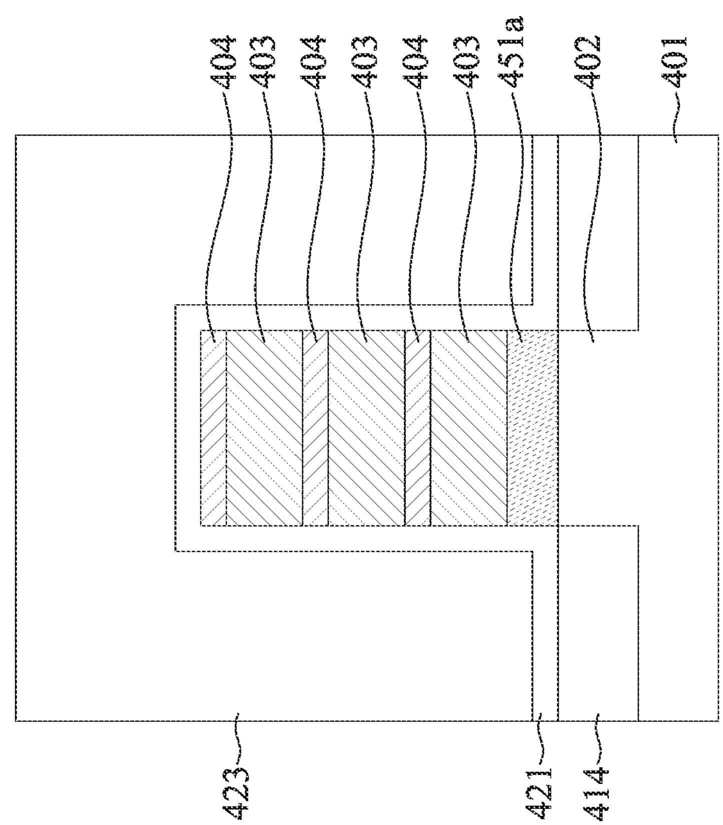

Returning to FIG. 49B, the method M3 then proceeds to block S313 where a plurality of inner spacers are formed in the recesses of the channel layers by suitable deposition process. With reference to FIGS. 56A to 56C, in some embodiments of block S313, inner spacers 429 may be formed by depositing a spacer material blanket over the hard mask layer 421, the dummy gate structure 423, the semiconductor layers 403, the channel layers 404, the sacrificial layers 411, and the isolation dielectric 414 and followed by an etching process to remove portions of the spacer material, such that the remaining portions of the spacer material are left in the spaces between two adjacent channel layers 404 to form the inner spacers 429. In some embodiments, the inner spacers 429 may include $SiO_2$, $Si_3N_4$, $SiO_xN_y$, SiC, SiCN films, SiOC, SiOCN films, and/or combinations thereof.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a nitrogen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 57A:
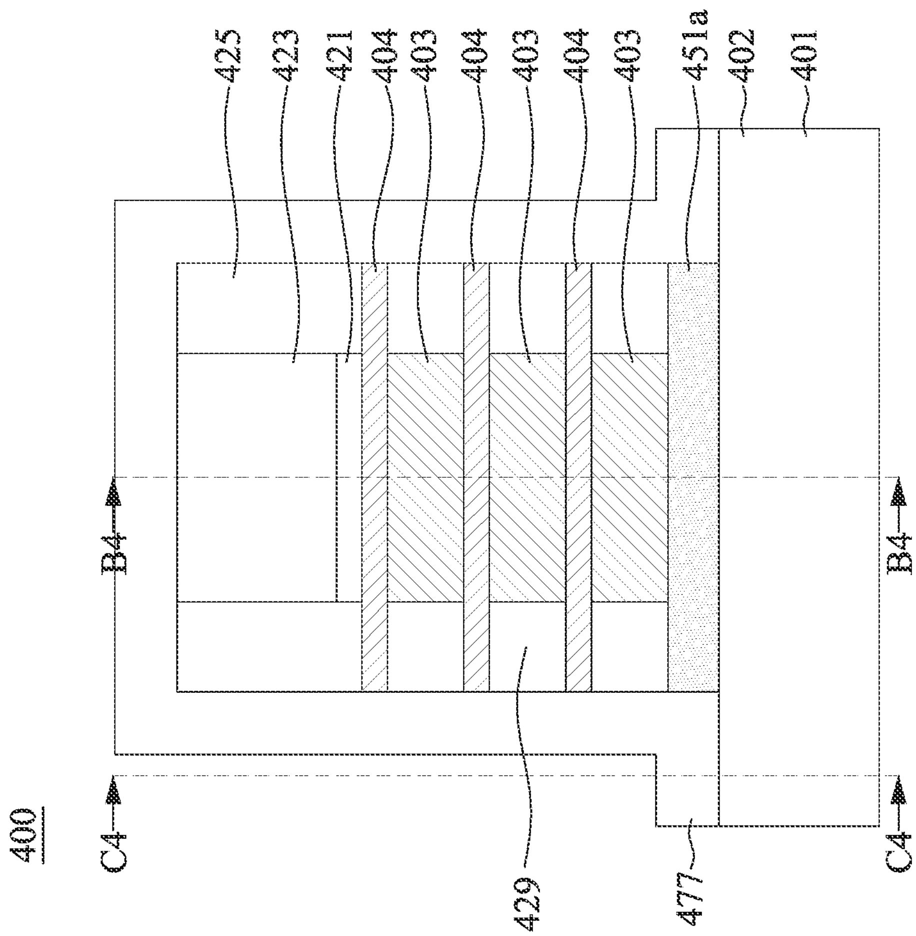
Figure 57C:
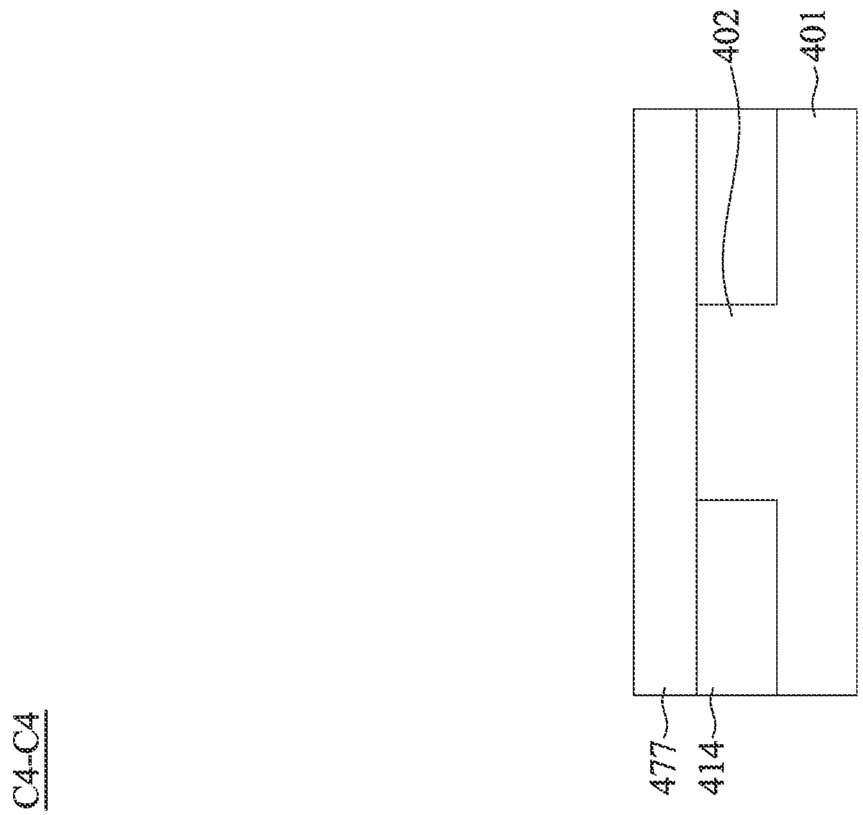
Figure 57B:
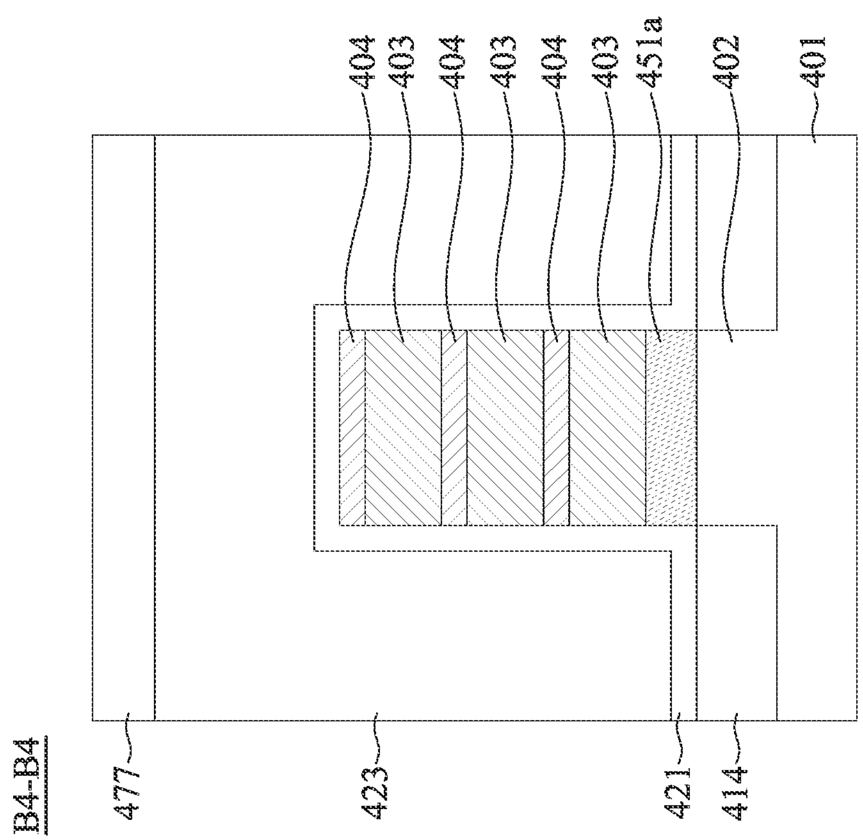

Returning to FIG. 49B, the method M3 then proceeds to block S334 where a second hard mask layer is formed over the substrate. With reference to FIGS. 57A to 57C, in some embodiments of block S334, a hard mask layer 477 is deposited as a blanket layer over the substrate 401. In some embodiments, the hard mask layer 477 has different material and/or components than the semiconductor layers 403, the hard mask layer 421, the dummy gate structure 423, the spacers 425 and 429, such that the hard mask layer 477 of has different etching rate than the semiconductor layers 403, the hard mask layer 421, the dummy gate structure 423, the spacers 425 and 429. For example, the hard mask layer 477 may be made of a carbon-containing material, such as SiOC, amorphous SiGe, and any other suitable materials, and the semiconductor layers 403, the channel layers 404, and the sacrificial layer 411 may be free from carbon. In some embodiments, the hard mask layer 477 may be made of a germanium-containing material, such as SiGe and any other suitable materials, and the semiconductor layers 403, the channel layers 404, and the sacrificial layer 411 may be free from germanium.

In some embodiments, the hard mask layer 477 may be formed by suitable deposition processes, for example, chemical vapor deposition (CVD), plasma enhanced chemical vapor deposition (PECVD), atomic layer deposition (ALD), evaporation, physical vapor deposition (PVD), chemical solution deposition, or other like processes.

Figure 58A:
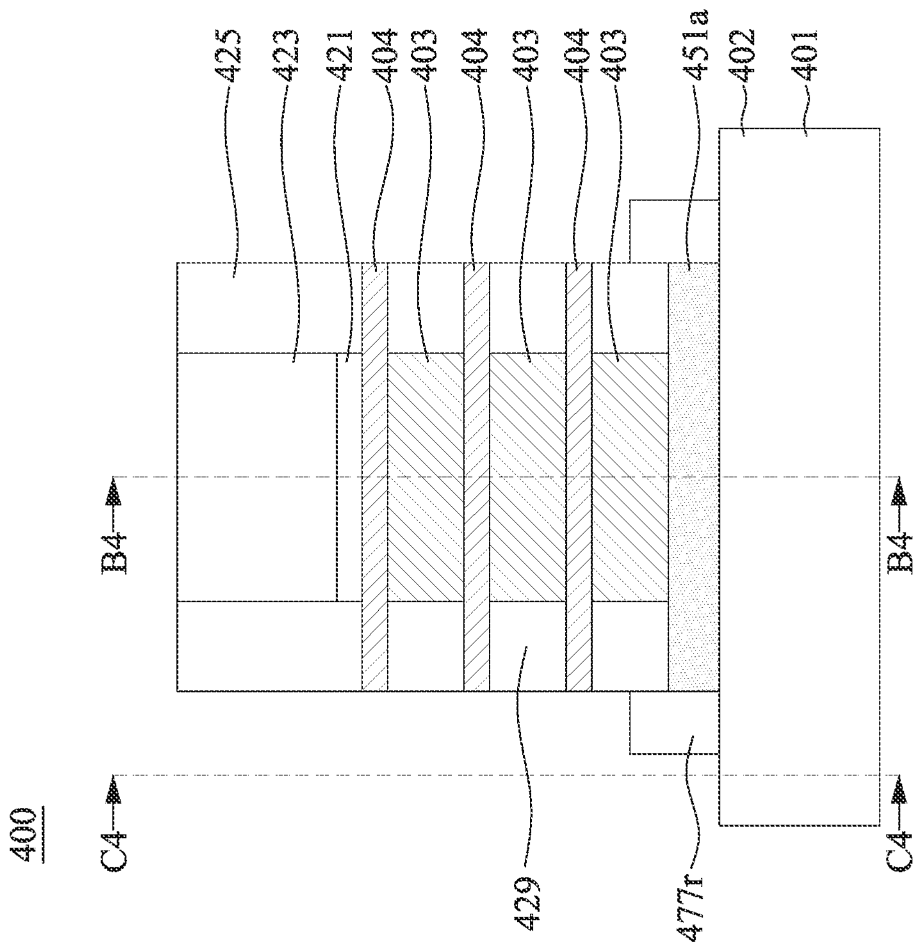
Figure 58C:
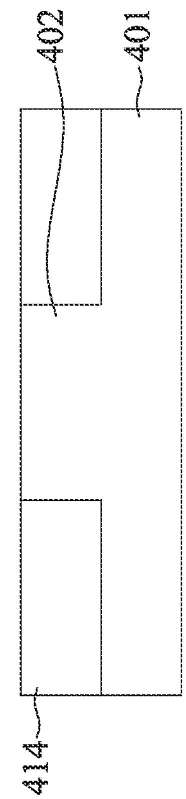
Figure 58B:
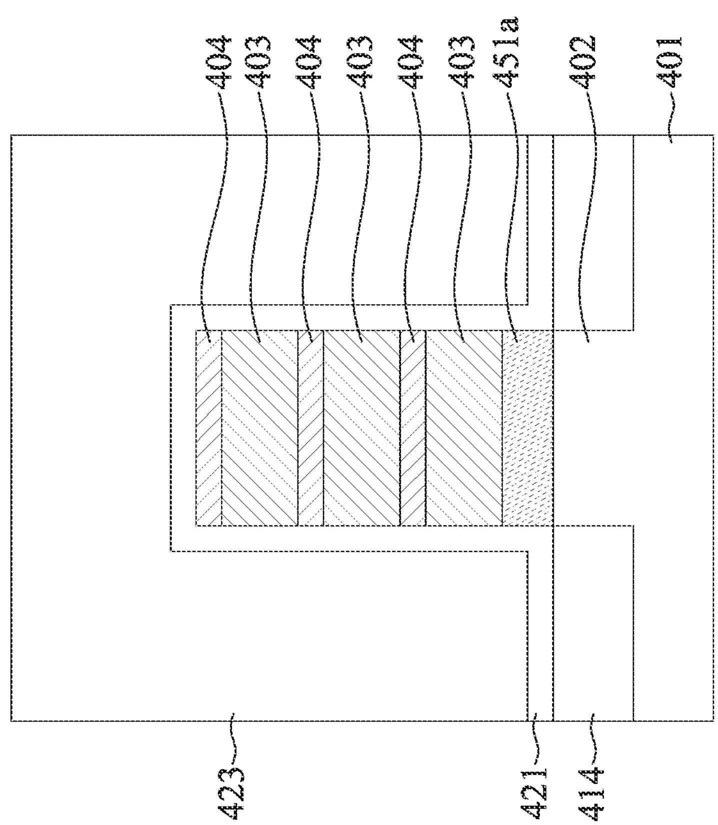

Returning to FIG. 49B, the method M3 then proceeds to block S315 where the sacrificial layer is etched such that a remainder of the second hard mask layer remains on an angle formed by a top surface of the isolation dielectric and a sidewall of the isolation layer. With reference to FIGS. 58A to 58C, in some embodiments of block S315, the hard mask layer 477 is etched such that a remainder 477*r* of the hard mask layer 477 remains on an angle formed by a top surface of the isolation dielectric 414 and a sidewall (may also be referred to as a lateral end surface) of the isolation layer 451_a_. In greater detail, the remainder 477_r_ of the hard mask layer 477 extends upwardly from the top surface of the isolation dielectric 414 along the lateral end surface of the isolation layer 451_a_ and beyond a top surface of the isolation layer 451_a_. In some embodiments, the remainder 477_r_ of the hard mask layer 477 has a lower height than isolation layer 451_a_.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, $C_2F_6$, and/or $C_4F_8$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, the hard mask layer 477 can be etched using a reactive-ion etching process (RIE) implementing a fluorine-containing gas (e.g., $C_4F_8$) with an oxygen-containing gas and/or a nitrogen-containing gas as an etchant, in some cases where the hard mask layer 477 is made of a carbon-containing material, such as SiOC. In some embodiments, the remainder 477_r_ can be etched using an atomic layer etching (ALE) process and/or implementing a chlorine-containing gas (e.g., a high temperature HCl gas), a fluorine-containing gas (e.g., $CF_4$) with an oxygen-containing gas as an etchant, in some cases where the hard mask layer 477 is made of a germanium-containing material, such as amorphous SiGe.

Figure 59A:
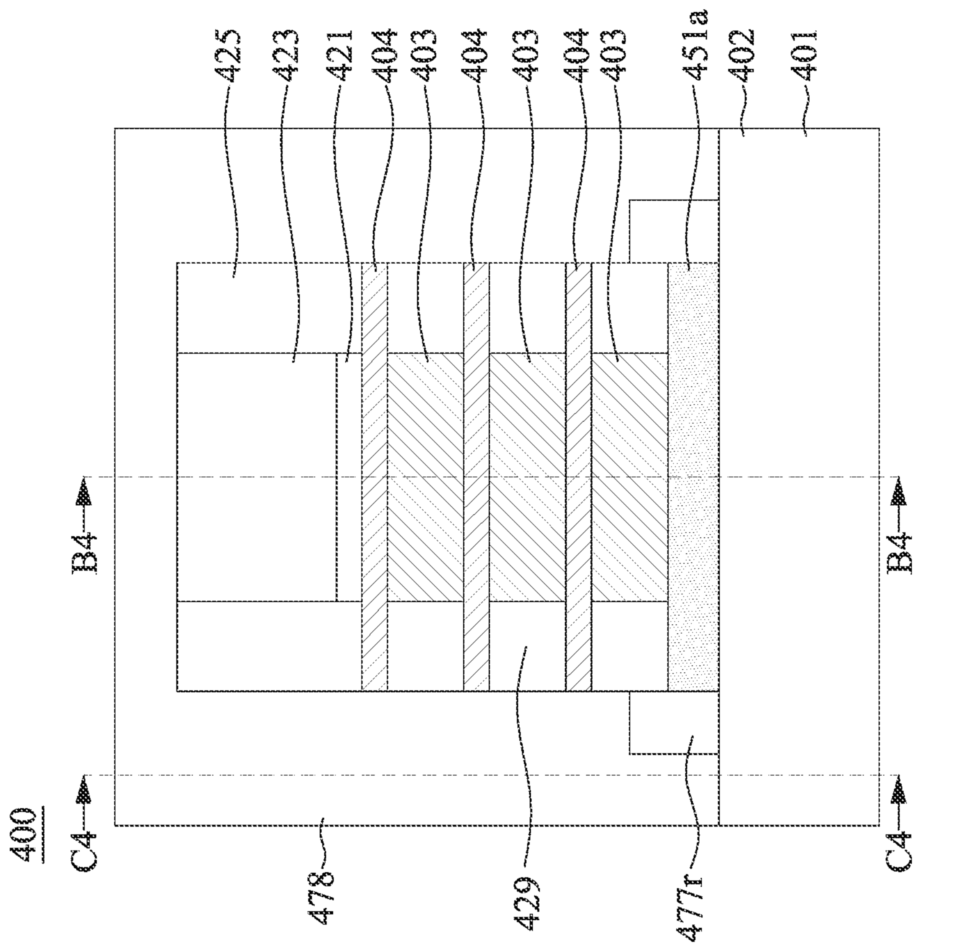
Figure 59C:
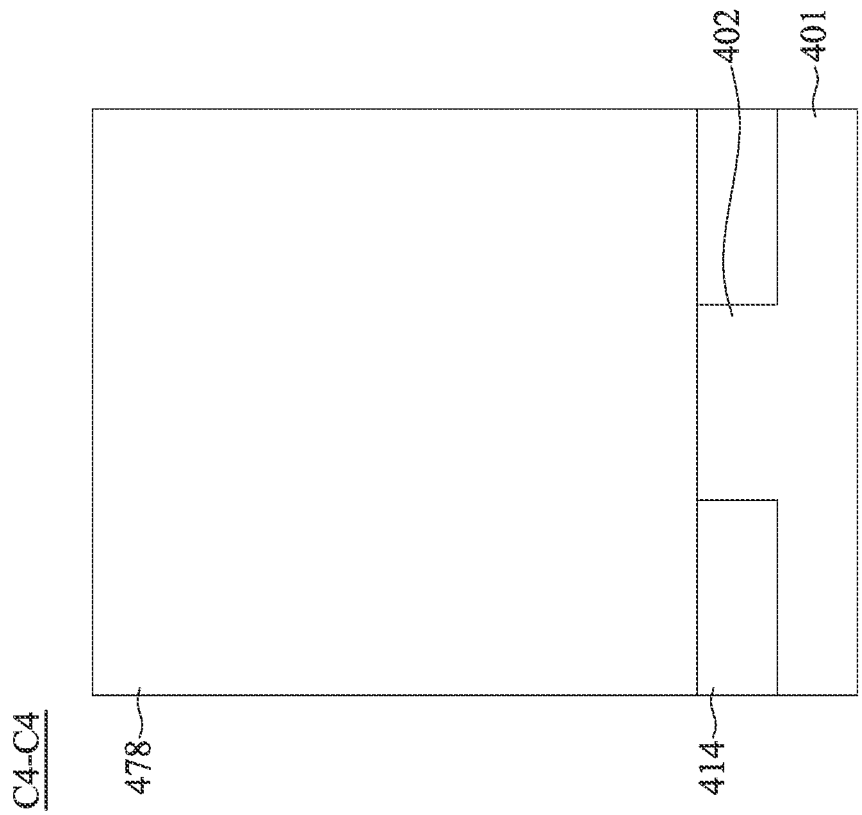
Figure 59B:
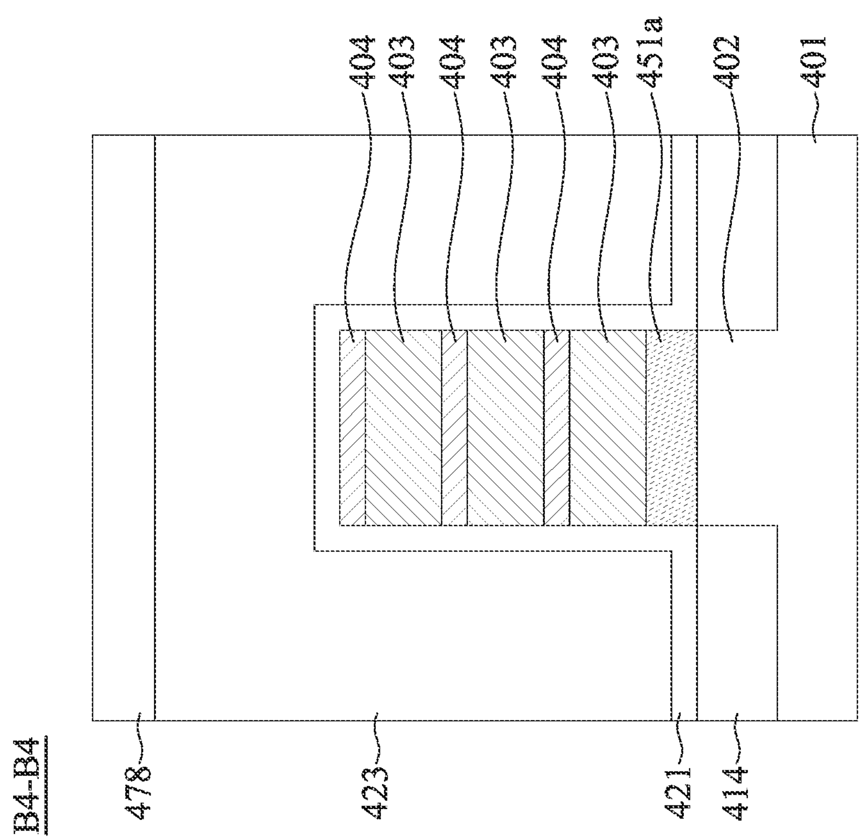

Returning to FIG. 49B, the method M3 then proceeds to block S316 where a second dielectric layer is deposited over the substrate. With reference to FIGS. 59A to 59C, in some embodiments of block S316, a dielectric layer 478 is formed over the substrate 401 to cover of the dummy gate structure 423, the spacers 425 and 429, the channel layers 404, the remainder 477_r_ of the hard mask layer 477, and the semiconductor strip 402. In some embodiments, the dielectric layer 478 may include $SiO_2$, $Si_3N_4$, $SiO_xN_y$, SiC, SiCN films, SiOC, SiOCN films, and/or combinations thereof. In some embodiments, the dielectric layer 478 may be formed by suitable deposition processes, for example, chemical vapor deposition (CVD), plasma enhanced chemical vapor deposition (PECVD), atomic layer deposition (ALD), evaporation, physical vapor deposition (PVD), chemical solution deposition, or other like processes.

Figure 60A:
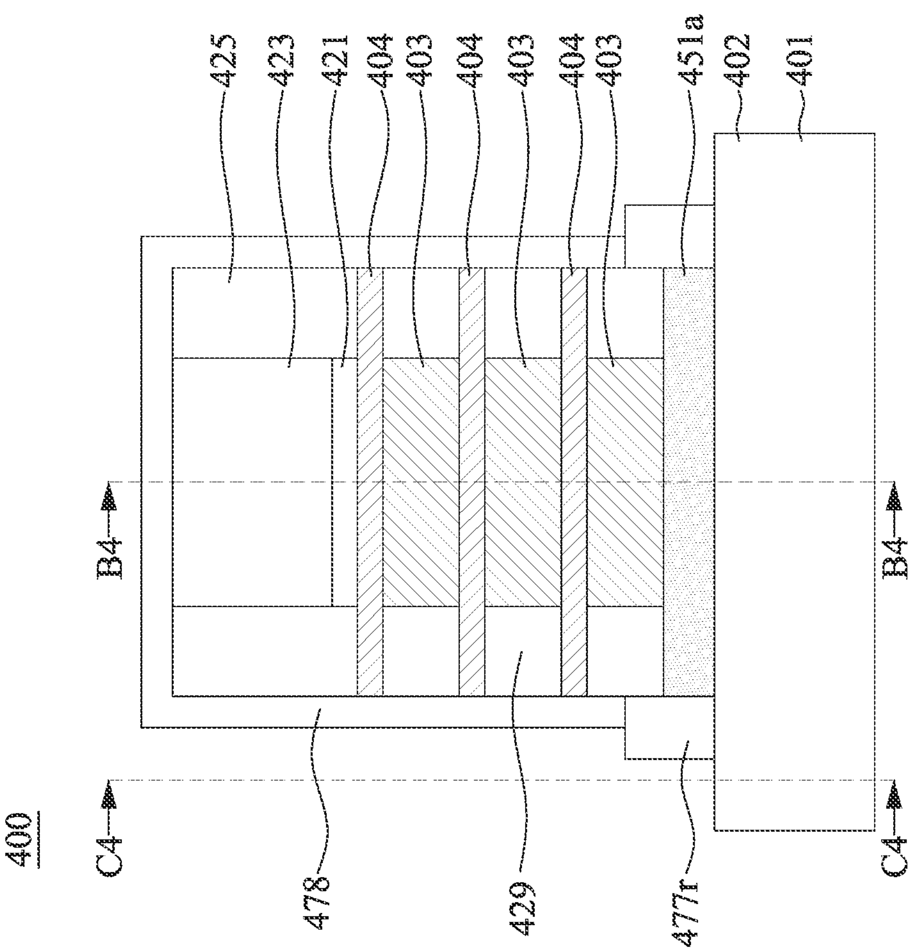
Figure 60B:
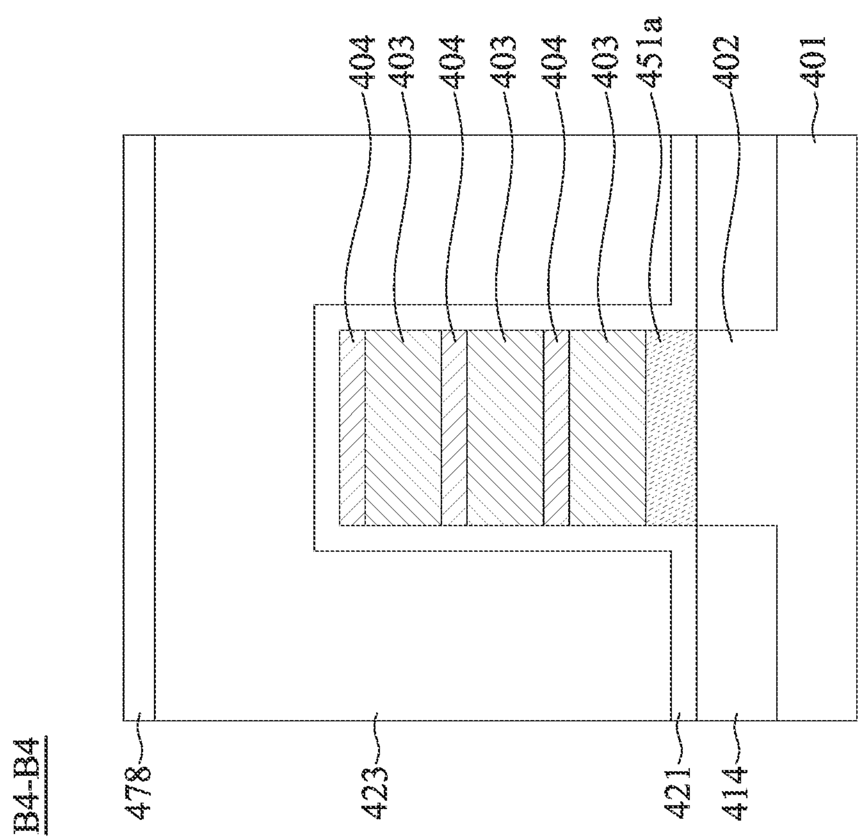
Figure 60C:
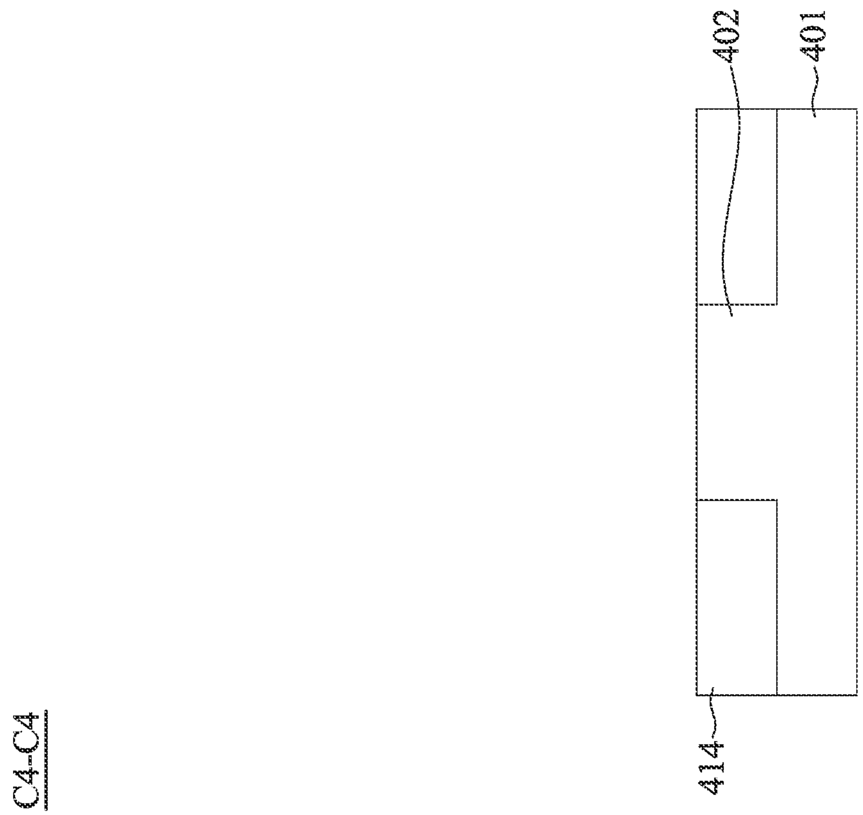

Returning to FIG. 49B, the method M3 then proceeds to block S317 where the second dielectric layer is etched to line top surfaces of the dummy gate structure and the gate spacers and to line the sidewalls of the gate and inner spacers and the channel layers. With reference to FIGS. 60A to 60C, in some embodiments of block S317, a patterned mask layer (not shown) is formed over the dielectric layer 478. The dielectric layer 478 as shown in FIG. 59A is etched through the patterned mask layer to form a vertical portion extends upwardly from the top surface of the remainder 477_r_ of the hard mask layer 477 along the sidewalls of the gate spacers 425 and 429 and the channel layers 404 and a lateral portion extends along the top surfaces of the dummy gate structure 423 and the gate spacers 425. After etching the dielectric layer 478, the patterned mask layer is removed. In other words, the dielectric layer 478 is etched to line top surfaces of the dummy gate structure 423 and the gate spacers 425 and to line the sidewalls of the gate spacers 425 and 429 and the channel layers 404.

In some embodiments, an etch process, such as, a reactive-ion etching (RIE) process or an atomic layer etching (ALE) process, or a combination thereof, may be performed on the dielectric layer 478 to etched the dielectric layer 478.

Figure 61A:
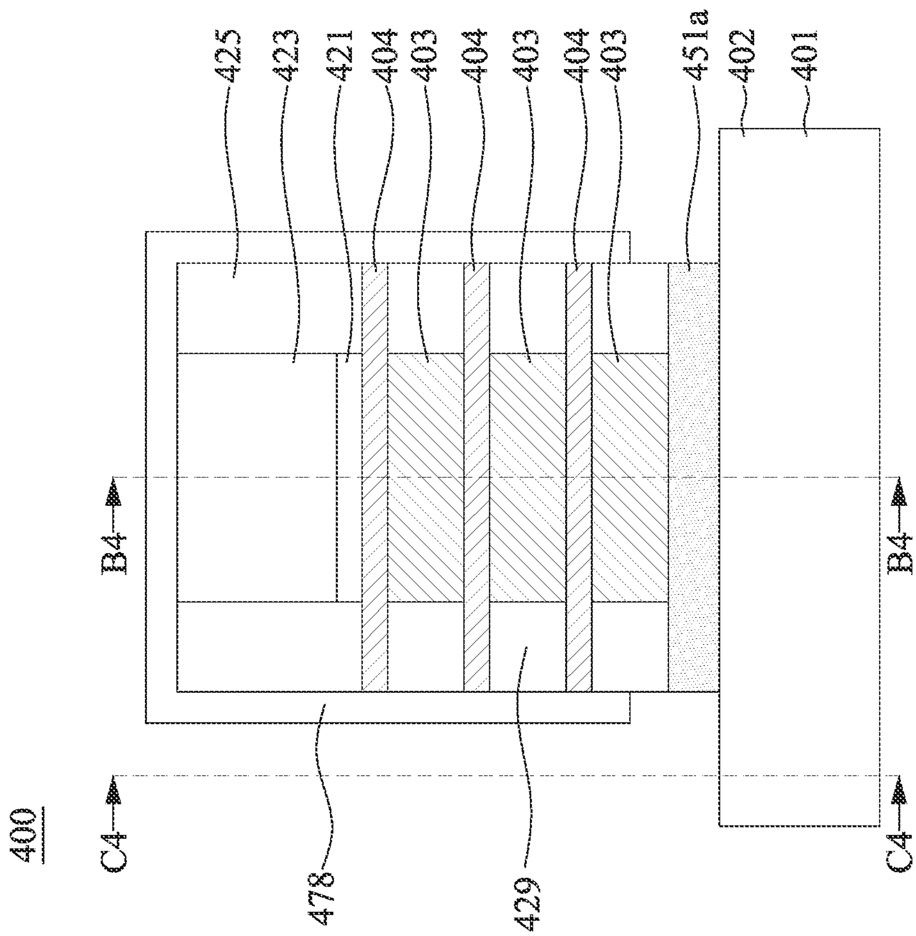
Figure 61C:
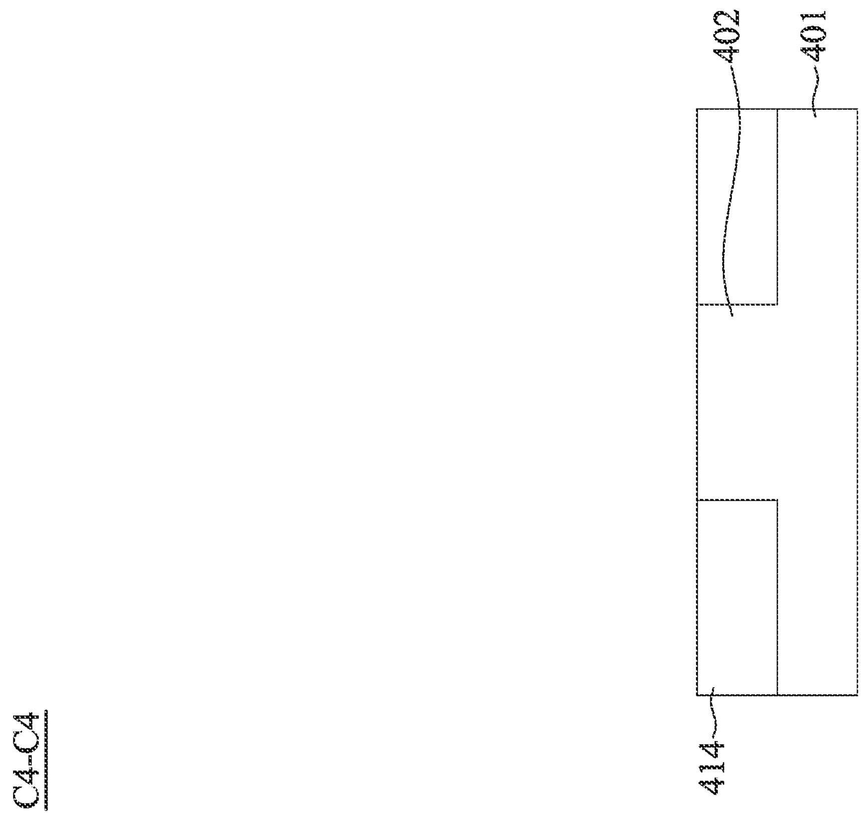
Figure 61B:
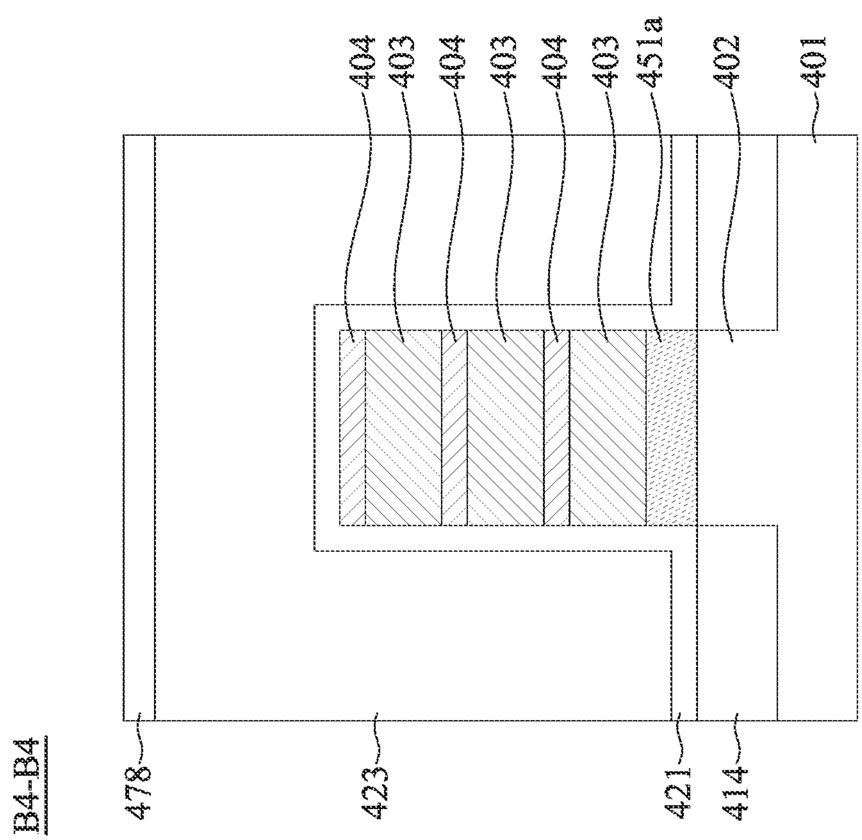

Returning to FIG. 49B, the method M3 then proceeds to block S318 where the remainder of the second hard mask layer is removed. With reference to FIGS. 61A to 61C, in some embodiments of block S318, the remainder 477_r_ of the hard mask layer 477 is removed. The removing of the remainder 477_r_ of the hard mask layer 477 may include a dry etching process or other suitable etching processes. In some embodiments, the etch process include using a technique and etchant selected to etch the hard mask layer 477 without significant etching of the surrounding structures. For example, the etch process may select to etch the remainder 477_r_ made of a carbon-containing material, such as SiOC, without etching the isolation layer 451_a_ and inner spacer 429 may be free from carbon. The etch process may select to etch the remainder 477_r_ made of a germanium-containing material, such as SiGe, without etching the isolation layer 451_a_ and inner spacer 429 may be free from germanium. Hence, after the remainder 477_r_ of the hard mask layer 477 is removed, a bottommost position of the dielectric layer 478 is spaced apart from the isolation dielectric 414, where the space between the dielectric layer 478 and the isolation dielectric 414 is the space occupied by an isolation structure 431 structure which is formed thereafter.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, $C_2F_6$, and/or $C_4F_8$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, the remainder 477_r_ can be removed using a reactive-ion etching process (RIE) implementing a fluorine-containing gas (e.g., $C_4F_8$) with an oxygen-containing gas and/or a nitrogen-containing gas as an etchant, in some cases where the remainder 477_r_ is made of a carbon-containing material, such as SiOC. In some embodiments, the remainder 477_r_ can be removed using an atomic layer etching (ALE) process and/or implementing a chlorine-containing gas (e.g., a high temperature HCl gas), a fluorine-containing gas (e.g., $CF_4$) with an oxygen-containing gas as an etchant, in some cases where the remainder 477_r_ is made of a germanium-containing material, such as amorphous SiGe.

Figure 62A:
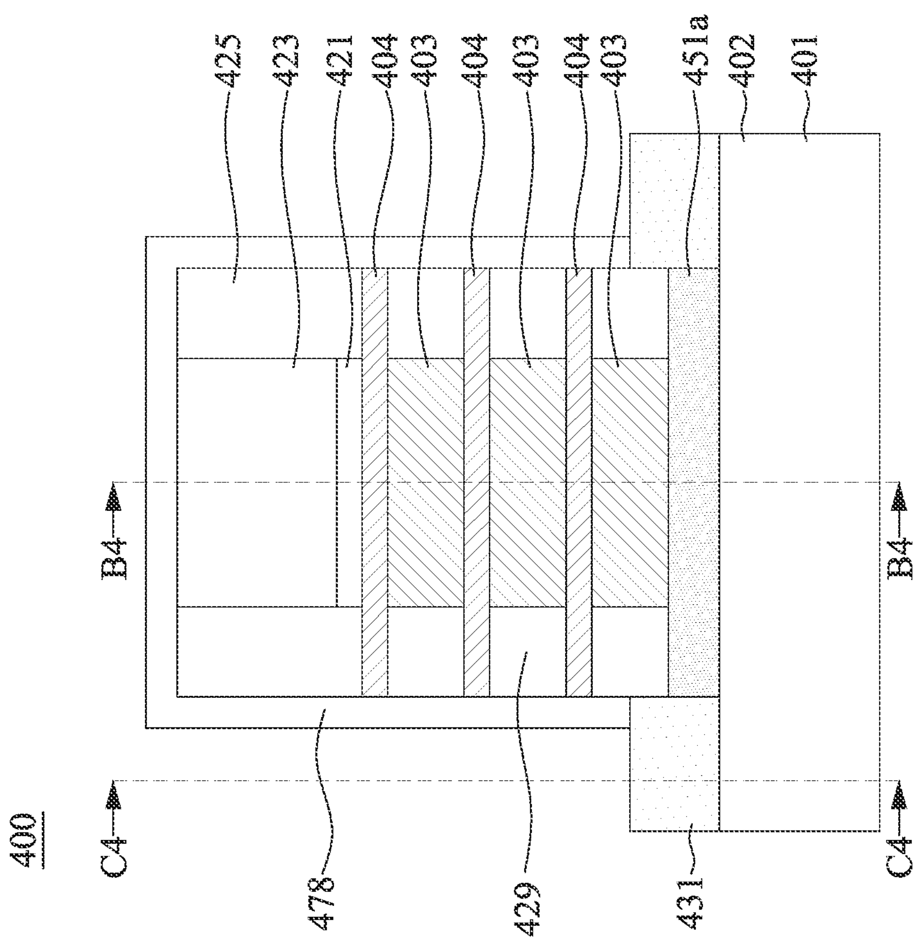
Figure 62B:
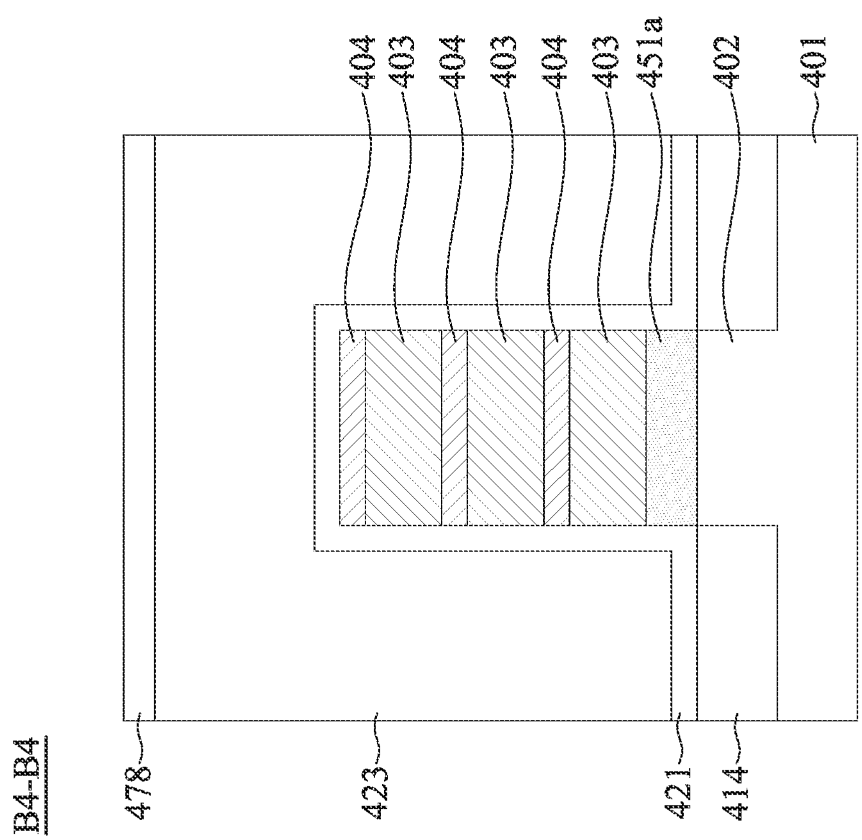
Figure 62C:
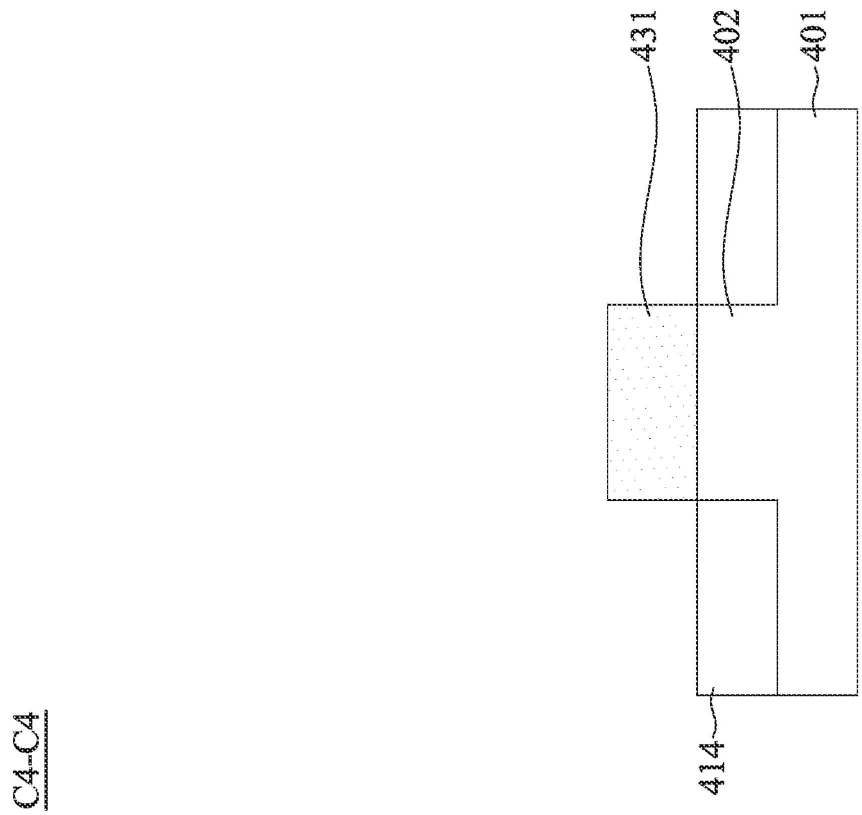

Returning to FIG. 49B, the method M3 then proceeds to block S319 where an isolation structure is formed on the semiconductor strip and adjacent to the dielectric layer. With reference to FIGS. 62A to 62C, in some embodiments of block S319, an isolation structure 431 is formed in the recesses 427, extends from the semiconductor strip 402 to a position level with the bottommost position of the dielectric layer 478 as shown in FIG. 61A, and is embedded in the source/drain structure 432 shown in FIG. 61C, such that the source/drain structure 432 is spaced apart from the semiconductor strip 402 by the isolation structure 431. In some embodiments, the epitaxial growth process may be performed on the semiconductor strip 402. The isolation structures 431 can also be interchangeably referred to as epitaxial structures.

In FIGS. 61A and 61C, the isolation structure 431 and the source/drain structures 432 which will be formed on the isolation structure 431 shown in FIGS. 62A to 62C have oppositely doped epitaxial source/drain features. In some embodiments, the isolation structure 431 includes a p-type dopant in a case where the semiconductor device 400 is of an nFET device, and the isolation structure 431 includes an n-type dopant in a case where the semiconductor device 400 is of a pFET device. Hence, the forming of the isolation layer 451a can not only reduce the parasitic leakage current but also reduce the parasitic capacitance of the semiconductor device. For example, for the semiconductor device 400 as nFET device, the isolation structure 431 may be an epitaxial layer including silicon and/or germanium, where the silicon germanium containing epitaxial layers are doped with boron, carbon, other p-type dopant, or combinations thereof (for example, forming a Si:Ge:B epitaxial layer or a Si:Ge:C epitaxial layer). In furtherance of the example, for the semiconductor device 400 as the pFET device, the isolation structure 431 may be an epitaxial layer including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer, a Si:C epitaxial layer, or a Si:C:P epitaxial layer). In some embodiments, the source/drain structures 432 may be un-doped.

In various embodiments, the source/drain structures 432 may include Ge, Si, GaAs, AlGaAs, SiGe, GaAsP, SiP, or other suitable material. In some embodiments, an epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of the substrate 401. In some embodiments, the isolation structure 431 may be doped during deposition by adding impurities to a source material of the epitaxy process. In some implementations, the isolation structure 431 may be doped by an ion implantation process subsequent to a deposition process. In some implementations, annealing processes are performed to activate dopants in the isolation structure 431.

Figure 63A:
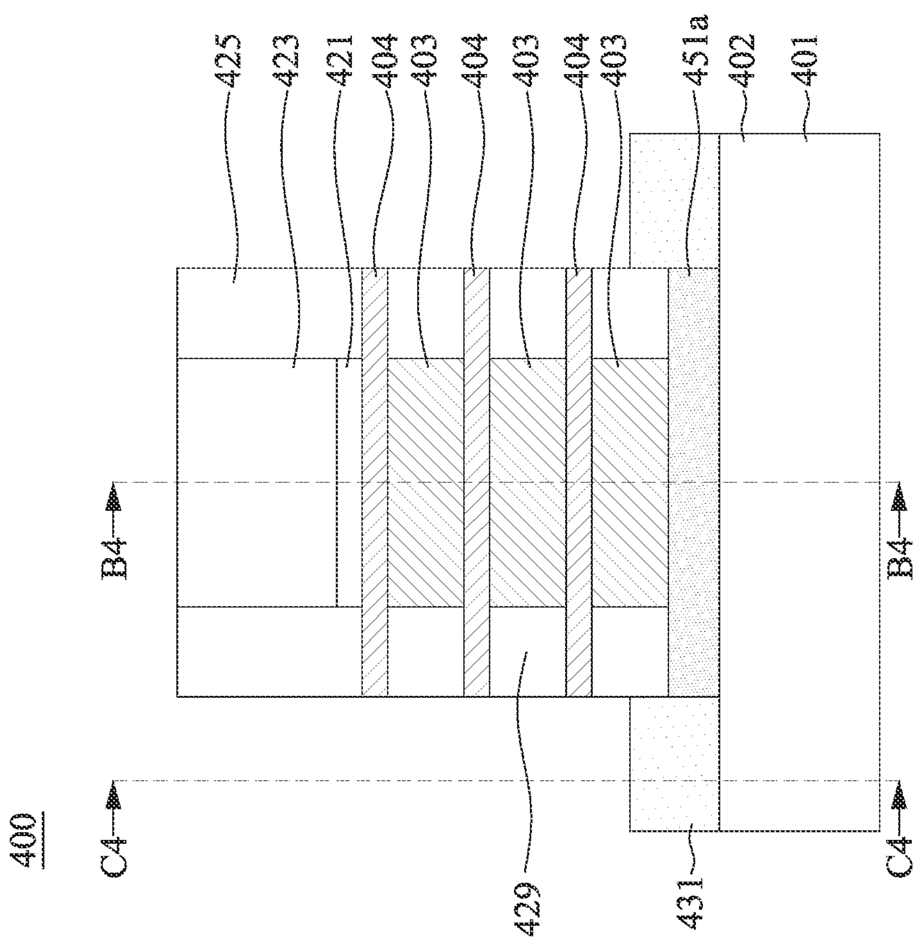
Figure 63C:
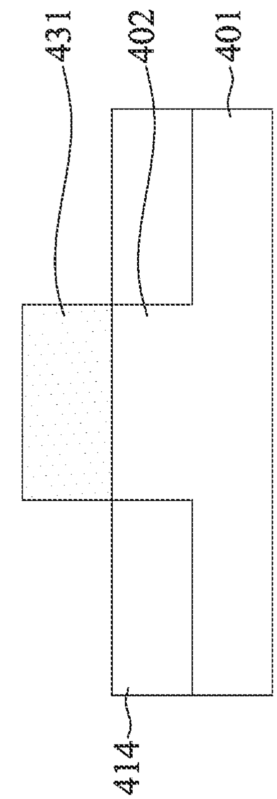
Figure 63B:
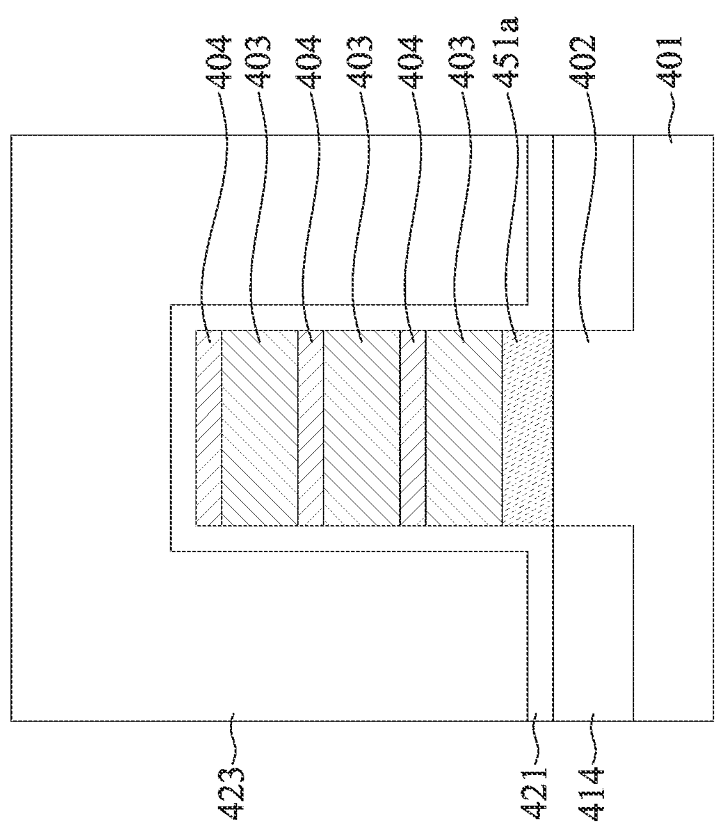

Returning to FIG. 49B, the method M3 then proceeds to block S320 where the etched second dielectric layer is removed to expose the sidewalls of the channel layers. With reference to FIGS. 63A to 63C, in some embodiments of block S320, the etched dielectric layer 478 is removed to expose longitudinal ends of the channel layers. The removing of the dielectric layer 478 may include a dry etching process or other suitable etching processes. In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., HF, $CF_4$, $NF_3$, $SF_6$, $CH_2F_2$, $CHF_3$, $C_2F_6$, and/or $C_4F_8$), a chlorine-containing gas (e.g., $Cl_2$, HCl, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a dry etching process may implement with HF and $NH_3$ gas.

Figure 64A:
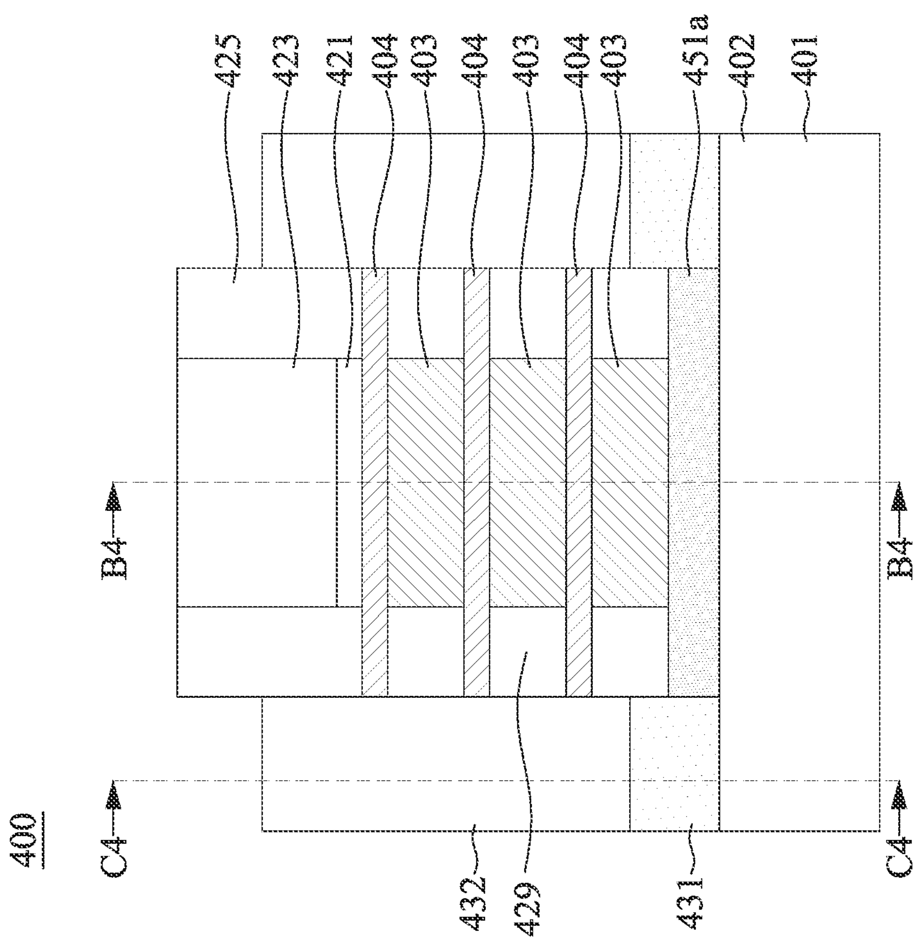
Figure 64B:
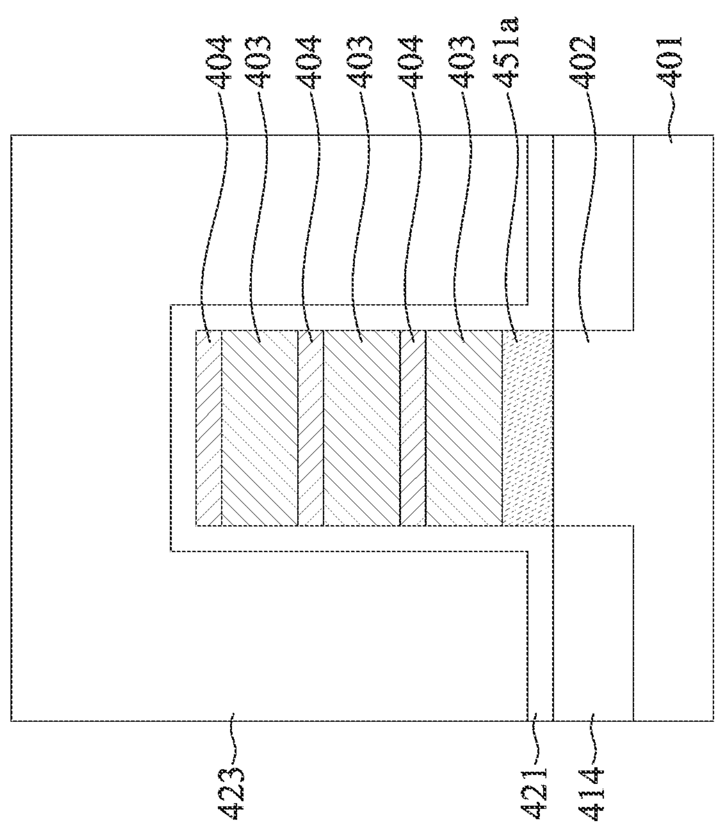
Figure 64C:
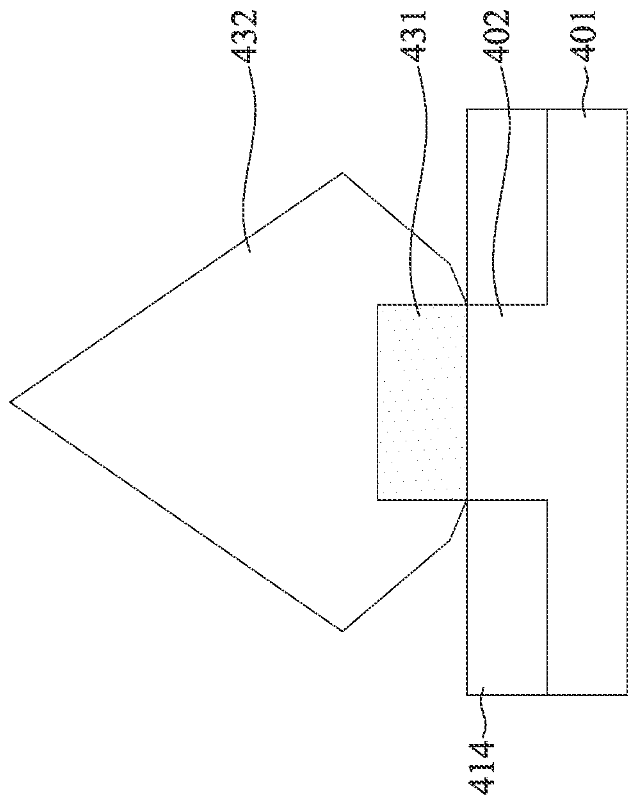

Returning to FIG. 49B, the method M3 then proceeds to block S321 where source/drain structures are formed adjacent to the channel layers. With reference to FIGS. 64A to 64C, in some embodiments of block S321, source/drain structures 432 are formed on the isolation structures 431 by, for example, an epitaxial growth process as source/drain structures. As such, the source/drain structures 432 are in contact with opposite ends of the channel layers 404. The epitaxial growth process is performed on the isolation structures 431. The source/drain structures 432 can also be interchangeably referred to as epitaxial structures. More specifically, the isolation structures 431 is embedded in (or being protruding into) the source/drain structures 432. In some embodiments, the source/drain structure 432 may be made of a material substantially the same as the isolation structure 431. For example, the source/drain structure 432 and the isolation structure 431 may be made from SiGe. In some embodiments, the source/drain structure 432 is made of a material different than the isolation structure 431.

In some embodiments, in situ doping (ISD) is applied to form doped source/drain structures 432. N-type and p-type FETs are formed by implanting different types of dopants to selected regions of the device to form the necessary junction(s). N-type devices may be formed by implanting arsenic (As) or phosphorous (P), and p-type devices may be formed by implanting boron (B). For example, the source/drain structures 432 may include materials such as SiP or SiGeB and any other suitable materials. In some embodiments, an epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of the isolation structure 431. In some embodiments, the source/drain structure 432 may be doped during deposition by adding impurities to a source material of the epitaxy process. In some implementations, the source/drain structures 432 may be doped by an ion implantation process subsequent to a deposition process. In some implementations, annealing processes are performed to activate dopants in the source/drain structures 432.

Figure 65A:
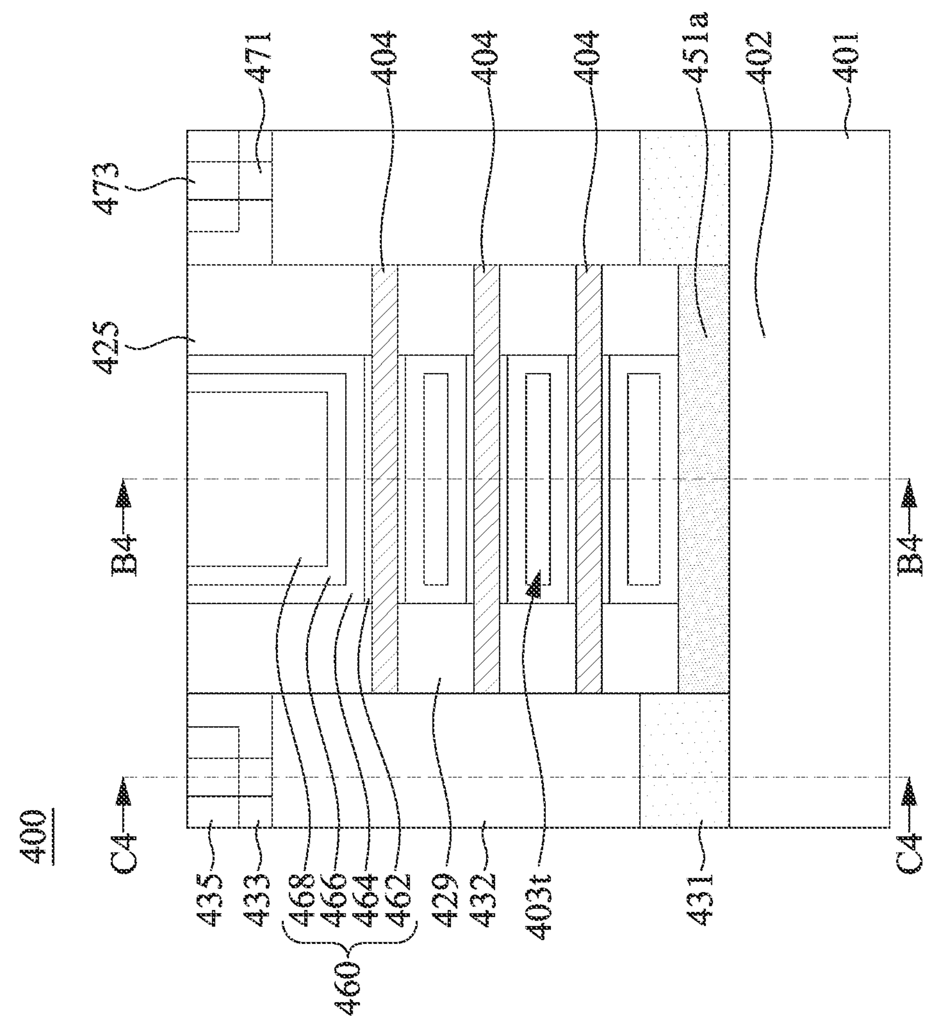
Figure 65B:
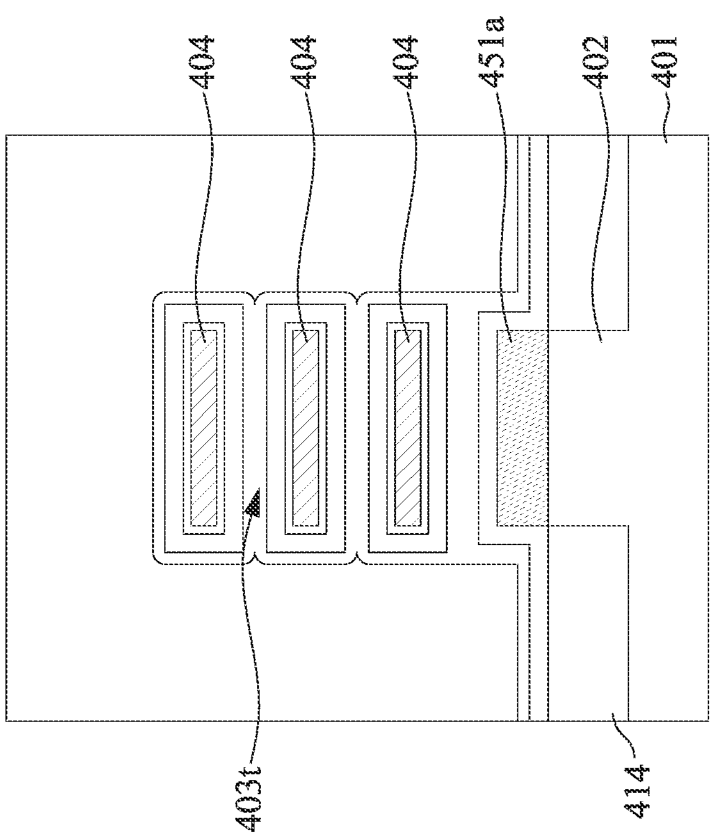
Figure 65C:
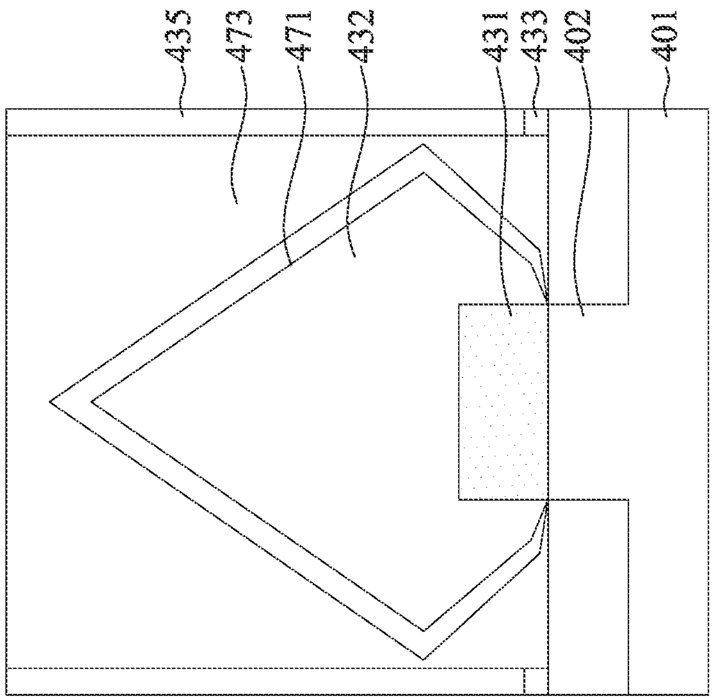

Operations for forming a semiconductor device 400 after the structure shown in FIGS. 64A to 64C and prior to the structure shown in FIGS. 65A to 65C at stages S322-S326 of the method M3 are substantially the same as the operations for forming the semiconductor device 100 shown in FIGS. 14A-14C and 21A-24C at stages S112 and S119-S122 of the method M1, and reference may be made to the foregoing paragraphs for the related detailed descriptions and such descriptions are not provided again herein. For example, material and manufacturing method of a contact etch stop layer (CESL) 433, an interlayer dielectric (ILD) layer 435, and the gate structure 460 may be substantially the same as that of a contact etch stop layer (CESL) 133, an interlayer dielectric (ILD) layer 135, and the gate structure 160 as shown in FIGS. 14A-14C and 21A-24C, and the related detailed descriptions may refer to the foregoing paragraphs, and are not described again herein.

Figure 49C:
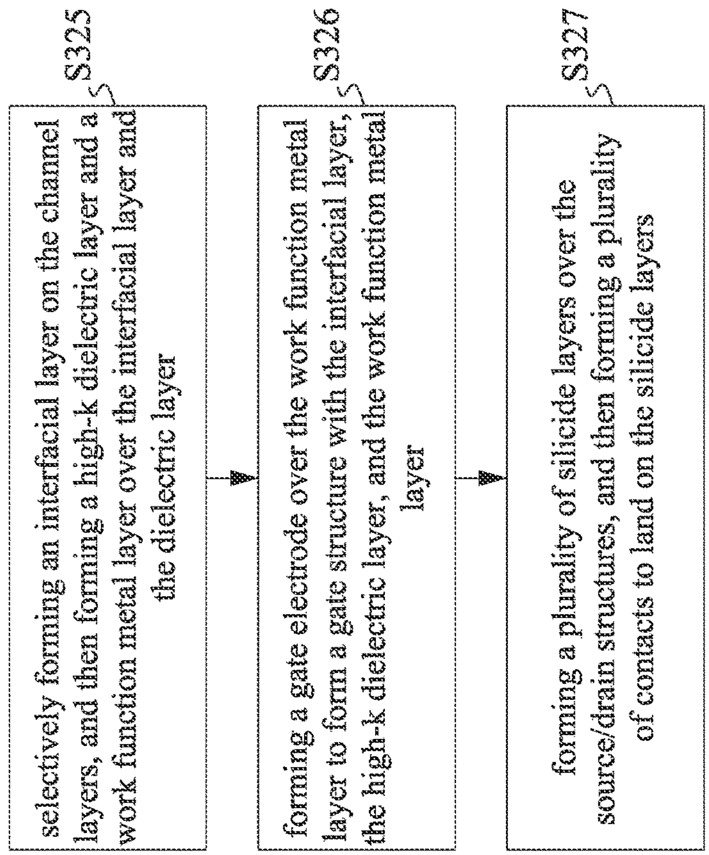

Returning to FIG. 49C, the method M3 then proceeds to block S327 where a plurality of silicide layers are formed over the source/drain structures, and a plurality of contacts are formed to land on the silicide layers. With reference to FIGS. 65A to 65C, in some embodiments of block S327, the silicide layers 471 may include metal silicide, such as $CoSi_2$, $TiSi_2$, $WSi_2$, $NiSi_2$, $MoSi_2$, $TaSi_2$, PtSi, or the like. Subsequently, the contacts 473 are formed to pass through the CESL 433 and the ILD layer 435 and land on the silicide layer 471. In some embodiments, the contacts 473 may include metal, such as tungsten (W), aluminum (Al), copper (Cu), or other suitable conductive material.

According to the aforementioned embodiments, it can be seen that the present disclosure offers advantages in fabricating semiconductor devices. It is understood, however, that other embodiments may offer additional advantages, and not all advantages are necessarily disclosed herein. An advantage is that the gate structure and/or source/drain structure is spaced apart from the semiconductor strip by the isolation layer, and thus the parasitic leakage current and the parasitic capacitance of the semiconductor device may be eliminated, which may improve the IOFF of the semiconductor device and in turn beneficial affects the gate control, thereby the device performance may be improved.

Alternative, an epitaxial structure may be interposed between the source/drain structure and the semiconductor strip, in which the epitaxial structure and the source/drain structures have oppositely doped epitaxial source/drain features, such that the source/drain structure are electrically separated from the semiconductor strip by the epitaxial structure. For example, the epitaxial structure may include a p-type dopant in a case where the semiconductor device is of an nFET device, and the epitaxial structure may include an n-type dopant in a case where the semiconductor device is of a pFET device. Hence, the parasitic leakage current and the parasitic capacitance of the semiconductor device may be eliminated due to the forming of the epitaxial structure, which may also improve the IOFF of the semiconductor device and in turn beneficial affects the gate control, thereby the device performance may be improved.

According to some embodiments, a semiconductor device includes a substrate, a semiconductor strip, an isolation dielectric, a plurality of channel layers, a gate structure, a plurality of source/drain structures, and an isolation layer. The semiconductor strip extends upwardly from the substrate and has a length extending along a first direction. The isolation dielectric laterally surrounds the semiconductor strip. The channel layers extend in the first direction above the semiconductor strip and arrange in a second direction substantially perpendicular to the substrate. The gate structure surrounds each of the channel layers. The source/drain structures are above the semiconductor strip and on either side of the channel layers. The isolation layer is interposed between the semiconductor strip and the gate structure and further interposed between the semiconductor strip and each of the plurality of source/drain structures. The isolation layer is in direct contact with the gate structure. The gate structure comprises a high-k dielectric layer lining a sidewall and a top surface of the isolation layer. In some embodiments, the isolation layer extends past an interface between a longest side of the semiconductor strip and the isolation dielectric. In some embodiments, the isolation layer on the semiconductor strip has a thicker thickness than on the isolation dielectric. In some embodiments, the isolation layer on the semiconductor strip has a thinner thickness than on the isolation dielectric. In some embodiments, the isolation layer on the semiconductor strip has a thickness substantially the same as the isolation dielectric. In some embodiments, the isolation layer has a sidewall coterminous with a sidewall of the semiconductor strip. The isolation layer is partially embedded in each of the plurality of source/drain structures. The isolation layer is in direct contact with the plurality of source/drain structures.

According to some embodiments, a substrate, a semiconductor strip, a plurality of channel layers, a gate structure, a plurality of source/drain structures, a plurality of epitaxial structures, and an isolation layer. The semiconductor strip extends upwardly from the substrate and has a length extending along a first direction. The channel layers extend in the first direction above the semiconductor strip and arrange in a second direction substantially perpendicular to the substrate. The gate structure wraps around each of the channel layers. The plurality of source/drain structures are on either side of the channel layers and each comprises a first type dopant. The epitaxial structures are interposed between the semiconductor strip and the plurality of source/drain structures and each comprises a second type dopant that has a different conductivity type than the first type dopant. The isolation layer is interposed between the semiconductor strip and the gate structure. The epitaxial structures each has a topmost end higher than a top surface of the isolation layer. The epitaxial structures are embedded in the source/drain structures, respectively. The epitaxial structures are in direct contact with the source/drain structures, respectively. In some embodiments, the first type dopant is of a p-type dopant and the second type dopant is of an n-type dopant. In some embodiments, the isolation layer has a width substantially the same as a width of the semiconductor strip along a lengthwise direction of the gate structure.

According to some embodiments, a method for forming a semiconductor device, comprising: forming a fin structure having a sacrificial layer over a substrate and a stack of alternating first and second semiconductor layers over the sacrificial layer; forming a hard mask layer across the fin structure; forming a dummy gate structure over the fin structure and across the fin structure; patterning the dummy gate structure to expose the hard mask layer; etching the hard mask layer through the patterned dummy gate structure until the sacrificial layer is exposed; after etching the hard mask layer, removing the sacrificial layer through the patterned dummy gate structure to form a space below the stack of the alternating first and second semiconductor layers; forming an isolation layer filling up the space, such that the isolation layer is sandwiched between the substrate and the stack of the alternating first and second semiconductor layers; after forming the isolation layer, removing the etched hard mask layer and the patterned dummy gate structure; after removing the etched hard mask layer and the patterned dummy gate structure, removing the first semiconductor layers such that the second semiconductor layers are suspended over the isolation layer; and forming a gate structure to surround each of the suspended second semiconductor layers. In some embodiments, the sacrificial layer and the first semiconductor layer are made of a germanium-containing material, and the sacrificial layer has a different germanium atomic percentage concentration than the first semiconductor layer. In some embodiments, the hard mask layer is made of a carbon-containing material. The method further includes etching portions of the stack of the alternating first and second semiconductor layers that extend laterally beyond the hard mask layer and the dummy gate structure to expose portions of the sacrificial layer prior to patterning the dummy gate structure; and forming a plurality of source/drain structures over the exposed portions of the sacrificial layer on either side of the stack of the alternating first and second semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:

forming a semiconductor strip extending upwardly from a substrate;

forming a fin structure having a sacrificial layer over the semiconductor strip and a stack of alternating first and second semiconductor layers over the sacrificial layer;

forming an isolation dielectric laterally surrounding the semiconductor strip;

forming a hard mask layer across the fin structure, such that the hard mask layer has a first portion wrapping around the stack, a second portion on a sidewall of the sacrificial layer, and a third portion extending on a top surface of the isolation dielectric;

forming a dummy gate structure over the hard mask layer and across the fin structure;

patterning the dummy gate structure to form an opening exposing the third portion of the hard mask layer, wherein from a top view, the opening does not overlap the fin structure;

removing the second and third portions of the hard mask layer through the opening to expose the sidewall of the sacrificial layer;

after removing the second and third portions of the hard mask layer, removing the sacrificial layer through the opening to form a space below the stack of the alternating first and second semiconductor layers;

forming an isolation layer filling up the space through the opening, such that the isolation layer is sandwiched between the substrate and the stack of the alternating first and second semiconductor layers;

after forming the isolation layer, removing the first portion of the hard mask layer and the patterned dummy gate structure;

after removing the first portion of the hard mask layer and the patterned dummy gate structure, removing the first semiconductor layers such that the second semiconductor layers are suspended over the isolation layer; and forming a gate structure to surround each of the suspended second semiconductor layers.

2. The method of claim 1, wherein the sacrificial layer and the first semiconductor layer are made of a germanium-containing material, and the sacrificial layer has a different germanium atomic percentage concentration than the first semiconductor layer.

3. The method of claim 1, wherein the hard mask layer is made of a carbon-containing material.

4. The method of claim 1, further comprising:

etching portions of the stack of the alternating first and second semiconductor layers that extend laterally beyond the hard mask layer and the dummy gate structure to expose portions of the sacrificial layer prior to patterning the dummy gate structure; and forming a plurality of source/drain structures over the exposed portions of the sacrificial layer on either side of the stack of the alternating first and second semiconductor layers.

5. A method for forming a semiconductor device, comprising:

forming a semiconductor strip extending upwardly from a substrate, wherein from a top view, the semiconductor strip has a length extending along a first direction;

forming a sacrificial layer over the semiconductor strip;

forming a stack of alternating channel layers and semiconductor layers above the sacrificial layer, wherein from the top view, the channel layers and the semiconductor layers extend in the first direction, and from a cross-sectional view, the channel layers and the semiconductor layers are arranged in a second direction substantially perpendicular to a top surface of the substrate;

forming an isolation dielectric laterally surrounding the semiconductor strip;

forming a hard mask layer extending across the stack and the sacrificial layer, such that the hard mask layer has a first portion wrapping around the stack, a second portion on a sidewall of the sacrificial layer, and a third portion extending on a top surface of the isolation dielectric;

forming a dummy gate structure over the hard mask layer and extending across the stack and the sacrificial layer;

forming a pair of source/drain structures above the semiconductor strip and on either side of the channel layers;

patterning the dummy gate structure to form an opening exposing the third portion of the hard mask layer, wherein from the top view, the opening does not overlap the stack;

removing the second and third portions of the hard mask layer through the opening to expose the sidewall of the sacrificial layer;

removing the sacrificial layer through the opening to form a space between the semiconductor strip and the stack and between the semiconductor strip and one of the source/drain structures;

forming an isolation layer in the space through the opening;

after forming the isolation layer, removing the patterned dummy gate structure, the first portion of the hard mask layer, and the semiconductor layers; and forming a gate structure surrounding each of the channel layers.

6. The method of claim 5, wherein the isolation layer is in direct contact with the gate structure.

7. The method of claim 5, wherein the gate structure comprises a high-k dielectric layer lining a sidewall and a top surface of the isolation layer.

8. The method of claim 5, wherein the isolation layer extends past an interface between a longest side of the semiconductor strip and the isolation dielectric.

9. The method of claim 8, wherein the isolation layer on the semiconductor strip has a thicker thickness than on the isolation dielectric.

10. The method of claim 5, wherein the isolation layer has a first portion embedded in the one of the source/drain structures.

11. The method of claim 10, wherein the one of the source/drain structures is in a position higher than a bottom surface of the first portion of the isolation layer.

12. The method of claim 10, wherein the first portion of the isolation layer underlying the one of the source/drain structures has a narrower width than a second portion of the isolation layer underlying the gate structure along a lengthwise direction of the gate structure.

13. The method of claim 5, wherein the isolation layer is in direct contact with the source/drain structures.

14. The method of claim 5, wherein the step of forming the isolation layer is performed after the step of forming the source/drain structures and prior to the step of forming the gate structure.

15. A method for forming a semiconductor device, comprising:

forming a semiconductor strip extending upwardly from a substrate;

forming a sacrificial layer over the semiconductor strip;
forming a stack of alternating first and second semiconductor layers over the sacrificial layer;
forming an isolation dielectric laterally surrounding the semiconductor strip;
forming a hard mask layer extending across the stack and the sacrificial layer, such that the hard mask layer has a first portion wrapping around the stack, a second portion on a sidewall of the sacrificial layer, and a third portion extending on a top surface of the isolation dielectric;
forming a dummy gate structure over the hard mask layer and extending across the stack and the sacrificial layer;
forming a pair of source/drain structures over the semiconductor strip and on opposite sides of the stack;
patterning the dummy gate structure to form an opening exposing the third portion of the hard mask layer, wherein from a top view, the opening does not overlap the stack;
removing the second and third portions of the hard mask layer through the opening to expose the sidewall of the sacrificial layer;
removing the sacrificial layer through the opening to form a first space between the semiconductor strip and the stack and a second space between the semiconductor strip and one of the source/drain structures;
forming an isolation layer having a first portion in the first space and interposing the semiconductor strip and the stack, and a second portion in the second space and interposing the semiconductor strip and the one of the source/drain structures through the opening;
after forming the isolation layer, removing the patterned dummy gate structure, the first portion of the hard mask layer, and the first semiconductor layers; and
forming a gate structure surrounding each of the second semiconductor layers.

16. The method of claim 15, wherein the one of the source/drain structures is spaced apart from the semiconductor strip by the second portion of the isolation layer.

17. The method of claim 15, wherein the one of the source/drain structures wraps around three sides of the second portion of the isolation layer.

18. The method of claim 15, wherein the isolation layer has a width substantially the same as a width of the semiconductor strip along a lengthwise direction of the gate structure.

19. The method of claim 15, further comprising:
forming isolation dielectric laterally surrounding the semiconductor strip, wherein the step of forming the isolation layer is performed such that the first portion of the isolation layer is further formed on the isolation dielectric.

20. The method of claim 19, wherein the second portion of the isolation layer on the semiconductor strip has a thicker thickness than on the isolation dielectric.

* * * * *